US008154072B2

(12) United States Patent
Koike et al.

(10) Patent No.: US 8,154,072 B2
(45) Date of Patent: *Apr. 10, 2012

(54) NONVOLATILE SEMICONDUCTOR MEMORY APPARATUS

(75) Inventors: Masahiro Koike, Yokohama (JP); Yuichiro Mitani, Kanagawa-Ken (JP); Tatsuo Shimizu, Tokyo (JP); Naoki Yasuda, Yokohama (JP); Yasushi Nakasaki, Yokohama (JP); Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 498 days.

This patent is subject to a terminal disclaimer.

(21) Appl. No.: 12/403,493

(22) Filed: Mar. 13, 2009

(65) Prior Publication Data
US 2010/0052035 A1    Mar. 4, 2010

(30) Foreign Application Priority Data
Sep. 4, 2008    (JP) ................................. 2008-227418

(51) Int. Cl.
*H01L 29/788* (2006.01)
(52) U.S. Cl. .................. 257/322; 257/324; 257/E21.21; 257/E21.423
(58) Field of Classification Search .................. 257/322, 257/324, E21.21, E21.423
See application file for complete search history.

(56) References Cited

U.S. PATENT DOCUMENTS
7,279,737 B2    10/2007 Nara et al.
7,943,984 B2 *   5/2011 Koike et al. .................. 257/325

2004/0264236 A1 * 12/2004 Chae et al. .................... 365/154
2008/0073691 A1    3/2008 Konno et al.
2008/0135922 A1    6/2008 Mitani et al.
2008/0217680 A1    9/2008 Shimizu et al.
2008/0237697 A1   10/2008 Shimizu et al.
2008/0237699 A1   10/2008 Shimizu et al.

FOREIGN PATENT DOCUMENTS
JP    2000-58831    2/2000
JP    33578861     10/2002
JP    2008-147390   6/2008

OTHER PUBLICATIONS
Definition of Fermi level, Aug. 2000.*

(Continued)

*Primary Examiner* — Matthew Landau
*Assistant Examiner* — Sonya McCall Shepard
(74) *Attorney, Agent, or Firm* — Finnegan, Henderson, Farabow, Garrett & Dunner, L.L.P.

(57) ABSTRACT

A nonvolatile semiconductor memory apparatus includes: a source and drain regions formed at a distance from each other in a semiconductor layer; a first insulating film formed on the semiconductor layer located between the source region and the drain region, the first insulating film including a first insulating layer and a second insulating layer formed on the first insulating layer and having a higher dielectric constant than the first insulating layer, the second insulating layer having a first site performing hole trapping and releasing, the first site being formed by adding an element different from a base material to the second insulating film, the first site being located at a lower level than a Fermi level of a material forming the semiconductor layer; a charge storage film formed on the first insulating film; a second insulating film formed on the charge storage film; and a control gate electrode formed on the second insulating film.

10 Claims, 106 Drawing Sheets

OTHER PUBLICATIONS

Relationship between electrons and holes, 1999-2000.*

Widiez et al., "Internal Photoemission over $HfO_2$ and $Hf_{(1-x)}Si_xO_2$ High-κ Insulating Barriers: Band Offset and Interfacial Dipole Characterization," Japanese Journal of Applied Physics (2008), 47:2410-14.

Seguini et al., "Band alignment at the $La_2Hf_2O_7/(001)Si$ interface," Applied Physics Letters (2006), 88:202903-1-202903-3.

Dimoulas et al., "$La_2Hf_2O_7$ high-κ gate dielectric grown direction on Si(001) by molecular-beam epitaxy," Applied Physics Letters (Oct. 11, 2004), 85:3205-07.

Wilk et al., "Improved Film Growth and Flatband Voltage Control of ALD $HfO_2$ and Hf—Al—O with $n^+$ poly-Si Gates using Chemical Oxides and Optimized Post-Annealing," 2002 Symposium on VLSI Technology Digest of Technical Papers (2002).

Yu et al., "Energy gap and band alignment of $(HfO_2)_x(Al_2O_3)_{1-x}$ on (100) Si," Applied Physics Letters (Jul. 8, 2002), 81:376-378.

Bachhofer et al., "Transient conduction in multidielectric silicon-oxide-nitride-oxide semiconductor structures," Journal of Applied Physics (Mar. 1, 2001), 89:2791-2800.

Robertson, "Band offsets of wide-band-gap oxides and implications for future electronic devices," J. Vac. Sci. Technol. B (May/Jun. 2000), 18:1785-91.

Koike, M. et al., "Nonvolatile Semiconductor Memory Apparatus,"

U.S. Appl. No. 12/233,023, filed Sep. 18, 2008.
U.S. Appl. No. 12/388,810, filed Feb. 19, 2009.
U.S. Appl. No. 12/370,641, filed Feb. 13, 2009.
U.S. Appl. No. 09/324,868.
U.S. Appl. No. 12/189,400.

* cited by examiner

|  | DIELECTRIC CONSTANT | ΔEv |
|---|---|---|
| $HfO_2$ | 18 | 3.0 |
| $Al_2O_3$ | 9 | 4.9 |
| $La_2O_3$ | 30 | 2.6 |
| $SiO_2$ | 3.9 | 3.8 |
| $Si_3N_4$ | 7.4 | 2.1 |
| $TiO_2$ | 89 | 0.9 |
| $Hf_2Al_2O_7$ | 12 | 2.76 |
| $HfSiO_4$ | 11 | 3.6 |
| $LaAlO_3$ | 30 | 2.7 |
| $La_2Hf_2O_7$ | 23 | 2.4 |
| $Ta_2O_5$ | 30 | 1.8 |

FIG. 15

| low-k | high-k | min(eV) | max(eV) | EOTmin(nm) |
|---|---|---|---|---|
| $SiO_2$ | $HfO_2$ | 0.1 | 2.2 | 1.19 |
| $SiO_2$ | $Al_2O_3$ | 1.5 | 4.1 | 1.78 |
| $SiO_2$ | $La_2O_3$ | 0 | 1.9 | 1.32 |
| $SiO_2$ | $HfSiO_4$ | 0.1 | 2.9 | 1.40 |
| $SiO_2$ | $LaAlO_3$ | 0 | 1.9 | 1.12 |
| $SiO_2$ | $Hf_2Al_2O_7$ | 0.1 | 2.1 | 1.45 |
| $SiO_2$ | $La_2Hf_2O_7$ | 0.1 | 1.7 | 1.07 |
| $SiO_2$ | SiN | 0 | 0.9 | 2.85 |
| $SiO_2$ | $Ta_2O_5$ | 0 | 1.3 | 1.02 |
| $SiO_2$ | $TiO_2$ | — | — | — |

| low-k | high-k | EOTmin(nm) | |
|---|---|---|---|
| | | WITHOUT HOLE ASSIST LEVEL | WITH HOLE ASSIST LEVEL |
| SiO$_2$ | HfO$_2$ | 2.50 | 1.19 |
| SiO$_2$ | Al$_2$O$_3$ | 3.97 | 1.78 |
| SiO$_2$ | La$_2$O$_3$ | 2.30 | 1.32 |
| SiO$_2$ | HfSiO$_4$ | 3.16 | 1.40 |
| SiO$_2$ | LaAlO$_3$ | 2.22 | 1.12 |
| SiO$_2$ | Hf$_2$Al$_2$O$_7$ | 2.39 | 1.45 |
| SiO$_2$ | La$_2$Hf$_2$O$_7$ | 1.92 | 1.07 |
| SiO$_2$ | SiN | 2.85 | 2.85 |
| SiO$_2$ | Ta$_2$O$_5$ | 1.44 | 1.02 |
| SiO$_2$ | TiO$_2$ | — | — |

NONVOLATILE SEMICONDUCTOR MEMORY APPARATUS

CROSS-REFERENCE TO RELATED APPLICATION

This application is based upon and claims the benefit of priority from prior Japanese Patent Application No. 2008-227418 filed on Sep. 4, 2008 in Japan, the entire contents of which are incorporated herein by reference.

BACKGROUND

1. Technical Field

Described herein is a nonvolatile semiconductor memory apparatus.

2. Related Art

In recent years, electrically writable and erasable nonvolatile semiconductor memory apparatuses have been developed to provide higher performances. Such nonvolatile semiconductor memory apparatuses include, for example, EEPROMs (Electrically Erasable Programmable Read Only Memories), and there are two well-known types of EEPROMs: a floating gate type (hereinafter also referred to as the FG type) and a MONOS (Metal Oxide Nitride Oxide Semiconductor) type.

The fundamental structure of the FG type is characterized by a stacked structure formed with a control gate electrode, an interelectrode insulating film (also called an interpoly insulating film), a floating gate electrode, a tunnel insulating film (a $SiO_2$ film), and a substrate stacked in this order from the top. When a positive high voltage is applied to the control gate electrode, electrons can be injected (written) into the floating gate electrode from the substrate side. When a negative high voltage is applied, electrons can be removed (erased) from the floating gate electrode toward the substrate. Ideally, the electrons once written into the floating gate electrode remain in the floating gate electrode, unless an erasing operation is performed. Accordingly, the apparatus functions as a nonvolatile memory apparatus.

The fundamental structure of the MONOS type has a stacked structure formed with a control gate electrode, a block insulating film, a trapping film, a tunnel insulating film, and a substrate stacked in this order from the top. When writing is performed in this structure, electrons are injected by applying a high voltage, as in the FG-type structure. However, the electrons are stored in the trapping film. Erasing is performed not only by removing electrons but also by injecting holes, which differs from the erasing operation in the FG-type structure. In this manner, the stored electrons and the holes cancel each other, so as to realize erasing.

To improve the performance of a nonvolatile semiconductor apparatus, the erase efficiency may be increased. To increase the erase efficiency, a high voltage is applied to the tunnel insulating film so as to inject a large number of holes in a short period of time. In other words, the leakage current is increased. It is known that the relationship between the leakage current J flowing in the tunnel insulating film and the electric field $E_{ox}$ ($=V_{ox}/T_{ox}$) stays almost the same even if $T_{ox}$ varies, as long as $V_{ox}$ is sufficiently large. Here, $T_{ox}$ represents the film thickness of the tunnel insulating film, and $V_{ox}$ represents the voltage applied to the film. The reason is that the mechanism of the leakage current is dominated by the so-called Fowler-Nordheim (F-N) current $J_{fn}$, which is approximately expressed by the following equation (1):

$$J_{fn} = AE_{ox}^2 \exp\left(-\frac{B}{E_{ox}}\right) \quad (1)$$

In the case of a hole current, A and B represent the constants that depend on the tunneling mass of the holes in the tunnel insulating film and the barrier height felt by the holes. As can be seen from this equation, the leakage current is not affected by the film thickness $T_{ox}$, but is determined by the electric field $E_{ox}$. The possible common specs of the hole leakage current required in the tunnel insulating film indicate that the leakage current is $1.0 \times 10^{-16}$ A/cm$^2$ or less in a low electric field of 3 MV/cm, and the leakage current is $1.0 \times 10^{-5}$ A/cm$^2$ or greater in a high electric field of 13 MV/cm. Accordingly, to increase the erase efficiency, the electric field $E_{ox}$ may be made higher. However, a higher electric field results in a higher voltage that is undesirable. A higher voltage adversely affects the reliability of the tunnel insulating film.

When a high voltage is applied to the tunnel insulating film, a phenomenon called stress-induced leakage current (hereinafter also referred to as SILC) is caused, and the leakage current is increased with a low voltage. This phenomenon is considered to be caused by defects formed in the tunnel insulating film. If the voltage applied to the tunnel insulating film is high, the electrons tunneling through the bandgap of the tunnel insulating film reach the conduction band of the tunnel insulating film. When moving on to the anode side, the electrons reaching the conduction band have a large energy. Because of the energy, impact ionization is caused, and holes are generated. The holes generated in this manner travel in the opposite direction from electrons, and form defects in the tunnel insulating film. The defects trigger SILC. Therefore, it is preferable that the leakage current is increased so as to achieve higher erase efficiency, without an increase in the electric field $E_{ox}$. For example, it is ideal that a leakage current of $1.0 \times 10^{-5}$ A/cm$^2$ or greater is obtained when the electric field $E_{ox}$ is 13 MV/cm, or a leakage current of $1.0 \times 10^{-5}$ A/cm$^2$ is obtained when the electric field $E_{ox}$ is lower than 13 MV/cm.

To realize such a structure, the inventors of the present invention suggested a method for forming a trap (a site that captures and releases electrons) at a shallow level from the conduction band of a tunnel insulating film (a $SiO_2$ film) (see JP-A 2008-147390(KOKAI), for example). The tunnel insulating film disclosed in JP-A 2008-147390(KOKAI) has a three-layer stacked structure in which an insulating layer not having a trap level is interposed between two insulating layers each having a trap level. In a low electric field, the tunneling current in the tunnel insulating film is restricted to the same amount as that in an insulating film not having a trap level.

In a high electric field, on the other hand, electrons tunnel through the trap level. Accordingly, the tunneling probability becomes higher than that in an insulating film not having a trap level, and the leakage current also becomes greater. In this manner, the write efficiency can be made higher without an increase in the electric field $E_{ox}$. This is an ideal feature for a tunnel insulating film. The above is a case of an electron leakage current $J_e$. In a case of a hole leakage current $J_h$, Ge is added, for example, to a shallow level from the valence band of the tunnel insulating film (a $SiO_2$ film), so as to form a trap (a site that captures and releases holes). In this manner, the erase efficiency can be made higher, like the write efficiency.

If the voltage can be made even lower, SILC can be restricted, and the reliability of the tunnel insulating film can be made even higher. To do so, the tunnel insulating film should be made thinner. However, if the film thickness of the tunnel SiO$_2$ film is reduced to 5 nm or less, the D-T (Direct Tunneling) current caused by electrons becomes dominant in a low electric field of 3 MV/cm in the electric field E$_{ox}$, and the above mentioned specs required in the tunnel insulating film are not fulfilled. Therefore, the film thickness of the tunnel insulating film cannot be reduced to 5 nm or less.

Attention should be paid to whether or not the leakage current J$_e$ fulfills the specs. Since the barrier height against holes tends to be higher than the barrier height against electrons, the leakage current J$_h$ generated by holes is lower than the leakage current J$_e$ generated by electrons in any electric field (J$_h$<J$_e$), or the leakage current J$_e$ is always dominant, in a case where the structure of the insulating film is symmetrical in the film thickness direction. Accordingly, in a low electric field, the leakage current J$_h$ is automatically restricted to a small amount, as long as the leakage current J$_e$ is restricted to a small amount.

In terms of the electric properties (the J-E$_{ox}$ characteristics), a tunnel insulating film having a trap level is basically the same as an insulating film not having a trap level in a low electric field, and therefore, the film thickness of the tunnel insulating film having a trap level cannot be reduced to 5 nm or less.

Meanwhile, as a technique for reducing leakage current, the use of a high-dielectric film is known (see Japanese Patent No. 3,357,861, for example). According to Japanese Patent No. 3,357,861, the leakage current in a low electric field cannot be reduced merely by the use of a single-layer high-dielectric film, and the leakage current in a high electric field cannot be increased. However, if a stacked structure includes a high-dielectric film and a low-dielectric film at an appropriate ratio, the leakage current can be reduced in a low electric field, and can be increased in a high electric field. The equivalent oxide thickness (EOT) of the tunnel insulating film having such a stacked structure can be reduced, and the voltage can be lowered accordingly. Generally there is a tendency that the higher a dielectric constant, the lower the barrier height. The tendency leads to the problem of an increase in current due to the thermal excitation of electrons; however, this problem can be solved by the stacked structure in Japanese Patent No. 3,357,861. Thus, the leakage current can be reduced by the use of a stacked structure including a low-dielectric film that tends to have a large barrier height.

In this stacked structure, the EOT can be reduced to 5 nm or less. Accordingly, a high leakage current of $1.0 \times 10^{-5}$ A/cm$^2$ generated by holes and normally required for erasing can be obtained with a low voltage V$_{ins}$. However, with the electric field E$_{ox}$ converted into an oxide film (=V$_{ins}$/EOT) being taken into account, it is necessary to have an electric field higher than 13 MV/cm. A stacked structure formed with a low-dielectric film and a high-dielectric film has the advantage that the film thickness can be reduced while the leakage current in a low electric field is restricted to a small amount, but also has the drawback that a high electric field E$_{ox}$ is required to obtain a high current necessary for erasing.

As described above, by the conventional art, the EOT of a tunnel insulating film cannot be reduced to 5 nm or less while the specs of the leakage current required in a nonvolatile semiconductor memory apparatus are fulfilled. Since the film thickness cannot be made smaller, it is necessary to apply a high voltage when data writing or erasing is performed. As a result, defects are formed in the insulating film, leading to SILC.

SUMMARY

Possible embodiments of this invention are made in view of these circumstances, and some embodiments of this invention may provide a nonvolatile semiconductor memory apparatus including a tunnel insulating film that can reduce the leakage current in a low electric field and increase the leakage current in a high electric field, even if the EOT is made smaller.

A nonvolatile semiconductor memory apparatus according to a first aspect of the present invention includes: a memory element including: a semiconductor substrate; a source region and a drain region formed at a distance from each other in the semiconductor layer; a first insulating film formed on a portion of the semiconductor layer, the portion being located between the source region and the drain region, the first insulating film including a first insulating layer and a second insulating layer formed on the first insulating layer and having a higher dielectric constant than the first insulating layer, the second insulating layer having a first site that performs hole trapping and releasing, the first site being formed by adding an element different from a base material to the second insulating film, the first site being located at a lower level than a Fermi level of a material forming the semiconductor layer; a charge storage film formed on the first insulating film; a second insulating film formed on the charge storage film; and a control gate electrode formed on the second insulating film.

A nonvolatile semiconductor memory apparatus according to a second aspect of the present invention includes: a memory element that includes: a semiconductor layer; a source region and a drain region formed at a distance from each other in the semiconductor layer; a first insulating film formed on a portion of the semiconductor layer, the portion being located between the source region and the drain region, the first insulating film having a site that performs hole trapping and releasing, the site being formed by adding an element different from a base material to the first insulating film, the site being located at a lower level than a Fermi level in a surface of a material forming the semiconductor layer; a charge storage film formed on the first insulating film; a second insulating film formed on the charge storage film; and a control gate electrode formed on the second insulating film.

DESCRIPTION OF THE DRAWINGS

FIG. 15 is a diagram showing the dielectric constants and band offsets ΔEv of various insulating films;

DETAILED DESCRIPTION

Figure 1:
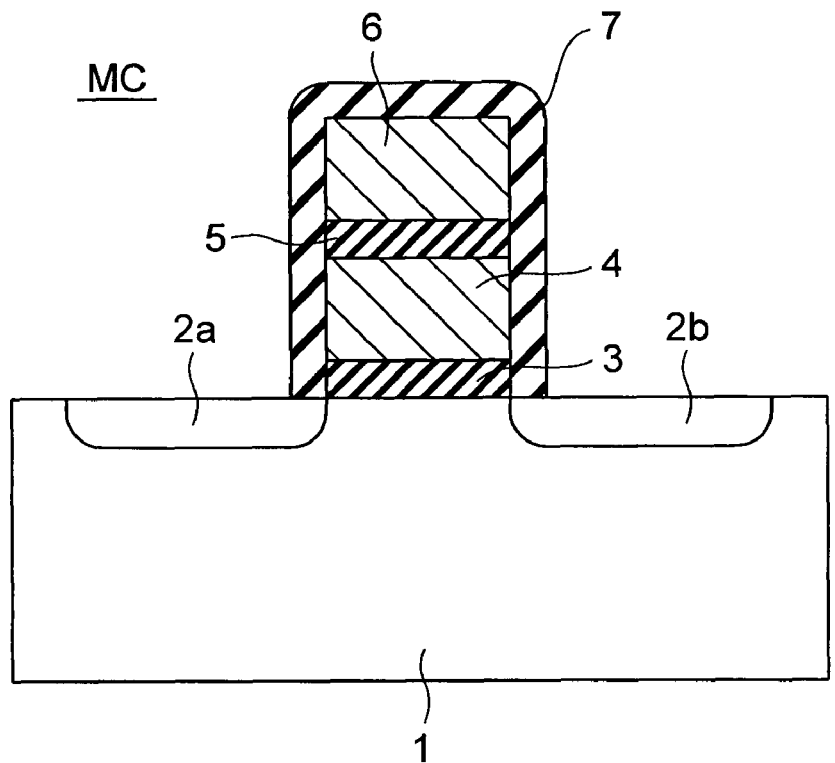
FIG. 1 is a cross-sectional view of a memory cell of a nonvolatile semiconductor memory apparatus in accordance with a first embodiment.

Before describing the embodiments, the course of events for achieving the present invention will be described below.

As described above, the tunnel insulating film invented by the inventors of the present invention and disclosed in JP-A 2008-147390(KOKAI) has a three-layer stacked structure that is symmetrical in the film thickness direction. In the three-layer stacked structure, an insulating layer not having a trap level is interposed between two insulating layers having a trap level. In a low electric field, the tunnel insulating film can restrict a tunnel current to the same amount as that in a case of an insulating film not having a trap level. Meanwhile, electrons tunnel through the trap level in a high electric field. Accordingly, the tunneling probability becomes higher than that in an insulating film not having a trap level, and the leakage current becomes larger. Thus, the write efficiency can be made higher without an increase in the electric field $E_{ox}$, and an ideal tunnel insulating film can be formed. When the insulating layers are SiO$_2$ layers or SiN layers, Ge, As, or P is added so as to form a trap level in each of the insulating layers at both ends of the three-layer stacked structure. When the insulating layers are HfO$_2$ layers, Al, Si, or P is added so as to form the trap level.

In a case where the insulating layers are SiO$_2$ layers or SiN layers, and the added element is Ge, a level that can be a hole trap level (a hole assist level) is formed in the neighborhood of 2 eV to 3 eV from the upper end of the valence band. With the use of this level, high-speed erasing can be performed in a low electric field, according to JP-A 2008-147390(KOKAI).

However, the leakage current in a low electric field becomes the same as the leakage current of an insulating film not having an assist level, and the tunnel SiO$_2$ film disclosed in JP-A 2008-147390(KOKAI) cannot be made thinner than 5 nm, which is the minimum film thickness that fulfills the specs. Also, this tunnel insulating film is designed for a FG-type nonvolatile semiconductor memory apparatus, and the insulating film structure needs to be symmetrical in the film thickness direction so as to perform writing and erasing. Furthermore, if a trap level is formed in the entire tunnel insulating film, or in the middle as well as at both ends of the tunnel insulating film, the leakage current becomes larger in a low electric field. Therefore, a trap level cannot be formed in the entire film. The tunnel insulating film structure must be a three-layer stacked structure that is symmetrical in the film thickness direction, and a trap level needs to be formed only at both ends of the structure.

Also, as described above, with the use of a stack film formed with a high-dielectric film and a low-dielectric film as disclosed in Japanese Patent Publication No. 3357861, the leakage in a low electric field can be reduced, and desired charge retention properties can be achieved. However, if exactly the same specs as those of an oxide film are expected in a tunnel insulating film, it is difficult to realize such a tunnel insulating film only with the insulating film having the stacked structure disclosed in Japanese Patent Publication No. 3357861. For example, in a case where the low-dielectric film of the stacked structure is an oxide film, a sufficiently high voltage needs to be applied to the oxide film, so as to sufficiently increase the leakage current generated by holes. If electrons flow from the low-dielectric film to the high-dielectric film, and a high voltage is applied to the oxide film, the upper end of the valence band of the high-dielectric film is greatly lifted up, and the effect of the high-dielectric film to restrict the tunneling current becomes small. Accordingly, the leakage current can be made larger. However, if the electric field for erasing has a constant value of 13 MV/cm in the electric field $E_{ox}$, the voltage that is applied to the oxide film when the oxide film is made thinner becomes lower, and the leakage current cannot be increased enough. Therefore, the structure disclosed in Japanese Patent Publication No. 3357861 has the problem that the electric field $E_{ox}$ to be applied in the tunnel insulating film at the time of erasing needs to be made higher.

The inventors made intensive studies to discover an optimum tunnel insulating film structure to solve the above two problems. The tunnel insulating film structure is described as embodiments of the present invention in the following. The embodiments of the present invention are described with reference to the accompanying drawings. It should be noted that like components are denoted by like reference numerals throughout the embodiments, and explanation of overlapped aspects in the embodiments is not repeated. Some of the drawings are schematic views designed for ease of explanation and understanding of the present invention. The shapes, sizes, and ratios in the drawings might be different from the values in actual apparatuses, but various changes may be made to those values, with the following explanation and known techniques being taken into consideration.

First Embodiment

A nonvolatile semiconductor memory apparatus in accordance with a first embodiment of the present invention includes NAND cell units that are arranged in a matrix form, for example. Each of the NAND cell units includes NAND cells formed with memory cells connected in series. Each of the memory cells MC has an n-type source region 2a and an n-type drain region 2b that are formed at a distance from each other in a p-type Si substrate 1, and contain n-type impurities (such as P (phosphorus) or As (arsenic)), as shown in FIG. 1. A tunnel insulating film 3 is formed on the region of the Si substrate 1 located between the source region 2a and the drain region 2b. A charge storage film 4 is formed on the tunnel insulating film 3, and an interelectrode insulating film 5 is formed on the charge storage film 4. A control gate electrode 6 is formed on the interelectrode insulating film 5. The gate of the stacked structure formed with the control gate electrode 6, the interelectrode insulating film 5, the charge storage film 4, and the tunnel insulating film 3 is covered with a silicon oxide film 7. A floating gate electrode may be used as the charge storage film 4, so as to form a FG-type nonvolatile semiconductor memory apparatus. Alternatively, a trap insulating film may be used as the charge storage film 4, so as to form a so-called MONOS type nonvolatile semiconductor memory apparatus.

Figure 2:
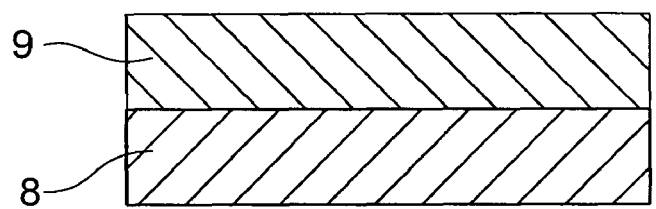
FIG. 2 is a cross-sectional view of a tunnel insulating film in accordance with the first embodiment.

As shown in FIG. 2, the tunnel insulating film 3 has a stacked structure formed with an insulating layer 9 made of a high-dielectric constant (high-k) material having hole assist levels that capture and release holes, and an insulating layer 8 made of a low-dielectric constant (low-k) material having no assist levels. The tunnel insulating film 3 of this embodiment definitely differs from a conventional tunnel insulating film in its structure. More specifically, the tunnel insulating film invented by the inventors of the present invention and already disclosed in JP-A 2008-147390(KOKAI) is a $SiO_2$ film having electron assist levels, and has a three-layer structure having the electron assist levels only at both ends of one of the films. On the other hand, the stacked structure in accordance with this embodiment is a two-layer stacked structure formed with two insulating layers of different dielectric constants, and has hole assist levels. In the former case, the tunnel insulating film is always symmetrical in the film thickness direction, and should have the assist levels formed only in the low-dielectric film. In the latter case, the tunnel insulating film is not necessarily symmetrical, and can have assist levels in the entire film. Also, while the tunnel insulating film having the stacked structure that is disclosed in Japanese Patent Publication No. 3357861 and is formed with insulating layers of different dielectric constants does not have assist levels, the stacked structure of the tunnel insulating film in accordance with this embodiment has hole assist levels formed therein.

Figure 3:
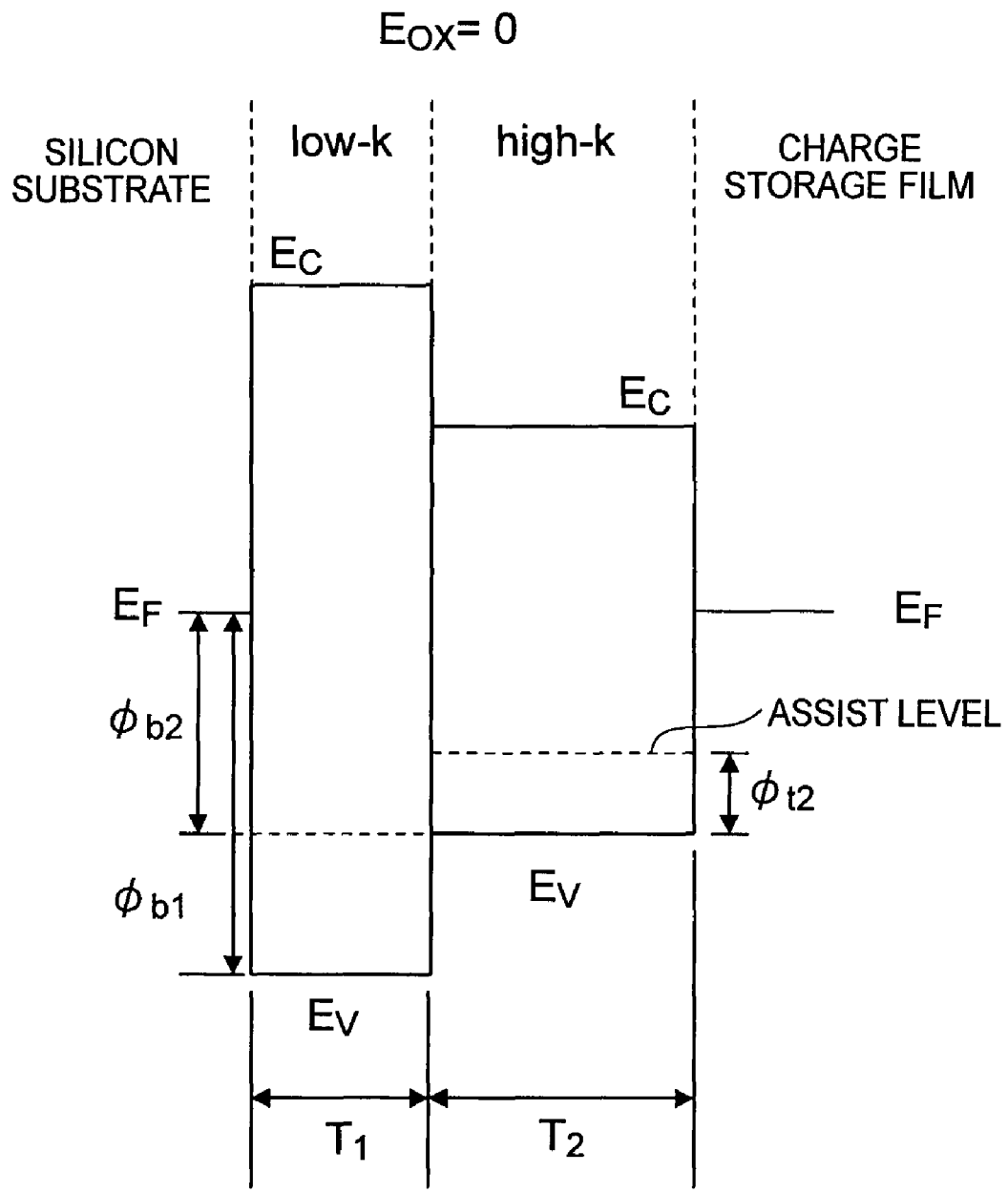
FIG. 3 is an energy band diagram obtained in a case where no electric field is applied in the tunnel insulating film of the first embodiment.

FIG. 3 is a schematic view of the energy band observed in a case where no electric field is applied ($E_{ox}=0$) in the tunnel insulating film of the stacked structure shown in FIG. 2. From the left-hand side in FIG. 3, $E_F$ represents the Fermi level of the semiconductor substrate, the next one indicates the conduction band minimum (CBM) $E_c$ and the valence band maximum (VBM) $E_v$ of the insulating layer made of a low-k material (hereinafter also referred to as the low-k layer), the next one indicates the $E_c$, the assist level, and the $E_v$ of the insulating layer made of a high-k material (hereinafter also referred to as the high-k layer), and the last one indicates the Fermi level $E_F$ of the charge storage film 5. Here, the Fermi level $E_F$ of the semiconductor substrate is the Fermi level observed on the surface when the semiconductor substrate is in an accumulation state (an erased state), and is normally located approximately 0.1 eV lower than the upper end $E_v$ of the valence band of the semiconductor substrate. Also, the physical thicknesses of the low-k and high-k insulating layers (referred to as the physical layer thicknesses) are represented by $T_1$ and $T_2$, respectively. The differences between the Fermi level $E_F$ of the semiconductor substrate and the upper ends $E_v$ of the valence bands of the low-k layer and the high-k layer, or the barrier heights against holes, are represented by $\phi_{b1}$ and $\phi_{b2}$, respectively. Here, the hole assist level is defined by the depth $\phi_{t2}$ from the upper end $E_v$ of the valence band of the high-k layer. Although the barrier height and the assist level have negative values on the energy axis, the barrier height and the assist level are represented by absolute values (positive values). The assist level is equivalent to the level of $\phi_{b2}-\phi_{t2}$, seen from the Fermi level $E_F$ of the semiconductor substrate. $E_c$ and $E_v$ of the semiconductor substrate and the charge storage films are not shown. In FIG. 3, the Fermi levels $E_F$ of the semiconductor substrate and the charge storage film are the same when $E_{ox}$ is 0. However, the Fermi levels $E_F$ of the semiconductor substrate and the charge storage film are not necessarily the same.

The tunneling current J that flows through the tunnel insulating film having this stacked structure is expressed as follows:

$$J = \frac{4\pi m e}{h^3} \int_0^\infty \zeta(E_x) T^*(E_x) \, dE_x \tag{2}$$

$$\zeta(E_x) = \int_0^\infty \frac{dE_r}{1 + \exp[(E_r + E_x - E_F)/(k_B T)]} \tag{3}$$

Here, e represents the elementary charge, m represents the mass of electrons in vacuum, h represents the Planck's constant, $k_B$ represents the Boltzmann's constant, T represents the absolute temperature, E represents the energy of holes, $E_x$ (=$E-E_y$) represents the energy in the tunneling direction (the x-axis direction) of holes, $E_F$ represents the Fermi level of the semiconductor substrate, and $T^*(E_x)$ represents the effective tunneling probability of the holes flowing through the tunnel insulating film. In this embodiment, calculations are performed based on those equations, with the stacked structure of different insulating films and the assist level being taken into consideration.

Figure 4:
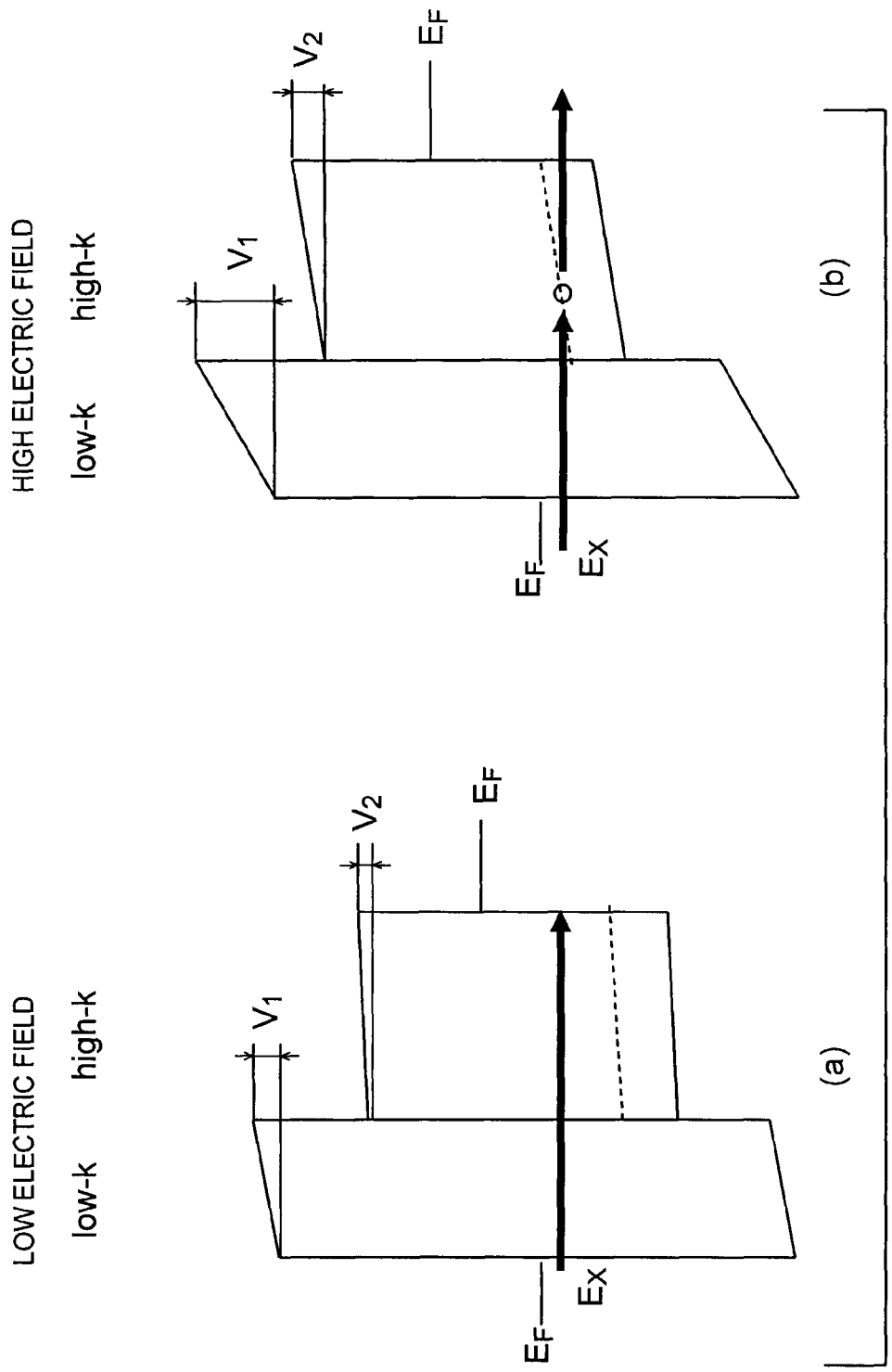
FIGS. 4(a) and 4(b) are energy band diagrams obtained in cases where an electric field is applied in the tunnel insulating film of the first embodiment.

FIG. 4(a) is a schematic view of the energy band observed in a case where a low electric field $E_{ox}$ is applied in the tunnel insulating film having the stacked structure shown in FIG. 2. Here, $\in_1$ and $\in_2$ represent the dielectric constants of the low-k layer and the high-k layer, and $V_1$ and $V_2$ represent the voltages to be applied to the low-k layer and the high-k layer, respectively. If the electric flux density is constant in the stacked structure formed with insulating layers having different dielectric constants, the actual electric fields applied in the respective insulating layers are different from each other. Where $E_1$ and $E_2$ represent the actual electric fields applied in the low-k layer and the high-k layer, the following relationships are established:

$$\in_{ox} \times E_{ox} = \in_1 \times E_1 = \in_2 \times E_2 \tag{4}$$

Here, $\in_{ox}$ (=3.9) represents the dielectric constant of $SiO_2$. The actual electric fields are defined as: $E_1 = V_1/T_1$ and $E_2 = V_2/T_2$. Accordingly, the following equation is satisfied:

$$\in_1 \times V_1/T_1 = \in_2 \times V_2/T_2 \tag{5}$$

As can be seen from the equation (4), the actual electric field in the low-k layer is greater than the actual electric field in the high-k layer. This is because the actual electric field $E_1$ becomes greater than the actual electric field $E_2$, since the dielectric constant $\in_1$ is smaller than the dielectric constant $\in_2$. Accordingly, in a case where the physical layer thickness $T_1$ of the low-k layer is greater than the physical layer thickness $T_2$ of the high-k layer, the voltage $V_1$ applied to the low-k layer is higher than the voltage $V_2$ applied to the high-k layer. This is because $(\in_1/T_1)$ is smaller than $(\in_2/T_2)$ when the thickness $T_1$ is greater than the thickness $T_2$, since the dielectric constant $\in_1$ is smaller than the dielectric constant $\in_2$. Thus, a relationship V1>V2 is derived from the relationship $(\in_1/T_1)<(\in_2/T_2)$ and Equation (5).

As the voltage $V_2$ is applied to the high-k layer, the assist level has the width of $V_2$, when seen from the energy level. In such a situation, however, the Fermi level $E_F$ of the semiconductor substrate is higher than the assist level. Therefore, the assist level does not affect leakage current. In a low electric field, the leakage current is the same as the leakage current generated in the insulating films of a stacked structure that does not have an assist level. The effective tunneling probability $T^*(E_x)$ in that case is expressed as:

$$T^*(E_x) = T_{FN}(\phi_{b1}^*, m_1^*, E_1) T_{FN}^{-1}(\phi_{b1}^* - V_1, m_1^*, E_1) T_{FN}(\phi_{b2}^*, m_2^*, E_2) T_{FN}^{-1}(\phi_{b2}^* - V_2, m_2^*, E_2) \tag{6}$$

Here, $\phi_{b1}^* = \phi_{b1} + E_F - E_x$, $\phi_{b2}^* = \phi_{b2} + E_F - E_x - V_1$, $m_1^*$, and $m_2^*$ represent the effective masses of the tunneling holes in the low-k layer and the high-k layer, respectively. The value of a typical effective mass is 0.6 m. Where $T_{FN}$ represents the Fowler-Nordheim (F-N) tunneling probability, and the relationships, $0 \leq E_x < \phi_b^*$, are satisfied, the following equation (7) is established:

$$T_{FN}(\phi_b^*, m^*, E) = \exp\left[-\frac{8\pi(2m^*)^{1/2}}{3heE} \phi_b^{*3/2}\right] \tag{7}$$

Where $\phi_b^* \leq E_x$ is satisfied, the following equation (8) is established:

$$T_{FN}(\phi_b^*, m^*, E) = 1 \tag{8}$$

Figure 5:
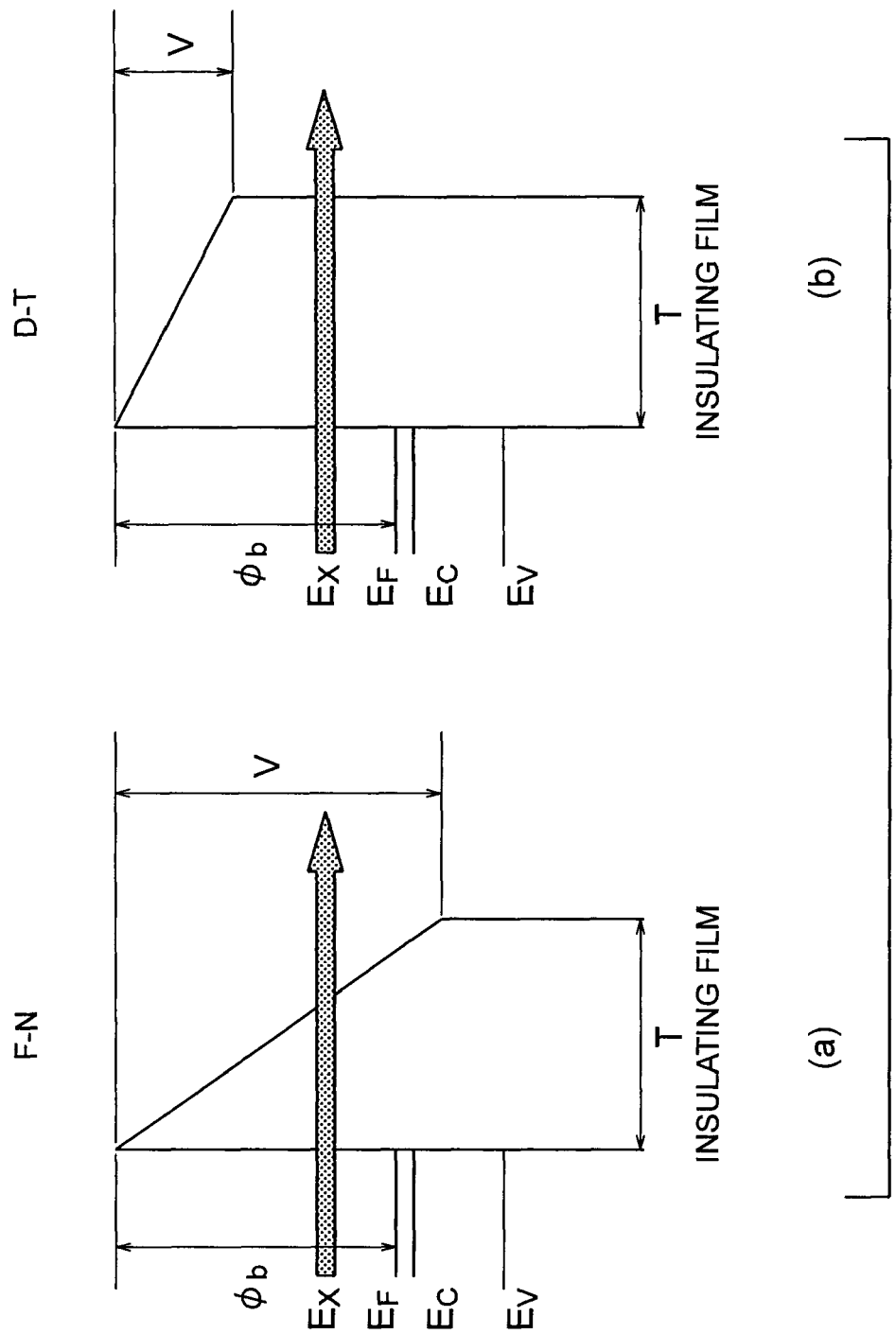
FIGS. 5(a) and 5(b) are diagrams for explaining the difference between D-T and F-N tunneling.

Here, m* represents the effective mass of the holes tunneling in the tunnel insulating film, $\phi_b^*$ represents the effective barrier height of the tunnel insulating film, and $E_1$ and $E_2$ represent the actual electric fields in the low-k layer and the high-k layer, respectively. The "F-N tunneling" means holes tunneling through a tilted valence band of insulating films (or electrons tunneling through the conduction band), as shown in FIG. 5(a). The "D-T (Direct Tunneling)" means holes not tunneling through a valence band of the insulating films but directly reaching the electrode on the opposite side, as shown in FIG. 5(b). For ease of explanation of the holes tunneling, the ordinate axis indicating the energy is shown in the opposite direction from that in a normal case (in the case of electrons), or shown upside down in the drawings. The energy axis is shown upside down in some cases described later, but it can be easily noticed based on the contents of the description.

FIG. 4(b) is a schematic view of the energy band observed in a case where a high electric field $E_{ox}$ is applied in the tunnel insulating film having the stacked structure shown in FIG. 2. Since the electric field $E_{ox}$ is high, the voltages to be applied to the respective films become high. More specifically, a high voltage $V_1$ is applied to the low-k layer, and a lower voltage $V_2$ than the voltage $V_1$ is applied to the high-k layer. As can be seen from FIG. 4(b), since the higher voltage is applied to the low-k layer when the electric field $E_{ox}$ is high, the upper end $E_v$ of the valence band of the high-k layer becomes higher by $V_1$, and the assist level also becomes higher by $V_1$, accordingly. Therefore, the Fermi level $E_F$ of the semiconductor substrate overlaps the height of the assist level. Holes then start tunneling via the assist level. Where $p_1$ represents the probability that holes tunnel from the semiconductor substrate to the assist level, $p_2$ represents the probability that holes tunnel from the assist level to the charge storage film, and f represents the occupancy of the assist level (1-f represents the non-occupancy of the assist level), the probability P that holes flow through the assist level in a steady state satisfies the following equation based on the continuity of the current density:

$$P = p_1 \times (1-f) = p_2 \times f \tag{9}$$

Since f is $p_1/(p_1+p_2)$ here, the following relationship is established:

$$P = 1/(1/p_1 + 1/p_2) \tag{10}$$

The probability that holes do not flow through the assist level is represented by the product of $p_1$ and $p_2$, or $p_1 \times p_2$, which is smaller than the value according to the equation (10). Therefore, the leakage current flowing through the assist level is higher than the leakage current not flowing through the assist level.

Figure 6:
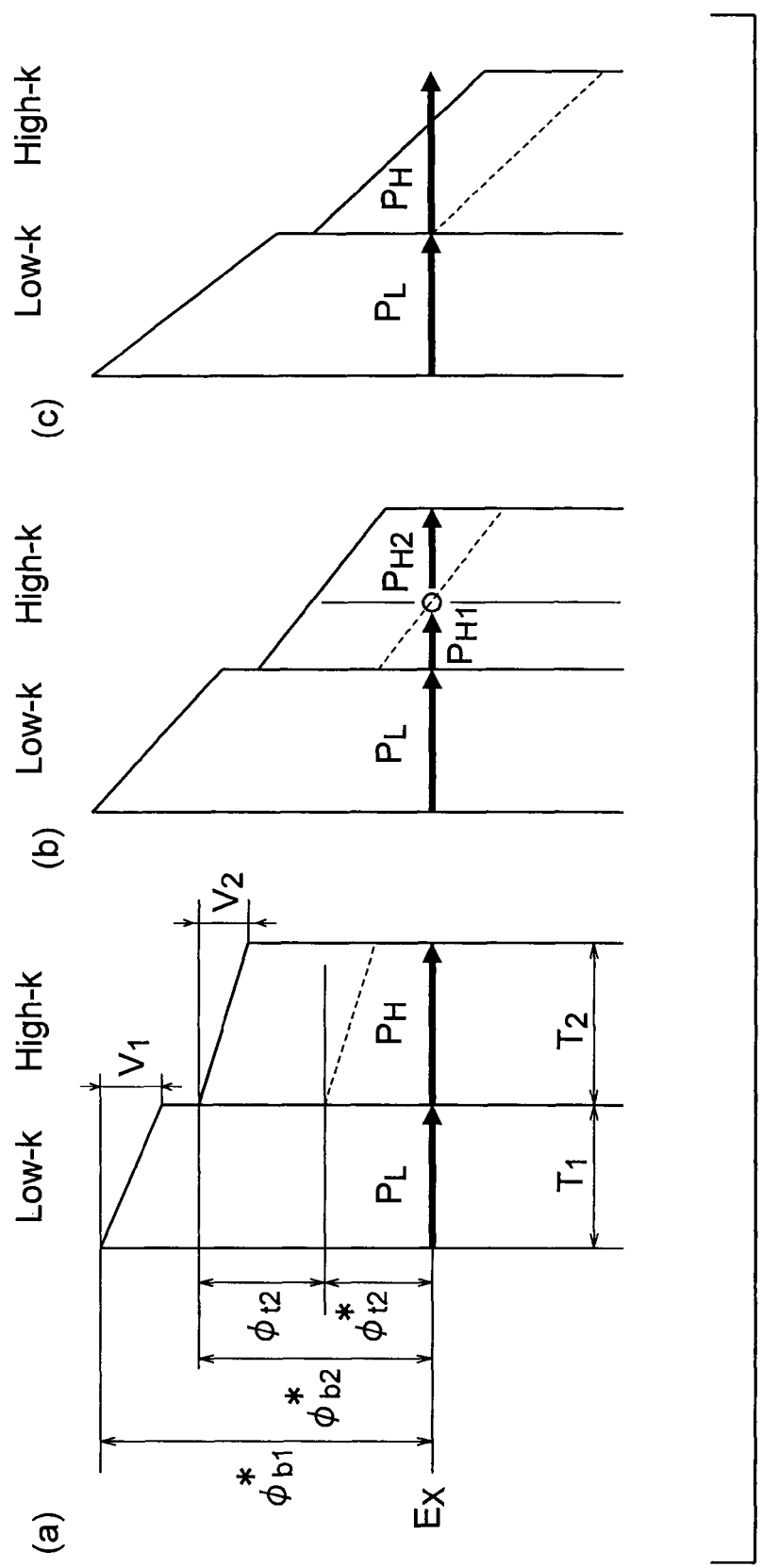
FIGS. 6(a) to 6(c) are diagrams for explaining the tunneling probabilities of tunnel insulating films each having a low-k layer and a high-k layer stacked therein.

If an assist level is formed only in the high-k layer of a tunnel insulating film having the stacked structure of the low-k layer and the high-k layer, the tunneling probabilities are classified as shown in FIGS. 6(a) to 6(c), based on the positional relationship between the energy level $E_x$ of the tunneling holes and $\phi_{T2}$, and are collectively expressed as follows:

$$P^* = \begin{cases} P_L P_H & |V_2| < \phi_{T2}^* \\ 1/[1/(P_L P_{H1}) + 1/P_{H2}] & 0 < \phi_{T2}^* \le |V_2| \\ P_L P_H & \phi_{T2}^* \le 0 \end{cases} \quad (11)$$

Here, $\phi_{T2}^*$ is defined as $\phi_{T2} - \phi_{b2}^*$.

In cases where holes are tunneling, not flowing through an assist level (FIGS. 6(a), 6(c)), the tunneling probability is expressed by the product of the probability of holes tunneling through the high-k layer and the probability of holes tunneling through the low-k layer, which is the same as the value according to the equation (6) expressing the probability observed in a case where there is not an assist level. In a case where holes are tunneling through an assist level (FIG. 6(b)), the following equations are established:

$$P_L = T_{FN}(\phi_{b1}^*, m_1^*, E_1) T_{FN}^{-1}(\phi_{b1}^* - |V_1|, m_1^*, E_1)$$

$$P_{H1} = T_{FN}(\phi_{b2}^*, m_2^*, E_2) T_{FN}^{-1}(\phi_{T2}, m_2^*, E_2)$$

$$P_{H2} = T_{FN}(\phi_{T2}, m_2^*, E_2) T_{FN}^{-1}(\phi_{b2}^* - |V_2|, m_2^*, E_2) \quad (12)$$

As described above, an assist level does not affect leakage current in a low electric field. Accordingly, the leakage current can be restricted to a small amount by increasing the physical film thickness of the tunnel insulating film including a high-k layer. Since holes tunnel through an assist level in a high electric field, the hole tunneling probability becomes higher, and the leakage current can be made greater than the leakage current generated in the case where there is not an assist level. It is preferable that an assist level exists in the high-k layer so as to trap all the holes introduced from the semiconductor substrate. The amount of the assist level should be at least $1.0 \times 10^{16}$ cm$^{-3}$, so that the leakage current can be made greater in a high electric field.

Figure 7:
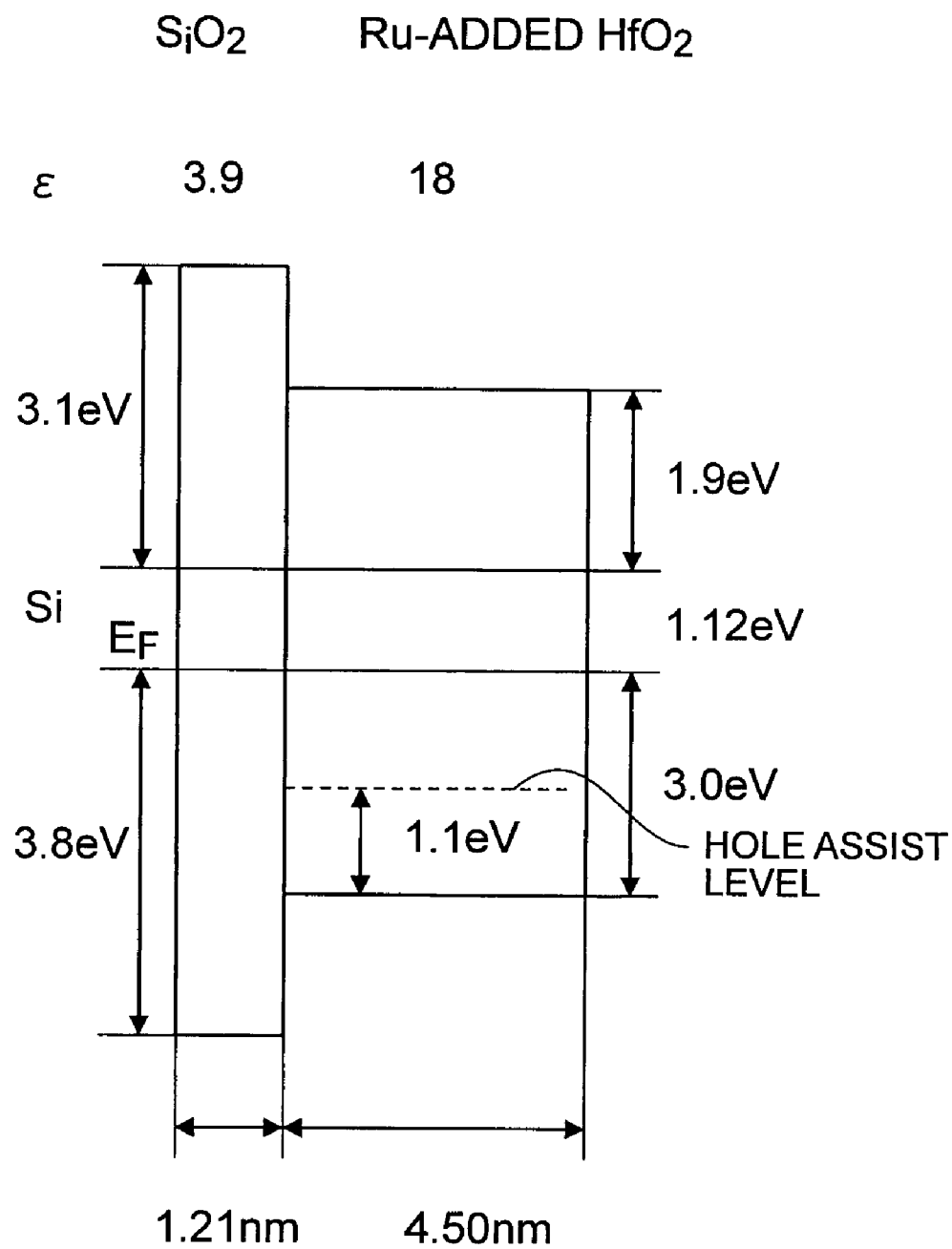
FIG. 7 is an energy band diagram of the tunnel insulating film according to the first embodiment.

An example of a tunnel insulating film having the stacked structure of this embodiment is a stack insulating film that includes a SiO$_2$ layer as the low-k layer and a Ru-added HfO$_2$ layer as the high-k layer having an assist level. The dielectric constant $\in_1$ of the SiO$_2$ is 3.9, and the dielectric constant $\in_2$ of the Ru-added HfO$_2$ is 18. The hole barrier height $\phi_{b1}$ of the low-k layer with respect to the Fermi level $E_F$ of the silicon substrate is 3.8 eV, and the barrier height $\phi_{b2}$ of the high-k layer is 3.0 eV (see). Widiez, et al., Jpn, J. Appl. Phys. 47, 2410 (2008), and H. Bachhofer, et al., J. Appl. Phys., 89, 2791 (2001), for example). FIG. 7 shows the band diagram seen in a case where $E_{ox}$ is 0 in this structure. Here, the tunnel insulating film is a very thin film having an EOT ($T_{eq,all}$) of 2.2 nm, for example. The EOT ($T_{eq1}$) of the low-k layer is 1.21 nm. Since an EOT is a film thickness converted into the thickness of a SiO$_2$ film, the physical film thickness $T_1$ of the SiO$_2$ layer is also 1.21 nm. The EOT ($T_{eq2}$) of the high-k layer is 0.97 nm, and the physical film thickness $T_2$ is 4.50 nm (=0.97×18/3.9). An assist level is formed by adding Ru to an HfO$_2$ layer, for example. According to the results of calculations performed by the inventors, the hole assist level $\phi_{t2}$ is 1.1 eV. In FIG. 7, the abscissa axis indicates the physical film thickness $T_{phys}$, and the ordinate axis indicates the energy.

Figure 8A:
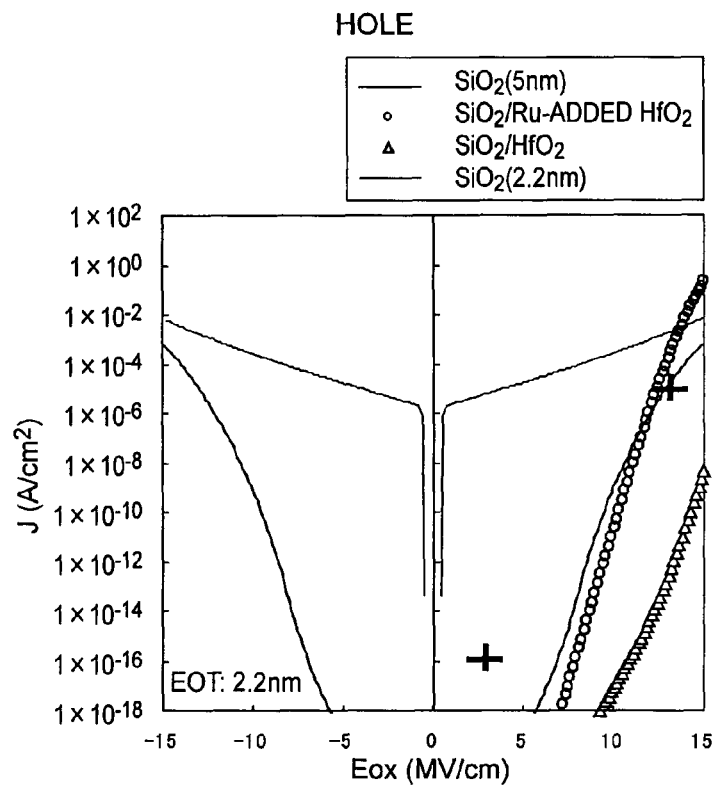
FIG. 8A is a diagram showing the field dependency of a hole leakage current flowing in the tunnel insulating film of the first embodiment when erasing is performed and charges are retained.
Figure 8B:
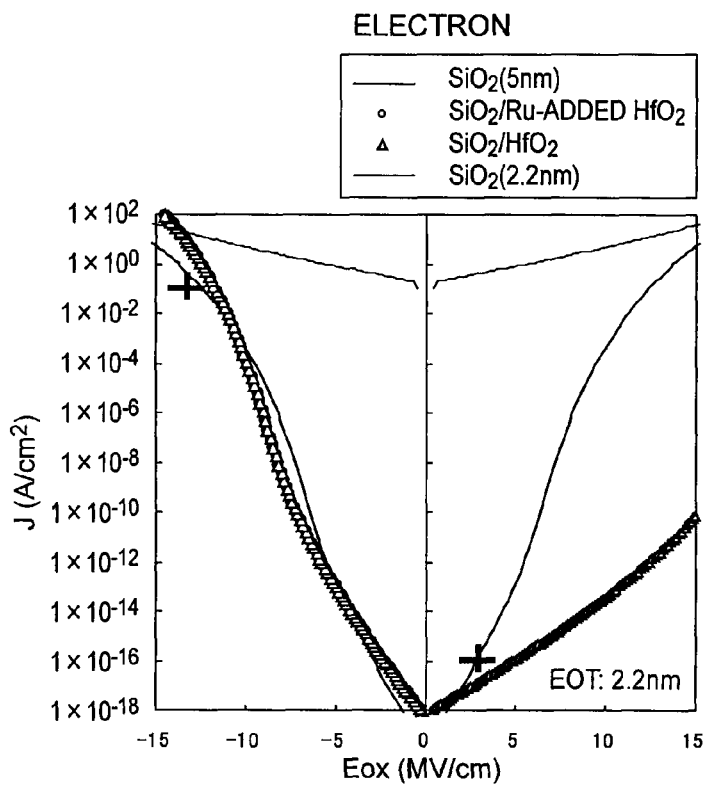
FIG. 8B is a diagram showing the field dependency of an electron leakage current flowing in the tunnel insulating film of the first embodiment when writing is performed and charges are retained.

FIGS. 8A and 8B show the relationships between the electric field $E_{ox}$ applied in the tunnel insulating film of the above described two-layer structure having an EOT of 2.2 nm and the leakage current flowing in the tunnel insulating film. FIG. 8A shows the cases where the leakage current is caused by holes, and FIG. 8B shows the cases where the leakage current is caused by electrons. For the purpose of comparison, FIGS. 8A and 8B also show cases of stacked insulating films without an assist level (stacked insulating films not having Ru added thereto), and cases of single-layer insulating films of a 5-nm thick SiO$_2$ layer and a 2.2-nm thick SiO$_2$ layer. In the case of a single-layer HfO$_2$ layer having an EOT of 2.2 nm, the leakage current is very small, and does not fall into the ranges shown in FIGS. 8A and 8B. Therefore, this case is not shown in FIGS. 8A and 8B.

The cross marks shown at 3 MV/cm in FIGS. 8A and 8B represent the specs of the leakage currents caused by holes and electrons so as to hold charges. The leakage currents must be made equal to or lower than the values represented by the cross marks. The cross mark shown at 13 MV/cm in FIG. 8A represents the specs required for erasing, and the cross mark shown at 13 MV/cm in FIG. 8B represents the specs required for writing. In either case, the leakage current should be equal to or greater than the value represented by the cross mark. When erasing is performed, a high positive electric field $E_{ox}$ is applied in the tunnel insulating film. In general, the specs required in the erase characteristics are equal to or greater than the erase characteristics in a SiO$_2$ layer having a layer thickness of 5 nm. For example, in an electric field of 13 MV/cm, the hole leakage current is equal to or greater than $1 \times 10^{-5}$ A/cm$^2$.

As can be seen from FIG. 8A, if the SiO$_2$ layer has a layer thickness of 5 nm, the above specs (indicated by the cross marks in FIG. 8A) can be fulfilled. If the SiO$_2$ layer has a layer thickness of 2.2 nm, an even greater amount of leakage current can be generated. In the case of the 2.2 nm film thickness, however, the leakage current in a low electric field of 3 MV/cm becomes greater than the value represented by the cross mark, and the specs required in the charge retention properties and the erase characteristics cannot be fulfilled at the same time. In a case of an insulating film having a stacked structure, the leakage current is $2 \times 10^{-13}$ A/cm$^2$ at 13 MV/cm in the film without an assist level (or the film not having Ru added thereto, for example), which is 8 digits smaller than the required spec, $2 \times 10^{-5}$ A/cm$^2$.

As described above, in a case where holes flow through the low-k layer and the high-k layer in this order, the upper end $E_v$ of the valence band of the high-k layer becomes higher, and the hole barrier height becomes smaller. Therefore, the leakage current tends to increase. This structure can exhibit its effects with a certain film thickness. If the EOT ($T_{eq,all}$) of the tunnel insulating film is made smaller, however, the voltage $V_{ins}$ to be applied to the tunnel insulating film needs to be reduced according to its definition ($E_{ox} = V_{ins}/T_{eq,all}$), even while the electric field $E_{ox}$ remains the same. In this manner, while the voltage can be made lower, the value of the barrier height cannot be made lower, because it is determined by the properties of the film. Therefore, in a tunnel insulating film having a stacked structure without an assist level, the leakage current cannot be made sufficiently large in an electric field of 13 MV/cm.

In a tunnel insulating film having a stacked structure having an assist level, on the other hand, the specs required for erasing in an electric field of 13 MV/cm can be fulfilled. As can be seen from the leakage current in the electric field of 13 MV/cm shown in FIG. 8A, there is a leakage current that is much larger than the value represented by the cross mark according to the specs required for erasing. This implies that erasing can be performed at a high speed or can be performed in a low electric field.

The tunnel insulating film having this stacked structure is formed so as to fulfill the specs required for the leakage current generated by electrons, or the specs required in the charge retention properties and the write characteristics. In FIG. 8B, so as to retain charges when the electric field is a +3 MV/cm, the leakage current generated by electrons needs to be equal to or less than $1 \times 10^{-16}$ A/cm$^2$, and this requirement is satisfied. So as to satisfy the write characteristics when the electric field is −13 MV/cm, the leakage current generated by electrons needs to be equal to or greater than 0.1 A/cm$^2$, and this is also satisfied.

As described above, in this embodiment, the tunnel insulating film has a stacked structure formed with a high-k insulating layer having a hole assist level and a low-k insulating layer. In a high electric field $E_{ox}$ of 13 MV/cm, the hole leakage current is equal to or greater than $1 \times 10^{-5}$ A/cm$^2$, and the erase efficiency can be increased. In an electric field of 3 MV/cm, the hole leakage current can be made $1 \times 10^{-16}$ A/cm$^{-2}$ or smaller. Accordingly, the specs of the charge retention are fulfilled. Since the hole leakage current is equal to or greater than 0.1 A/cm$^2$ in an electric field of −13 MV/cm, the specs of the write efficiency can also be fulfilled. At the same time, the tunnel insulating film can be made as thin as 5 nm or less, which cannot be achieved with a SiO$_2$ film. Furthermore, the EOT of the tunnel insulating film can be made 2.2 nm.

As described above, this embodiment can provide a nonvolatile semiconductor memory apparatus that includes a tunnel insulating film that can reduce the leakage current in a low electric field, and can increase the hole leakage current in a high electric field, even if its EOT is made smaller.

(Range of Film Thickness of Tunnel Insulating Film Having a Stacked Structure)

Figure 9:
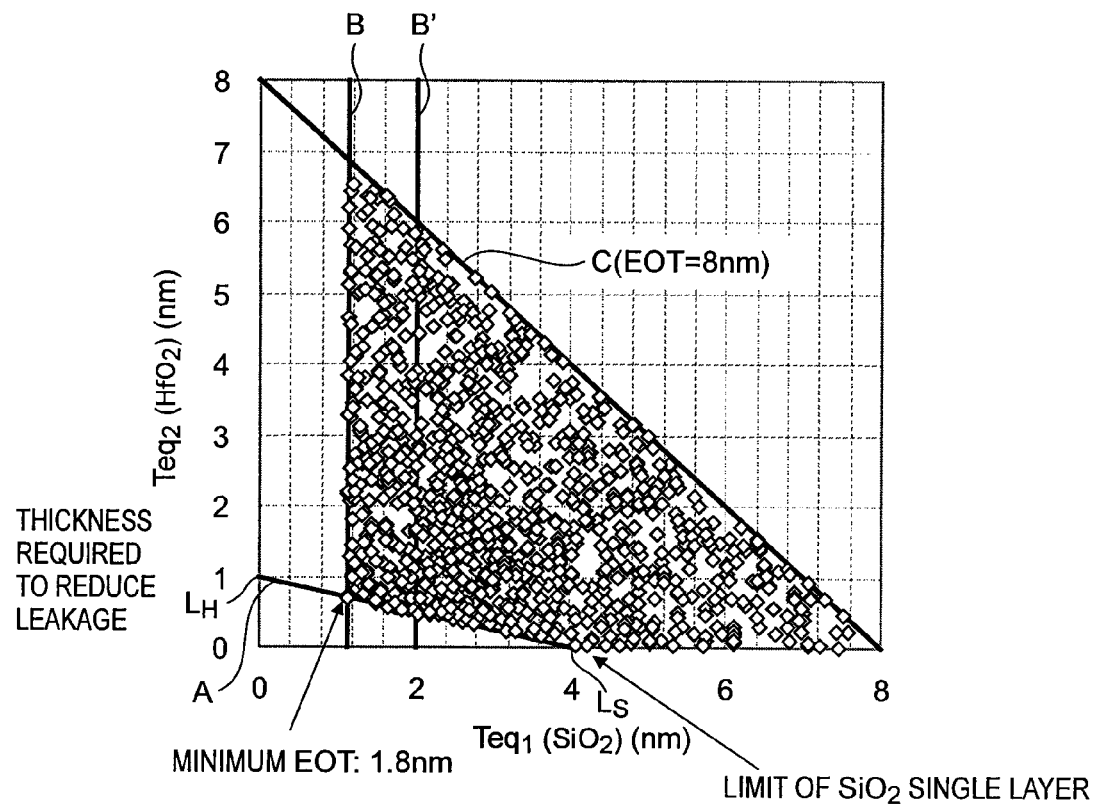
FIG. 9 is a diagram showing the ranges of the EOTs of the SiO$_2$ layer and the HfO$_2$ layer forming the tunnel insulating film according to the first embodiment.

Next, the range of the film thickness of the tunnel insulating film having a stacked structure that can fulfill the required specs in the tunnel insulating film in the nonvolatile semiconductor memory apparatus of the first embodiment is described. FIG. 9 shows the range that fulfills the specs required in the tunnel insulating film. In FIG. 9, the abscissa axis indicates the EOT of the SiO$_2$ layer or $T_{eq1}$(SiO$_2$), and the ordinate axis indicates the EOT of the HfO$_2$ layer or $T_{eq2}$(HfO$_2$). The range includes not only the spots represented by the dots, but also the regions between the dots. The upper limit of the EOT ($T_{eq,all}$), which is the sum of the thicknesses of the SiO$_2$ layer and the HfO$_2$ layer is 8 nm. This upper limit is represented by the straight line C ($T_{eq1}+T_{eq2}=8$) in FIG. 9. Therefore, the region represented by $T_{eq1}+T_{eq2}>8$ (the region above the straight line C), shown in FIG. 9, is not included in the range that fulfills the specs. In FIG. 9, the straight line A represents the proportion of the minimum film thickness required for restricting the leakage current in a low electric field. The point $L_S$ at which the straight line A intersects with the abscissa axis concerns only the SiO$_2$ layer, and indicates that the SiO$_2$ layer needs to have approximately 4 nm so as to retain charges in a case where the current is generated by holes. In a case where the current is generated by electrons, the SiO$_2$ layer needs to have 5 nm. The point $L_H$ at which the straight line A intersects with the ordinate axis concerns only the HfO$_2$ layer, and the straight line A indicates the minimum film thickness required for the stacked structure of the SiO$_2$ layer and the HfO$_2$ layer to retain charges.

As can be seen from FIG. 9, any film formed only with a HfO$_2$ layer is not included in the region that fulfills the specs. This implies that the tunnel insulating film cannot be formed only with a HfO$_2$ layer. This is because the leakage current cannot be made high in a high electric field. The minimum thickness of the SiO$_2$ layer required to fulfill the specs of the leakage current in a high electric field is represented by the straight line B and the straight line B'. The straight line B' represents the minimum layer thickness of the SiO$_2$ layer required in the tunnel insulating film in a case where an assist level is not formed in the HfO$_2$ layer. The layer thickness is 2.0 nm. Even if there is not an assist level in the tunnel insulating film having the stacked structure formed with a SiO$_2$ layer and a HfO$_2$ layer, a thinner tunnel insulating film than a 4.0-nm thick single-layer SiO$_2$ layer can be formed, as long as the layer thickness of the SiO$_2$ layer is equal to or greater than 2.0 nm. In this case, the EOT of the entire tunnel insulating film can be made as small as 2.6 nm (indicated by the point at which the straight line A intersects with the straight line B').

An assist level is then formed by adding Ru to the HfO$_2$ layer, so that the thickness of the SiO$_2$ layer can be reduced to 1.1 nm. The SiO$_2$ layer is then combined with the HfO$_2$ layer, so as to form a very thin tunnel insulating film having an EOT of 1.8 nm, which is smaller than the film thickness, 2.0 nm, of the SiO$_2$ layer of a structure without an assist level. The reasons that the SiO$_2$ layer cannot be made thinner when there is not an assist level are as follows. When there is a high electric field, the leakage current should be high. Therefore, the upper end $E_v$ of the valence band of the HfO$_2$ layer should become sufficiently high, and the hole barrier height should become lower, so as to facilitate hole tunneling. However, if the film thickness $T_{eq1}$ of the SiO$_2$ layer is reduced while the electric field $E_{ox}$ ($=V_1/T_{eq1}$) remains the same, the voltage $V_1$ to be applied to the SiO$_2$ layer becomes lower, and the upper end $E_v$ of the valence band of the HfO$_2$ layer does not become sufficiently high. As a result, the leakage current cannot be made higher. In a case where there is an assist level in the HfO$_2$ layer, on the other hand, the hole tunneling probability becomes higher by virtue of the assist level, even if the upper end $E_v$ of the valence band of the HfO$_2$ layer does not become sufficiently high. Accordingly, in a stacked structure that includes a HfO$_2$ layer having an assist level, the SiO$_2$ layer can be made thinner than the SiO$_2$ layer in a structure without an assist level, and the EOT of the entire tunnel insulating film can be reduced to as small as 1.8 nm (indicated by the point at which the straight line A intersects with the straight line B).

Figure 10:
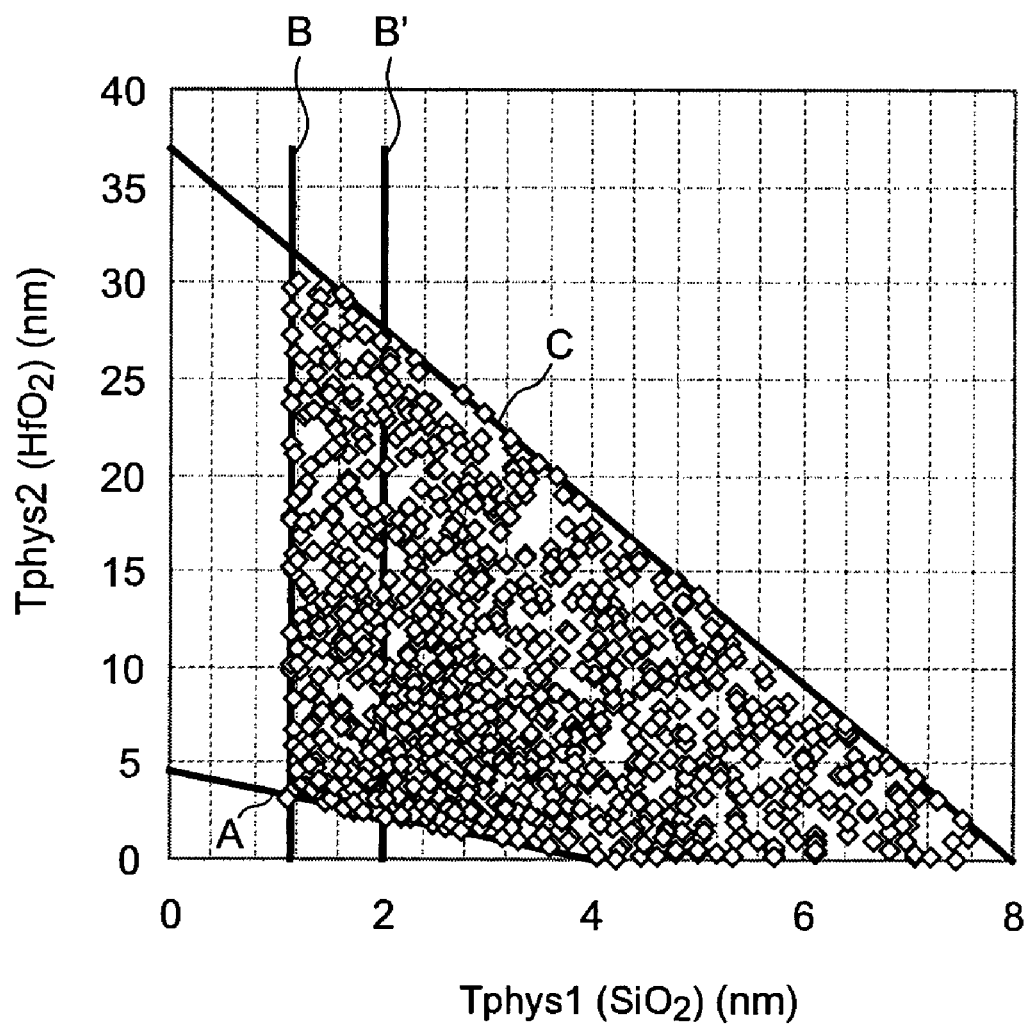
FIG. 10 is a diagram showing the ranges of the physical layer thicknesses of the SiO$_2$ layer and the HfO$_2$ layer forming the tunnel insulating film according to the first embodiment.
Figure 11:
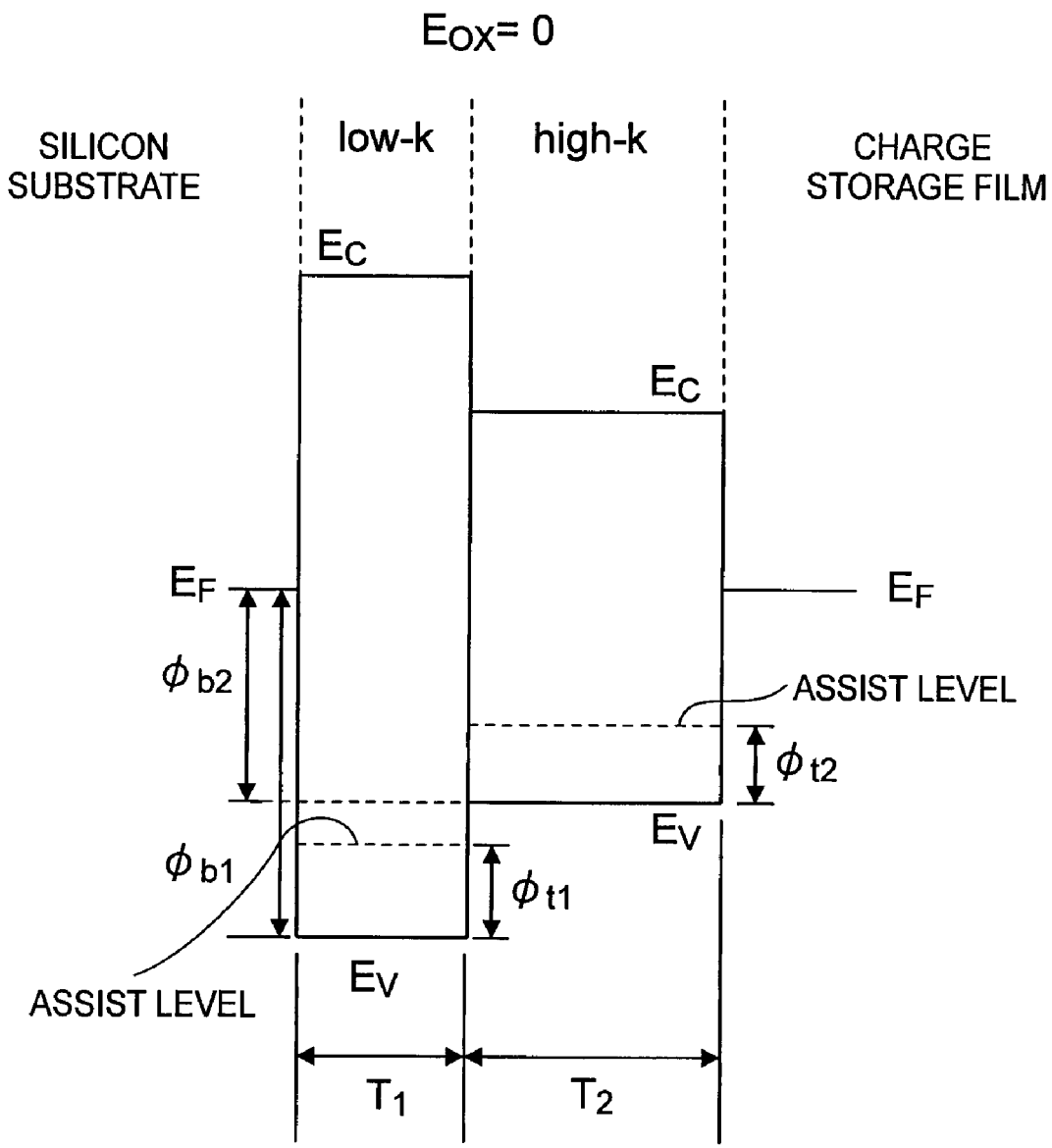
FIG. 11 is an energy band diagram obtained in a case where no electric field is applied in the tunnel insulating film of the first embodiment.

FIG. 10 shows the physical layer thickness converted from the data shown in FIG. 9. Although the abscissa axis $T_{phys1}$ (SiO$_2$) indicates the same values as the abscissa axis of FIG. 9, the ordinate axis $T_{phys2}$(HfO$_2$) is scaled according to the ratio between the dielectric constants of the HfO$_2$ layer and the SiO$_2$ layer. Accordingly, the physical layer thickness of the SiO$_2$ layer required in the stacked structure is the same as the thickness shown in FIG. 9. In a case where there is not an assist level, the required physical layer thickness of the SiO$_2$ layer is 1.8 nm. In a case where there is an assist level, the required physical layer thickness of the SiO$_2$ layer is 0.9 nm. The physical layer thickness of the HfO$_2$ layer is in the range of 3 nm to 28 nm. Since a ZrO$_2$ layer has the same characteristics as a HfO$_2$ layer, a ZrO$_2$ layer may be used in place of the HfO$_2$ layer.

Second Embodiment

Next, a nonvolatile semiconductor memory apparatus in accordance with a second embodiment is described. In the nonvolatile semiconductor memory apparatus of the first embodiment, the tunnel insulating film has an assist level formed only in the high-k layer. In the nonvolatile semiconductor memory apparatus of this embodiment, on the other hand, an assist level is formed not only in the high-k layer but also in the low-k layer of the tunnel insulating film. Other than the tunnel insulating film, the nonvolatile semiconductor memory apparatus of the second embodiment has the same structure as the nonvolatile semiconductor memory apparatus of the first embodiment.

Figure 12:
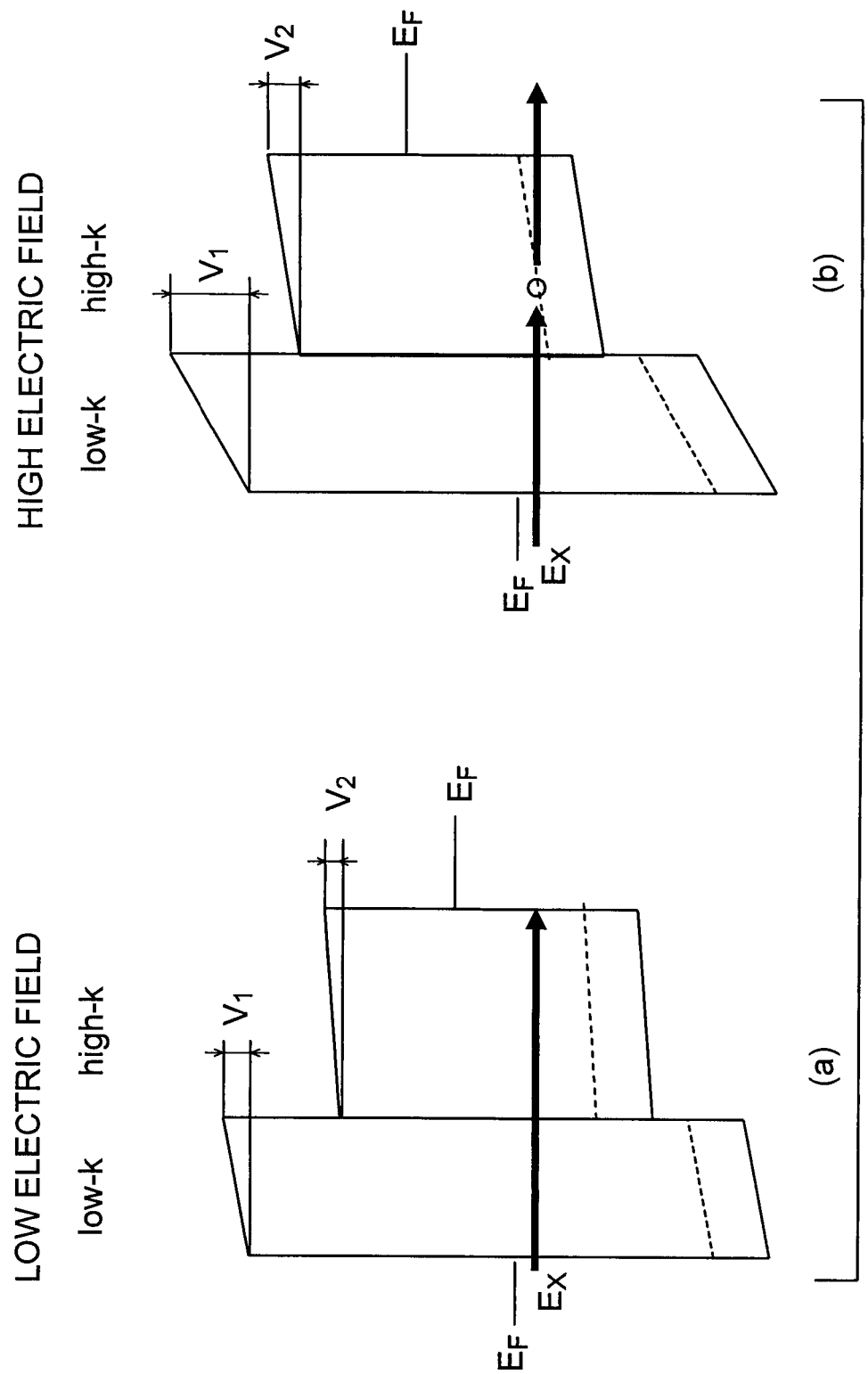
FIGS. 12(a) and 12(b) are energy band diagrams of a low electric field (a charge retaining state) and a high electric field (an erasing state) in the tunnel insulating film in accordance with the first embodiment.

As shown in FIGS. 12(a) and 12(b), the energy band diagrams of the tunnel insulating film of this embodiment when the electric field $E_{ox}$ is 0 are the same as the energy band diagram shown in FIG. 3, except that an assist level $\phi_{t1}$ is formed in the low-k layer. Likewise, as shown in FIGS. 12(a) and 12(b), the respective energy band diagrams obtained in a case where a low electric field is applied in the tunnel insulating film of this embodiment and in a case where a high electric field is applied in the tunnel insulating film of this embodiment are the same as the energy band diagrams shown in FIGS. 4(a) and 4(b), except that an assist level $\phi_{t1}$ is formed in the low-k layer. Since the assist level in the low-k layer does not contribute to the leakage current in those cases, the leakage current does not vary whether or not the low-k layer has an assist level, as shown in FIGS. 12(a) and 12(b). In other words, the write efficiency does not vary. If the assist level in the low-k layer contributes to the leakage current, the write efficiency becomes higher, but the charge retention properties might deteriorate or might be maintained, depending on the conditions.

As described above, in this embodiment, it is possible to form a tunnel insulating film that has a very small EOT fulfilling the required specs, even if there is an assist level formed in each of the low-k layer and the high-k layer of the tunnel insulating film. Accordingly, this embodiment can provide a nonvolatile semiconductor memory apparatus that includes a tunnel insulating film that can reduce the leakage current in a low electric field and can increase the leakage current in a high electric field, even if the EOT is reduced.

(Assist Level)

Although the assist level of 1.1 eV has been described above, the assist level may have some other value. However, the value of the effective assist level can not be any value in this invention. To achieve the above described effects of this embodiment, it is preferable that the value of the assist level falls within the range described below.

Figure 13A:
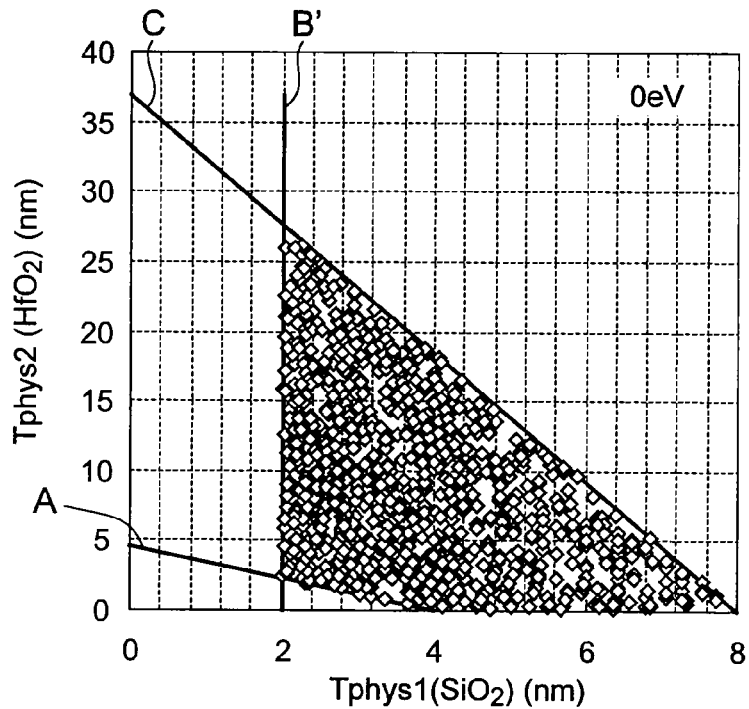
FIGS. 13A to 13P are diagrams showing the ranges of the physical film thicknesses of a SiO$_2$ layer and a HfO$_2$ layer in a tunnel insulating film.
Figure 13B:
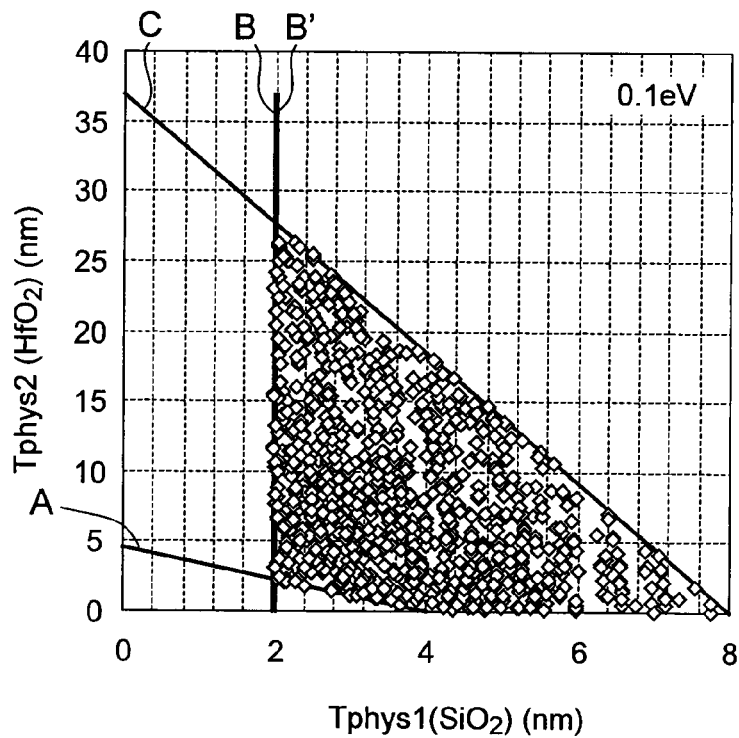
Figure 13C:
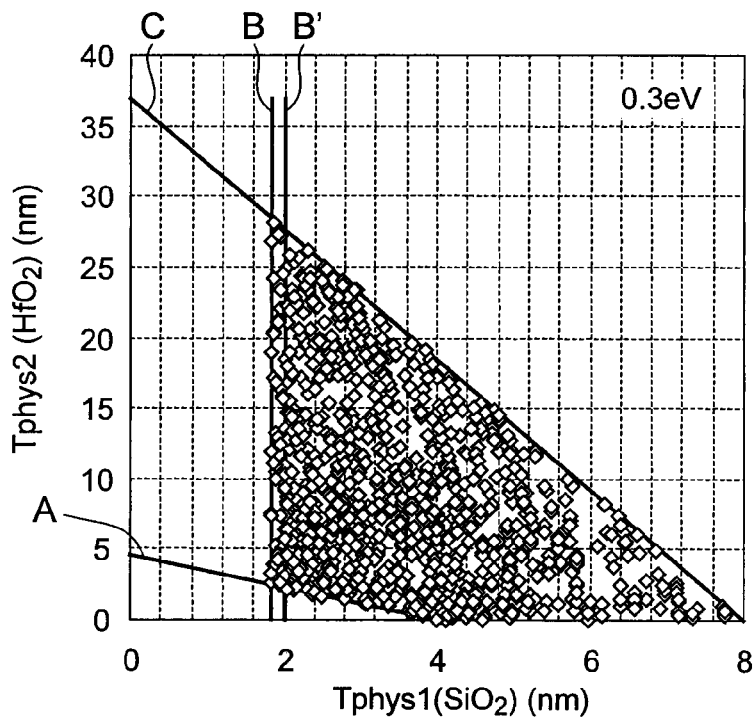
Figure 13D:
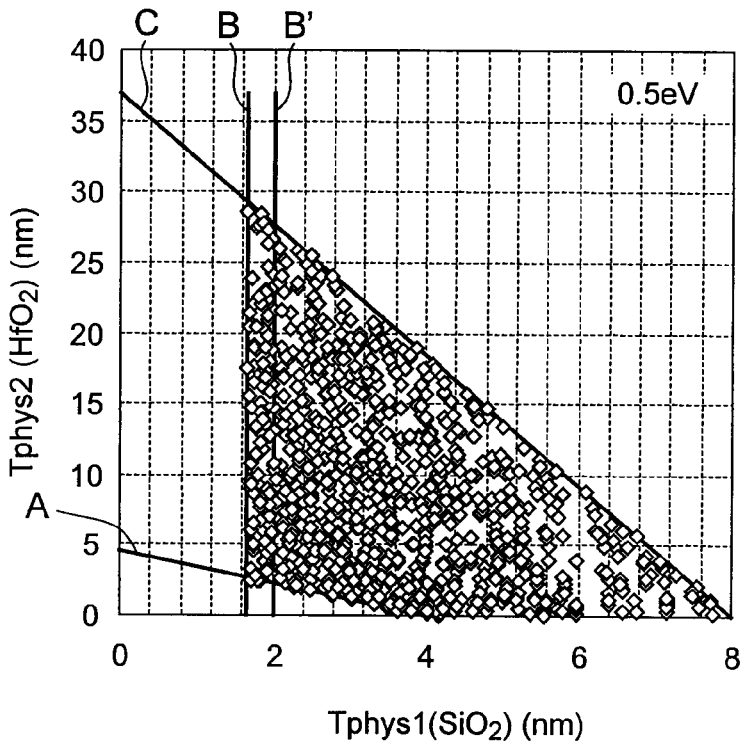
Figure 13E:
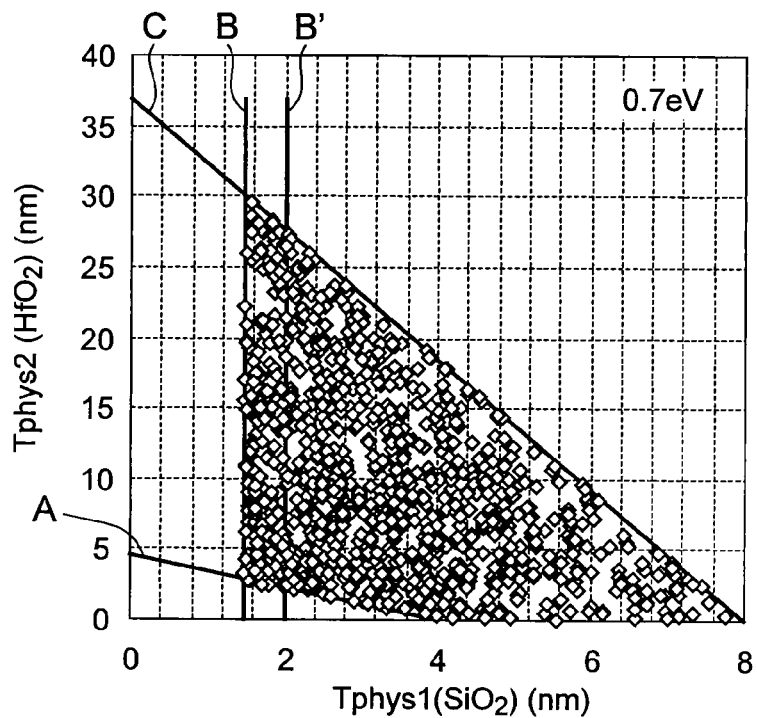
Figure 13F:
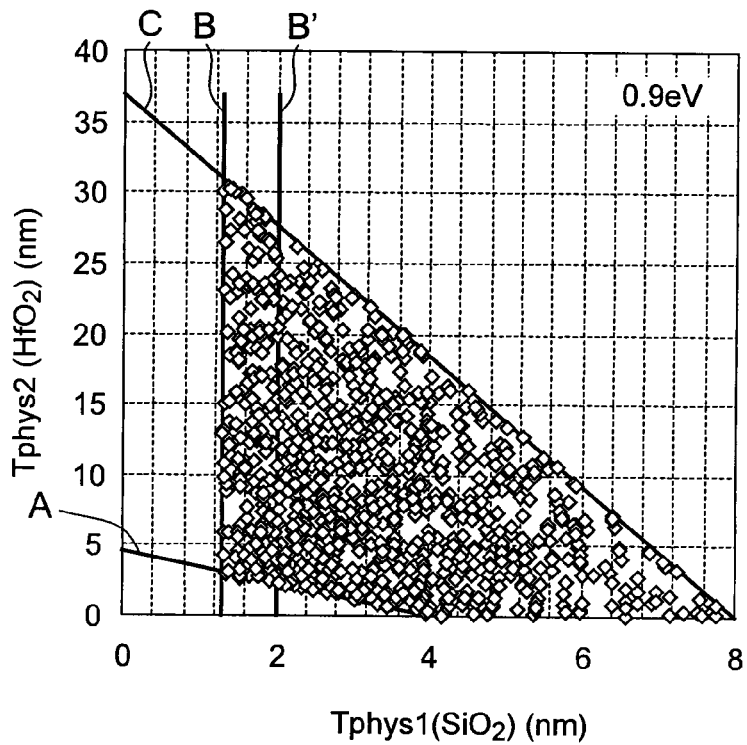
Figure 13G:
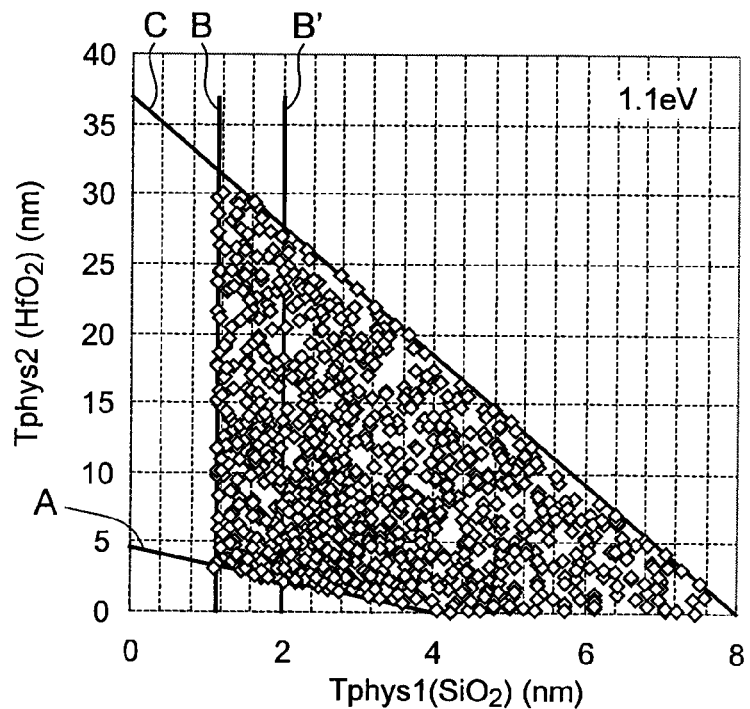
Figure 13H:
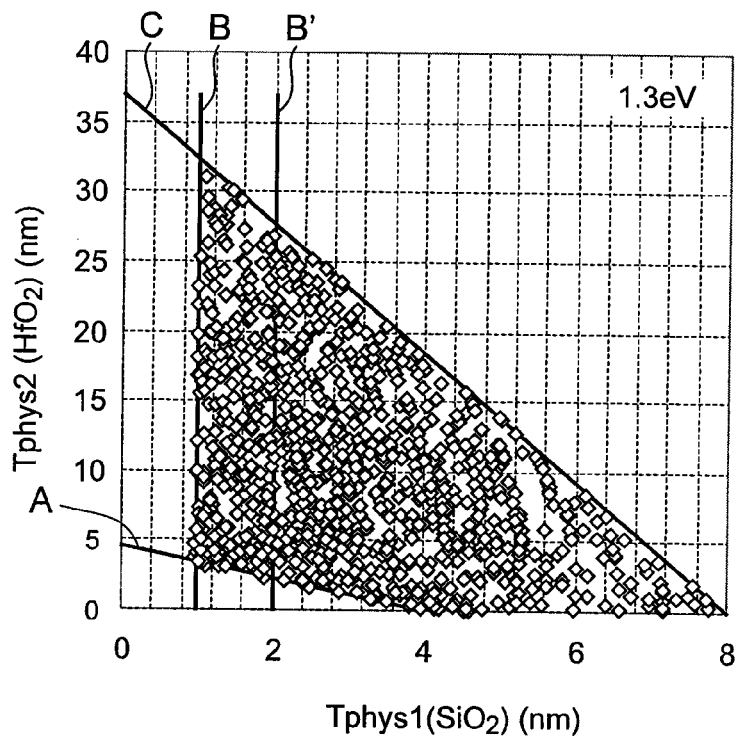
Figure 13I:
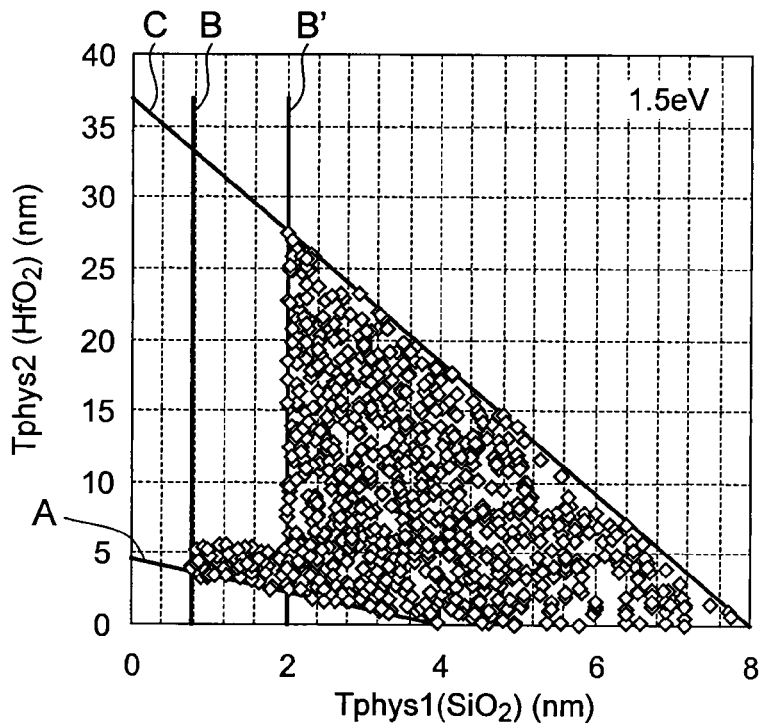
Figure 13J:
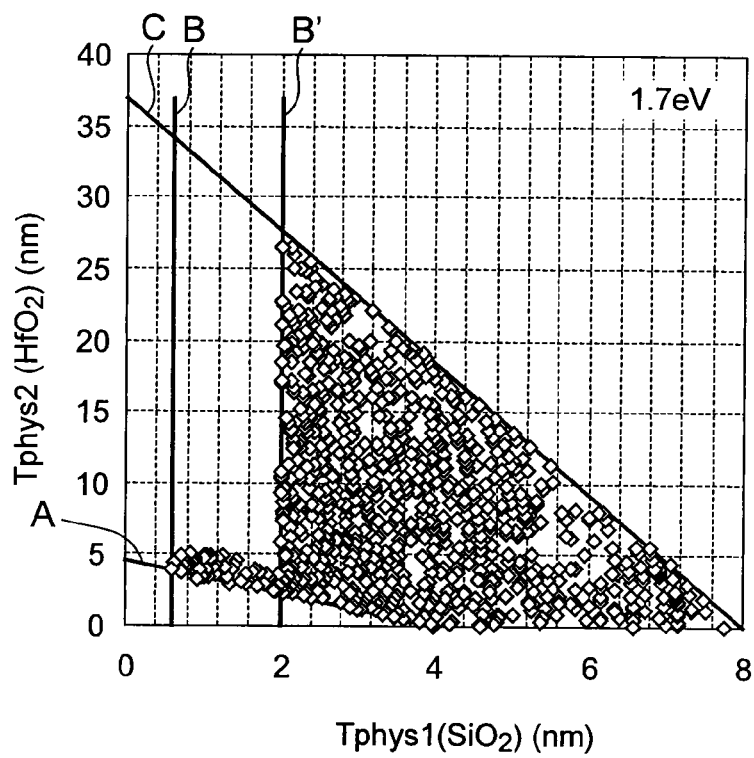
Figure 13K:
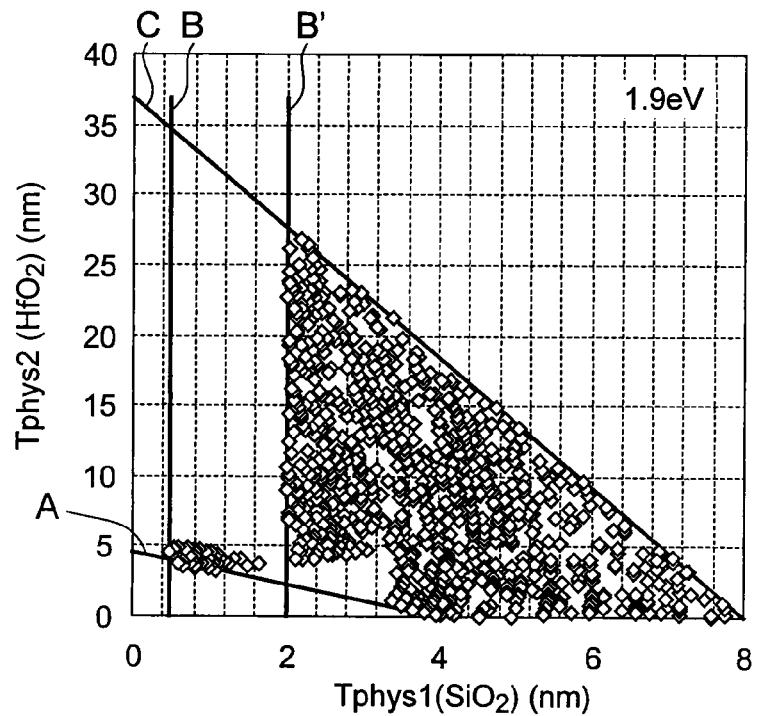
Figure 13L:
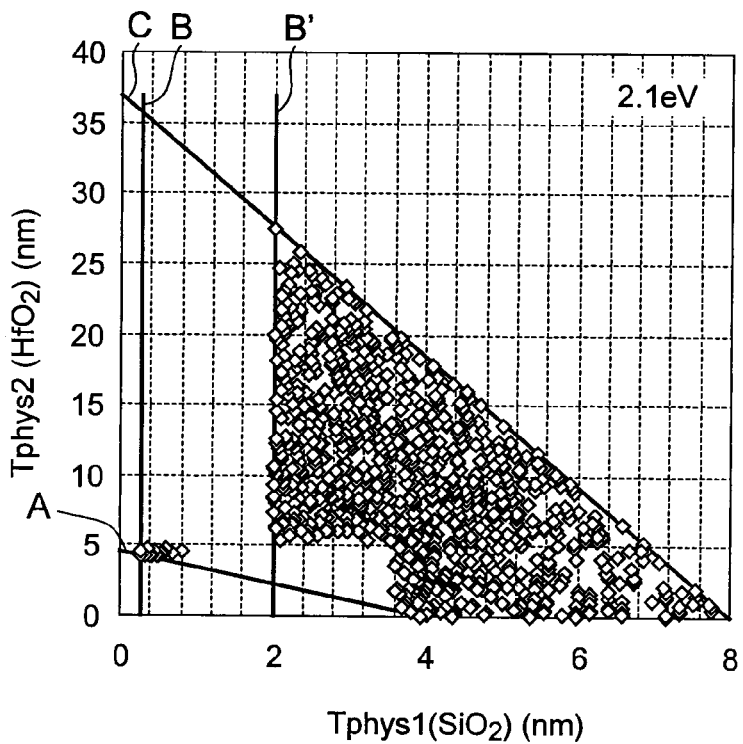
Figure 13M:
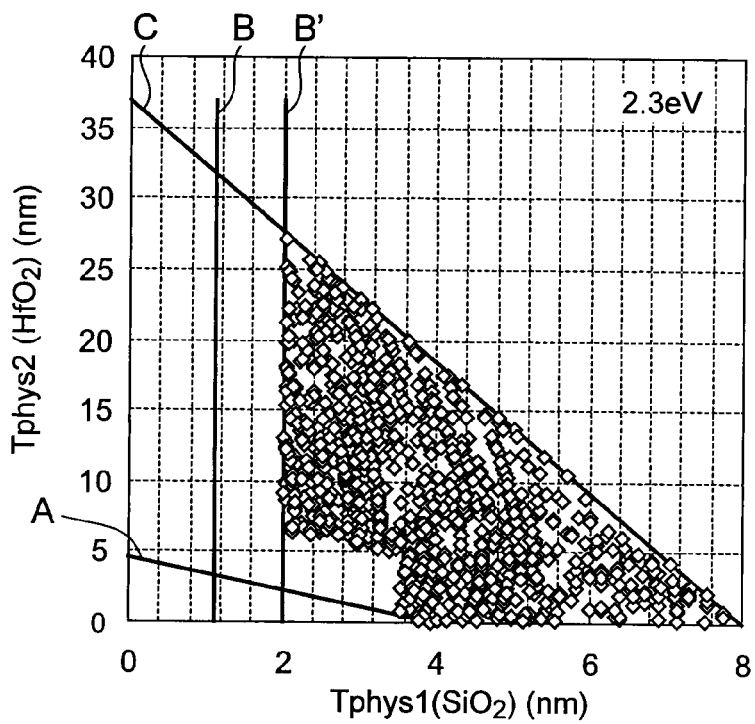
Figure 13N:
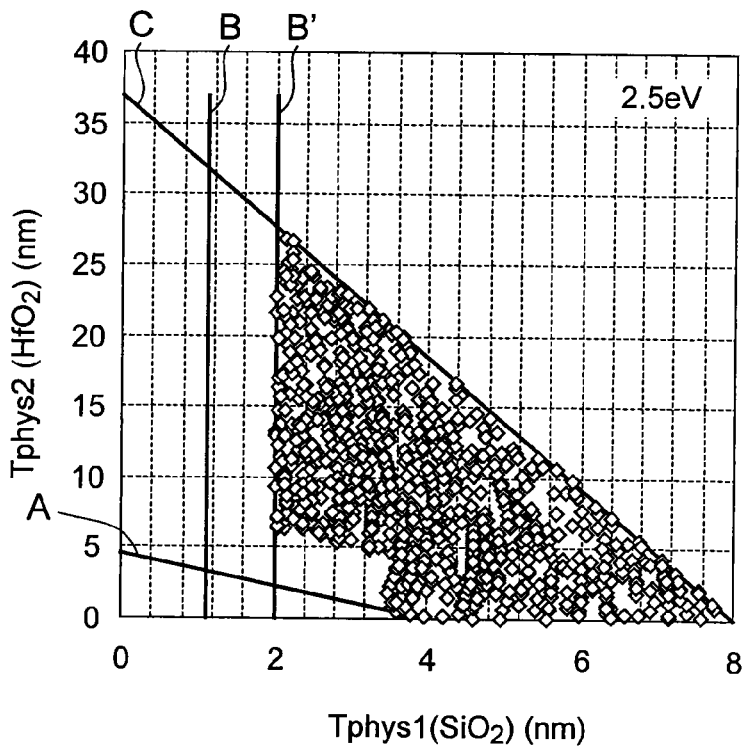
Figure 13O:
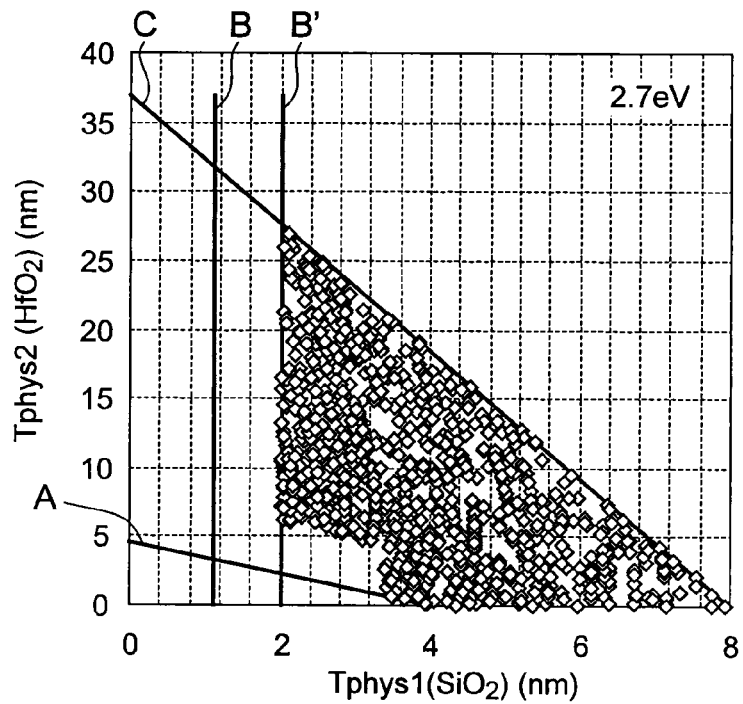
Figure 13P:
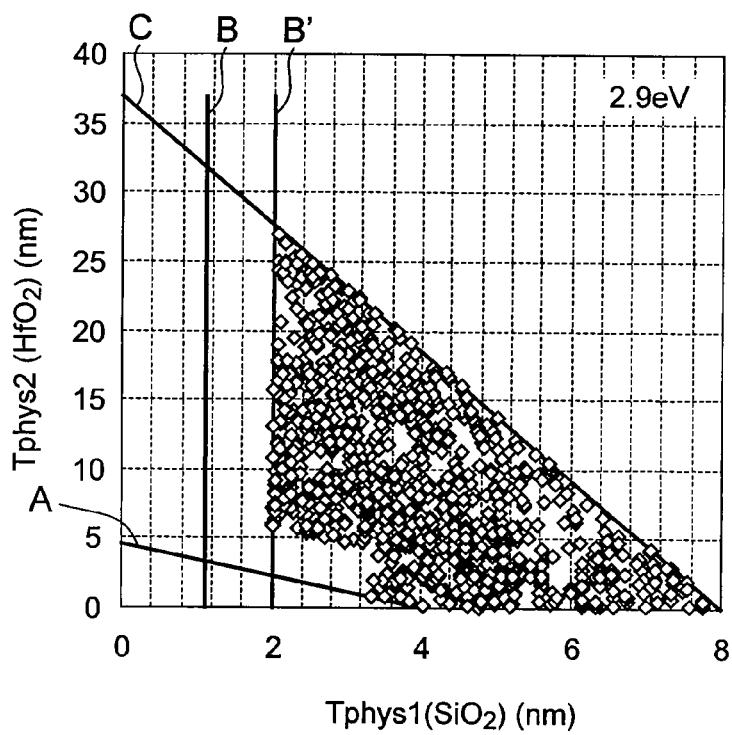
Figure 14:
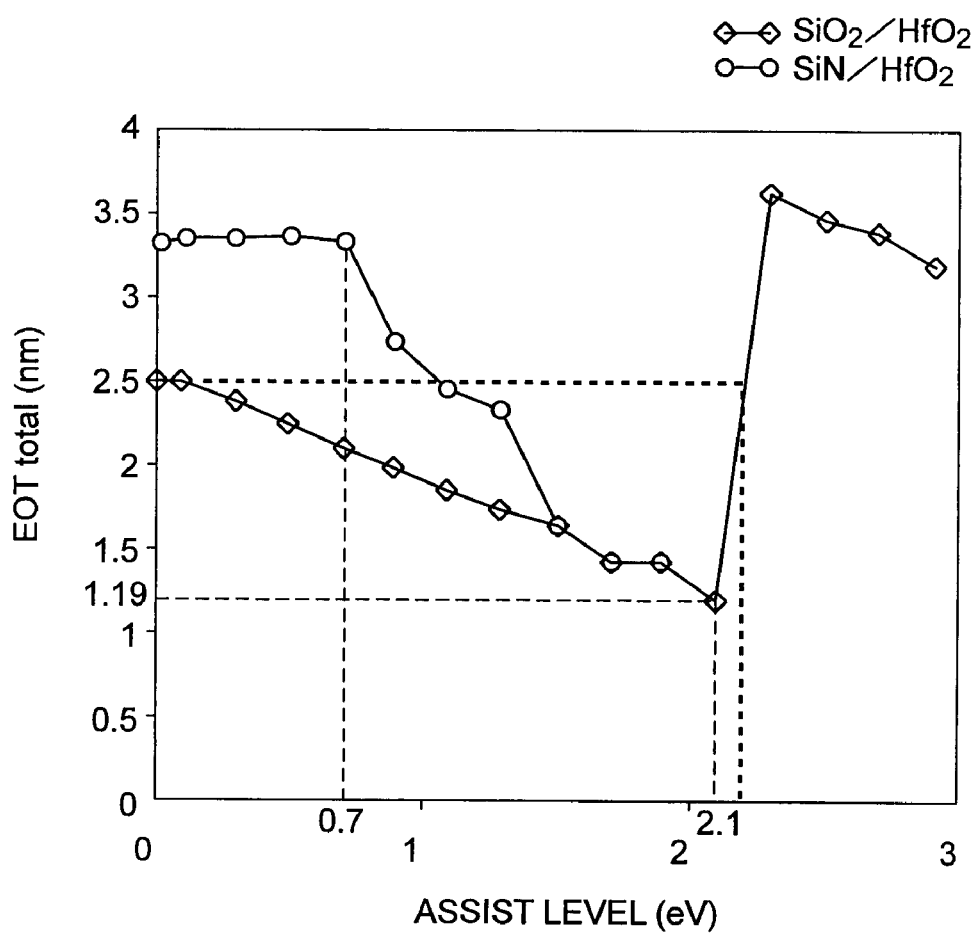
FIG. 14 is a diagram showing the assist level dependency of the EOT of the tunnel insulating film.

FIGS. 13A to 13P show the ranges of the physical film thicknesses $T_{phys}$ of the HfO$_2$ layer and the SiO$_2$ layer that fulfill the specs defined in an embodiment of the present invention. In this tunnel insulating film, the HfO$_2$ layer and the SiO$_2$ layer forming the stacked structure have various assist levels. Particularly, the range of the physical film thickness of the SiO$_2$ layer greatly varies with the assist level. FIGS. 13A to 13P illustrate cases where the assist level in the HfO$_2$ layer is 0 eV, 0.1 eV, 0.3 eV, 0.5 eV, 0.7 eV, 0.9 eV, 1.1 eV, 1.3 eV, 1.5 eV, 1.7 eV, 1.9 eV, 2.1 eV, 2.3 eV, 2.5 eV, 2.7 eV, and 2.9 eV. FIG. 14 shows the relationship between the assist level and the EOT of the tunnel insulating film. When the assist level is 0 eV, there is not an assist level, and the minimum EOT is 2.5 nm, as described above. As can be seen from FIG. 14, the EOT of the tunnel insulating film can be made smaller compared with the tunnel insulating film without an assist level, as the assist level becomes deeper from upper end of the valence band. When the assist level is 2.1 eV, the EOT becomes the smallest, and the EOT becomes approximately 1.19 nm. When the assist level becomes deeper than that, the EOT becomes rapidly greater. For example, when the assist level is 2.3 eV, the EOT is 3.6 nm, which is greater than the EOT of the tunnel insulating film without an assist level. This is because, when the assist level in the HfO$_2$ layer is deep, the leakage current generated through the assist level becomes dominant even in a low electric field $E_{ox}$ in the HfO$_2$ layer having a small layer thickness. As a result, the specs in a low electric field are not fulfilled. Therefore, it is preferable that the assist level is greater than 0 eV but is smaller than 2.2 eV. It has also become apparent that the optimum defect form is the one having Hf replaced with Ru in HfO$_2$. In the case where there is an assist level, the layer thickness of the low-k layer (the value of the point at which the straight line B intersects with the abscissa axis) can be made smaller than the layer thickness (the value of the point at which the straight line B' intersects with the abscissa axis) of the low-k layer required in a case where there is not an assist level (see FIGS. 13F to 13I). In the above description, the low-k layer is the SiO$_2$ layer, and the high-k layer is the HfO$_2$ layer. However, the same effects as above can be achieved in a case where the low-k layer is a silicon oxide layer and the high-k layer is a hafnia (HfO) layer, as long as the assist levels are within the above described ranges.

FIG. 14 also shows a case of a tunnel insulating film having a stacked structure formed with a HfO$_2$ layer and a silicon nitride (SiN) layer. In the case where the SiO$_2$ layer is replaced with a SiN layer, it is preferable that the assist level is greater than 0.7 eV but is smaller than 2.2 eV, as can be seen from FIG. 14. Accordingly, it is safe to say that either a SiO$_2$ layer or a SiN layer may be used as the low-k layer to be combined with the high-k layer to form a stacked structure, though the SiO$_2$ layer and the SiN layer have different preferred assist level ranges. Further, the low-k layer may be a SiON layer that has characteristics that fall between a SiO$_2$ layer and a SiN layer, or may have a stacked structure formed with three or more layers, such as a stacked structure formed with a SiO$_2$ layer, SiN layer, and a SiO$_2$ layer. As long as Si, O, and N are the principal elements, the low-k layer of an embodiment of the present invention can be formed, even if the low-k layer contains some other element.

Figure 49:
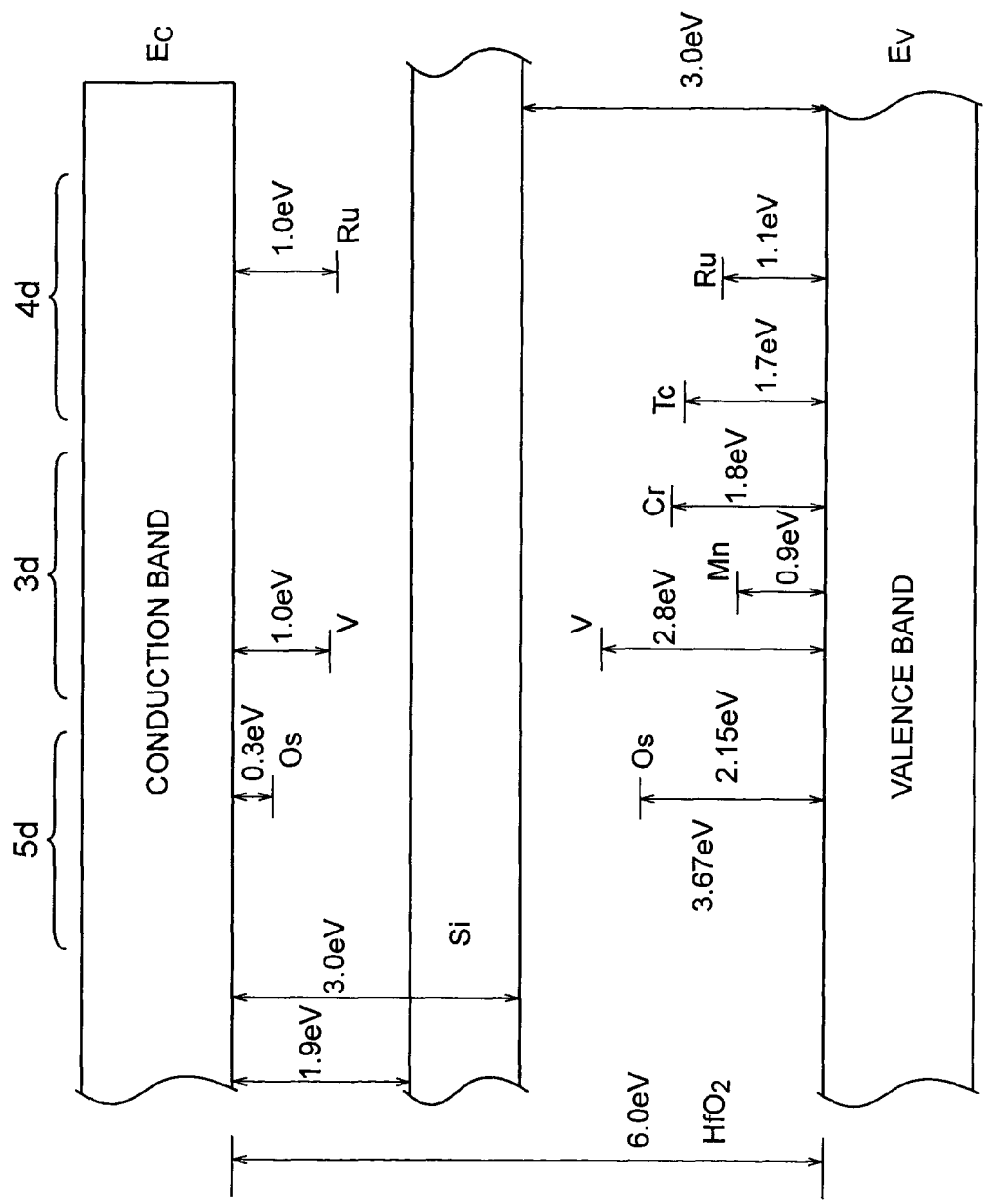
FIG. 49 is a diagram showing the hole assist levels formed with the elements added to a tunnel insulating film.

Although Ru is added so as to form an assist level in the above described example, it is possible to form an assist level with an element other than Ru, such as Cr, Mn, V, Tc, or Os. Accordingly, a different assist level from the assist level of 1.1 eV of the first embodiment can be formed. FIG. 49 shows the results of calculations performed to determine the assist levels to be formed with the respective elements that can be added to a HfO$_2$ layer in a case where the low-k layer of the tunnel insulating film is a SiO$_2$ layer and the high-k layer is a HfO$_2$ layer. As can be seen from FIG. 49, to form a hole assist level, Mn (0.9 eV), Cr (1.8 eV), and V (2.8 eV) are desirable as 3d elements. Ru (1.1 eV) is desirable as a 4d element. Os (2.15 eV) is desirable as a 5d element. Here, each of the numeric values in the brackets following the respective symbols of the elements indicates the energy difference between the upper end of the valence band of HfO$_2$ and the hole assist level. Also, as can be seen from FIG. 49, by adding V, Ru, or Os to the HfO$_2$ layer, not only a desirable assist level for holes but also a desirable assist level for electrons is formed. Accordingly, V, Ru, and Os are more preferable as the elements to be added.

The desirable assist level for holes is a hole assist level existing in the range from the upper end of the valence band of the high-k material to the upper end of the valence band of the low-k material. The desirable assist level for electrons is an electron assist level existing in the range from the lower end of the conduction band of the low-k material to the lower end of the conduction band of the high-k material.

Those elements to be added can also form the preferred assist level for holes in any of the lower described high-k layers. According to the calculations performed by the inventors, in a case where an $Al_2O_3$ layer is used as the high-k layer, it is possible to use C (carbon) as well as any of the above mentioned elements as the additional element for forming the preferred assist level for holes.

(High-K Layer)

Figure 16:
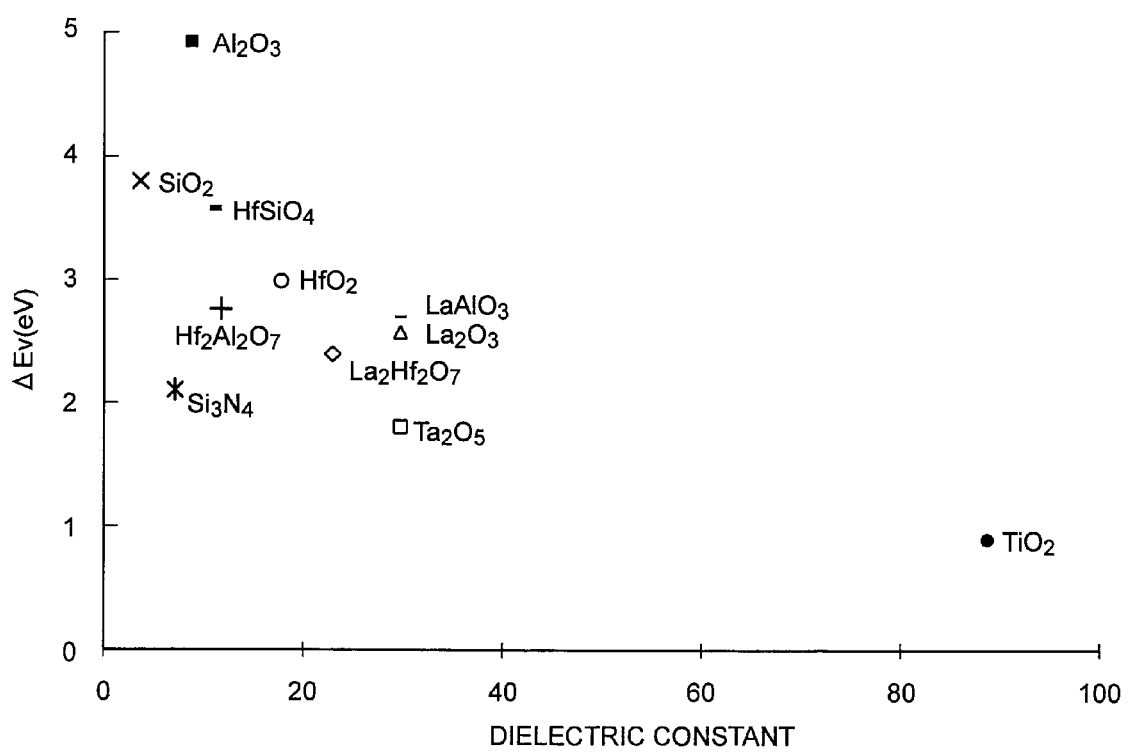
FIG. 16 is a graph showing the dielectric constants and band offsets ΔEv of various insulating films.

In the above description, the high-k layer is a $HfO_2$ layer. However, the same effects as above can be achieved with some other high-k layer. For example, each of the materials shown in the table in FIG. 15 can be used as the high-k layer (as disclosed by J. Robertson in J. Vac. Sci. Technol. B. 18, 1785 (2000), G. Yu, et al. in Appl. Phys. Lett. 81, 376 (2002), G. D. Wilk, et al. in Symp. VLSI Tech. Dig. 88 (2002), G, Seguini, et al. in Appl. Phys. Lett. 88, 202903 (2006), or A. Dimoulas, et al. in Appl. Phys. Lett. 85, 3205 (2004), for example). FIG. 16 shows the plotted relationships between the dielectric constants and the band offsets $\Delta E_v$ of those materials. Here, each of the band offsets $\Delta E_v$ is the difference between the upper end $E_v$ of the valence band of the Si substrate and the upper end $E_v$ of the valence band of the high-k layer, and is equivalent to the hole barrier height in a tunnel insulating film.

$Al_2O_3$ Layer

Figure 17A:
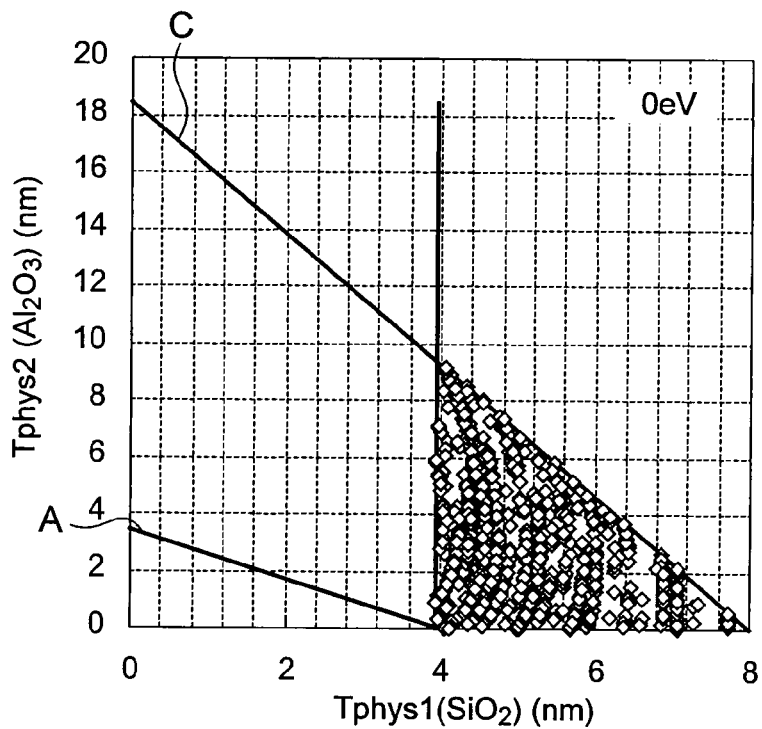
FIGS. 17A to 17Z are diagrams showing the ranges of the physical film thicknesses of a SiO$_2$ layer and an Al$_2$O$_3$ layer in a tunnel insulating film.
Figure 17B:
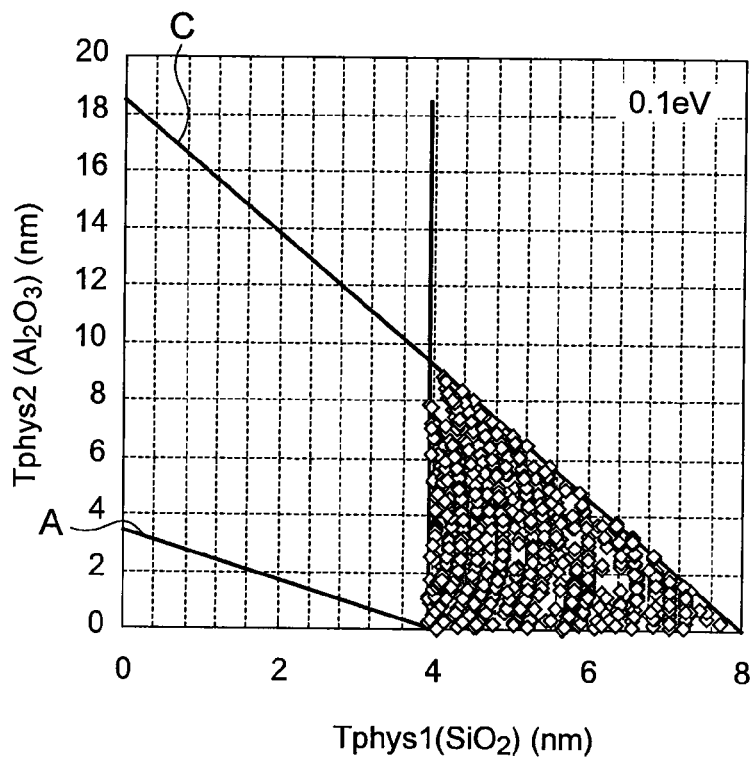
Figure 17C:
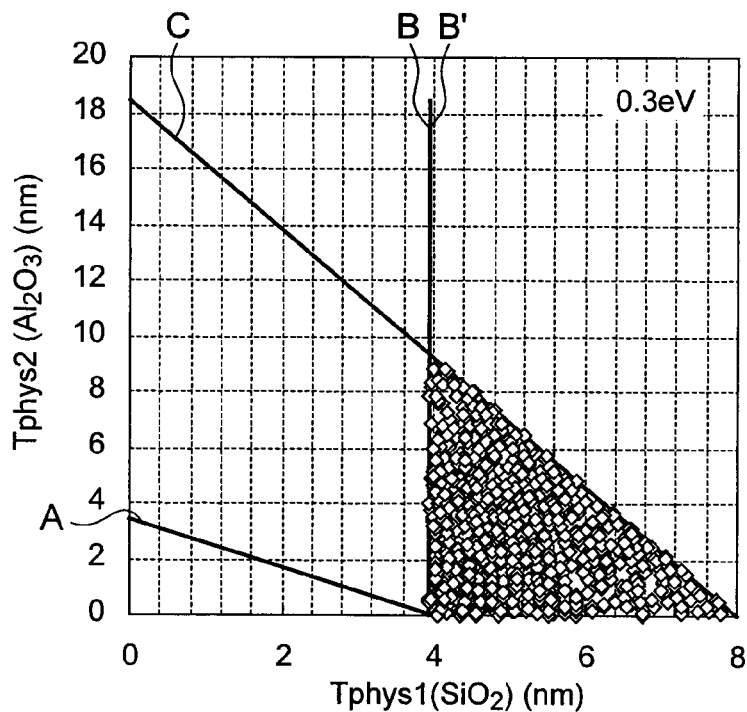
Figure 17D:
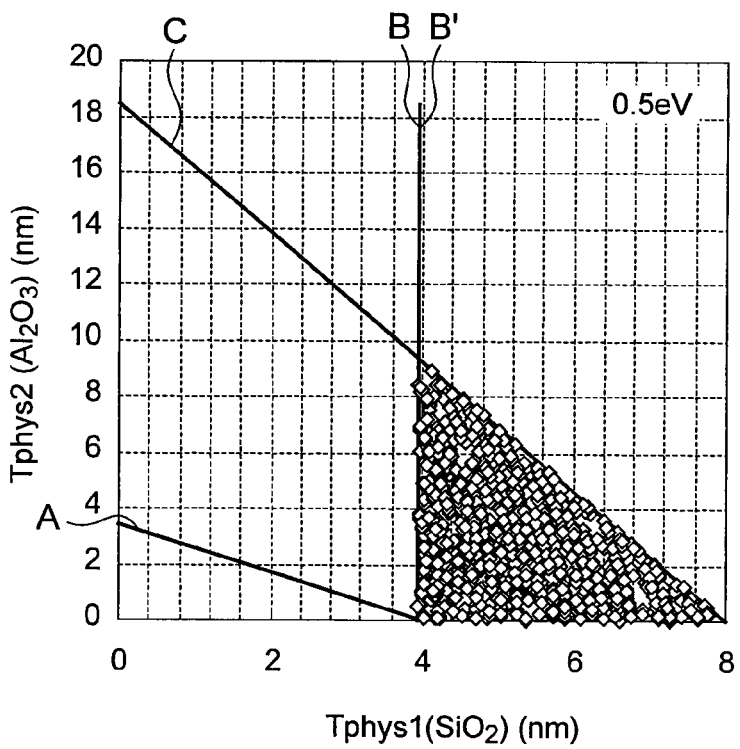
Figure 17E:
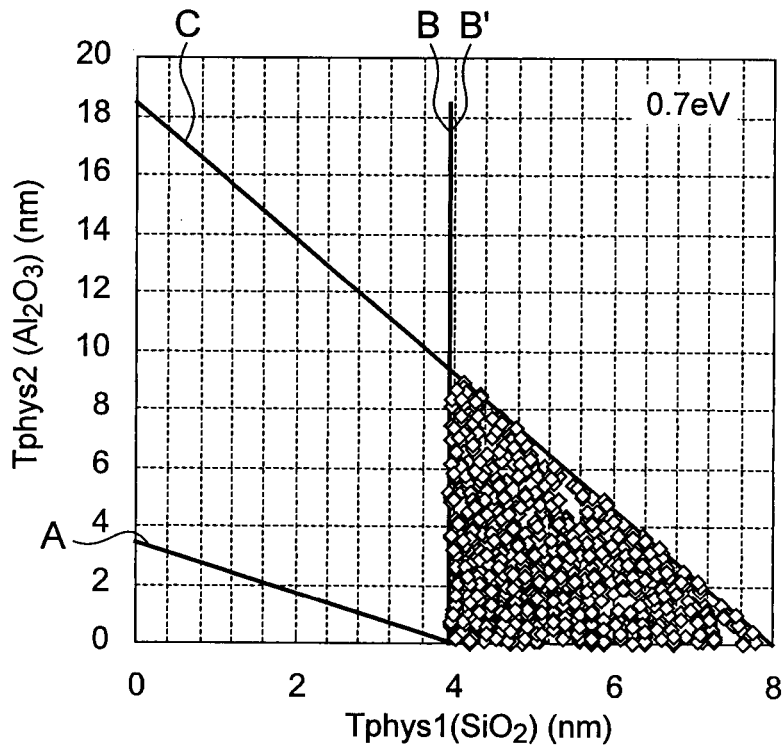
Figure 17F:
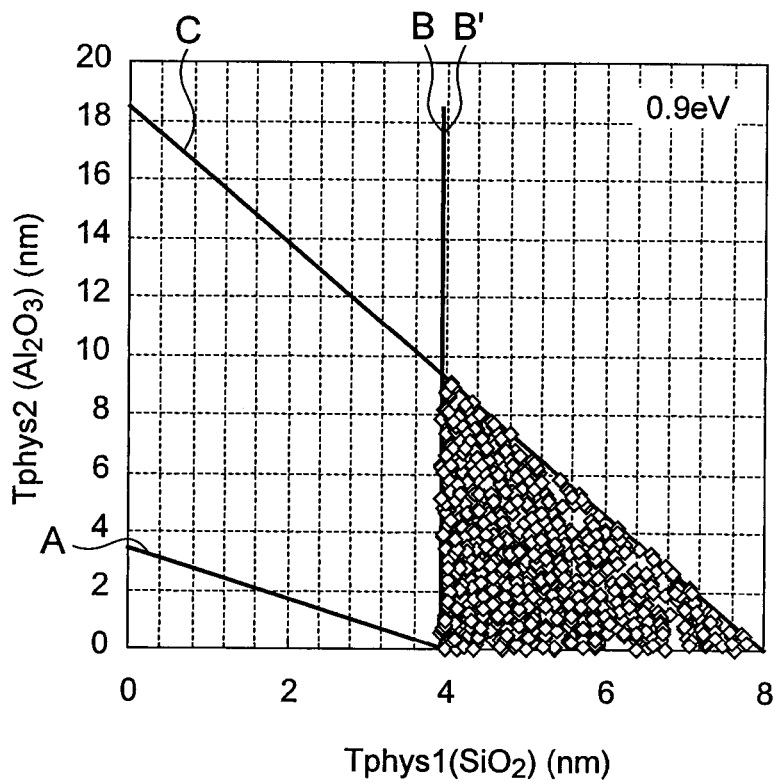
Figure 17G:
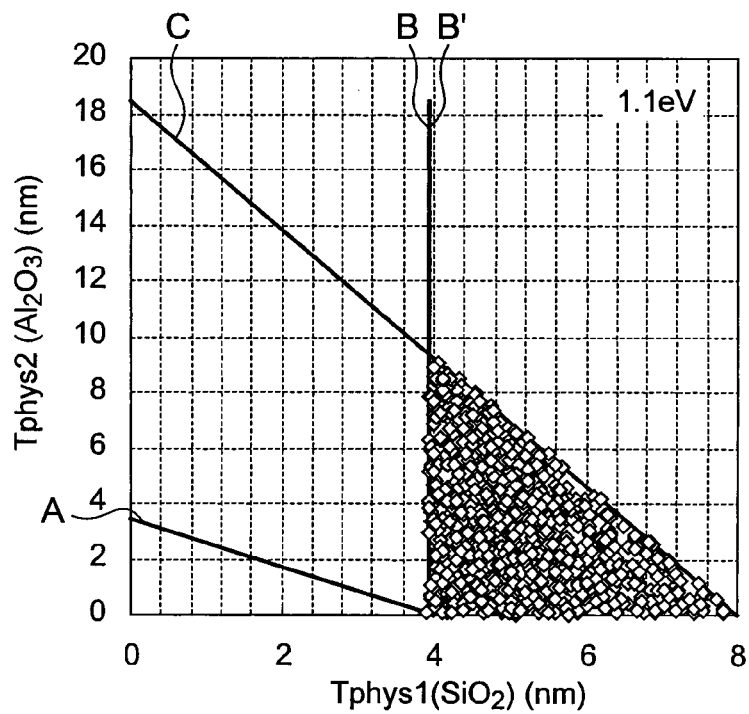
Figure 17H:
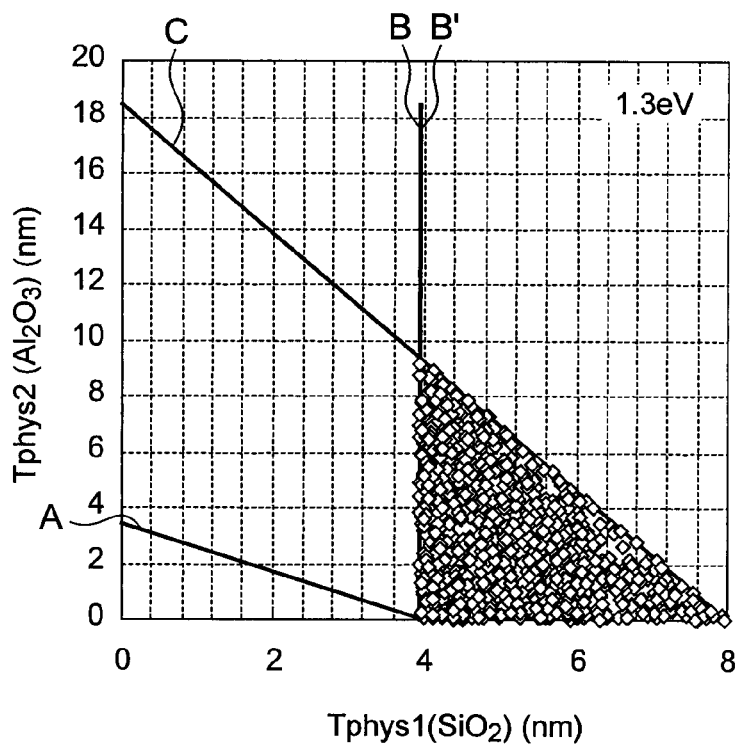
Figure 17I:
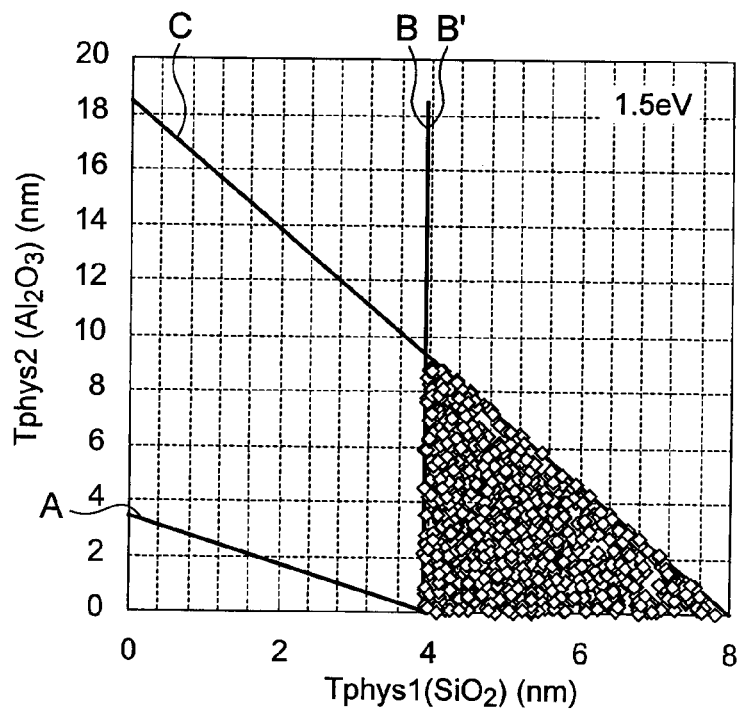
Figure 17J:
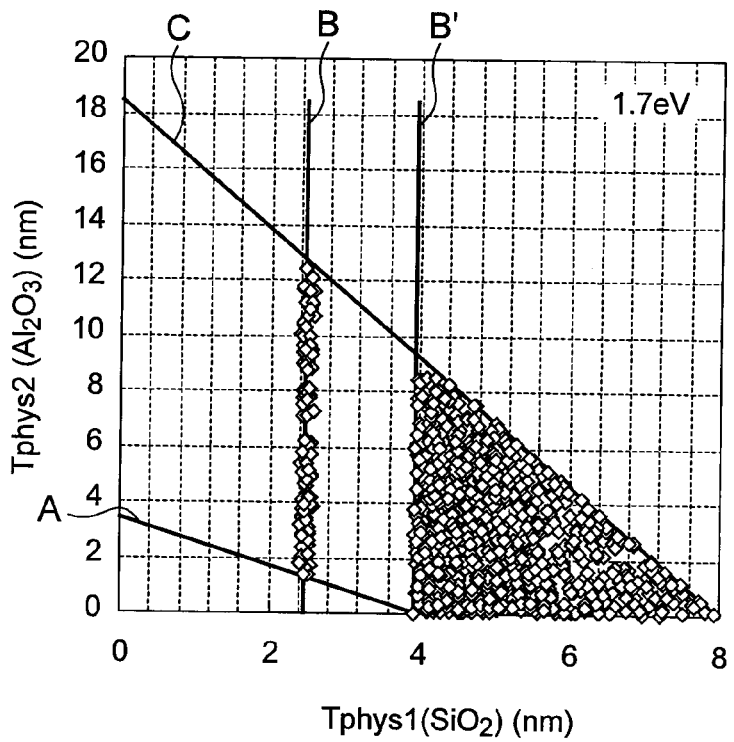
Figure 17K:
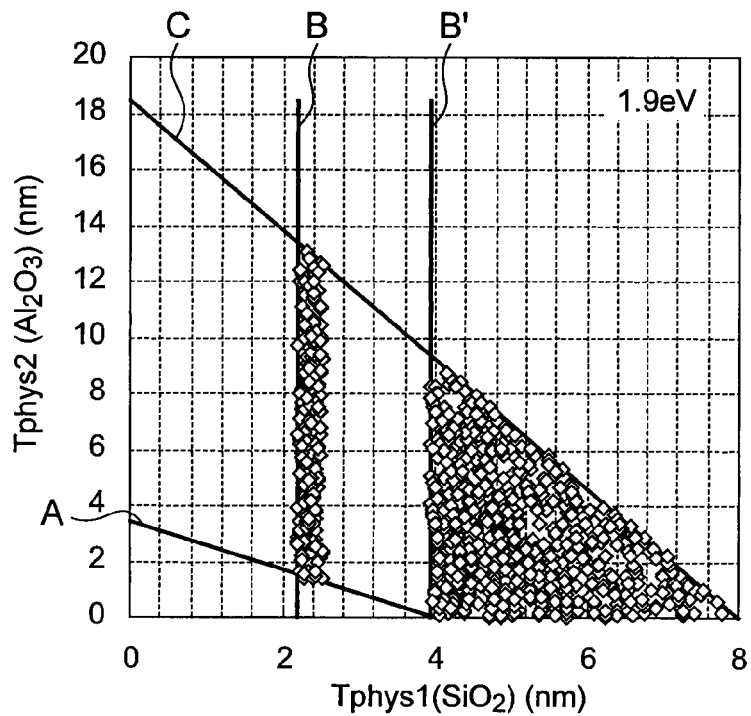
Figure 17L:
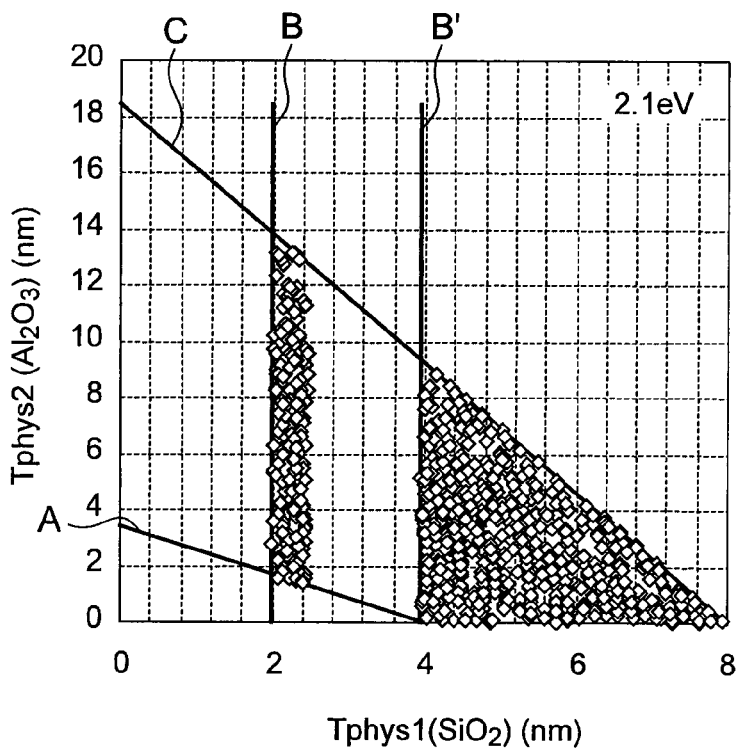
Figure 17M:
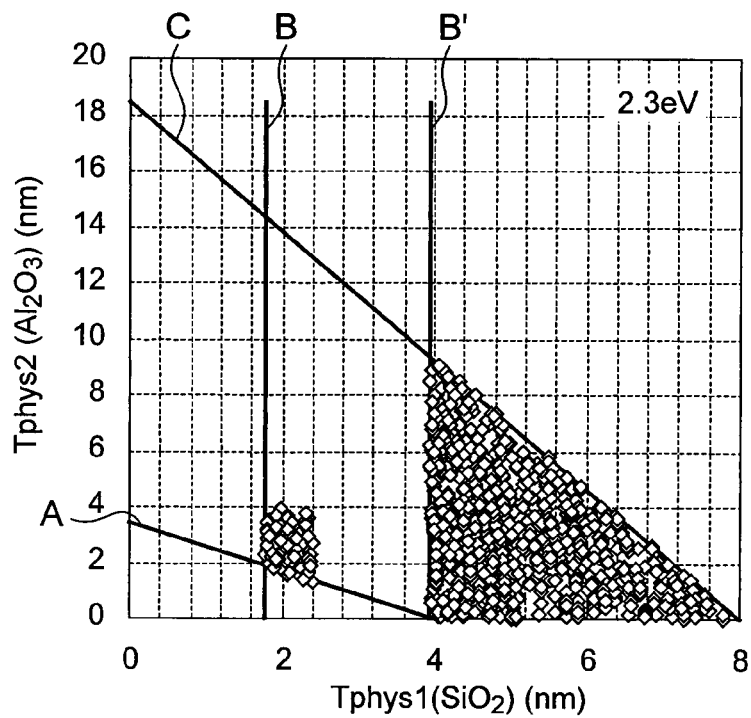
Figure 17N:
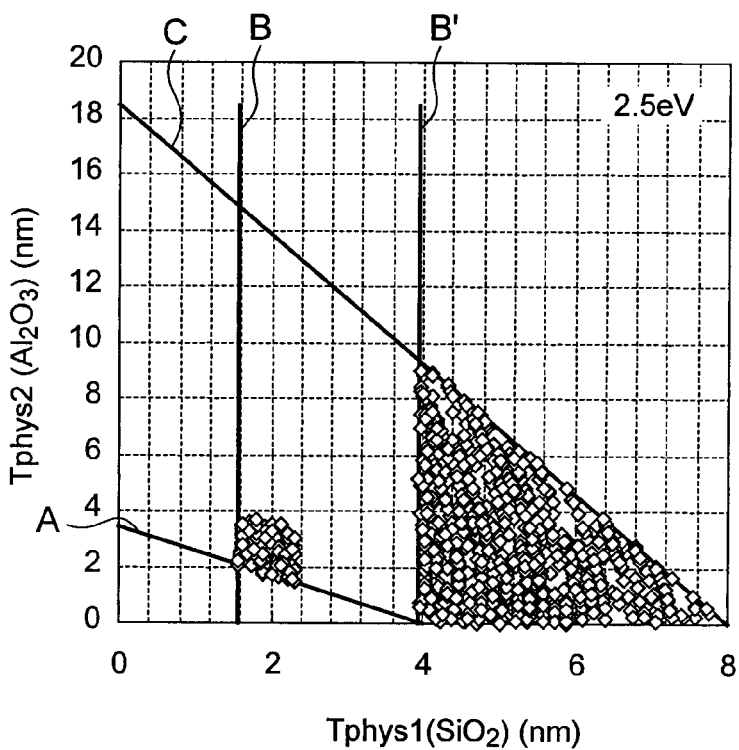
Figure 17O:
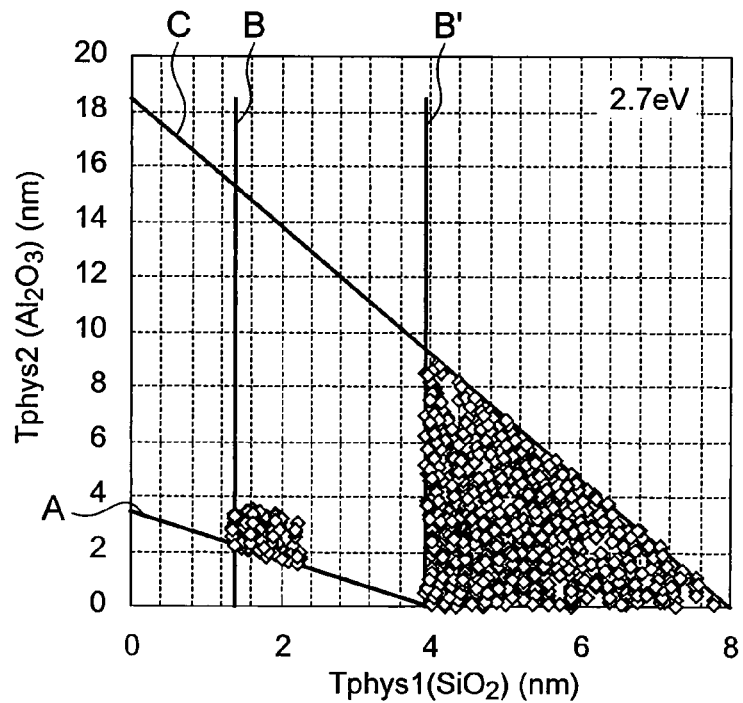
Figure 17P:
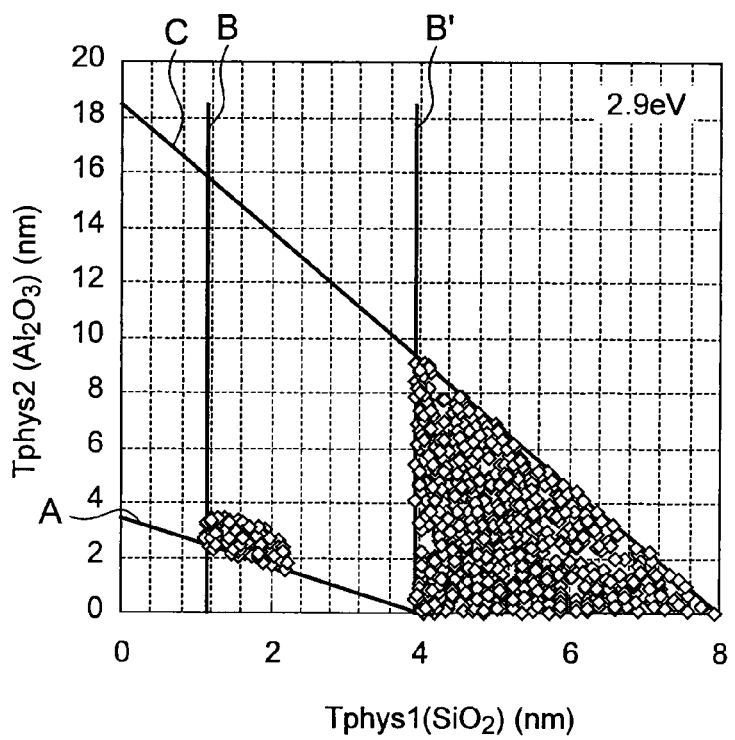
Figure 17Q:
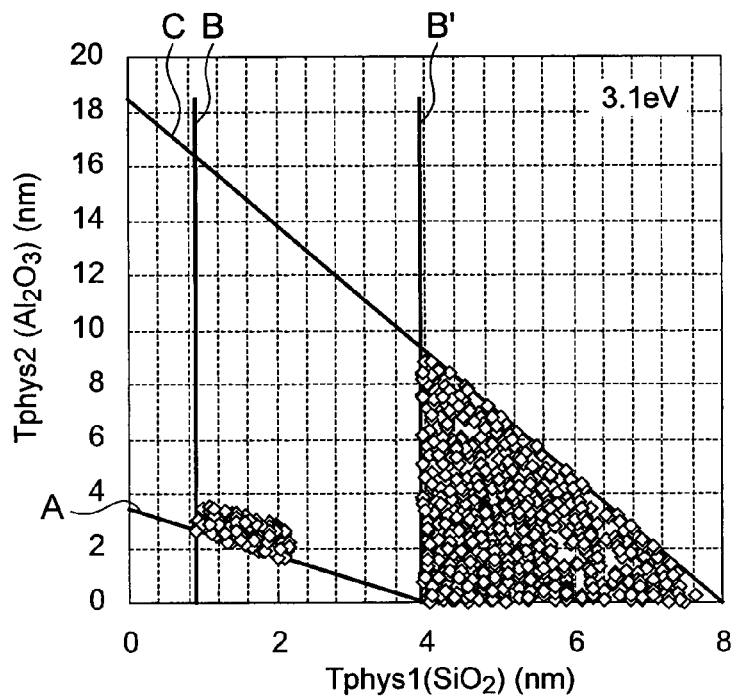
Figure 17R:
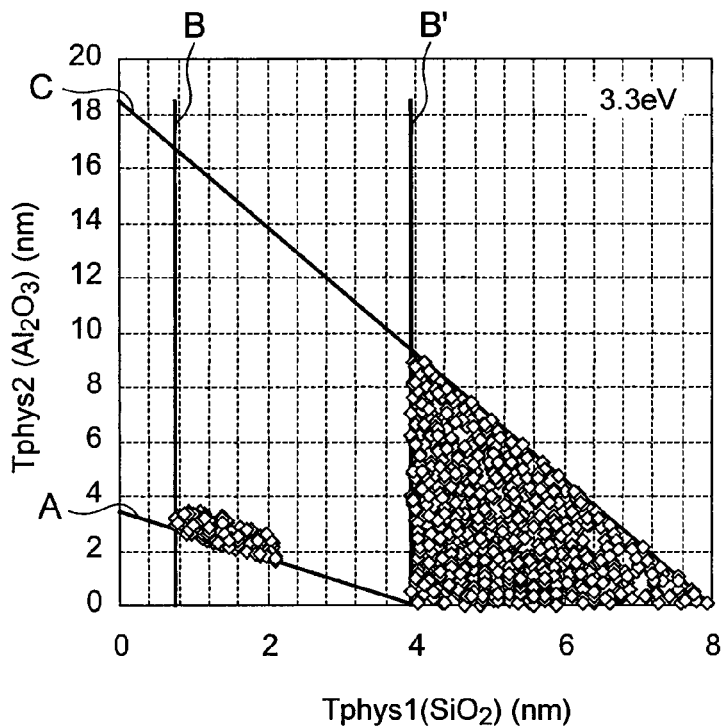
Figure 17S:
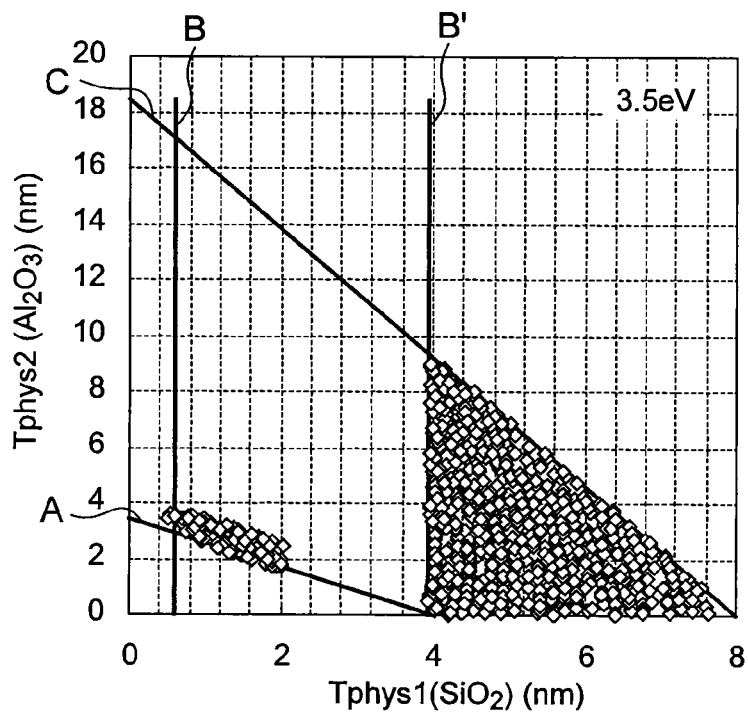
Figure 17T:
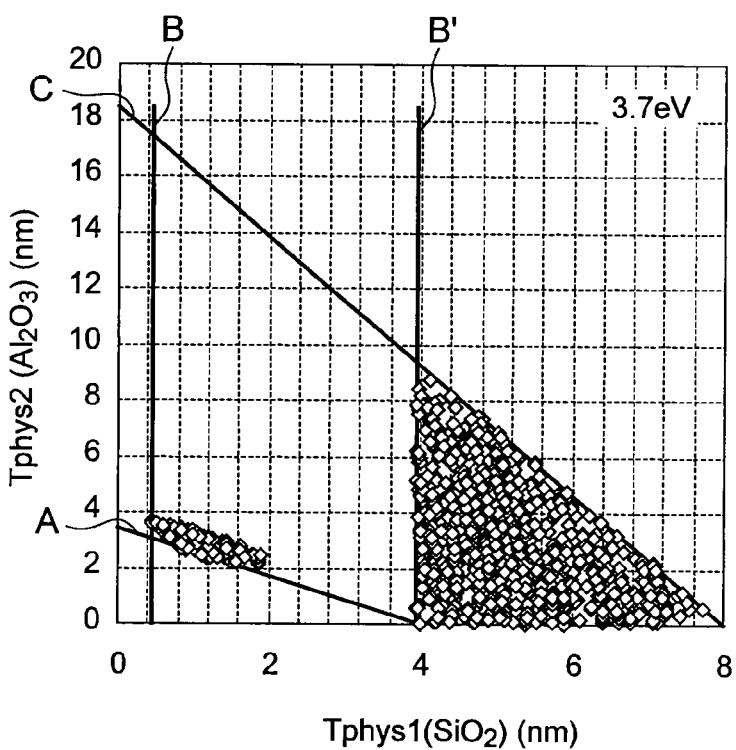
Figure 17U:
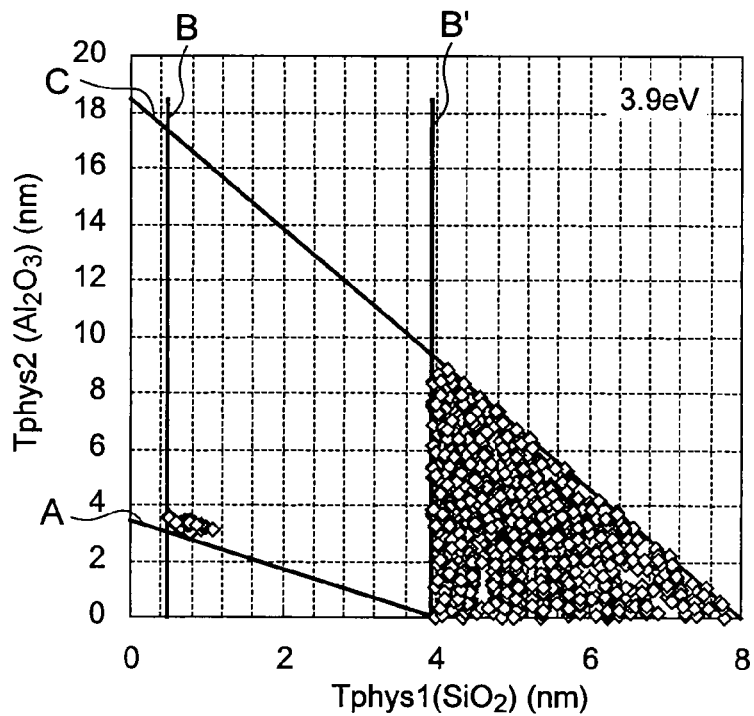
Figure 17V:
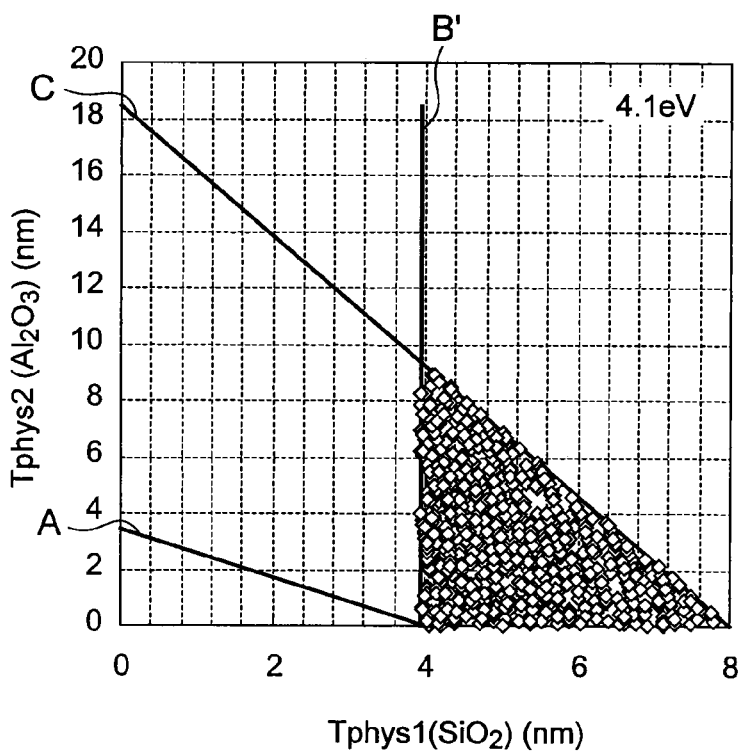
Figure 17W:
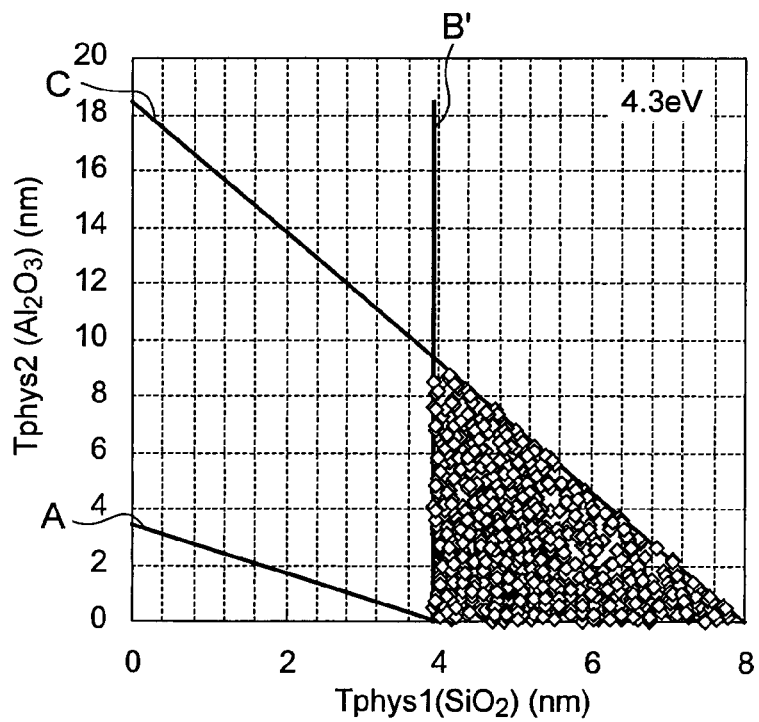
Figure 17X:
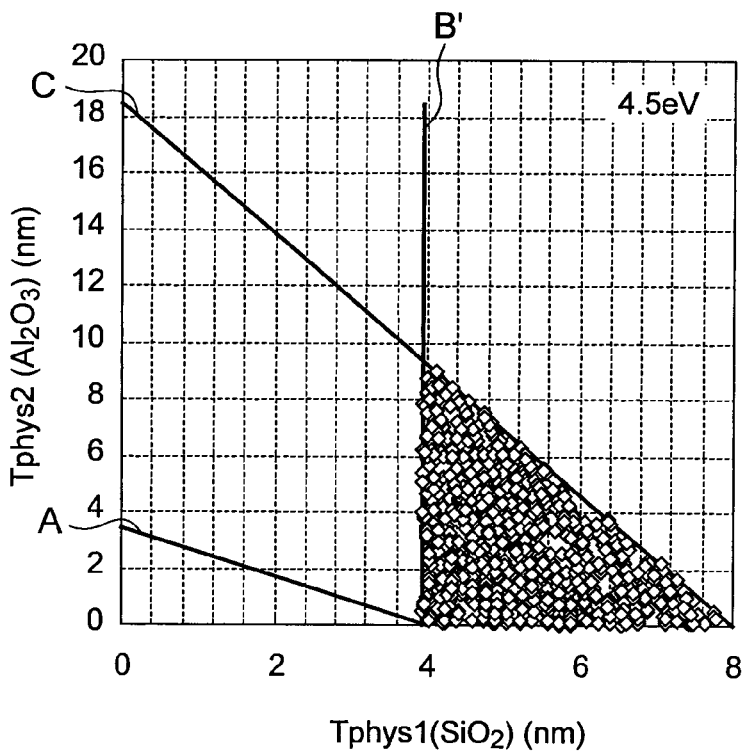
Figure 17Y:
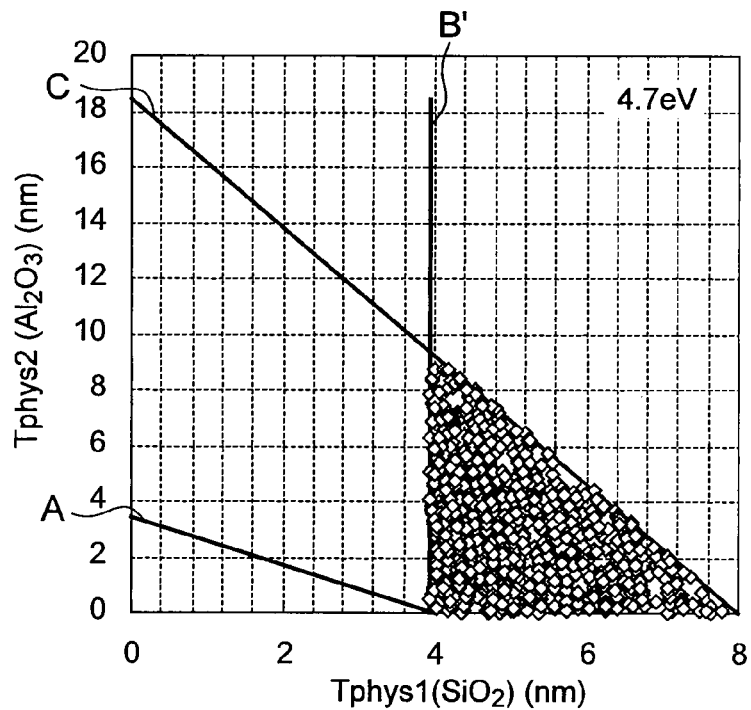
Figure 17Z:
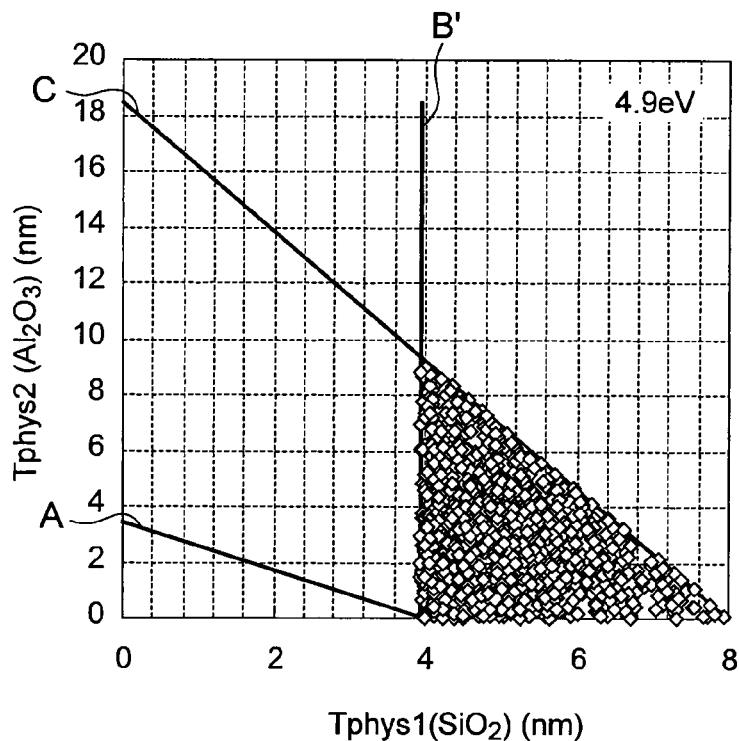

FIGS. 17A to 17Z show the ranges of the physical film thickness that fulfills the specs that are required in a tunnel insulating film as defined in an embodiment of the present invention at various assist levels in a case where an $Al_2O_3$ layer is selected as the high-k layer, and a $SiO_2$ layer is selected as the low-k layer of the stacked structure.

Figure 18:
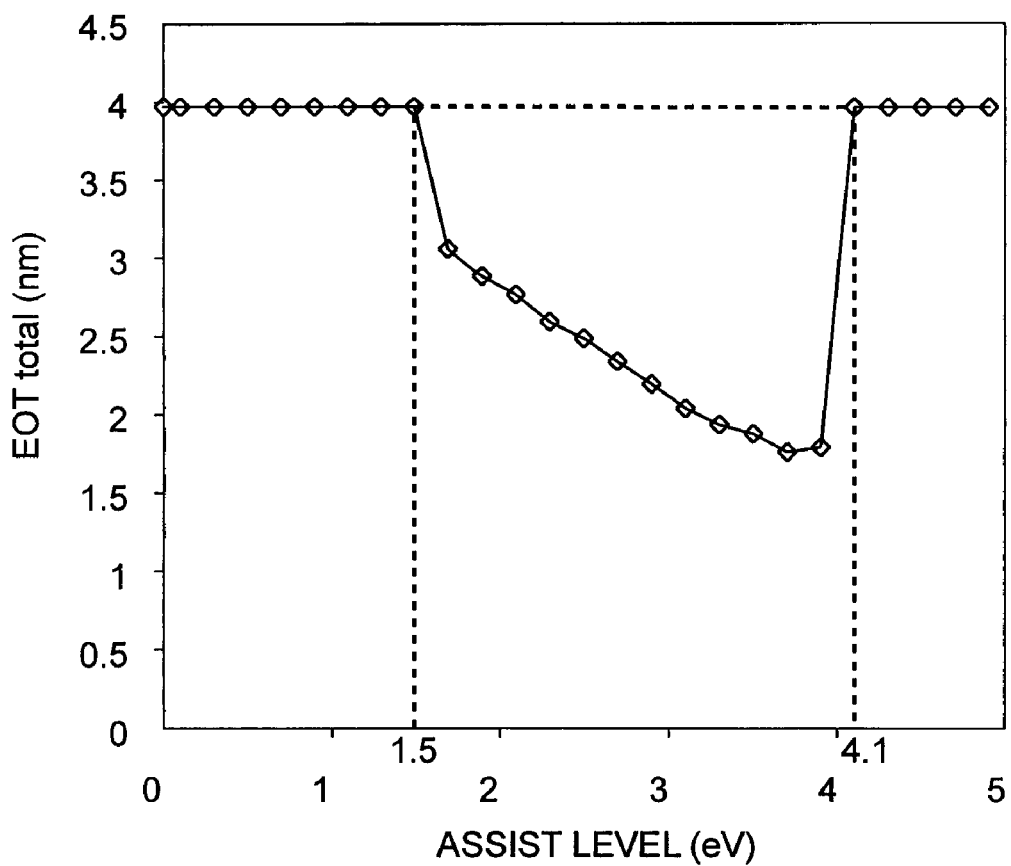
FIG. 18 is a diagram showing the assist level dependency of the EOT of the tunnel insulating film.

FIGS. 17A to 17Z illustrate cases where the assist level in the $Al_2O_3$ layer is 0 eV (no assist levels), 0.1 eV, 0.3 eV, 0.5 eV, 0.7 eV, 0.9 eV, 1.1 eV, 1.3 eV, 1.5 eV, 1.7 eV, 1.9 eV, 2.1 eV, 2.3 eV, 2.5 eV, 2.7 eV, 2.9 eV, 3.1 eV, 3.3 eV, 3.5 eV, 3.7 eV, 3.9 eV, 4.1 eV, 4.3 eV, 4.5 eV, 4.7 eV, and 4.9 eV. FIG. 18 shows the relationship between each of those assist levels and the EOT of the tunnel insulating film.

As can be seen from FIG. 18, in the case where the $Al_2O_3$ layer is selected as the high-k layer, it is preferable that the assist level is equal to or greater than 1.5 eV but is equal to or smaller than 4.1 eV. When there is an assist level, the layer thickness of the low-k layer (indicated by the value of the point at which the straight line B intersects with the abscissa axis) can be made smaller than the layer thickness of the low-k layer (indicated by the value of the point at which the straight line B' intersects with the abscissa axis) required in a case where there is not an assist level (see FIGS. 17J to 17U).

In this example, a $SiO_2$ layer is used as the low-k layer. However, since SiN (silicon nitride) has a lower dielectric constant than an $Al_2O_3$ layer, a SiN layer can be used as the low-k layer together with an $Al_2O_3$ layer, like a $SiO_2$ layer. In the above description, the low-k layer is a $SiO_2$ layer, and the high-k layer is an $Al_2O_3$ layer. However, the same effects as above can be achieved in a case where the low-k layer is a silicon oxide layer and the high-k layer is an alumina (AlO) layer, as long as the assist levels are within the above described ranges.

$La_2O_3$ Layer

Figure 19A:
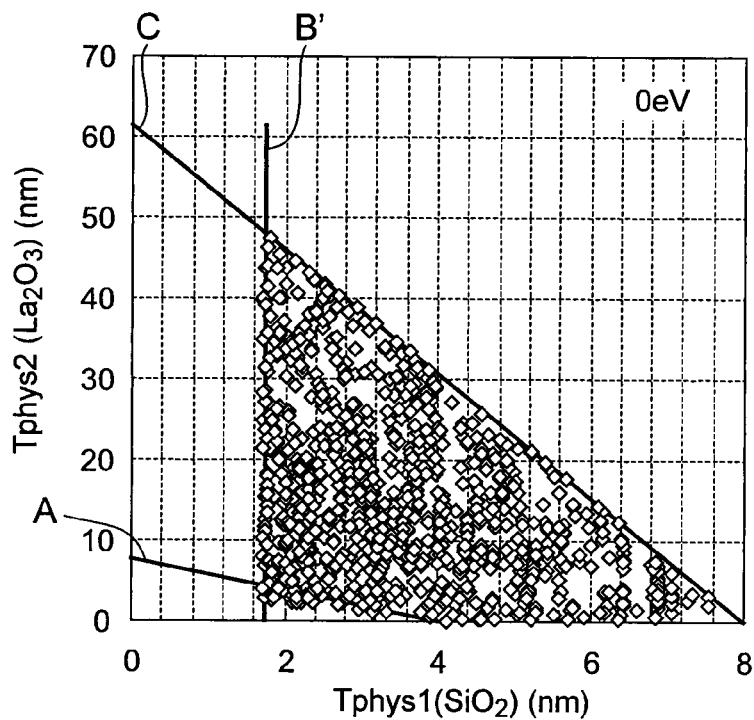
FIGS. 19A to 19N are diagrams showing the ranges of the physical film thicknesses of a SiO$_2$ layer and a La$_2$O$_3$ layer in a tunnel insulating film.
Figure 19B:
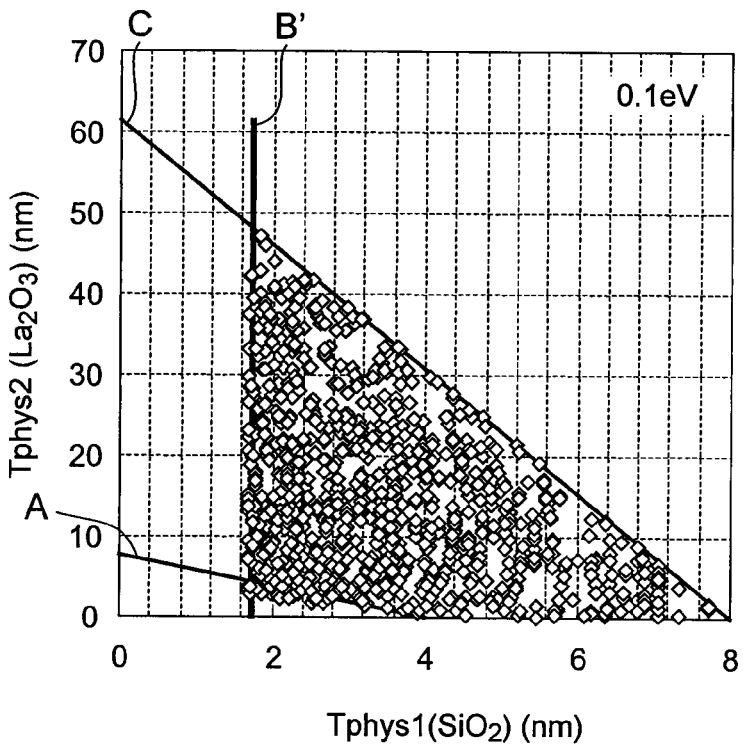
Figure 19C:
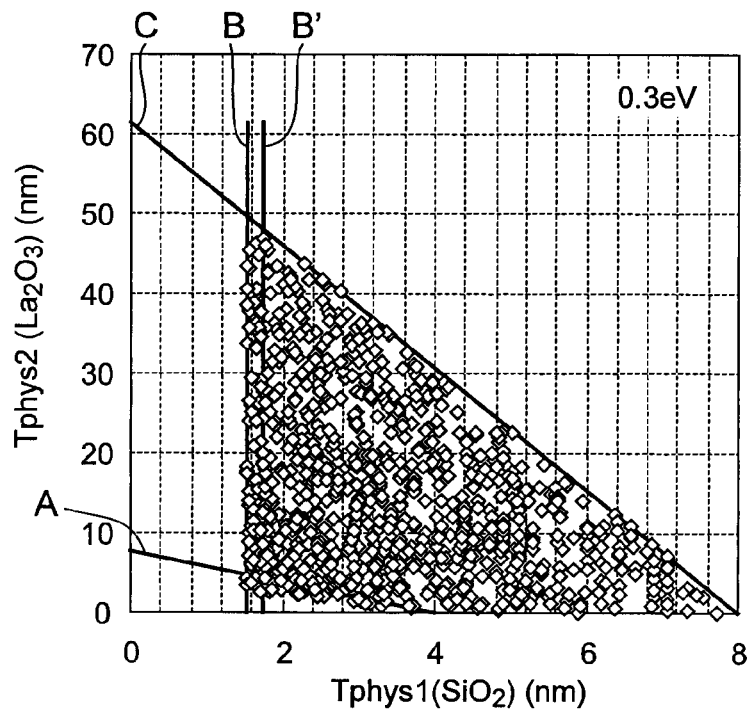
Figure 19D:
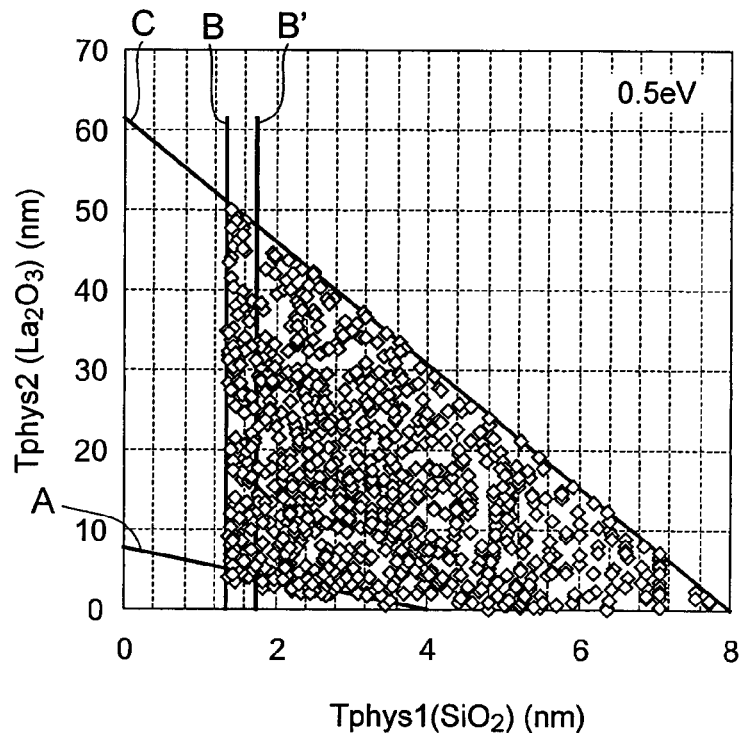
Figure 19E:
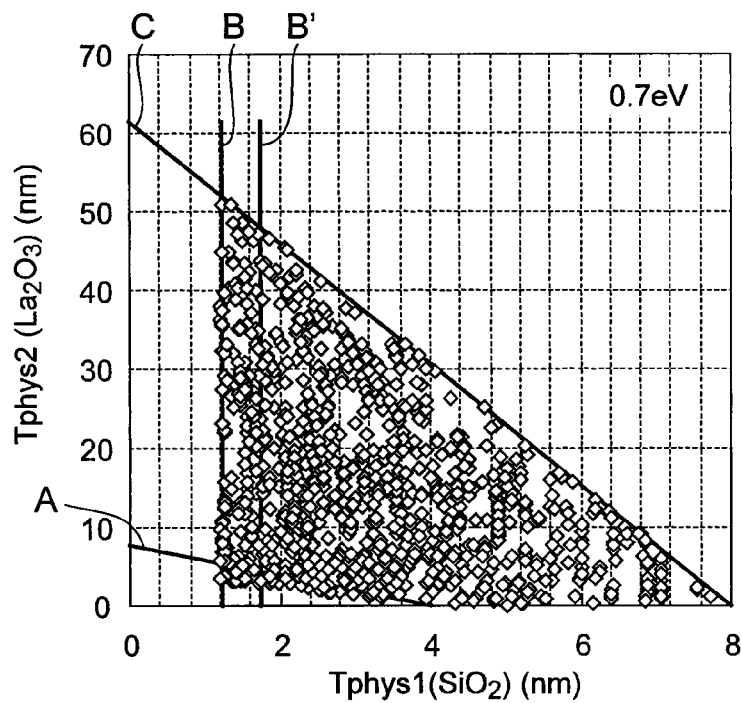
Figure 19F:
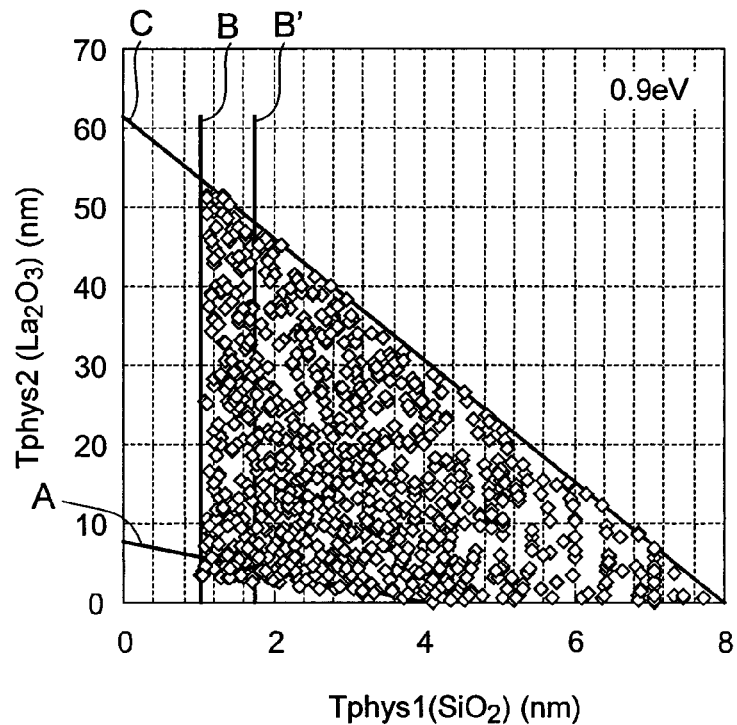
Figure 19G:
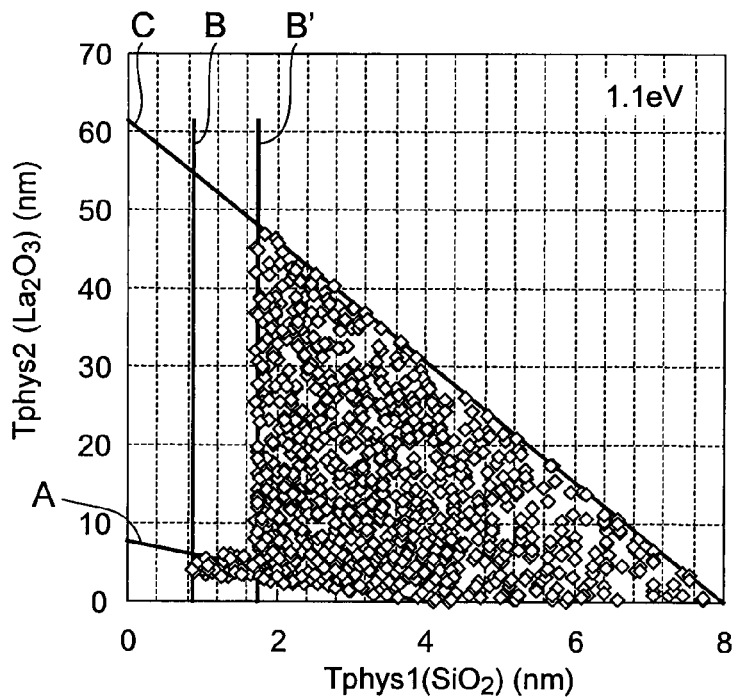
Figure 19H:
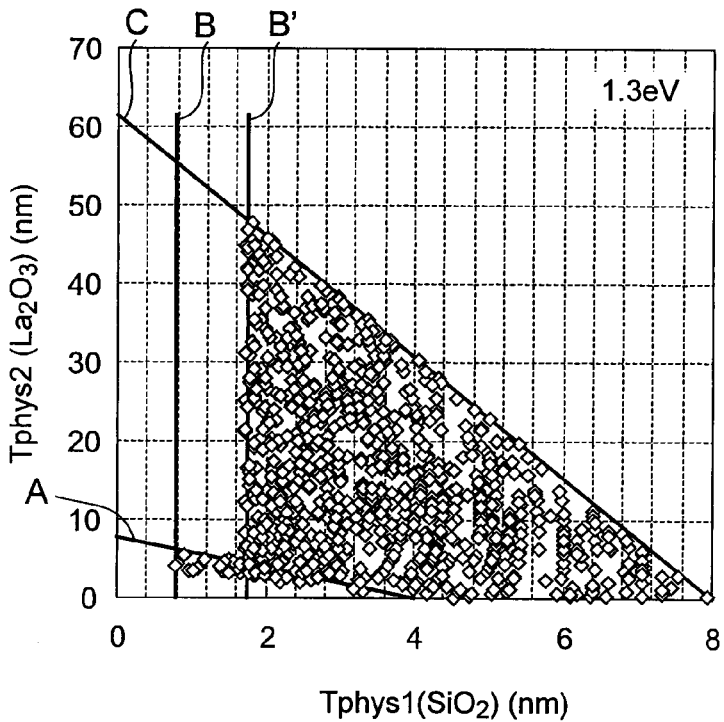
Figure 19I:
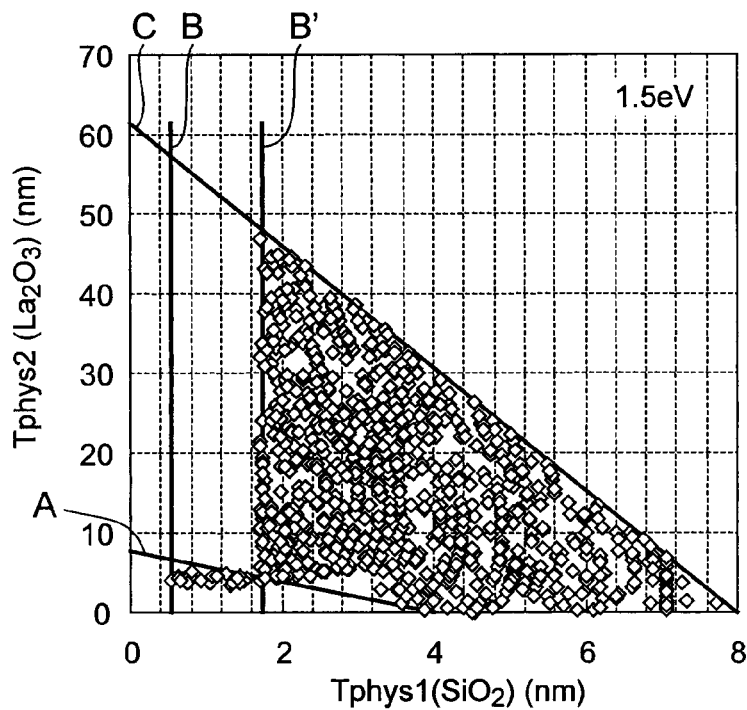
Figure 19J:
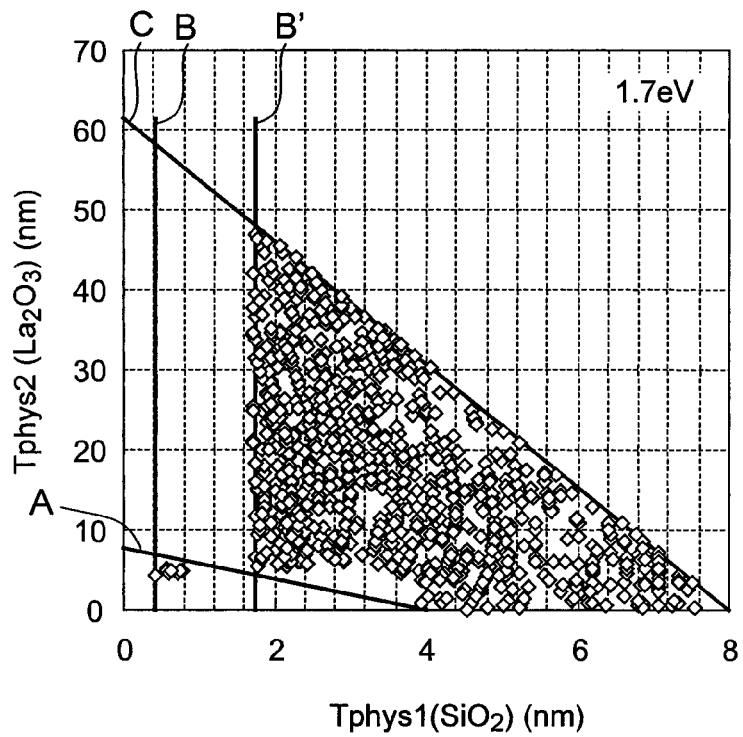
Figure 19K:
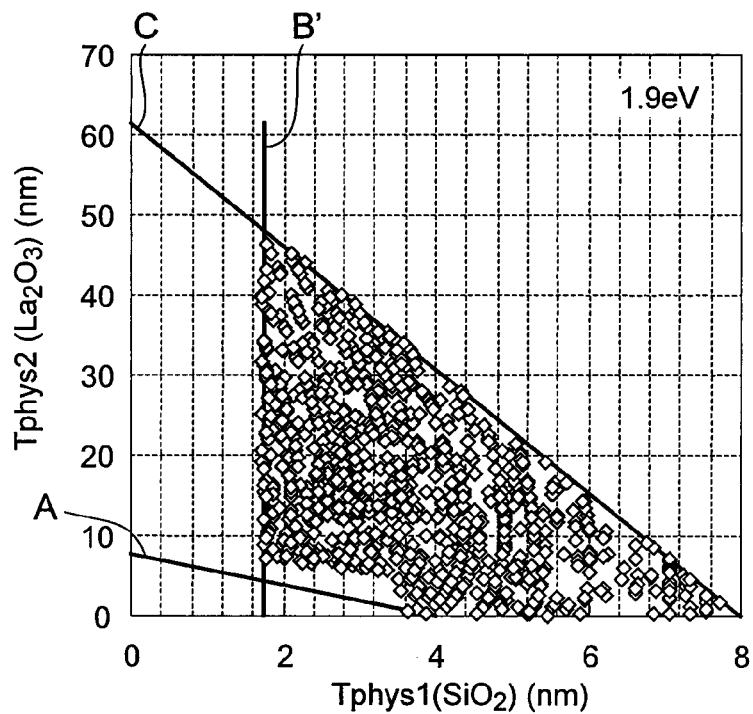
Figure 19L:
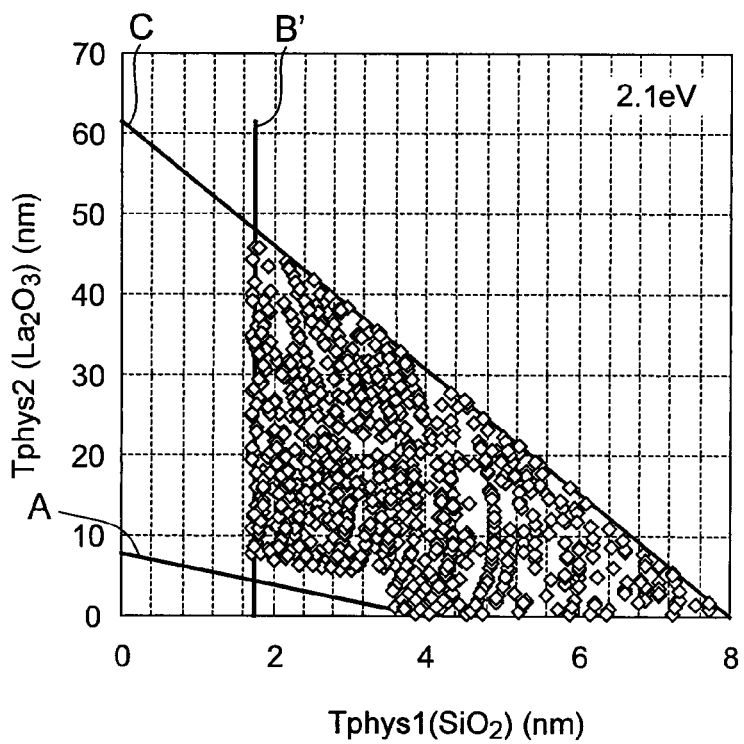
Figure 19M:
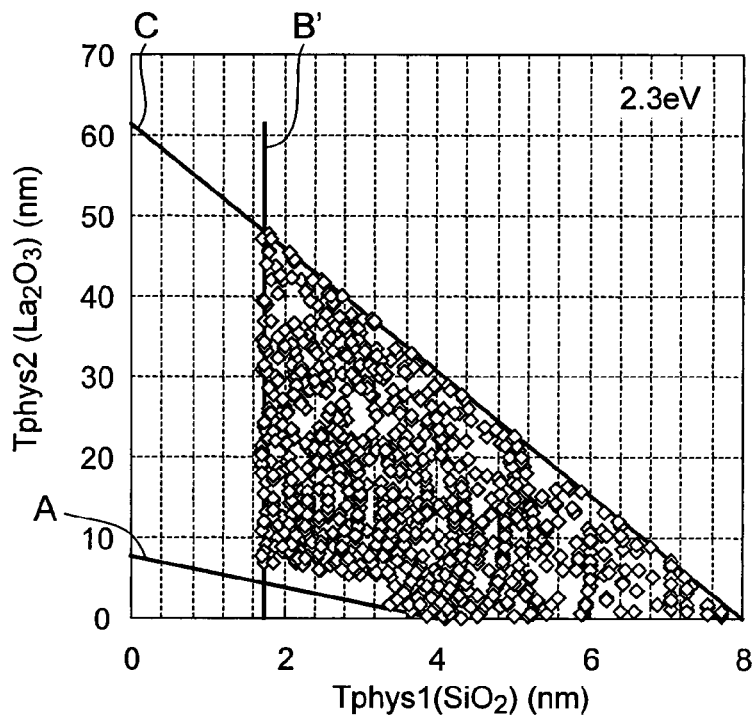
Figure 19N:
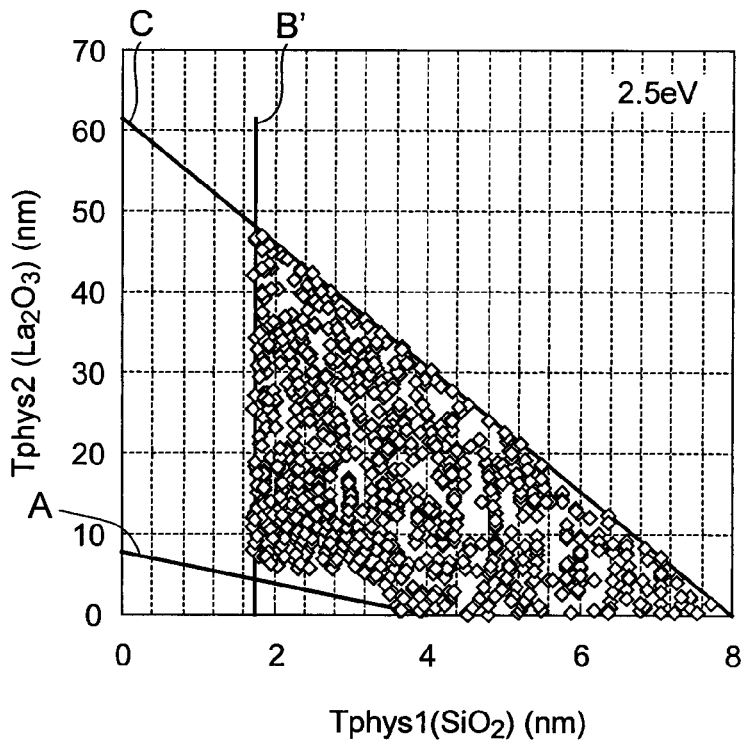

FIGS. 19A to 19N show the ranges of the physical film thickness that fulfills the specs that are required in a tunnel insulating film as defined in an embodiment of the present invention at various assist levels in a case where a $La_2O_3$ layer is selected as the high-k layer, and a $SiO_2$ layer is selected as the low-k layer of the stacked structure.

Figure 20:
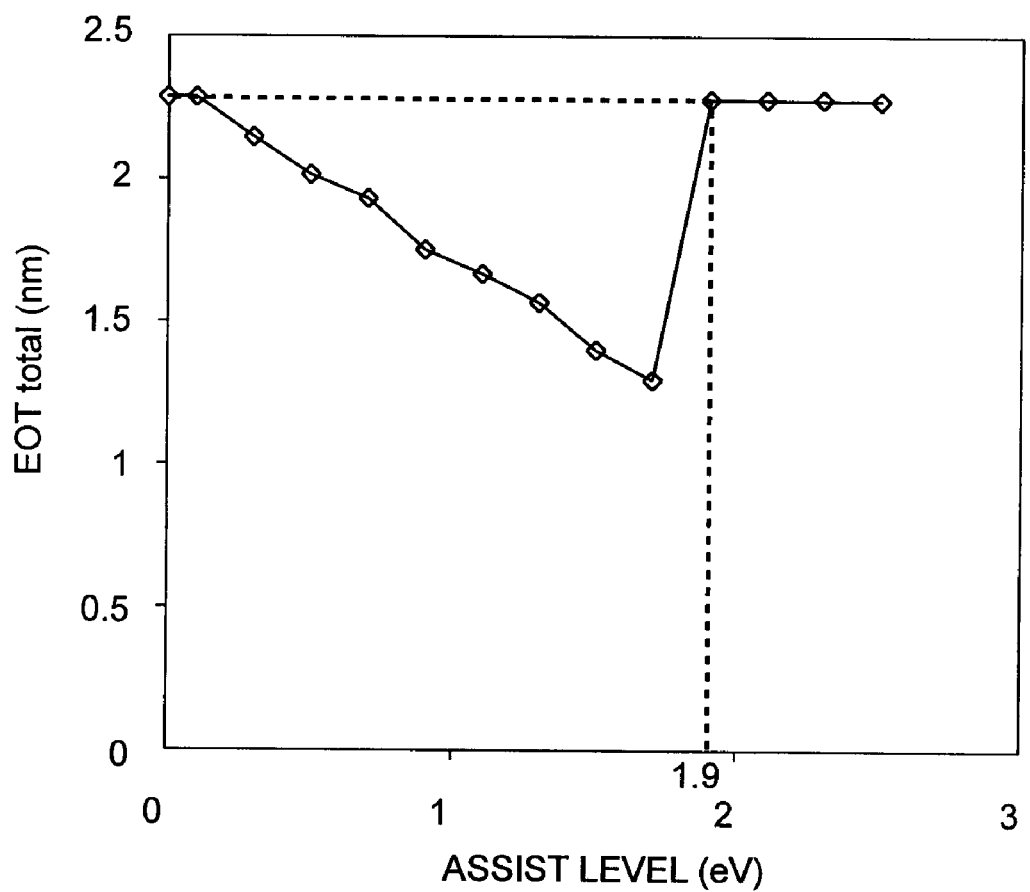
FIG. 20 is a diagram showing the assist level dependency of the EOT of the tunnel insulating film.

FIGS. 19A to 19N illustrate cases where the assist level in the $La_2O_3$ layer is 0 eV (no assist levels), 0.1 eV, 0.3 eV, 0.5 eV, 0.7 eV, 0.9 eV, 1.1 eV, 1.3 eV, 1.5 eV, 1.7 eV, 1.9 eV, 2.1 eV, 2.3 eV, and 2.5 eV. FIG. 20 shows the relationship between each of those assist levels and the EOT of the tunnel insulating film.

As can be seen from FIG. 20, in the case where the $La_2O_3$ layer is selected as the high-k layer, it is preferable that the assist level is equal to or greater than 0.1 eV but is smaller than 1.9 eV. When there is an assist level, the layer thickness of the low-k layer (indicated by the value of the point at which the straight line B intersects with the abscissa axis) can be made smaller than the layer thickness of the low-k layer (indicated by the value of the point at which the straight line B' intersects with the abscissa axis) required in a case where there is not an assist level (see FIGS. 19C to 19J).

In this example, a $SiO_2$ layer is used as the low-k layer. However, since SiN (silicon nitride) has a lower dielectric constant than a $La_2O_3$ layer, a SiN layer can be used as the low-k layer together with a $La_2O_3$ layer, like a $SiO_2$ layer. In the above description, the low-k layer is a $SiO_2$ layer, and the high-k layer is a $La_2O_3$ layer. However, the same effects as above can be achieved in a case where the low-k layer is a silicon oxide layer and the high-k layer is a lanthanum oxide (LaO) layer, as long as the assist levels are within the above described ranges.

HfSiO Layer

Figure 21A:
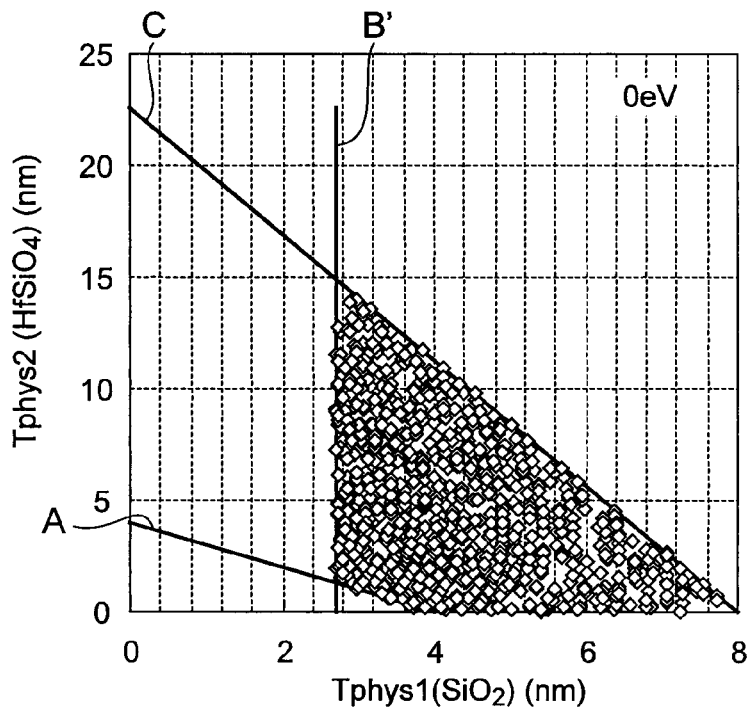
FIGS. 21A to 21S are diagrams showing the ranges of the physical film thicknesses of a SiO$_2$ layer and a HfSiO$_4$ layer in a tunnel insulating film.
Figure 21B:
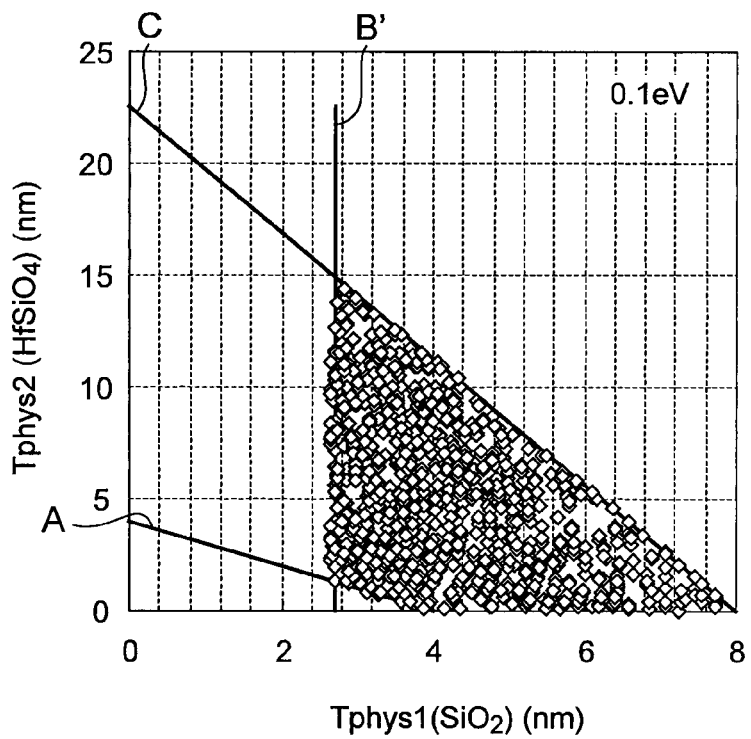
Figure 21C:
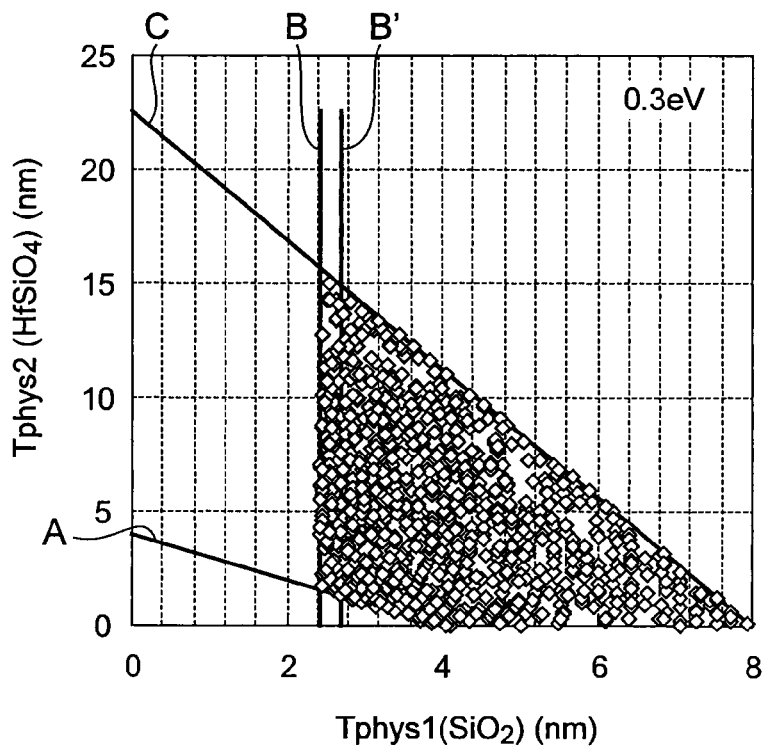
Figure 21D:
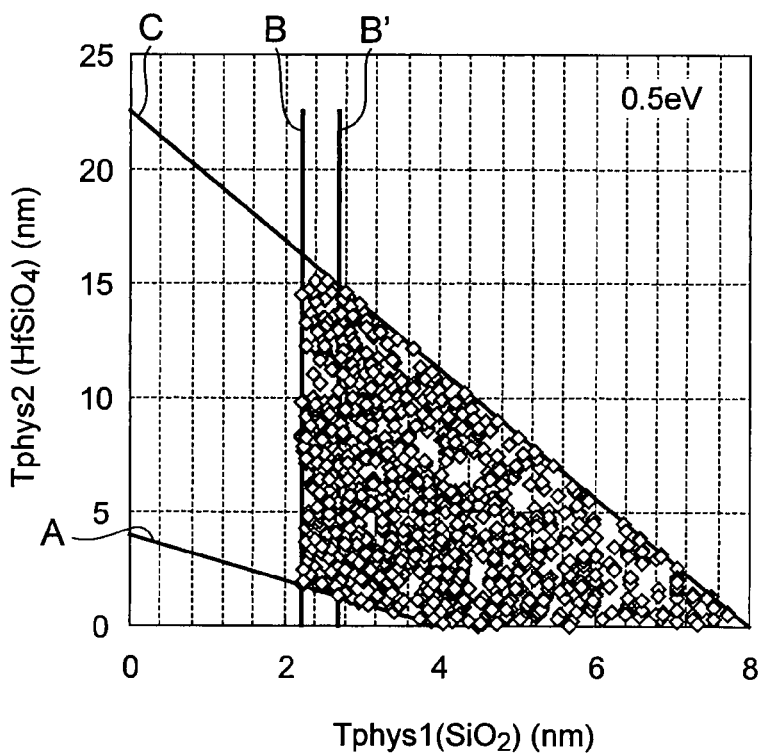
Figure 21E:
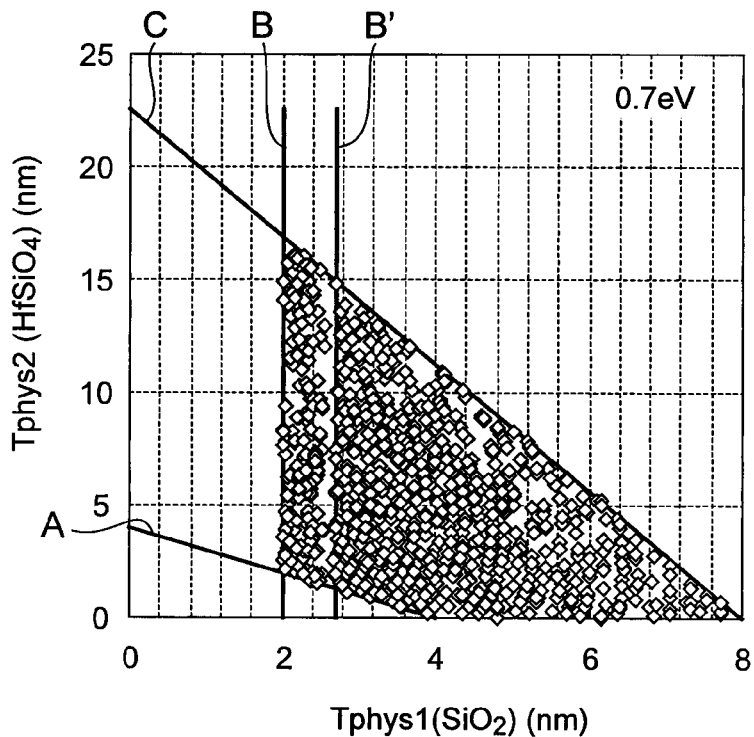
Figure 21F:
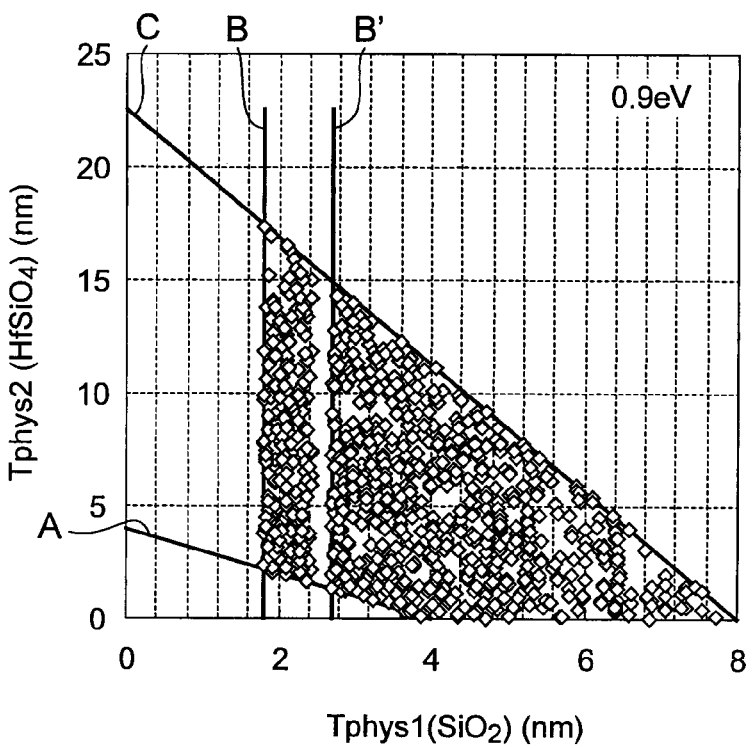
Figure 21G:
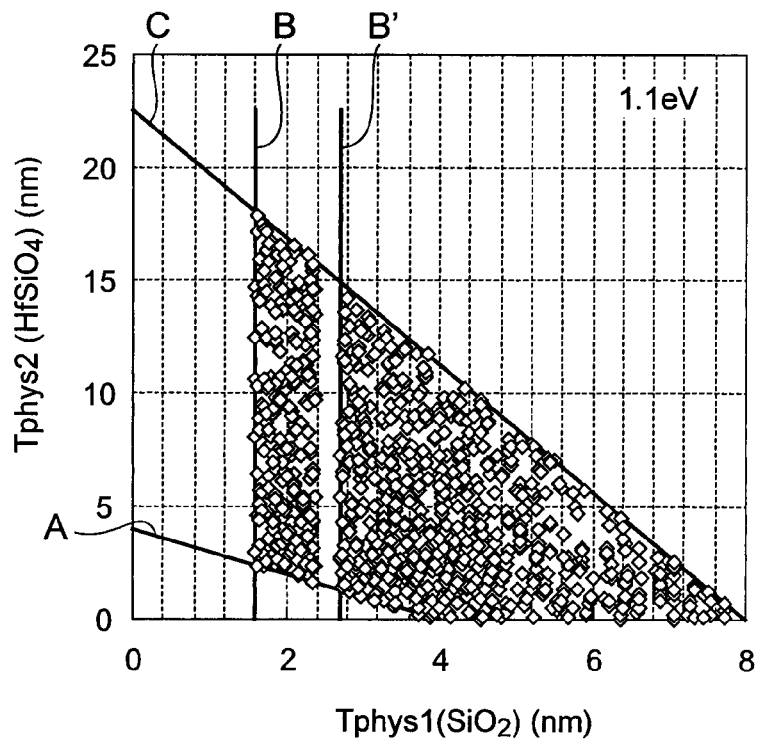
Figure 21H:
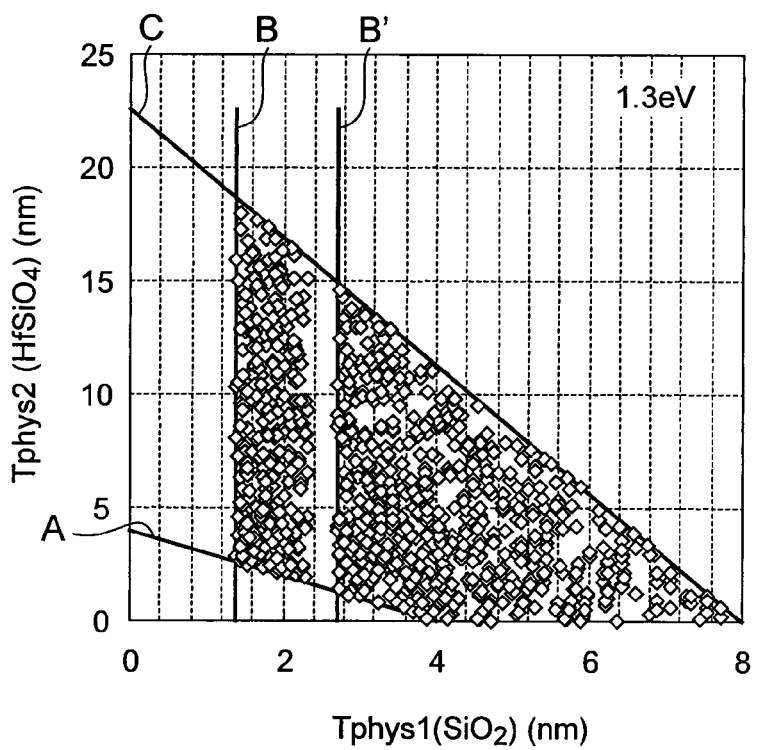
Figure 21I:
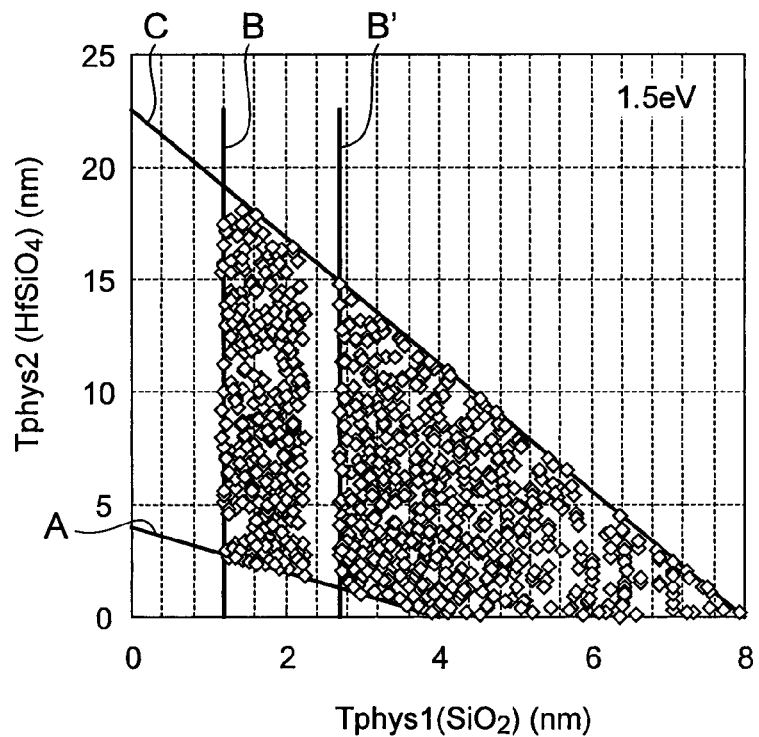
Figure 21J:
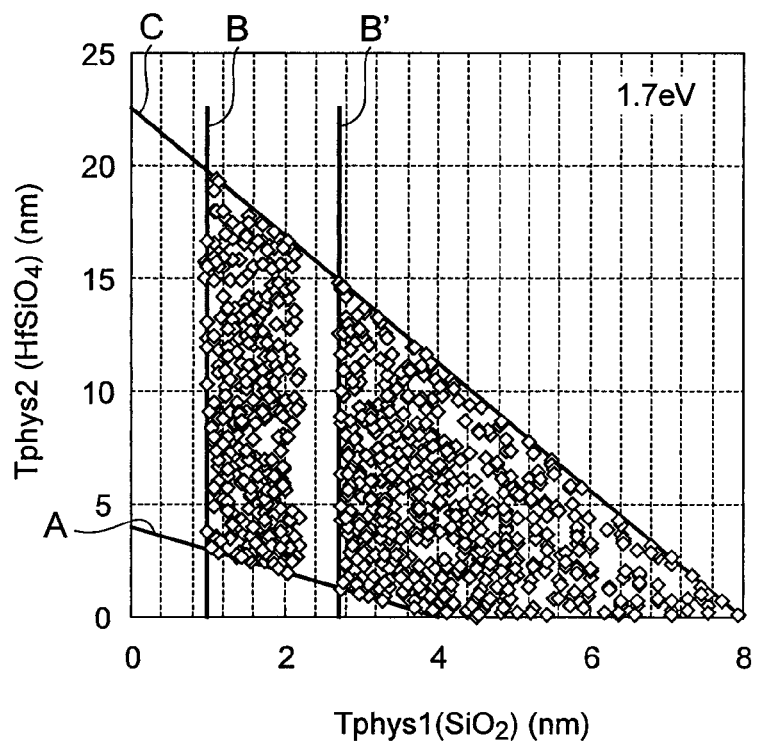
Figure 21K:
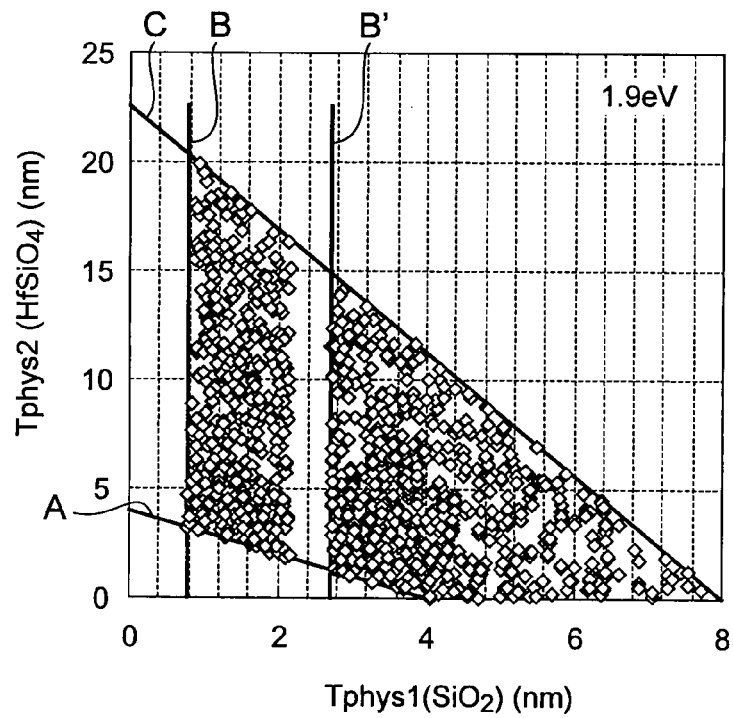
Figure 21L:
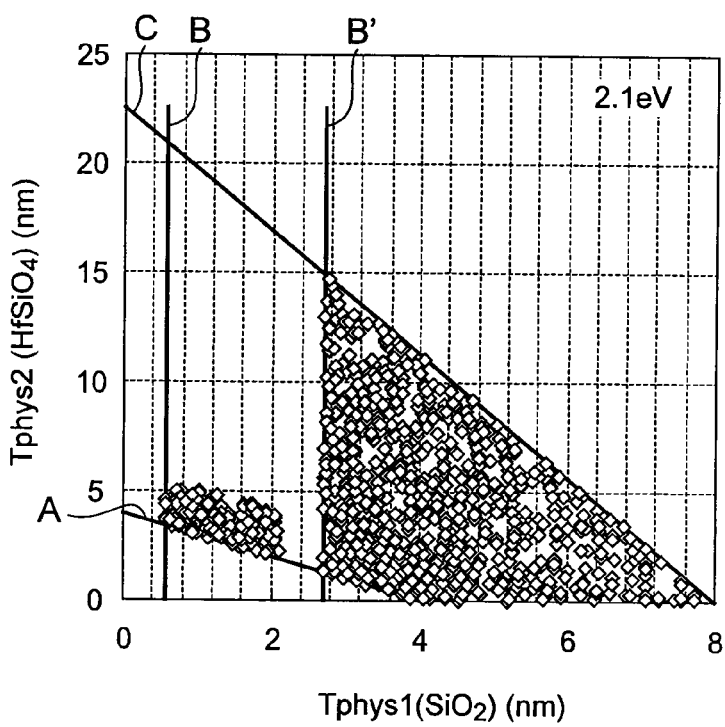
Figure 21M:
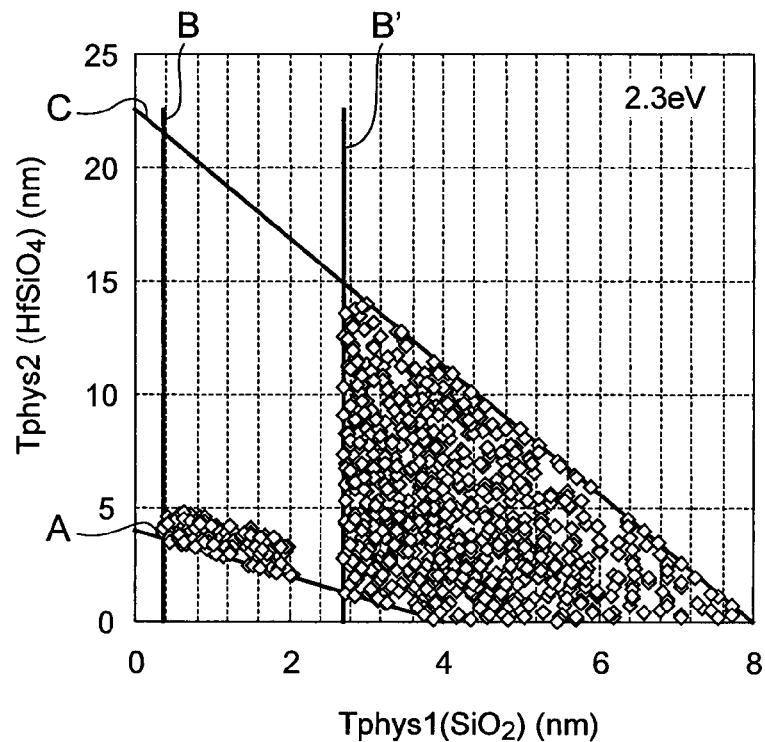
Figure 21N:
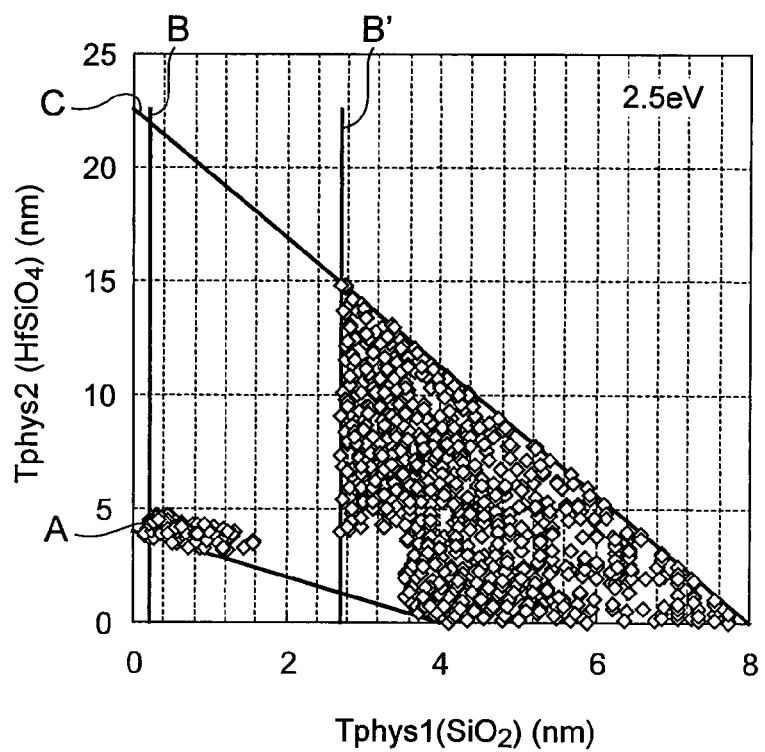
Figure 21O:
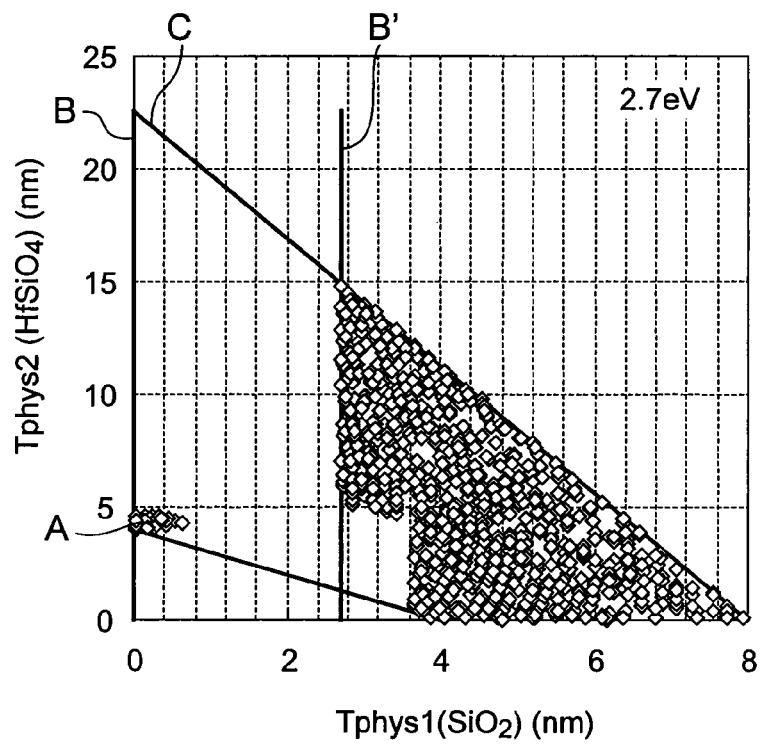
Figure 21P:
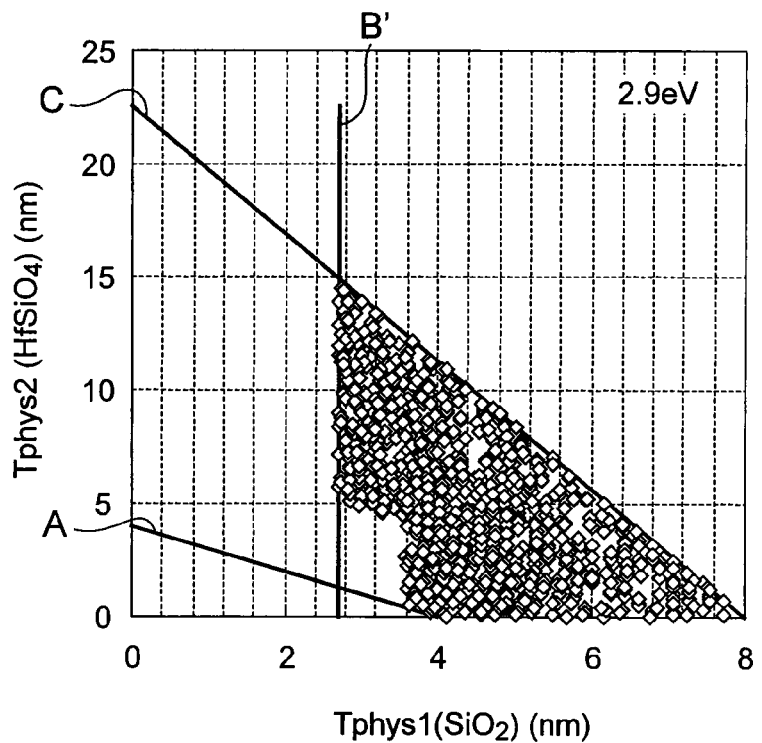
Figure 21Q:
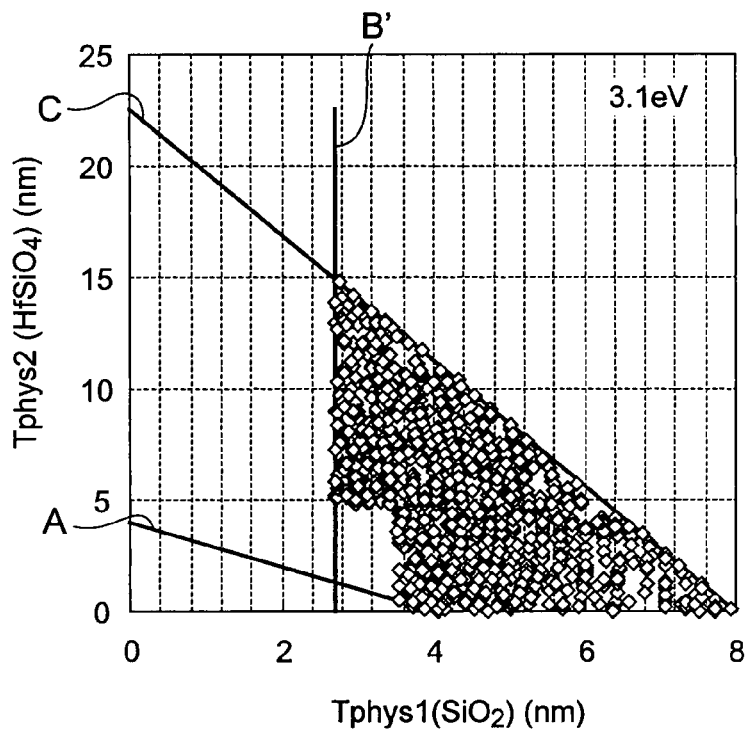
Figure 21R:
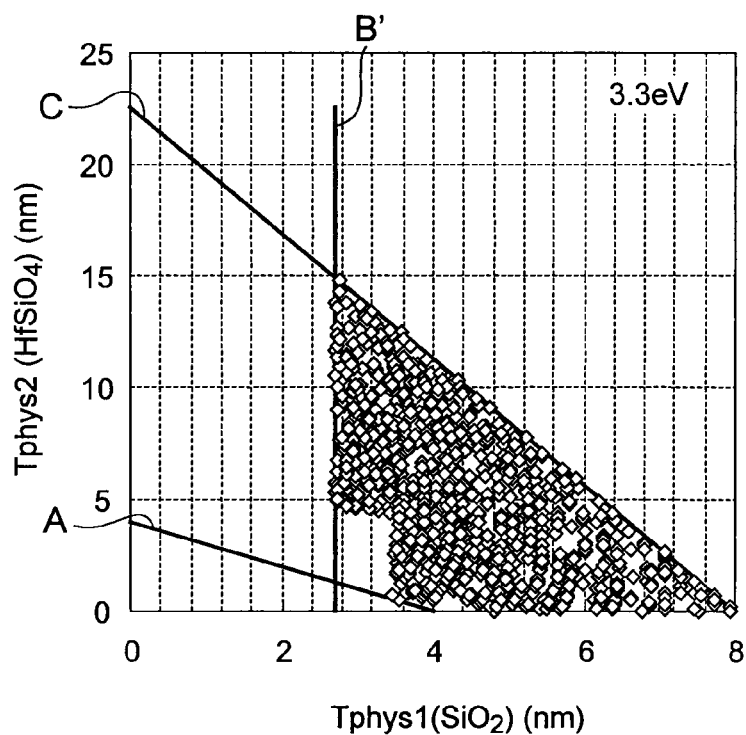
Figure 21S:
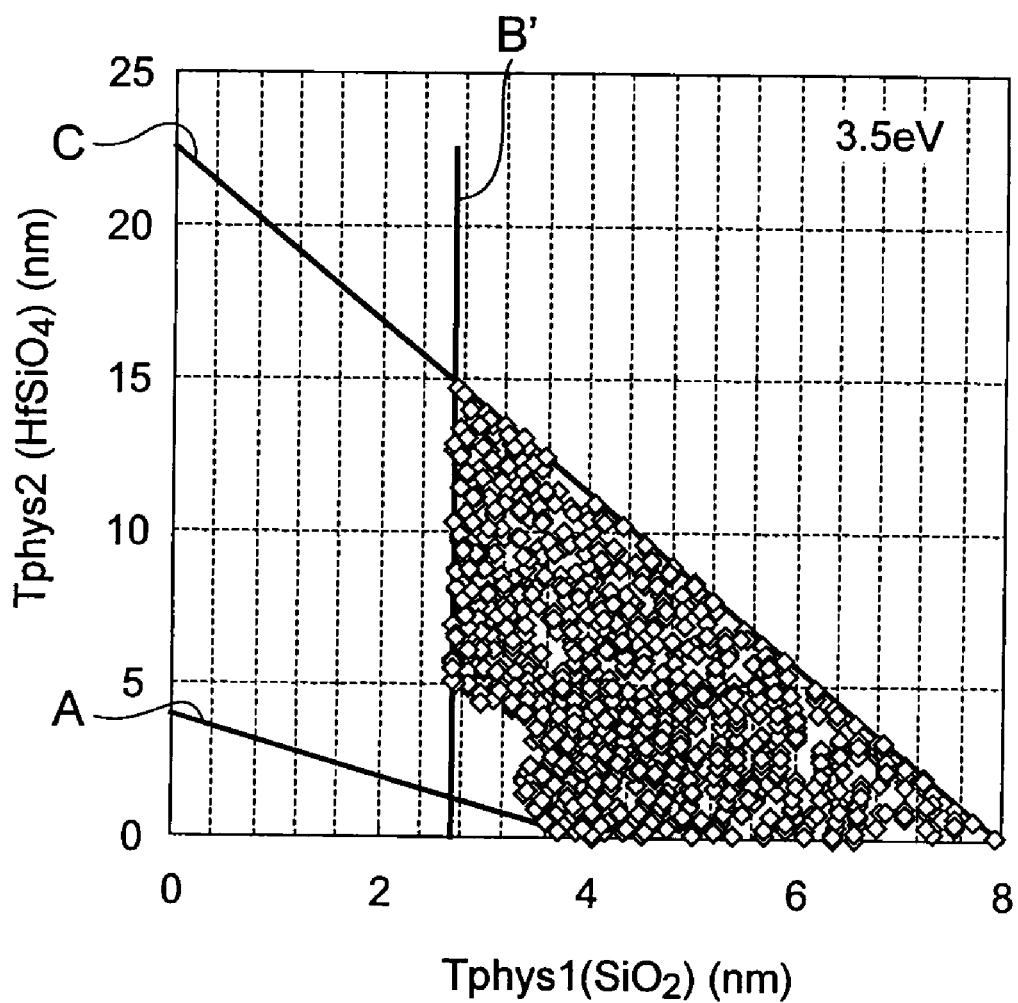
Figure 22:
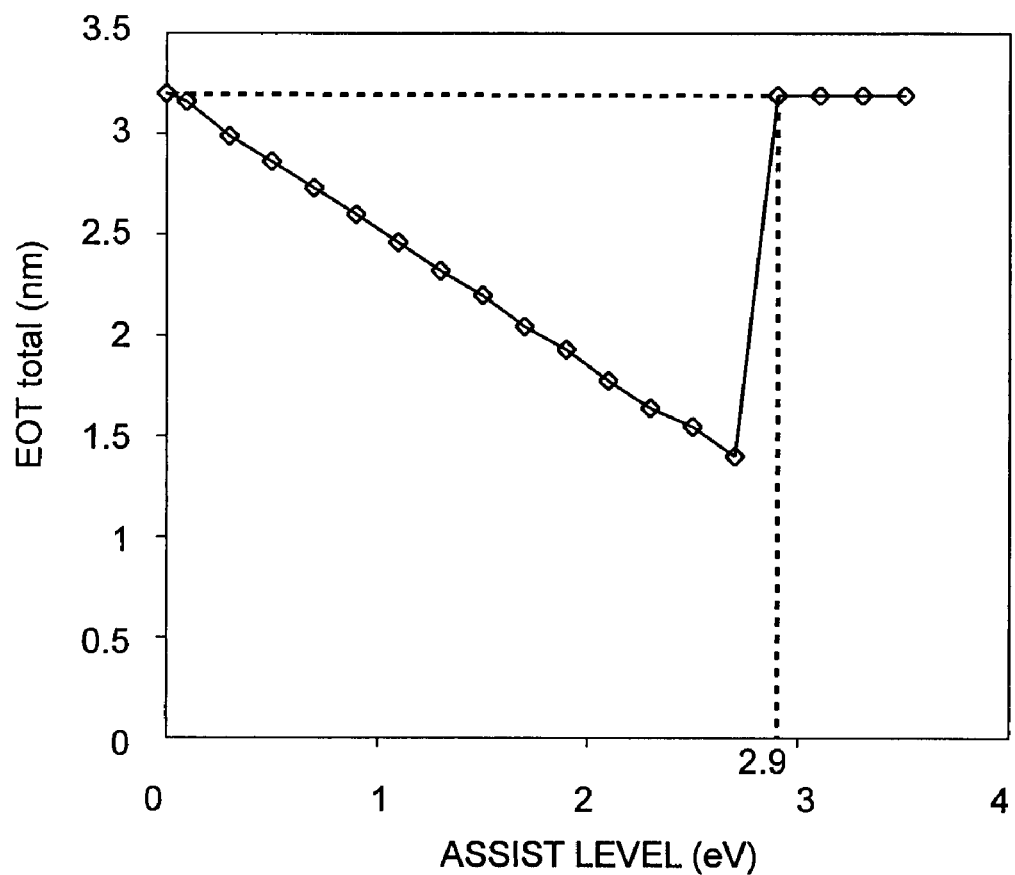
FIG. 22 is a diagram showing the assist level dependency of the EOT of the tunnel insulating film.

FIGS. 21A to 21S show the ranges of the physical film thickness that fulfills the specs that are required in a tunnel insulating film as defined in an embodiment of the present invention at various assist levels in a case where a $HfSiO_4$ layer is selected as the high-k layer, and a $SiO_2$ layer is selected as the low-k layer of the stacked structure. FIGS. 21A to 21S illustrate cases where the assist level in the $HfSiO_4$ layer is 0 eV (no assist levels), 0.1 eV, 0.3 eV, 0.5 eV, 0.7 eV, 0.9 eV, 1.1 eV, 1.3 eV, 1.5 eV, 1.7 eV, 1.9 eV, 2.1 eV, 2.3 eV, 2.5 eV, 2.7 eV, 2.9 eV, 3.1 eV, 3.3 eV, and 3.5 eV. FIG. 22 shows the relationship between each of those assist levels and the EOT of the tunnel insulating film.

As can be seen from FIG. 22, in the case where the $HfSiO_4$ layer is selected as the high-k layer, it is preferable that the assist level is greater than 0.1 eV but is equal to or smaller than 2.9 eV. When there is an assist level, the layer thickness of the low-k layer (indicated by the value of the point at which the straight line B intersects with the abscissa axis) can be made smaller than the layer thickness of the low-k layer (indicated by the value of the point at which the straight line B' intersects with the abscissa axis) required in a case where there is not an assist level (see FIGS. 21C to 21O). If there is not an assist level in the $HfSiO_4$ layer, the $SiO_2$ layer needs to have a layer thickness of 2.7 nm (see FIG. 21A). If there is an assist level of 0.3 eV or deeper in the $HfSiO_4$ layer, a tunnel insulating film can be formed only with the $HfSiO_4$ layer, and the $SiO_2$ layer is not necessary (see FIGS. 21C to 21O). If there is an assist level deeper than 2.9 eV in such a case, however, the EOT cannot be minimized. In this example, a $SiO_2$ layer is used as the low-k layer. However, since SiN has a lower dielectric constant than a $HfSiO_4$ layer, a SiN layer can be used as the low-k layer together with a $HfSiO_4$ layer, like a $SiO_2$ layer. In the above description, the low-k layer is a $SiO_2$ layer, and the high-k layer is a $HfSiO_4$ layer. However, the same effects as above can be achieved in a case where the low-k layer is a silicon oxide layer and the high-k layer is a hafnium silicate (HfSiO) layer, as long as the assist levels are within the above described ranges.

LaAlO Layer

Figure 23A:
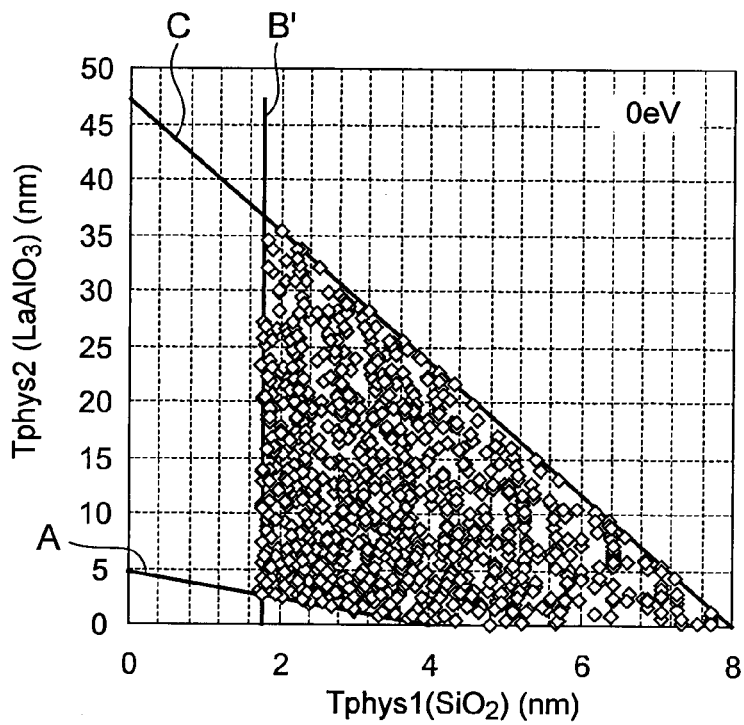
FIGS. 23A to 23N are diagrams showing the ranges of the physical film thicknesses of a SiO$_2$ layer and a LaAlO$_3$ layer in a tunnel insulating film.
Figure 23B:
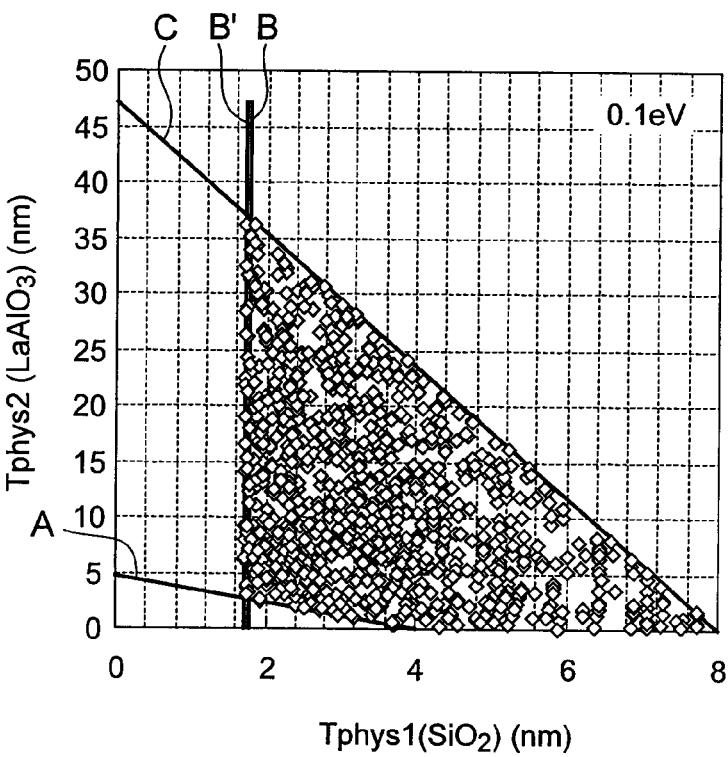
Figure 23C:
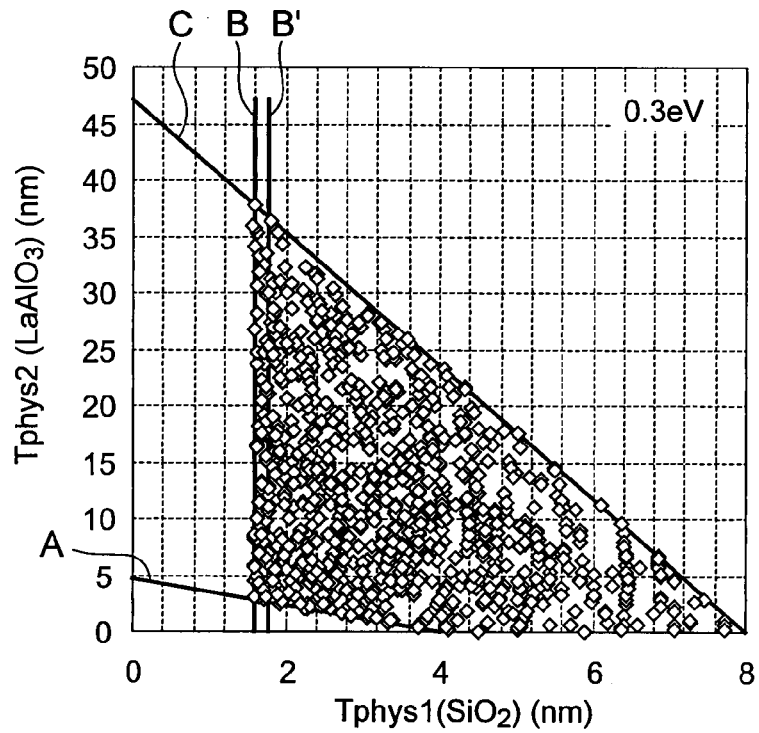
Figure 23D:
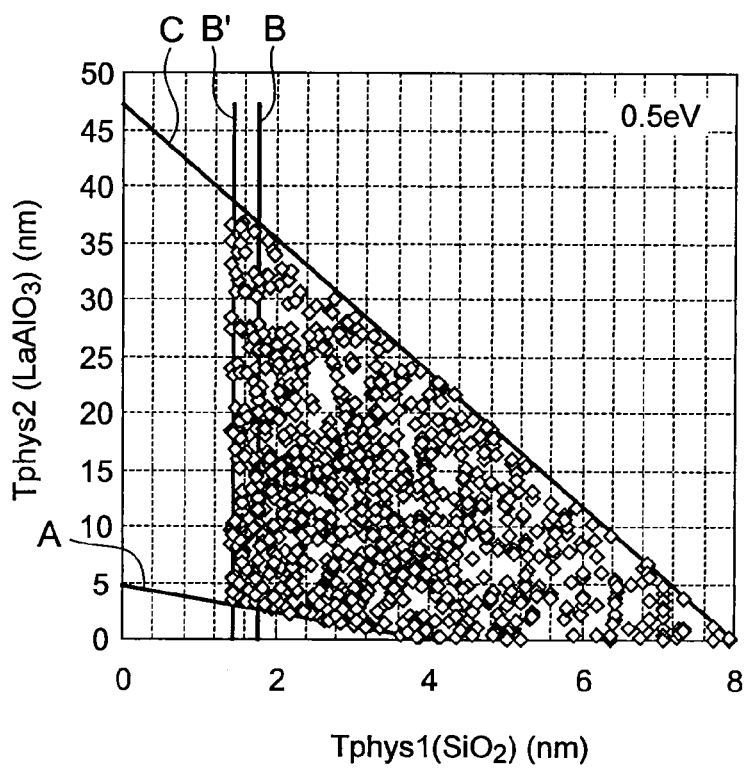
Figure 23E:
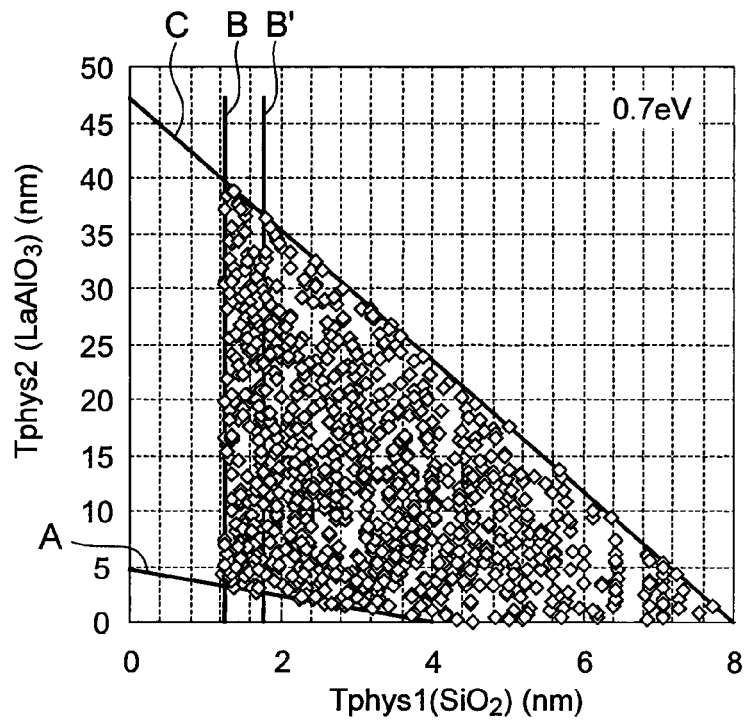
Figure 23F:
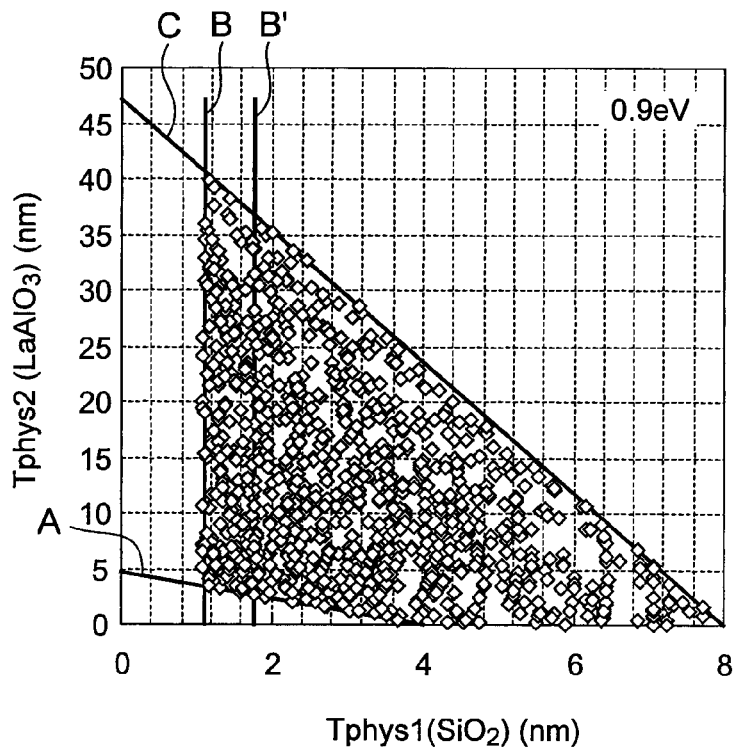
Figure 23G:
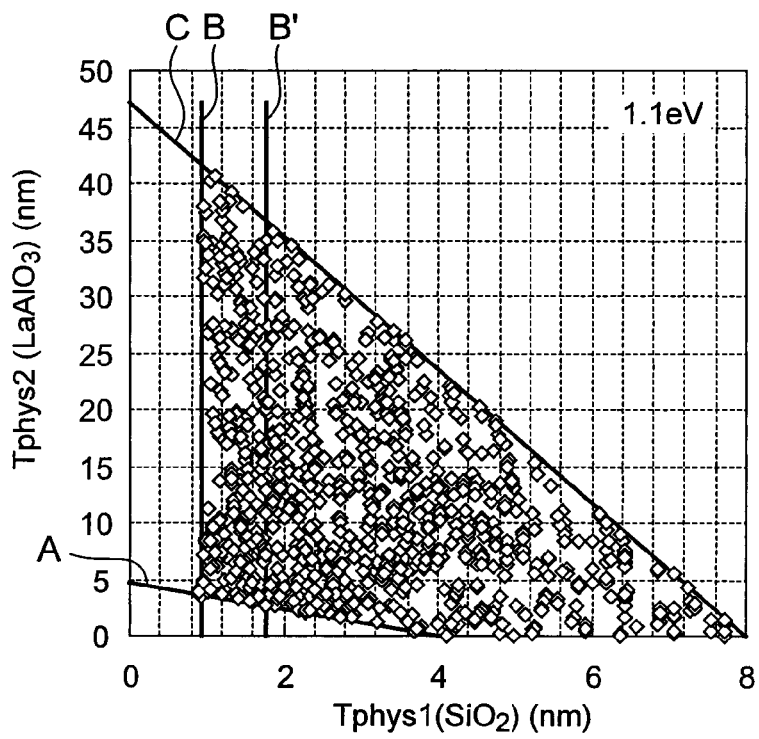
Figure 23H:
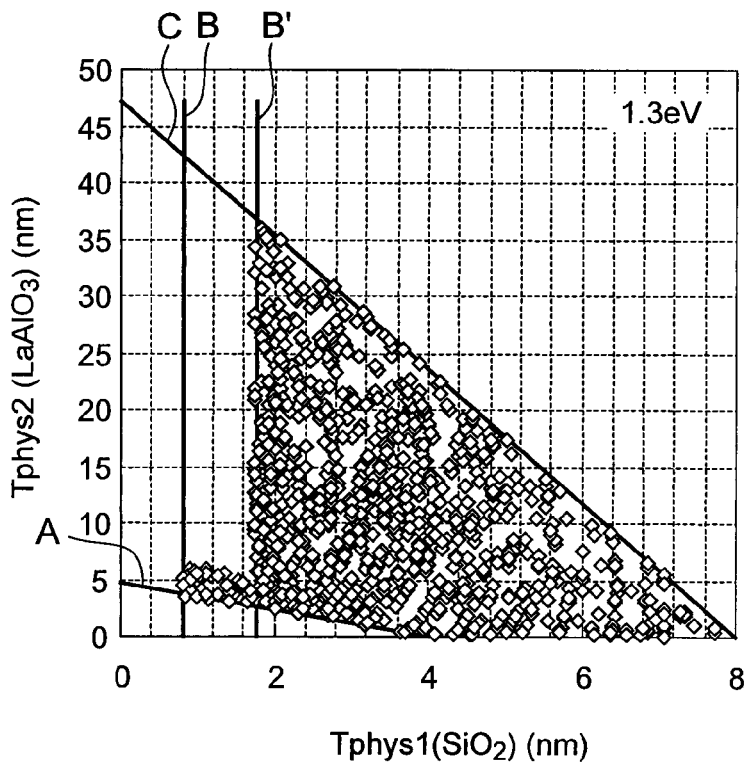
Figure 23I:
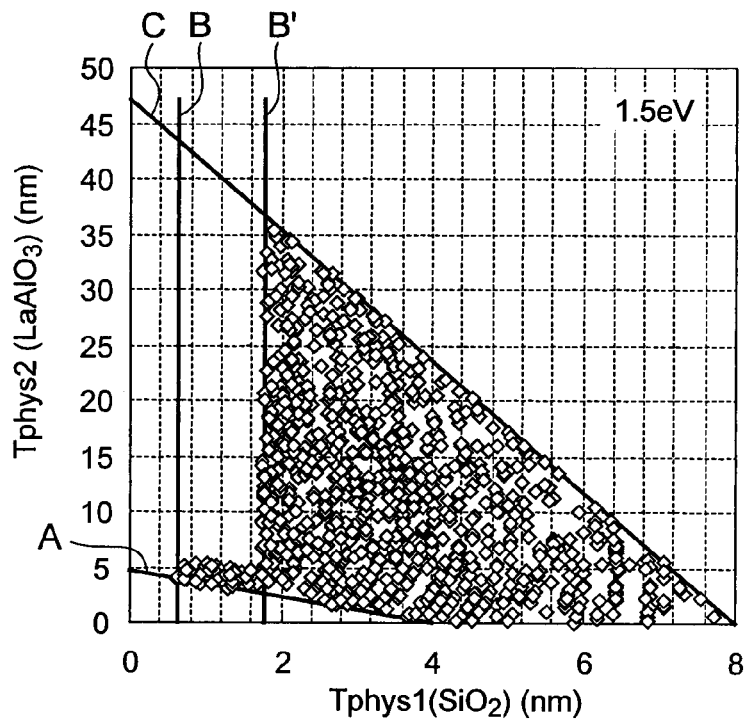
Figure 23J:
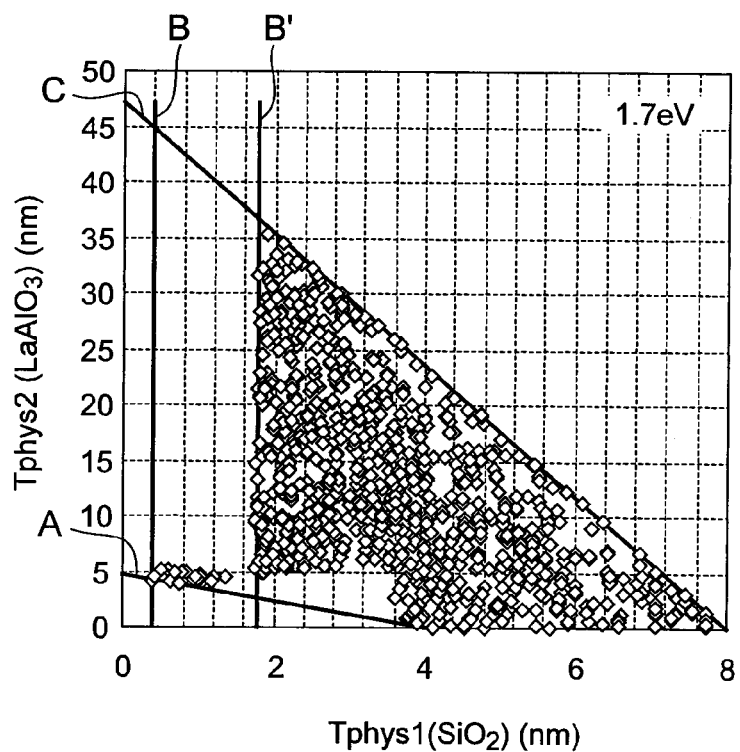
Figure 23K:
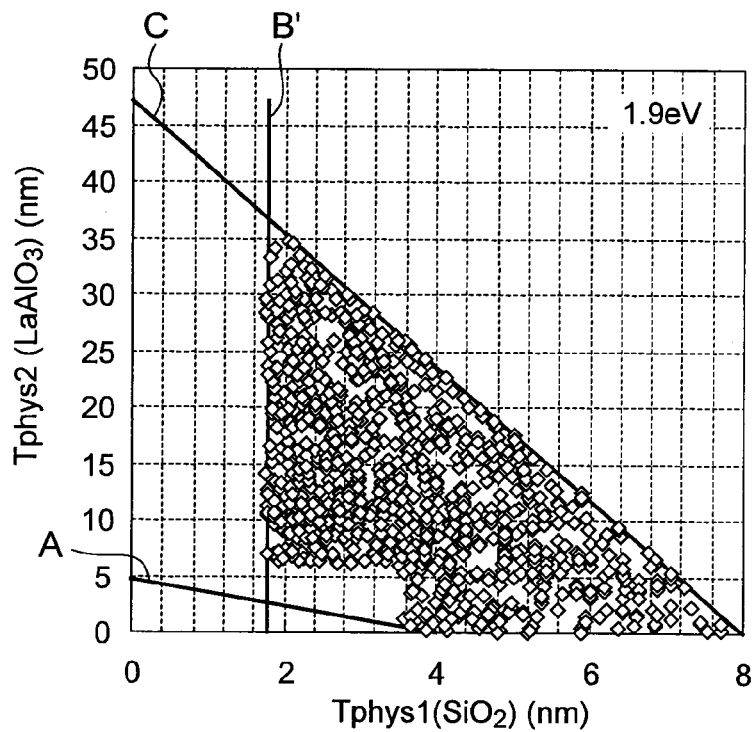
Figure 23L:
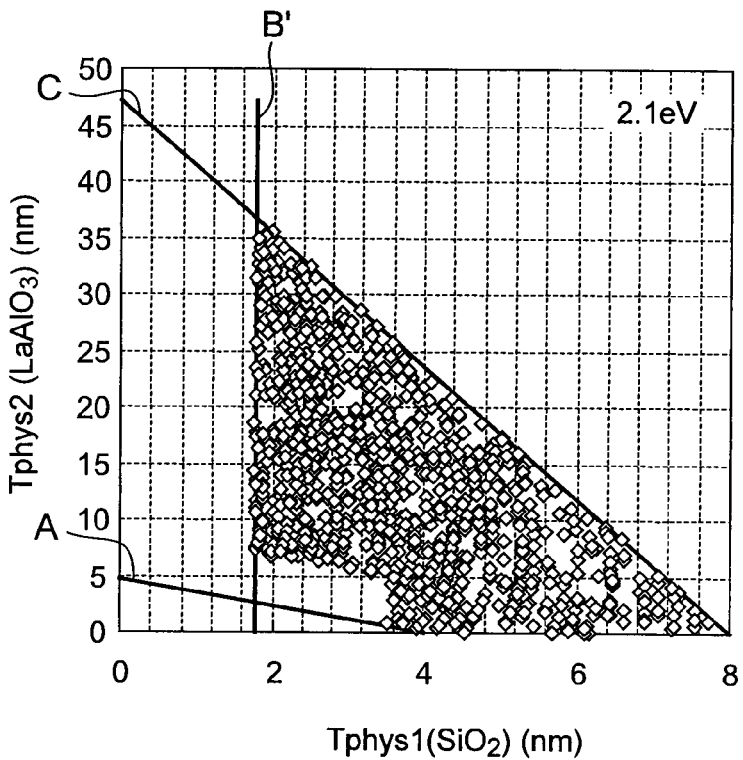
Figure 23M:
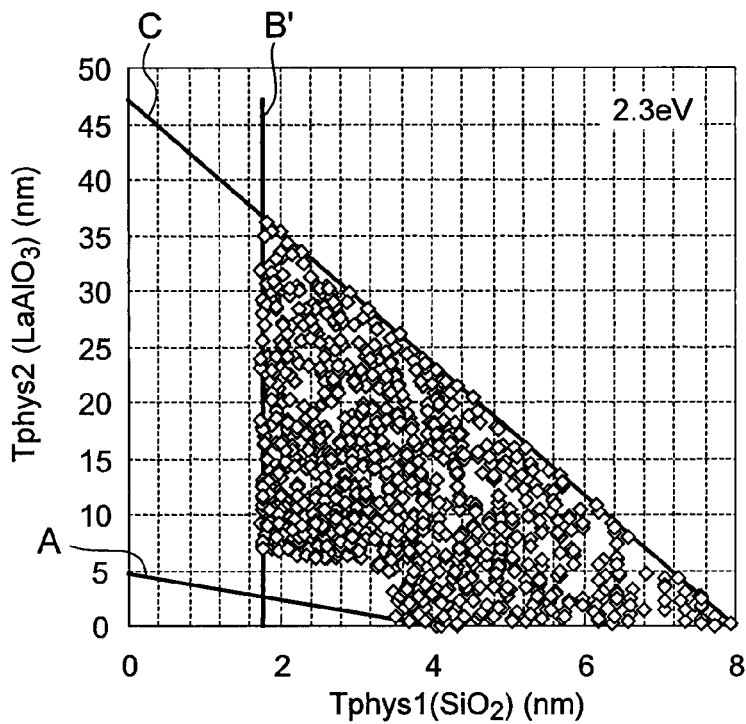
Figure 23N:
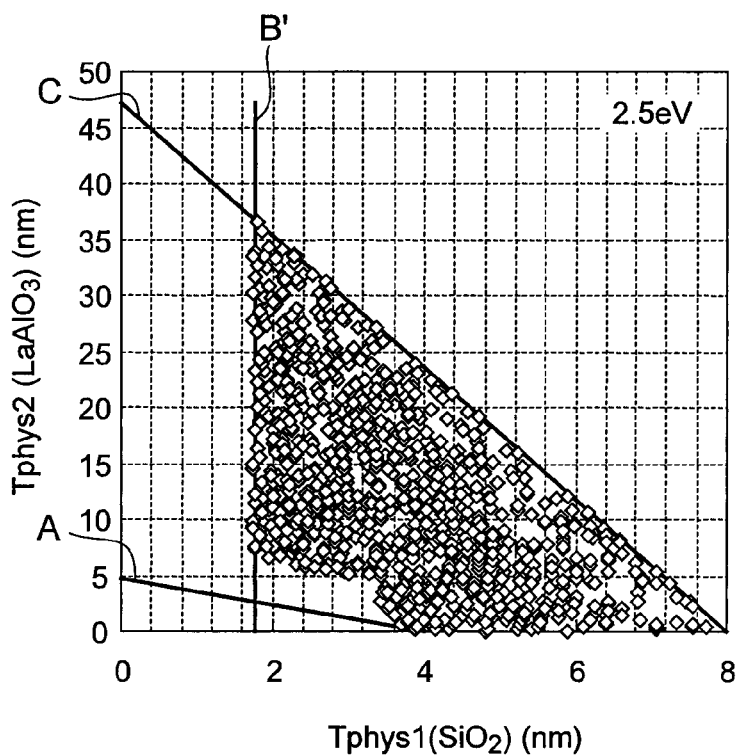
Figure 24:
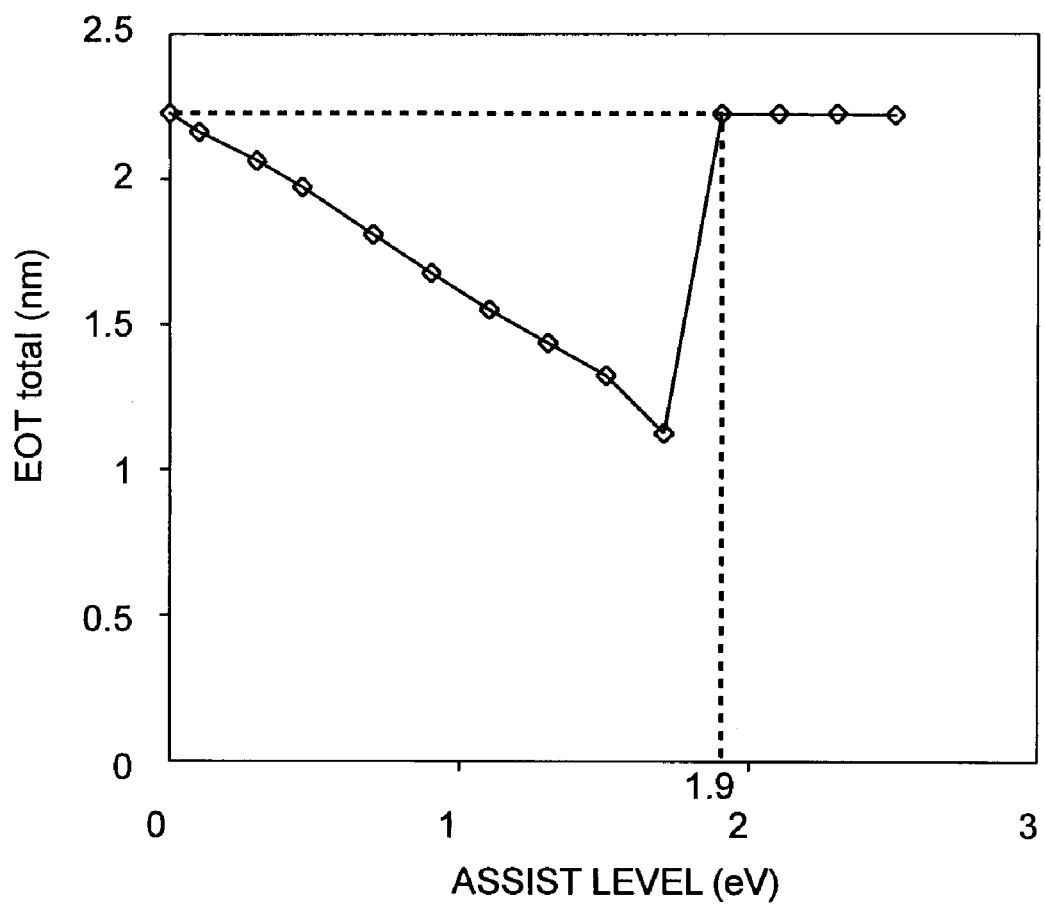
FIG. 24 is a diagram showing the assist level dependency of the EOT of the tunnel insulating film.

FIGS. 23A to 23N show the ranges of the physical film thickness that fulfills the specs that are required in a tunnel insulating film as defined in an embodiment of the present invention at various assist levels in a case where a LaAlO$_3$ layer is selected as the high-k layer, and a SiO$_2$ layer is selected as the low-k layer of the stacked structure. FIGS. 23A to 23N illustrate cases where the assist level in the LaAlO$_3$ layer is 0 eV (no assist levels), 0.1 eV, 0.3 eV, 0.5 eV, 0.7 eV, 0.9 eV, 1.1 eV, 1.3 eV, 1.5 eV, 1.7 eV, 1.9 eV, 2.1 eV, 2.3 eV, and 2.5 eV. FIG. 24 shows the relationship between each of those assist levels and the EOT of the tunnel insulating film.

As can be seen from FIG. 24, in the case where the LaAlO$_3$ layer is selected as the high-k layer, it is preferable that the assist level is greater than 0 eV but is smaller than 1.9 eV. When there is an assist level, the layer thickness of the low-k layer (indicated by the value of the point at which the straight line B intersects with the abscissa axis) can be made smaller than the layer thickness of the low-k layer (indicated by the value of the point at which the straight line B' intersects with the abscissa axis) required in a case where there is not an assist level (see FIGS. 23B to 23J). In this example, a SiO$_2$ layer is used as the low-k layer. However, since SiN (silicon nitride) has a lower dielectric constant than a LaAlO$_3$ layer, a SiN layer can be used as the low-k layer together with a LaAlO$_3$ layer, like a SiO$_2$ layer. In the above description, the low-k layer is a SiO$_2$ layer, and the high-k layer is a LaAlO$_3$ layer. However, the same effects as above can be achieved in a case where the low-k layer is a silicon oxide layer and the high-k layer is a lanthanum aluminate (LaAlO) layer, as long as the assist levels are within the above described ranges.

HfAlO Layer

Figure 25A:
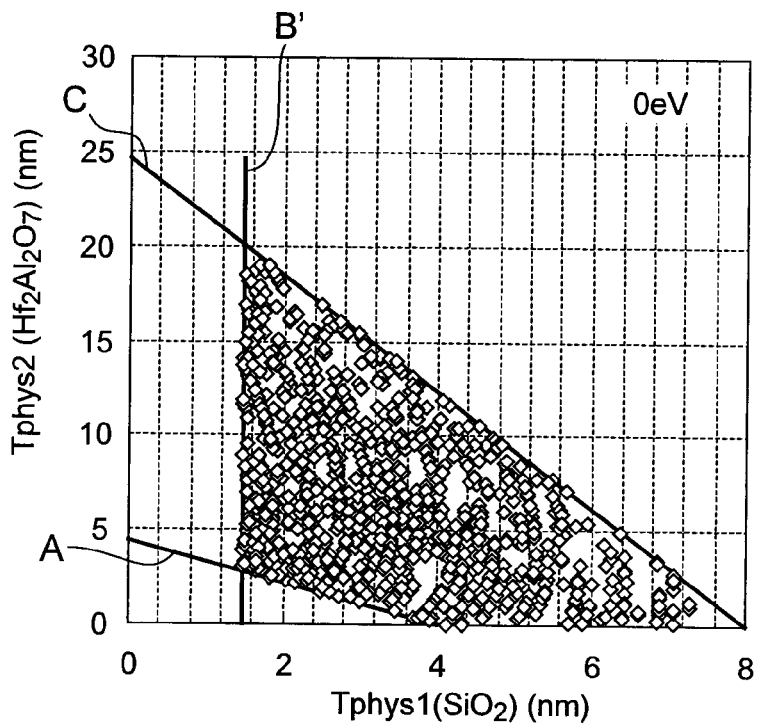
FIGS. 25A to 25O are diagrams showing the ranges of the physical film thicknesses of a SiO$_2$ layer and a Hf$_2$Al$_2$O$_7$ layer in a tunnel insulating film.
Figure 25B:
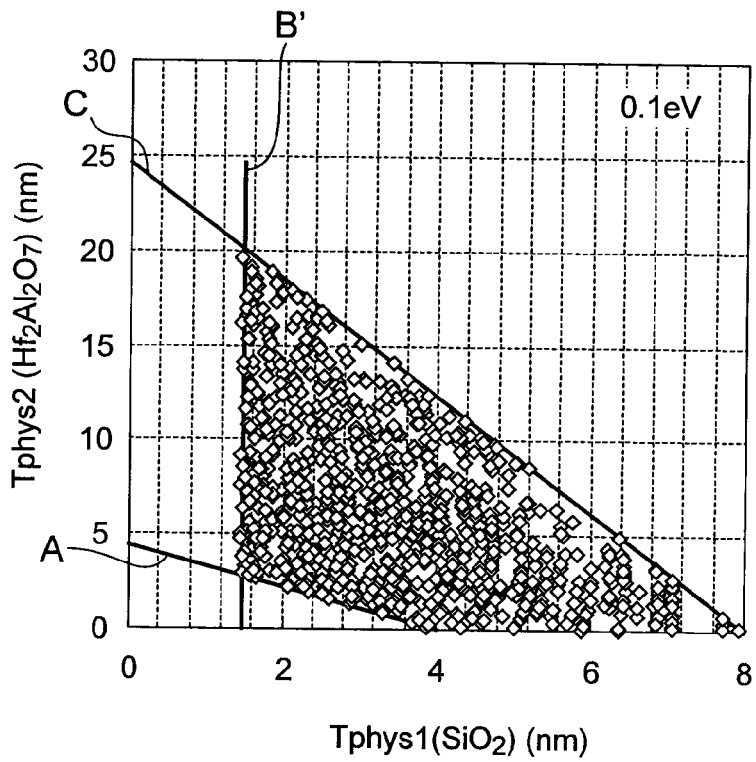
Figure 25C:
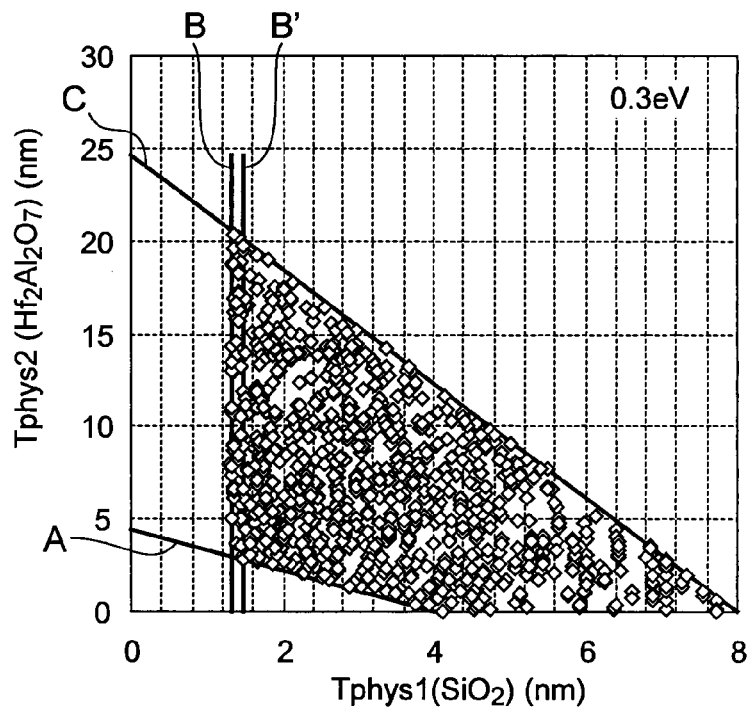
Figure 25D:
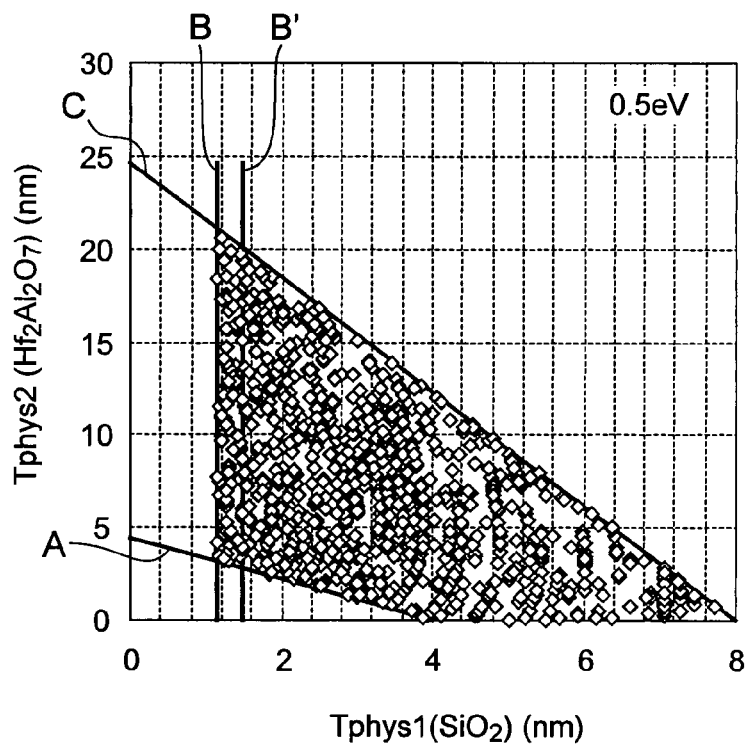
Figure 25E:
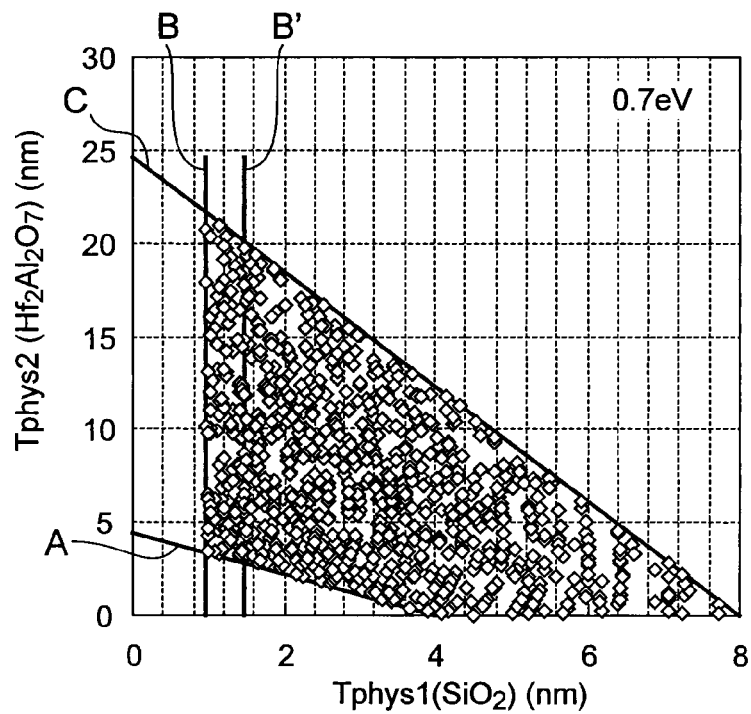
Figure 25F:
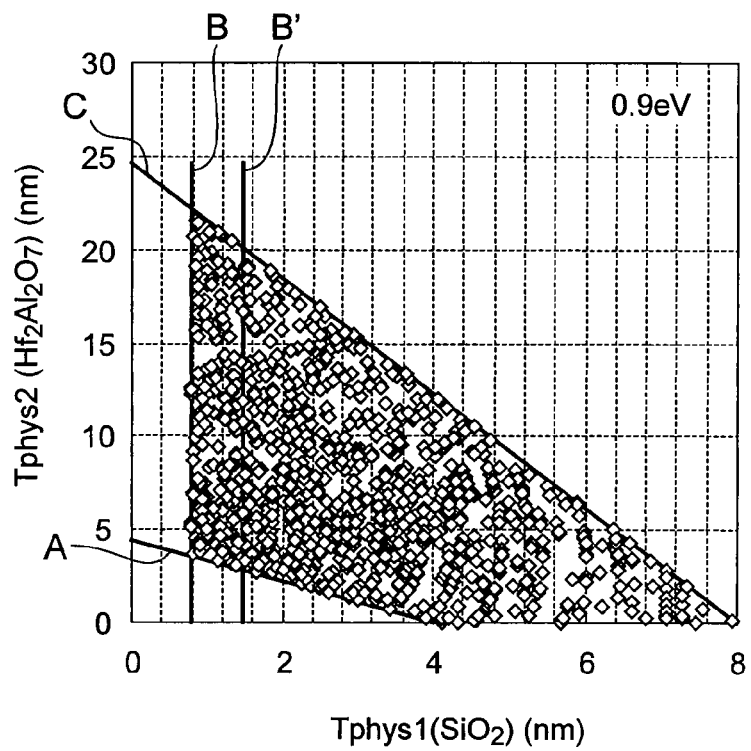
Figure 25G:
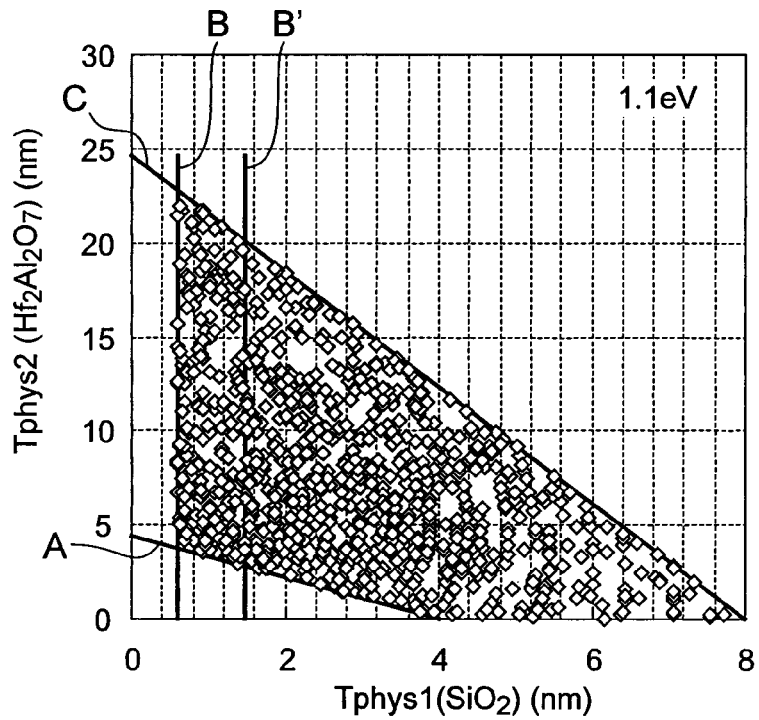
Figure 25H:
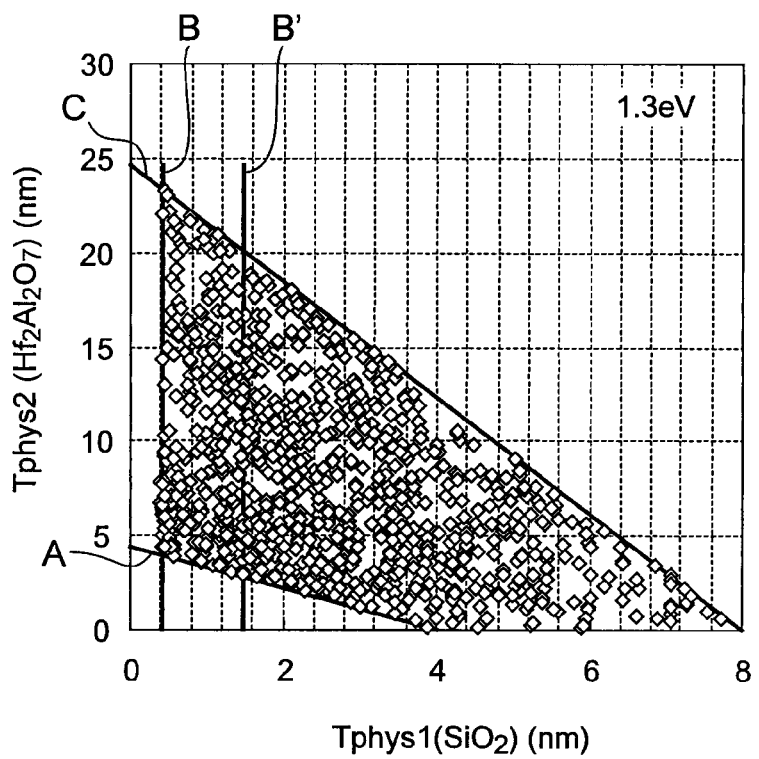
Figure 25I:
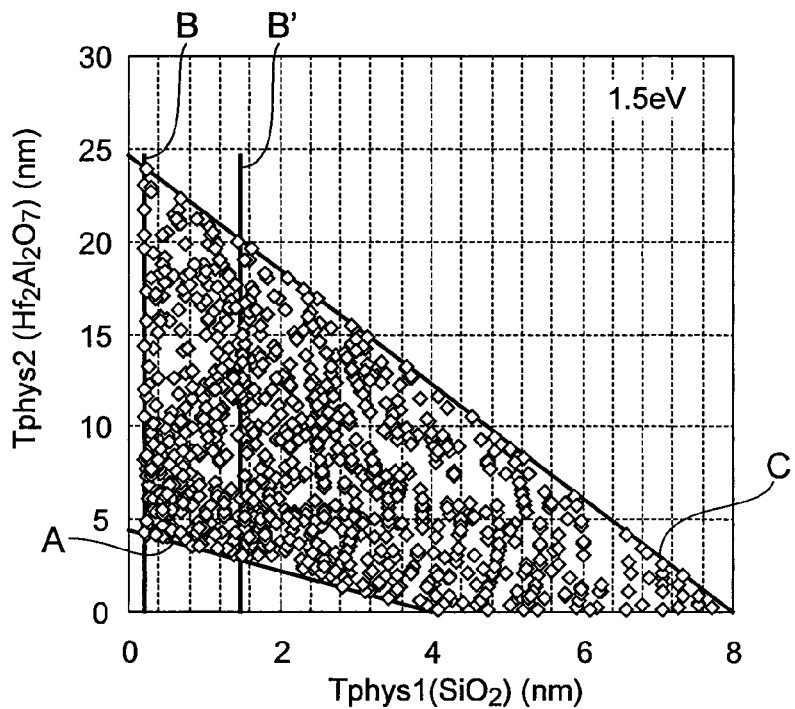
Figure 25J:
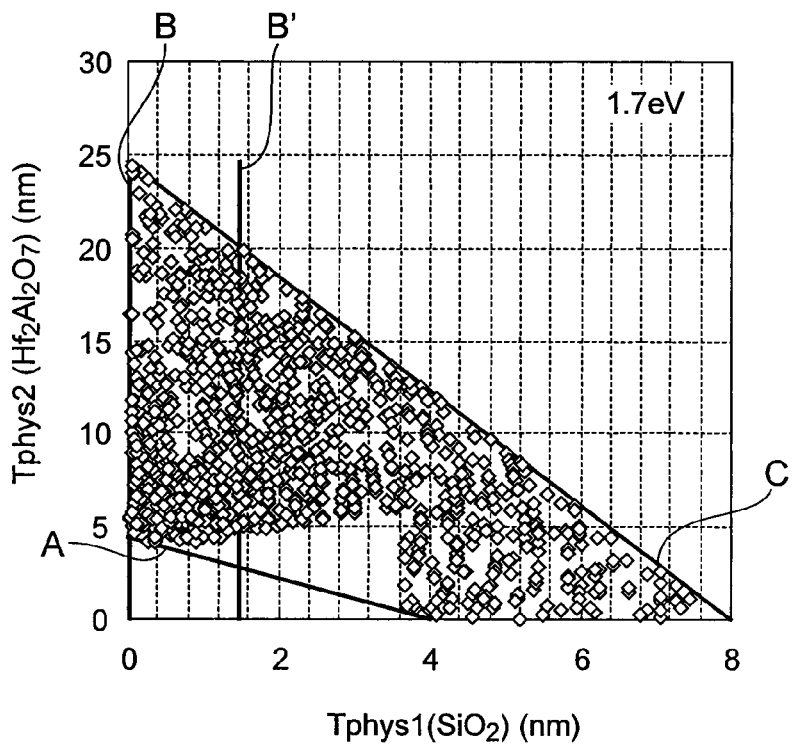
Figure 25K:
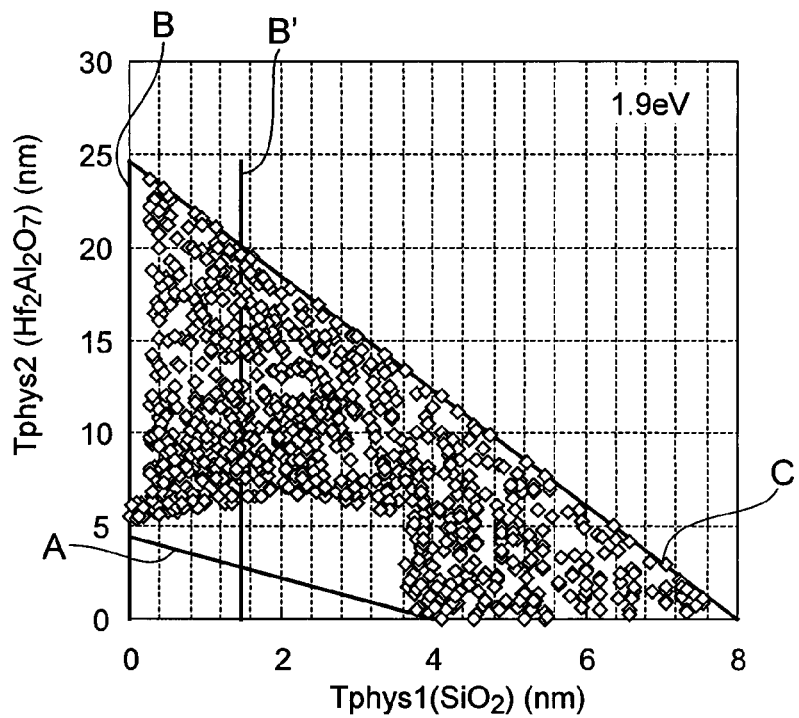
Figure 25L:
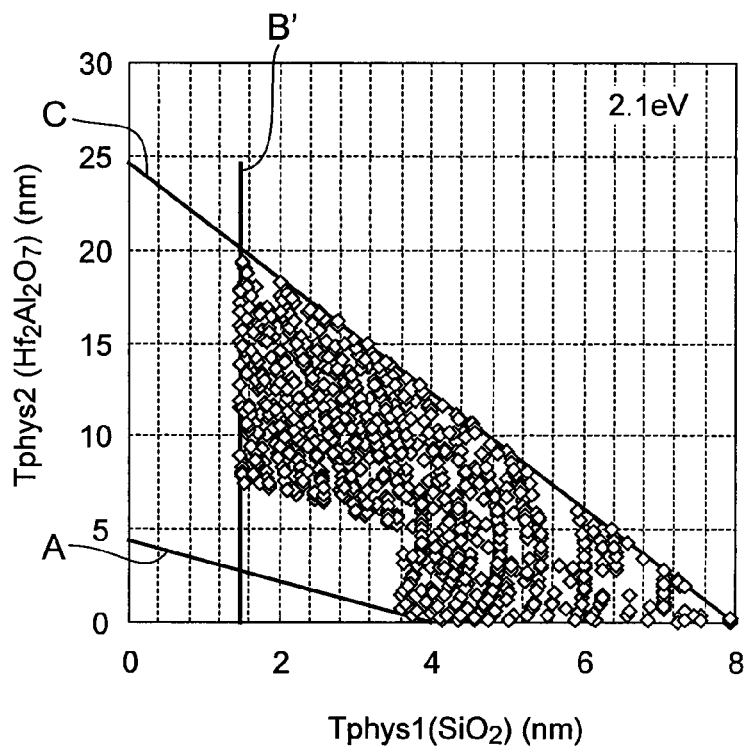
Figure 25M:
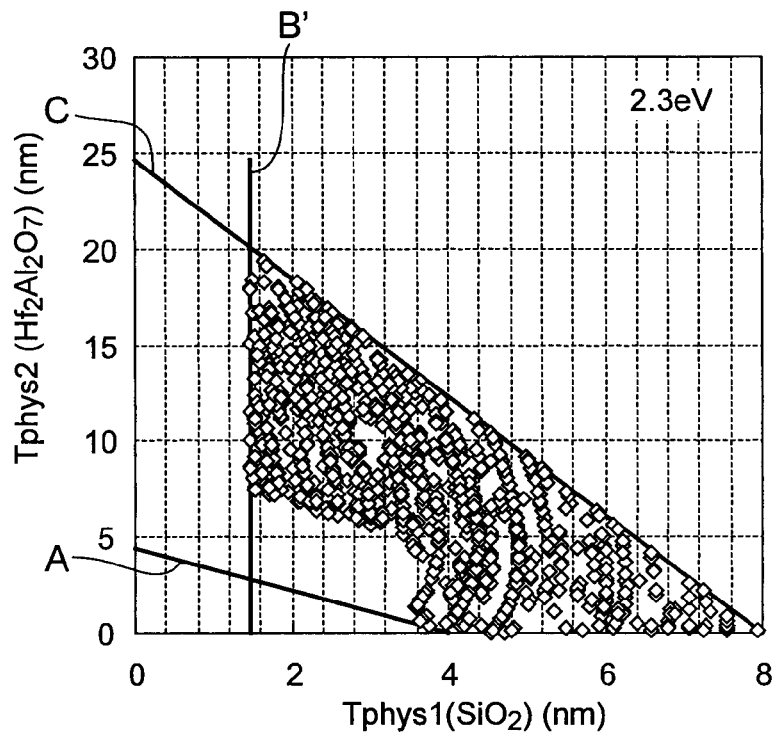
Figure 25N:
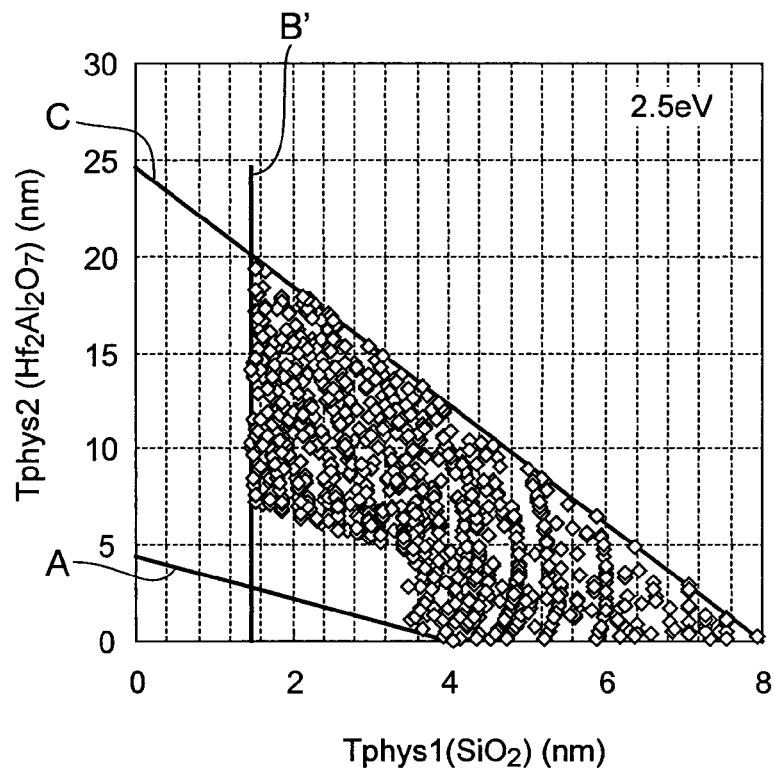
Figure 25O:
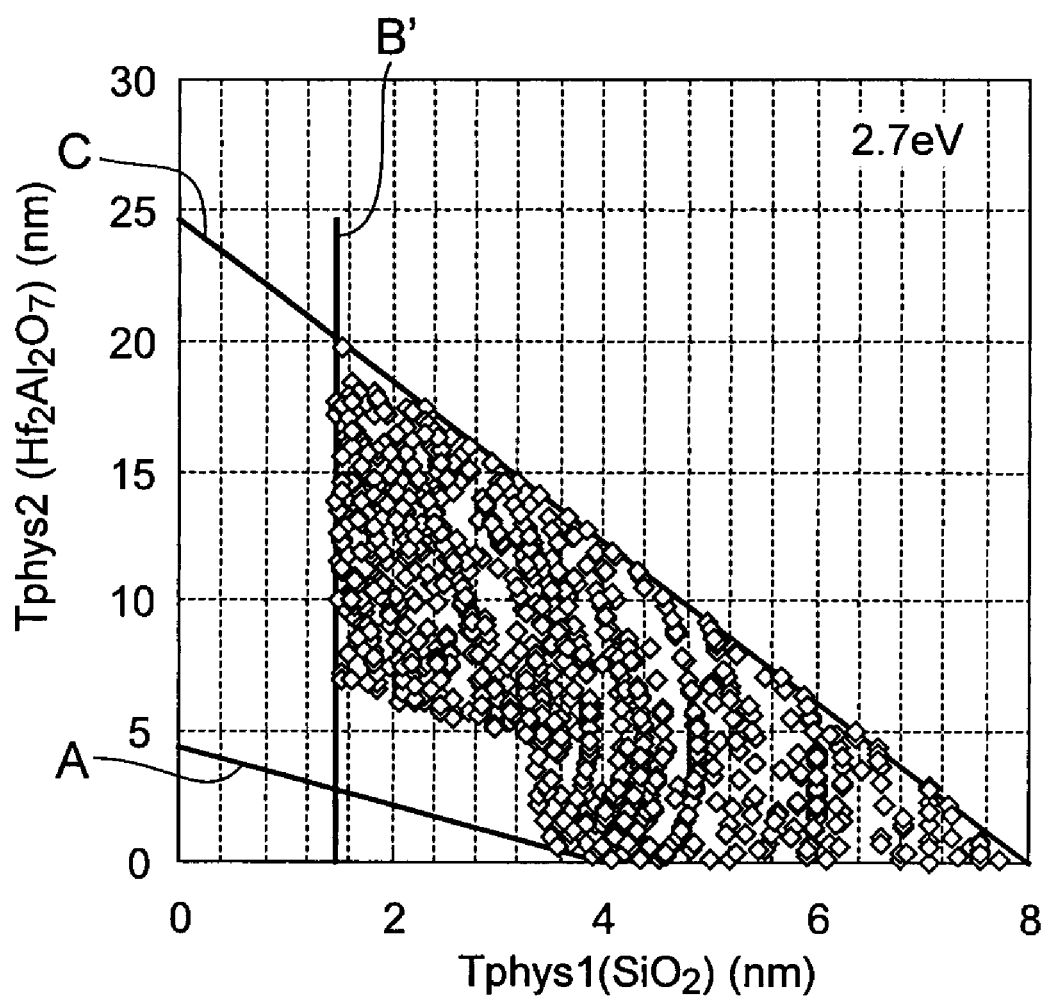
Figure 26:
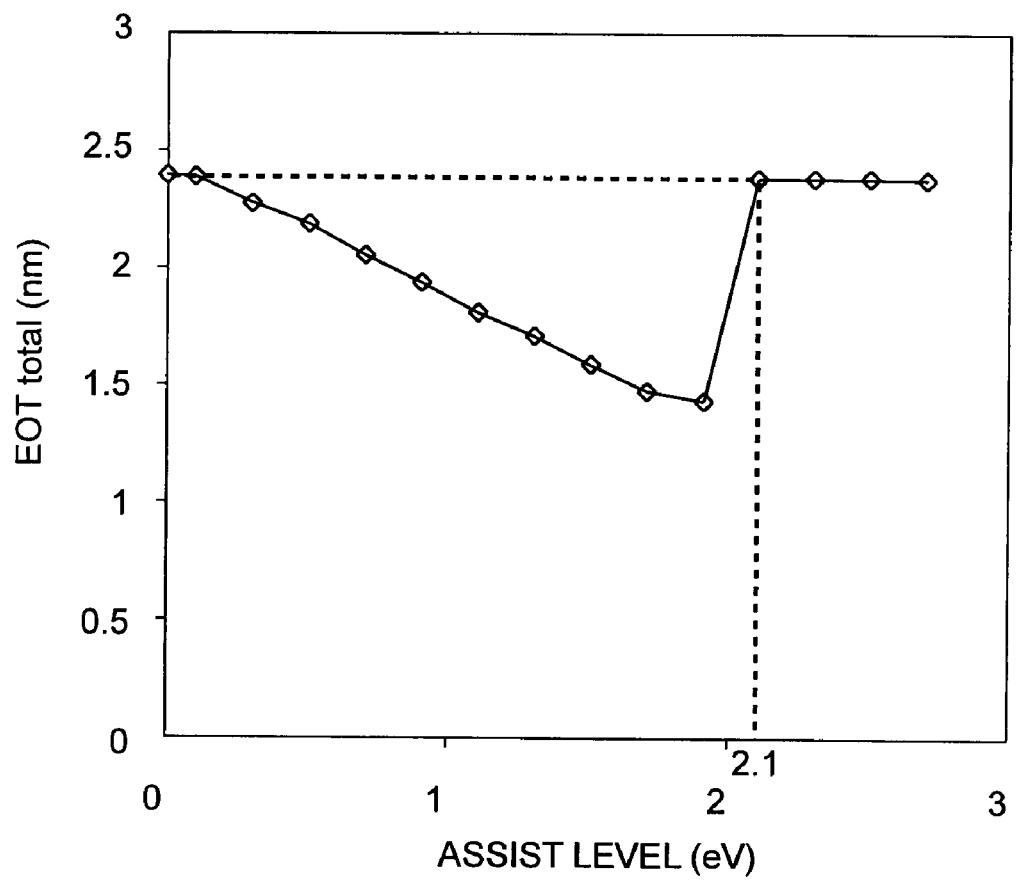
FIG. 26 is a diagram showing the assist level dependency of the EOT of the tunnel insulating film.
Figure 27A:
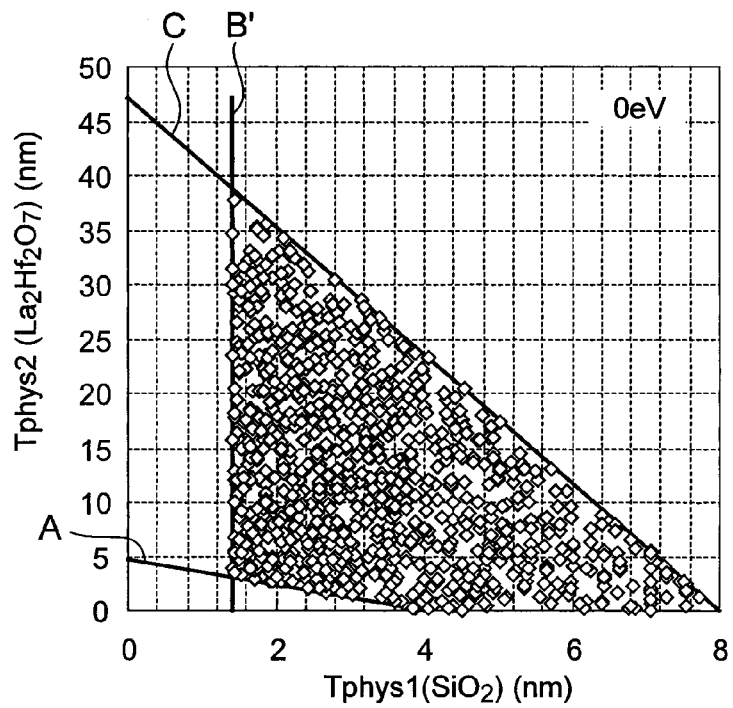
FIGS. 27A to 27M are diagrams showing the ranges of the physical film thicknesses of a SiO$_2$ layer and a La$_2$Hf$_2$O$_7$ layer in a tunnel insulating film.
Figure 27B:
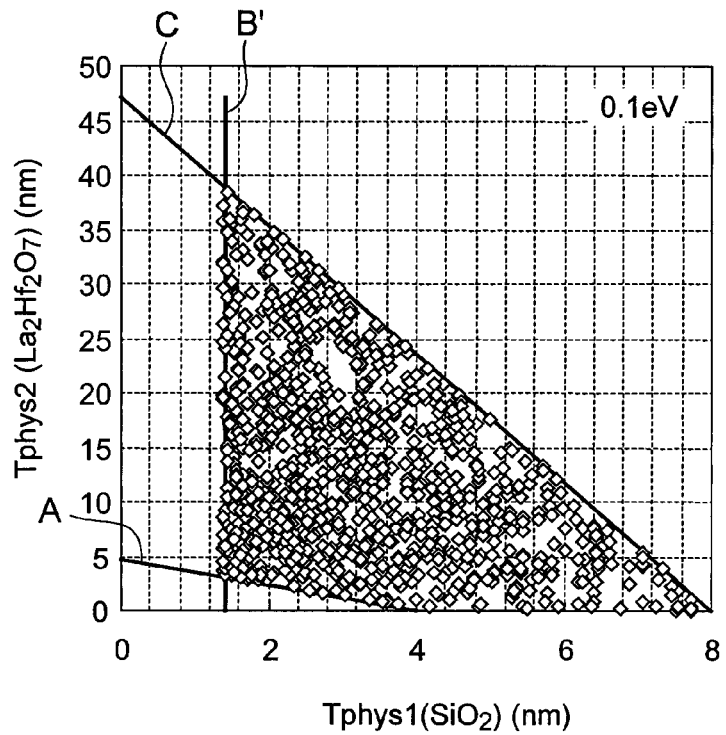
Figure 27C:
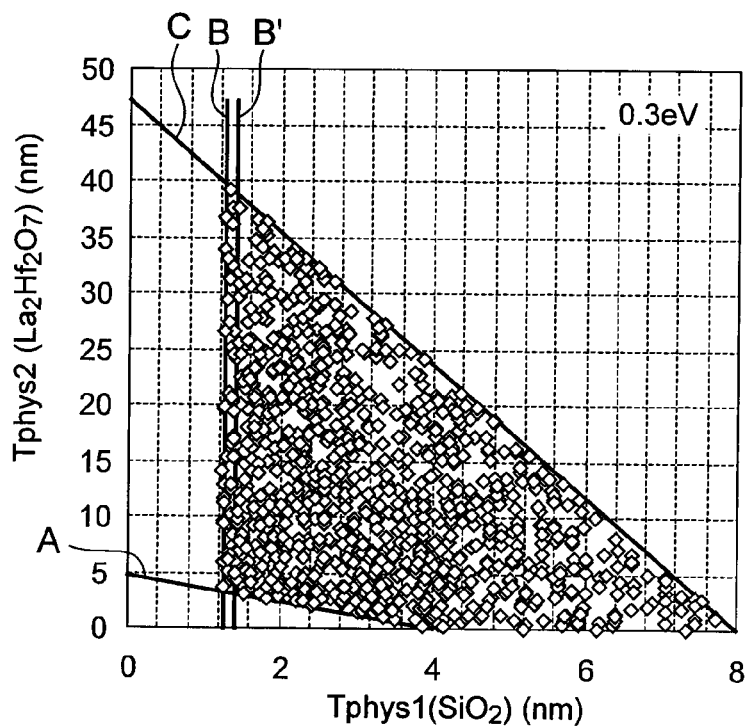
Figure 27D:
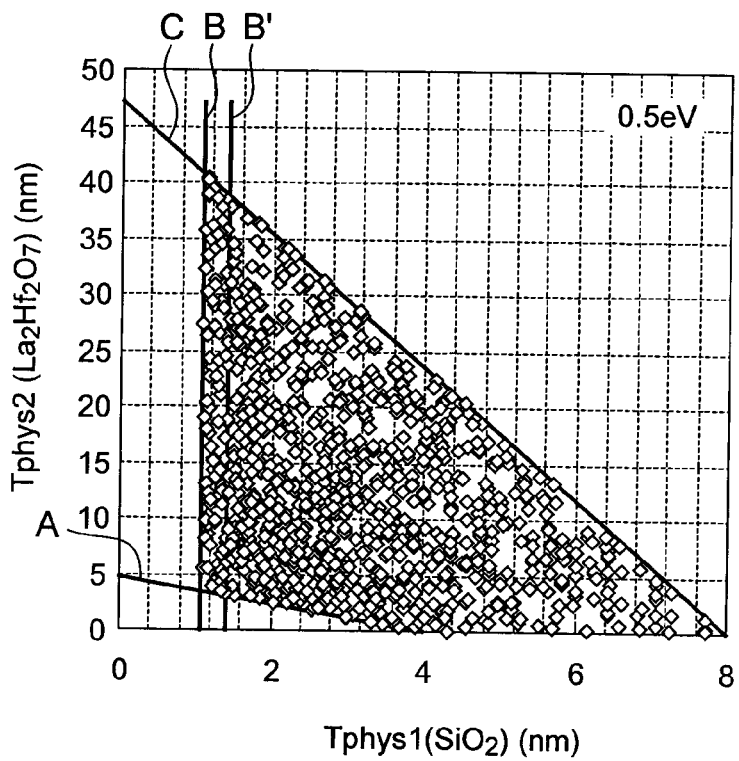
Figure 27E:
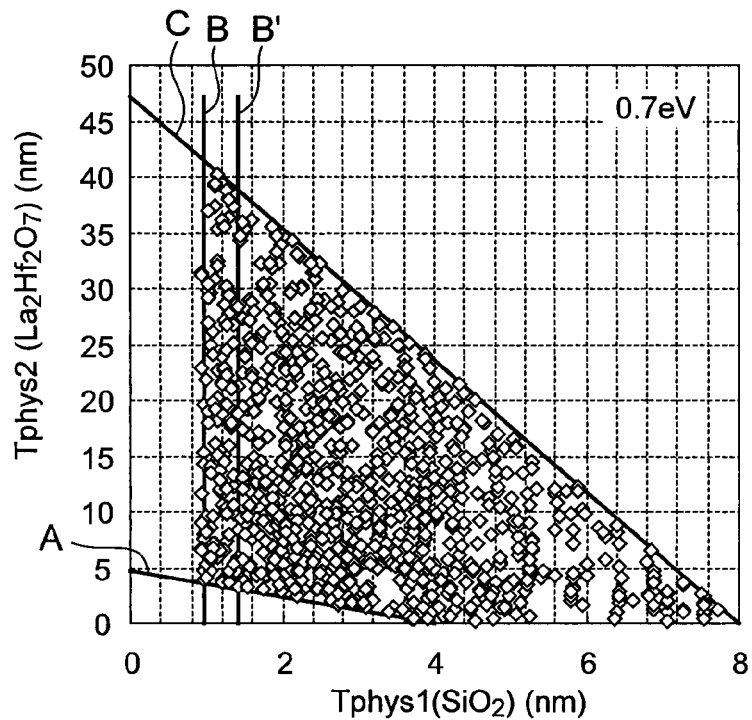
Figure 27F:
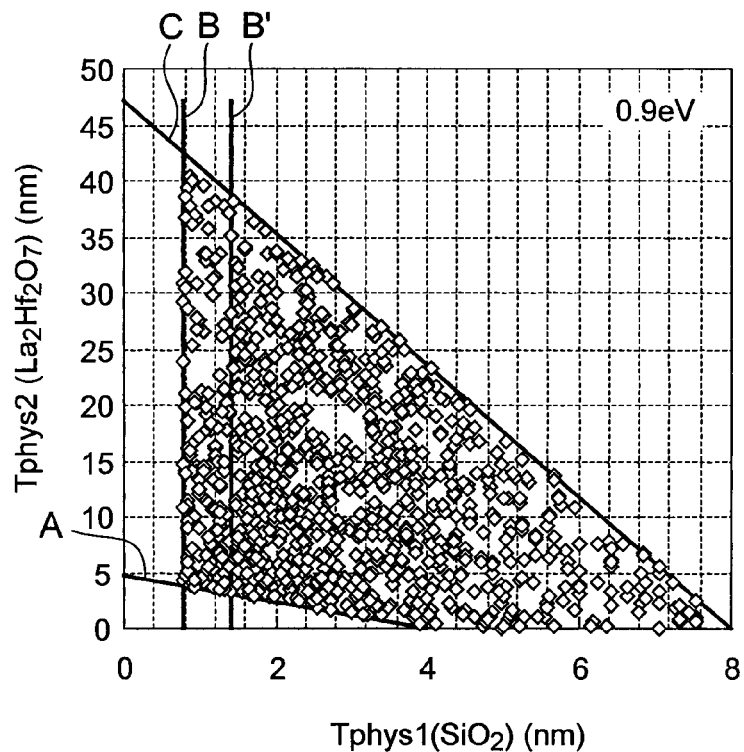
Figure 27G:
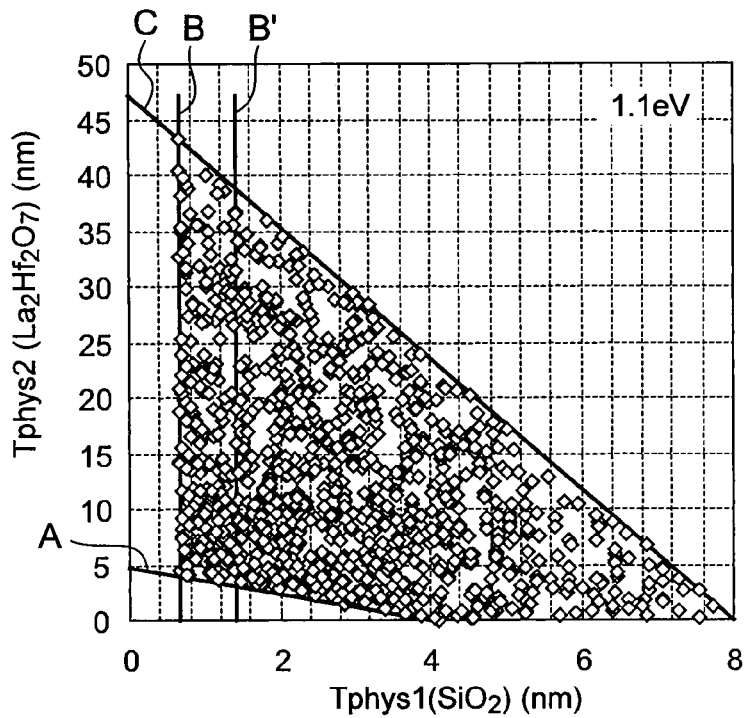
Figure 27H:
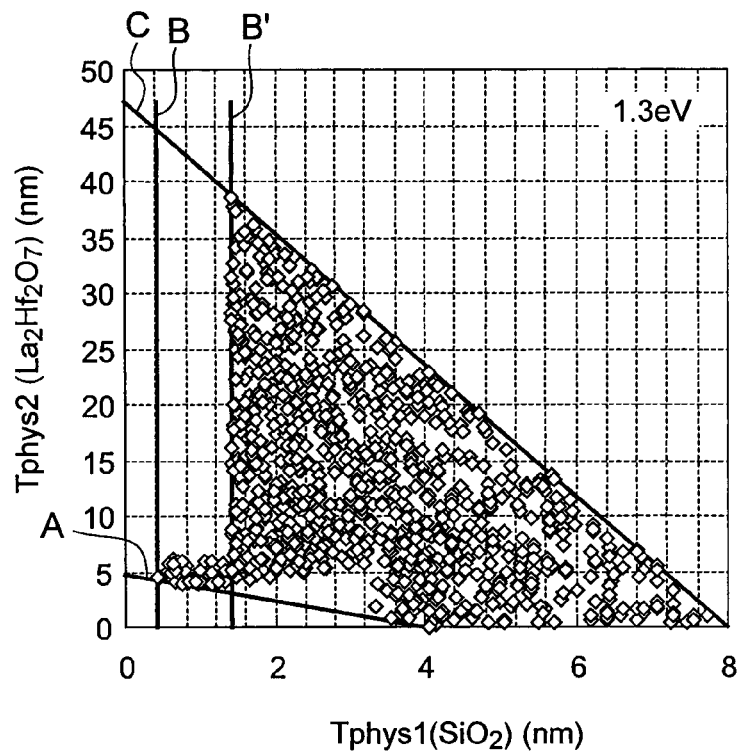
Figure 27I:
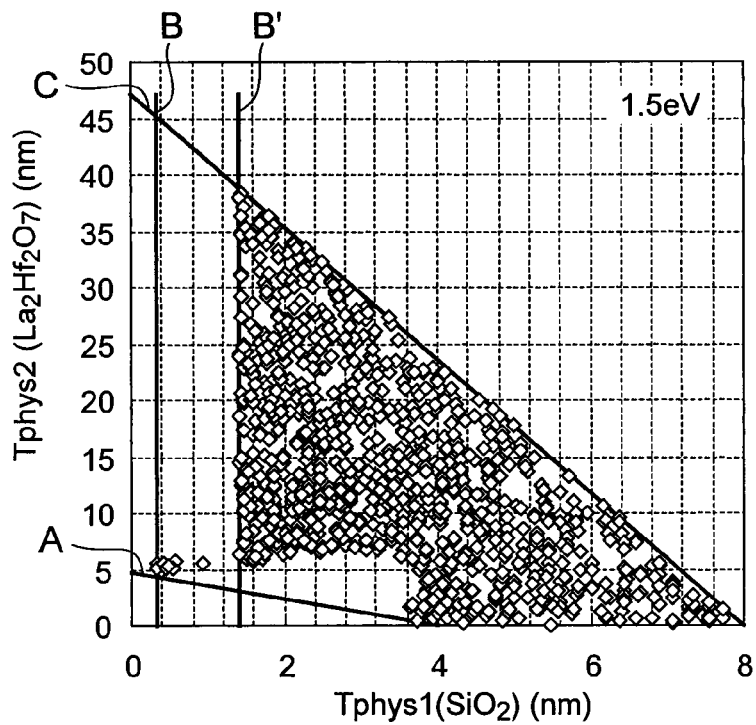
Figure 27J:
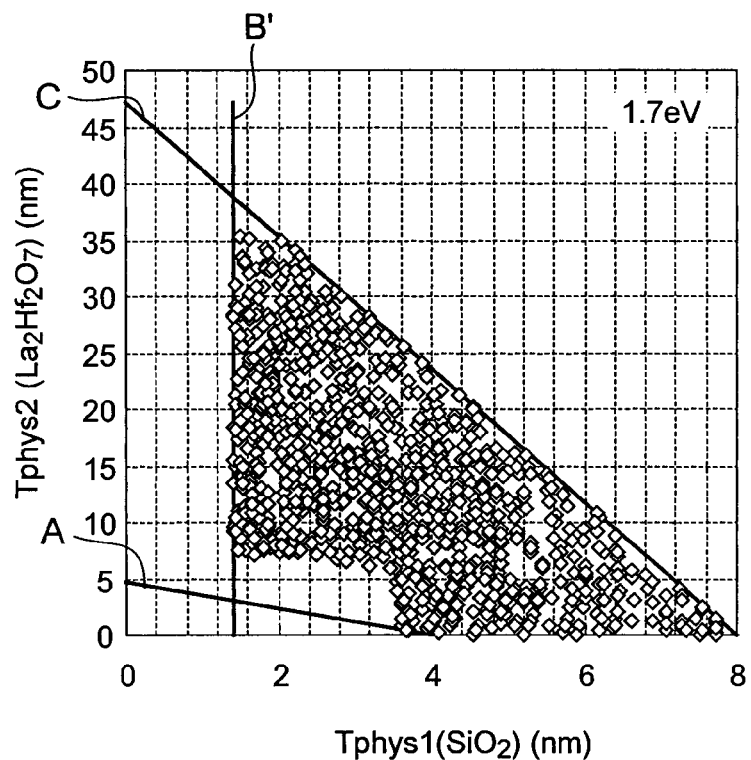
Figure 27K:
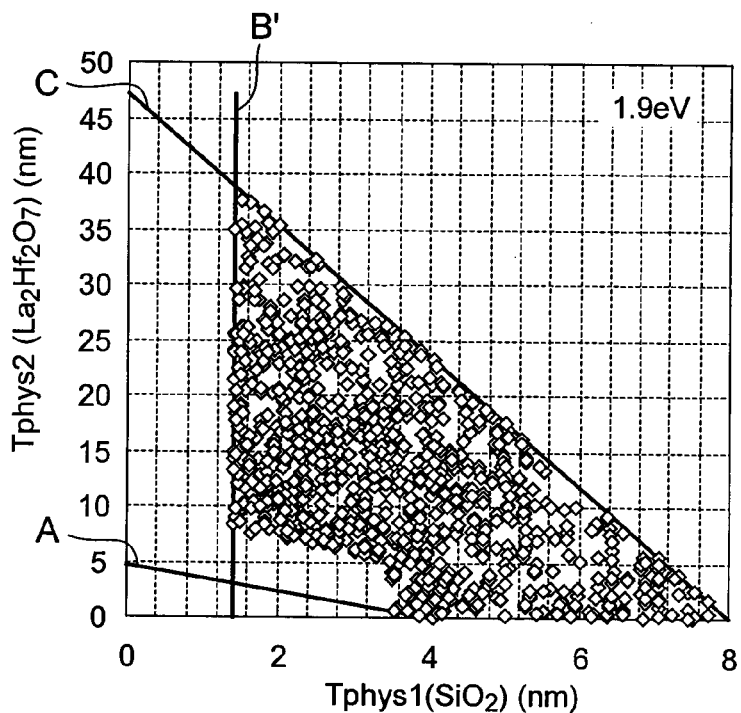
Figure 27L:
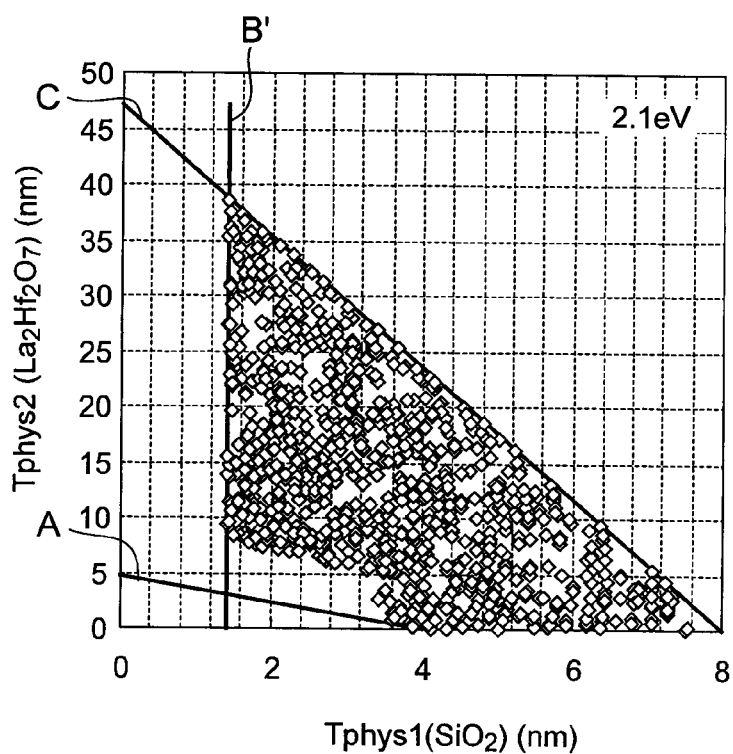
Figure 27M:
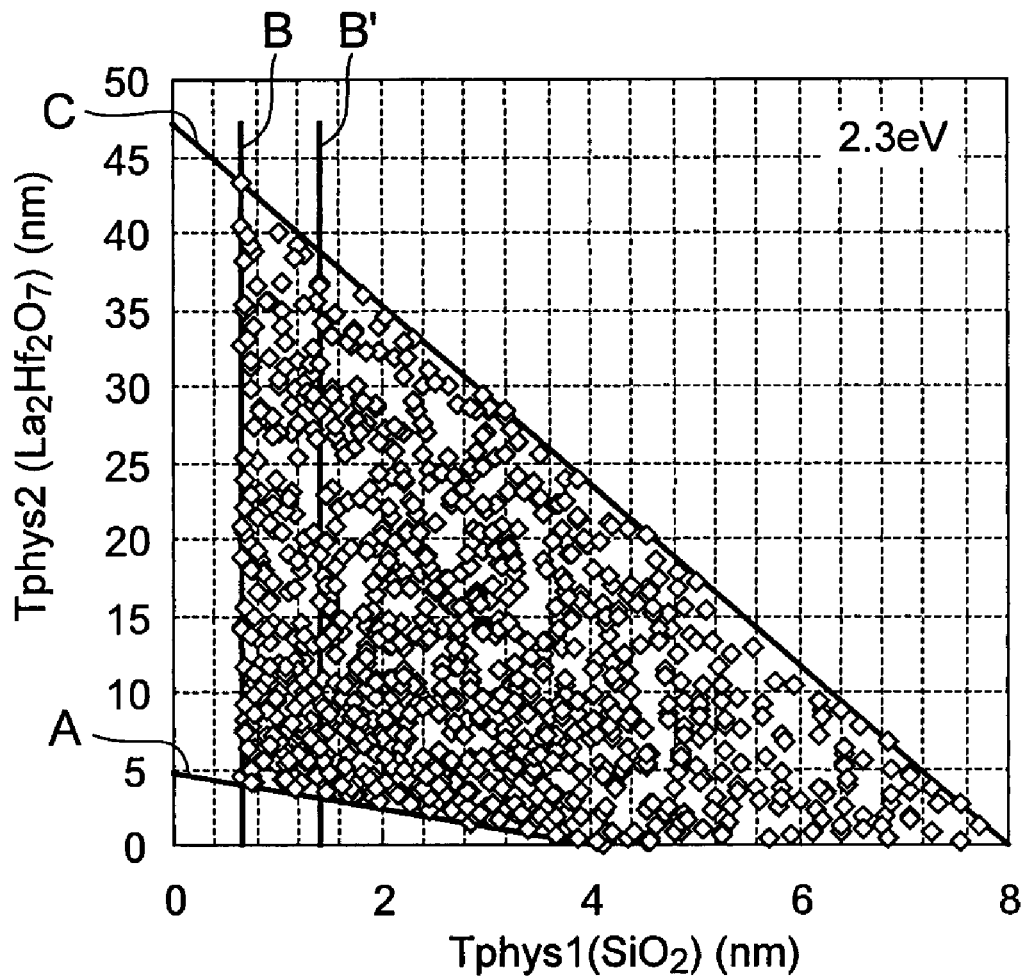

FIGS. 25A to 25O show the ranges of the physical film thickness that fulfills the specs that are required in a tunnel insulating film as defined in an embodiment of the present invention at various assist levels in a case where a Hf$_2$Al$_2$O$_7$ ((HfO$_2$)$_{2/3}$(Al$_2$O$_3$)$_{1/3}$) layer is selected as the high-k layer, and a SiO$_2$ layer is selected as the low-k layer of the stacked structure. FIGS. 25A to 25O illustrate cases where the assist level in the Hf$_2$Al$_2$O$_7$ layer is 0 eV (no assist levels), 0.1 eV, 0.3 eV, 0.5 eV, 0.7 eV, 0.9 eV, 1.1 eV, 1.3 eV, 1.5 eV, 1.7 eV, 1.9 eV, 2.1 eV, 2.3 eV, 2.5 eV, and 2.7 eV. FIG. 26 shows the relationship between each of those assist levels and the EOT of the tunnel insulating film.

As can be seen from FIG. 26, in the case where the Hf$_2$Al$_2$O$_7$ layer is selected as the high-k layer, it is preferable that the assist level is greater than 0.1 eV but is equal to or smaller than 2.1 eV. When there is an assist level in the Hf$_2$Al$_2$O$_7$ layer, the layer thickness of the low-k layer (indicated by the value of the point at which the straight line B intersects with the abscissa axis) can be made smaller than the layer thickness of the low-k layer (indicated by the value of the point at which the straight line B' intersects with the abscissa axis) required in a case where there is not an assist level (see FIGS. 25C to 25K). If there is an assist level in the range of 1.5 eV to 1.7 eV in the Hf$_2$Al$_2$O$_7$ layer, a tunnel insulating film can be formed only with the Hf$_2$Al$_2$O$_7$ layer, and the SiO$_2$ layer is not necessary (see FIGS. 25J to 25K). If there is an assist level in the range of 2.1 eV to 2.7 eV in the Hf$_2$Al$_2$O$_7$ layer, however, the EOT cannot be minimized. In this example, a SiO$_2$ layer is used as the low-k layer. However, since SiN (silicon nitride) has a lower dielectric constant than a Hf$_2$Al$_2$O$_7$ layer, a SiN layer can be used as the low-k layer together with a Hf$_2$Al$_2$O$_7$ layer, like a SiO$_2$ layer. In the above description, the low-k layer is a SiO$_2$ layer, and the high-k layer is a Hf$_2$Al$_2$O$_7$ layer. However, the same effects as above can be achieved in a case where the low-k layer is a silicon oxide layer and the high-k layer is a hafnium aluminate (HfAlO) layer, as long as the assist levels are within the above described ranges.

LaHfO Layer

Figure 28:
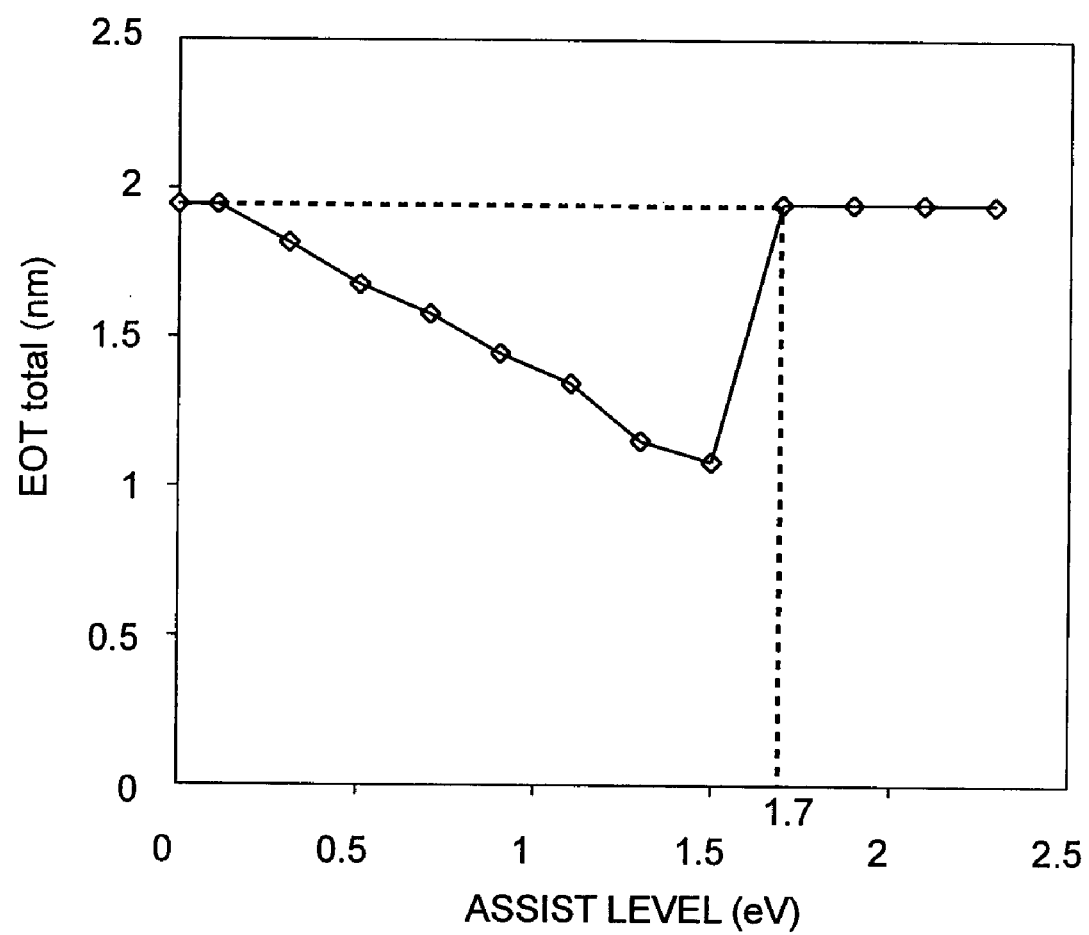
FIG. 28 is a diagram showing the assist level dependency of the EOT of the tunnel insulating film.
Figure 29A:
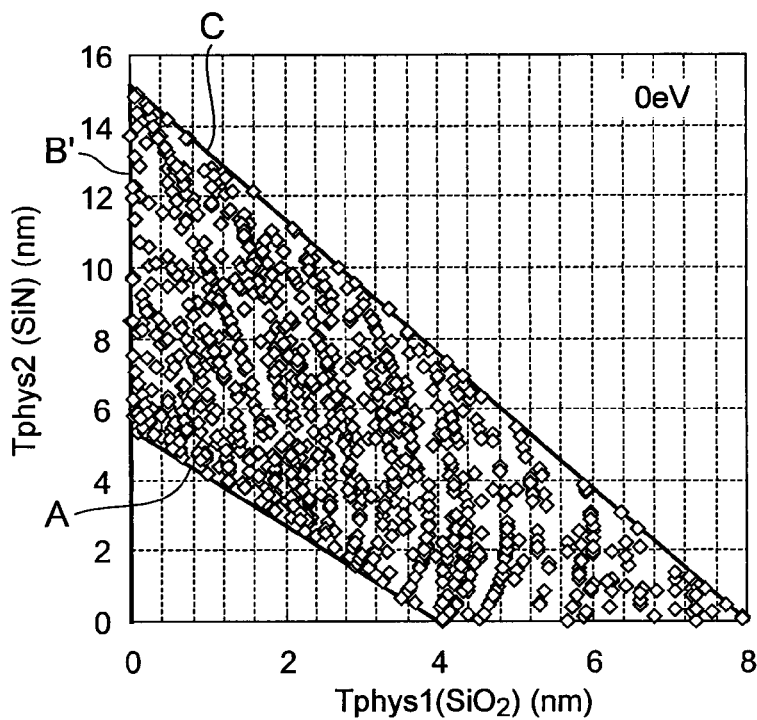
FIGS. 29A to 29K are diagrams showing the ranges of the physical film thicknesses of a SiO$_2$ layer and a SiN layer in a tunnel insulating film.
Figure 29B:
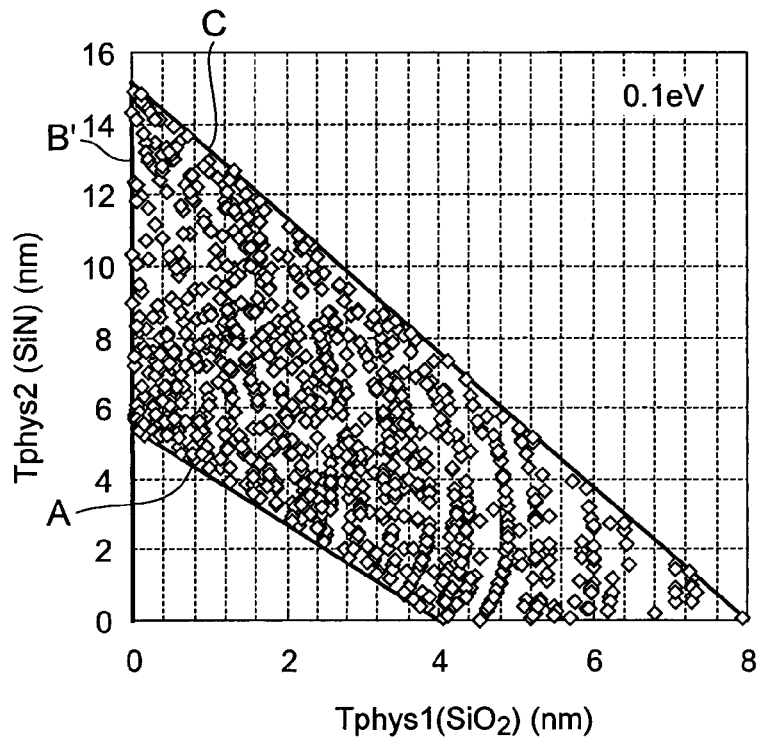
Figure 29C:
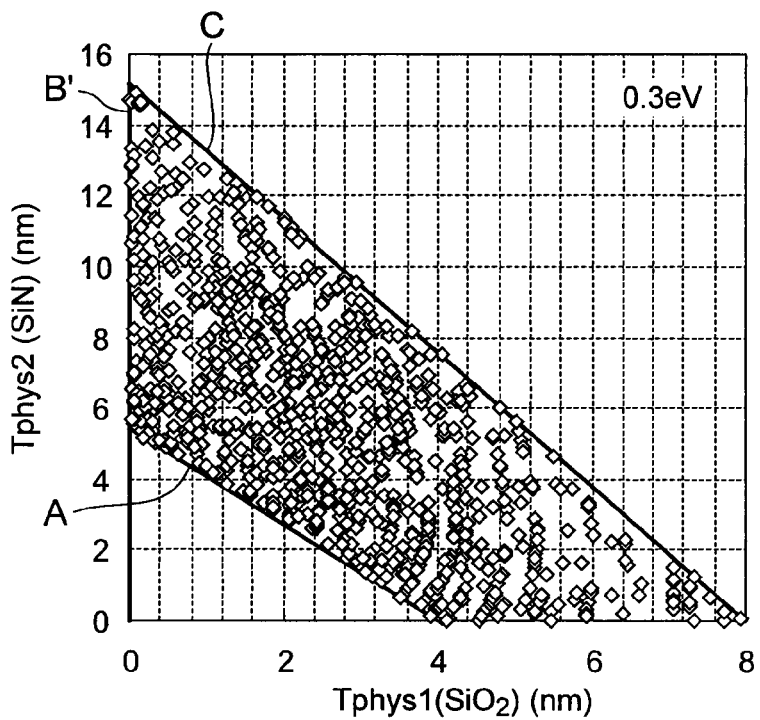
Figure 29D:
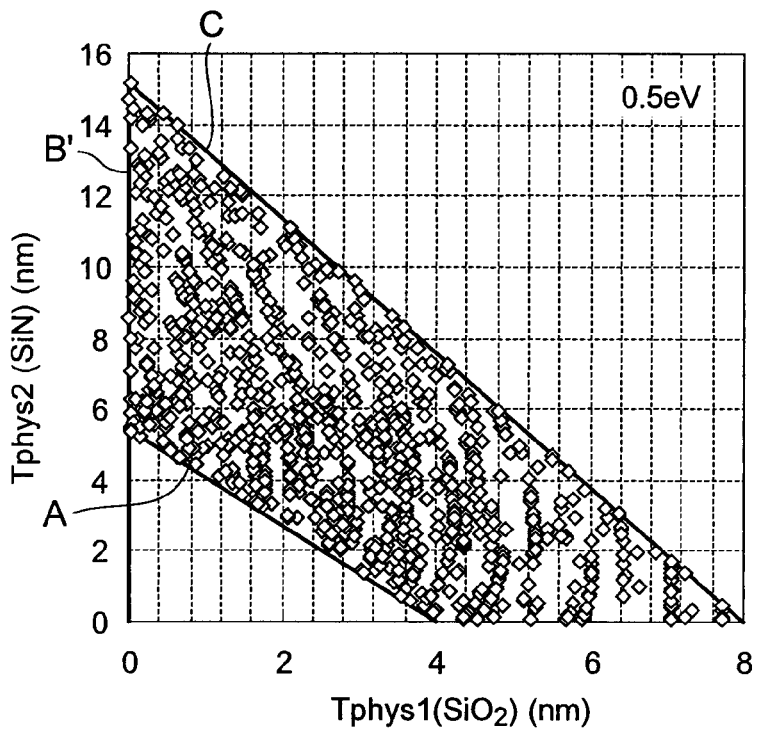
Figure 29E:
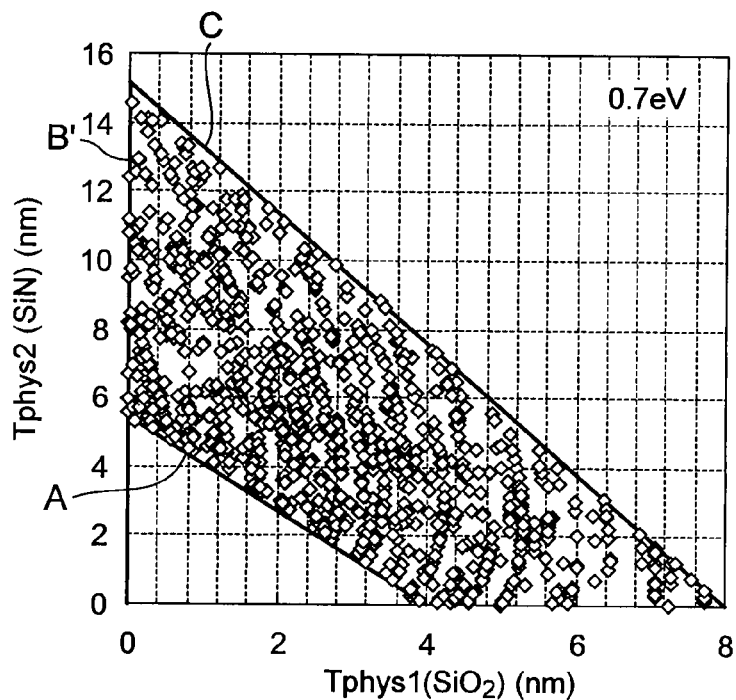
Figure 29F:
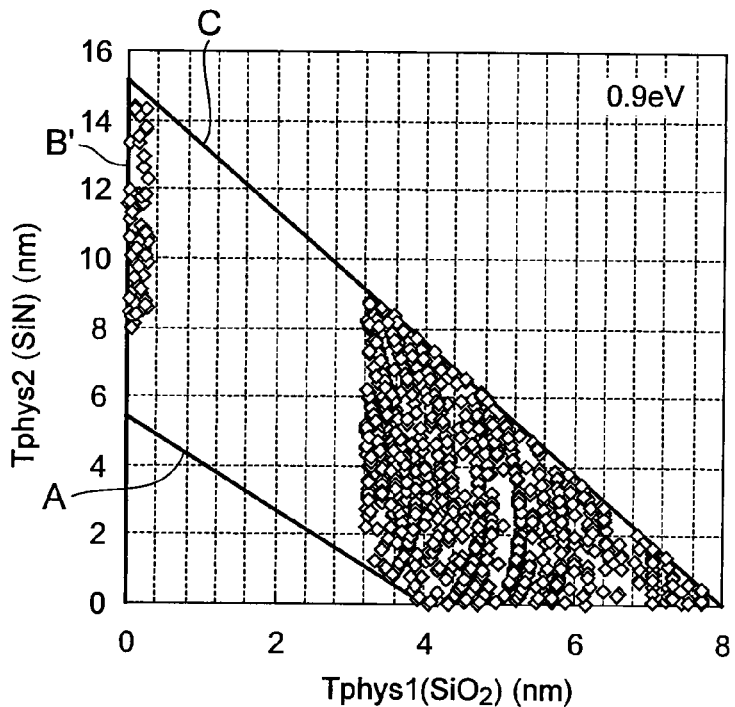
Figure 29G:
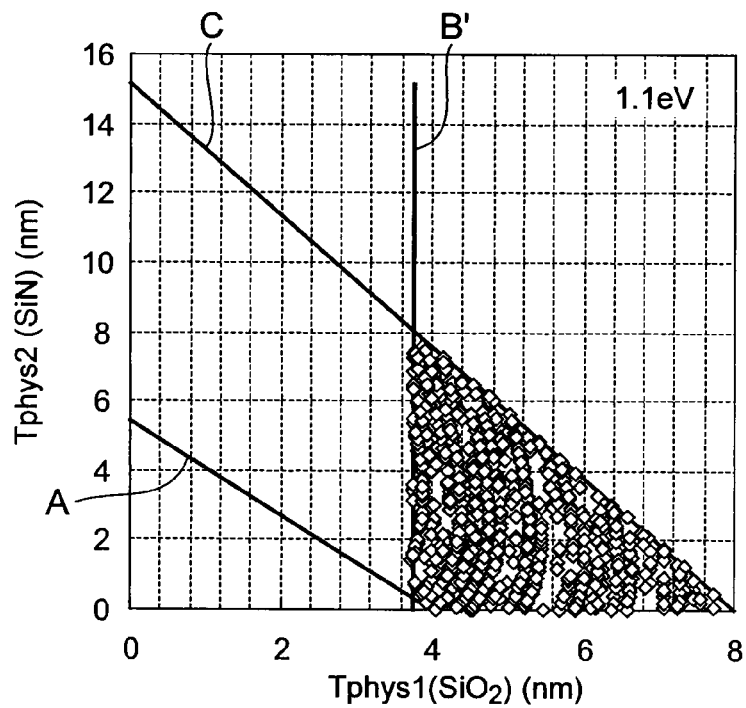
Figure 29H:
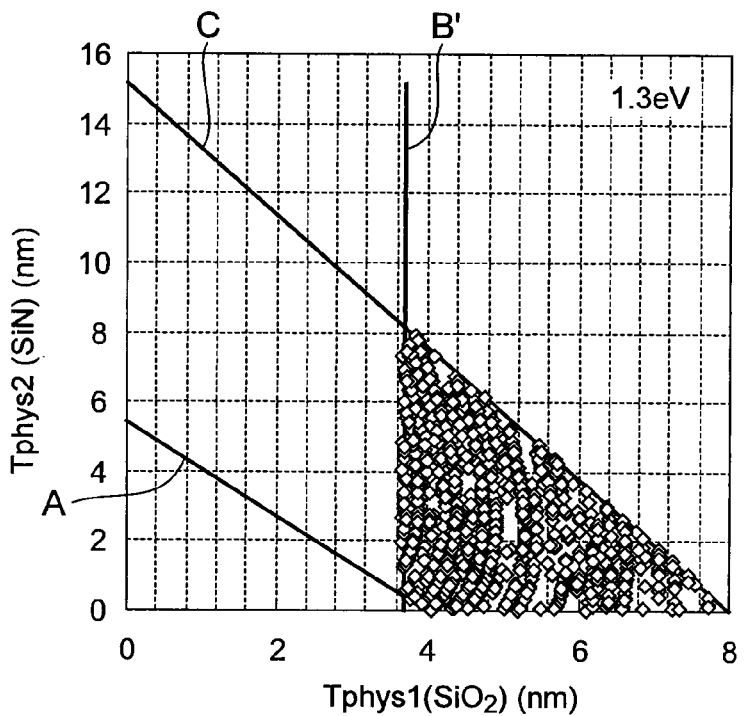
Figure 29I:
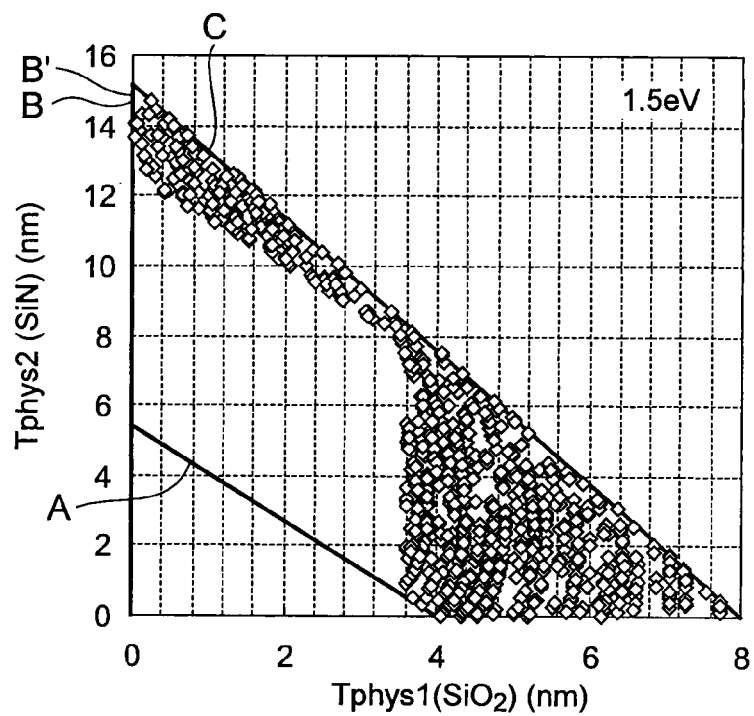
Figure 29J:
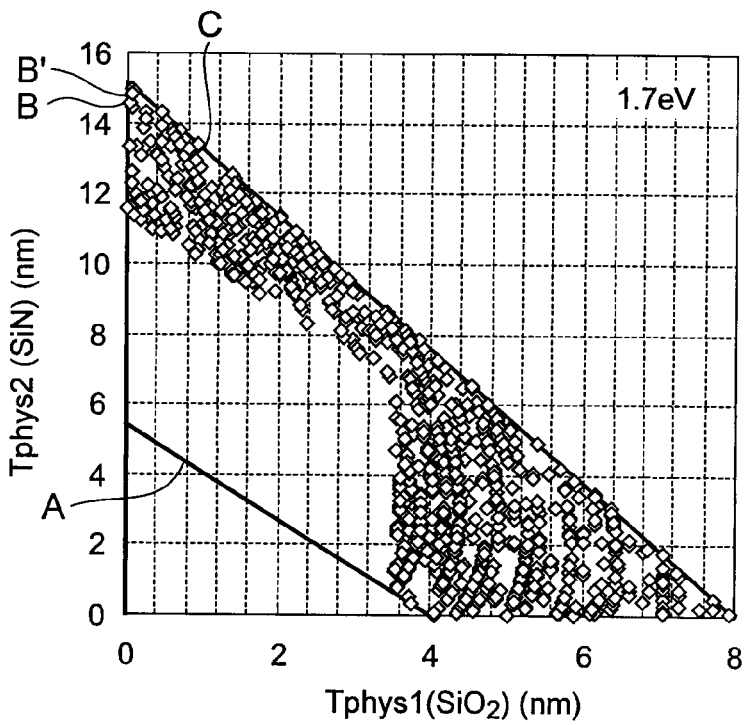
Figure 29K:
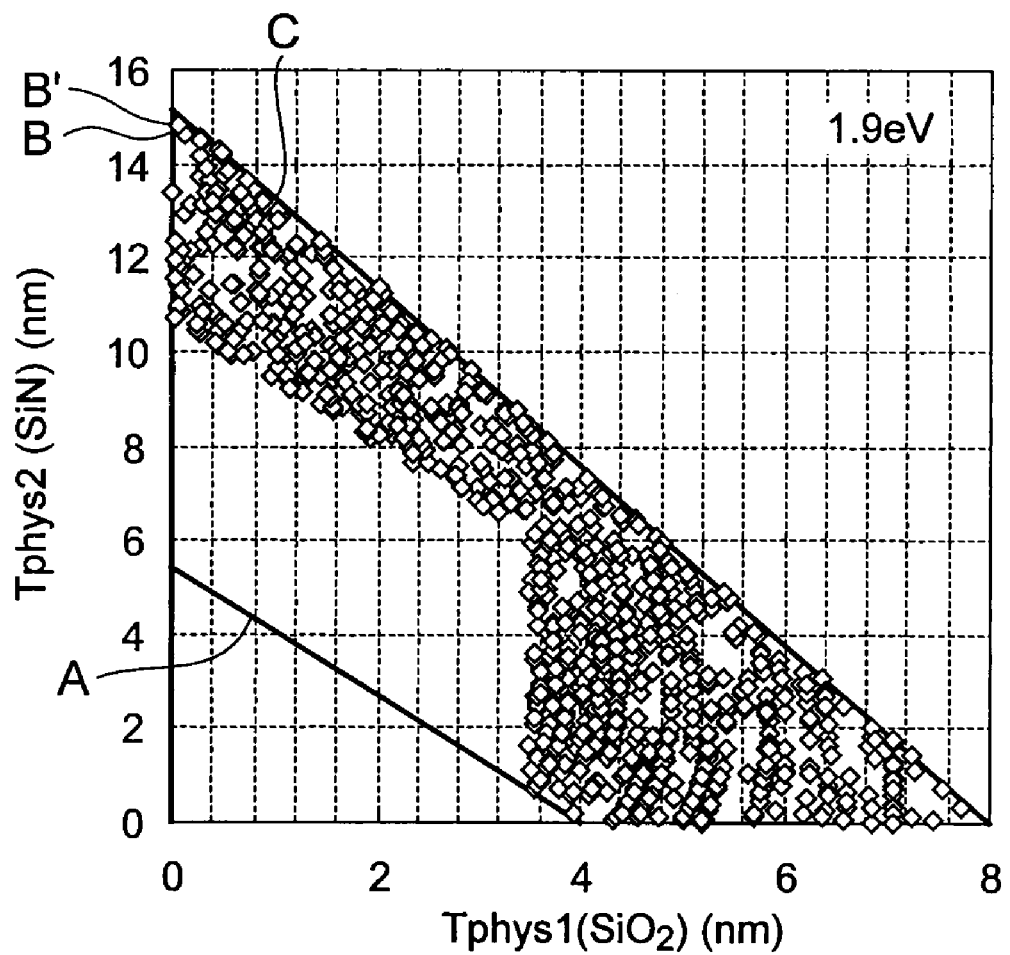

FIGS. 27A to 27M show the ranges of the physical film thickness that fulfills the specs that are required in a tunnel insulating film as defined in an embodiment of the present invention at various assist levels in a case where a La$_2$Hf$_2$O$_7$ layer is selected as the high-k layer, and a SiO$_2$ layer is selected as the low-k layer of the stacked structure. FIGS. 27A to 27M illustrate cases where the assist level in the La$_2$Hf$_2$O$_7$ layer is 0 eV (no assist levels), 0.1 eV, 0.3 eV, 0.5 eV, 0.7 eV, 0.9 eV, 1.1 eV, 1.3 eV, 1.5 eV, 1.7 eV, 1.9 eV, 2.1 eV, and 2.3 eV. FIG. 28 shows the relationship between each of those assist levels and the EOT of the tunnel insulating film.

As can be seen from FIG. 28, in the case where the La$_2$Hf$_2$O$_7$ layer is selected as the high-k layer, it is preferable that the assist level is equal to or greater than 0.1 eV but is equal to or smaller than 1.7 eV. When there is an assist level, the layer thickness of the low-k layer (indicated by the value of the point at which the straight line B intersects with the abscissa axis) can be made smaller than the layer thickness of the low-k layer (indicated by the value of the point at which the straight line B' intersects with the abscissa axis) required in a case where there is not an assist level (see FIGS. 27C to 27I). In this example, a SiO$_2$ layer is used as the low-k layer. However, since SiN (silicon nitride) has a lower dielectric constant than a La$_2$Hf$_2$O$_7$ layer, a SiN layer can be used as the low-k layer together with a La$_2$Hf$_2$O$_7$ layer, like a SiO$_2$ layer. In the above description, the low-k layer is a SiO$_2$ layer, and the high-k layer is a La$_2$Hf$_2$O$_7$ layer. However, the same effects as above can be achieved in a case where the low-k layer is a silicon oxide layer and the high-k layer is a lanthanum hafnate (LaHfO) layer, as long as the assist levels are within the above described ranges.

SiN Layer

Figure 30:
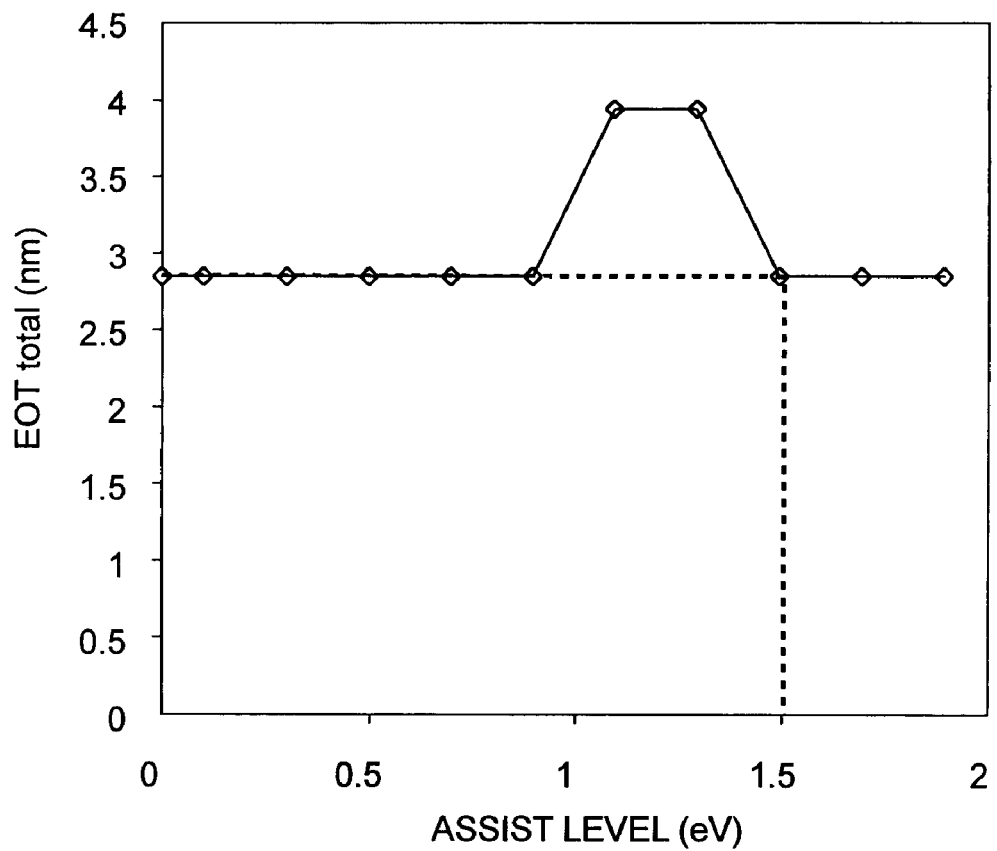
FIG. 30 is a diagram showing the assist level dependency of the EOT of the tunnel insulating film.
Figure 31A:
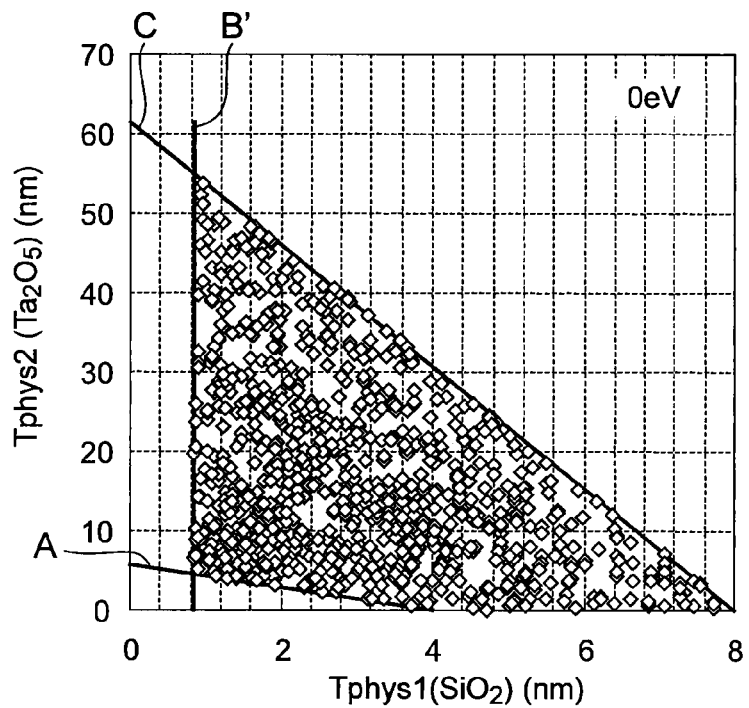
FIGS. 31A to 31J are diagrams showing the ranges of the physical film thicknesses of a SiO$_2$ layer and a Ta$_2$O$_5$ layer in a tunnel insulating film.
Figure 31B:
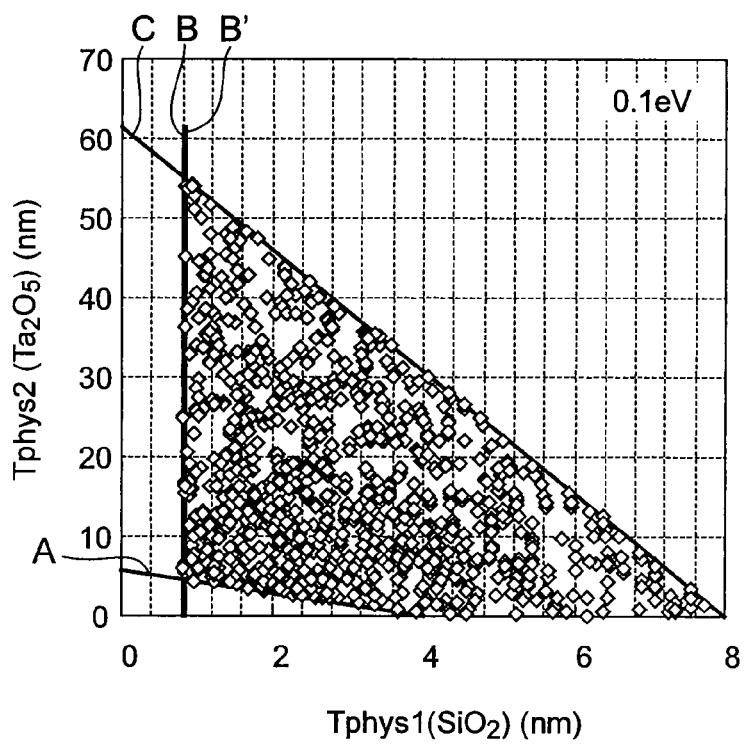
Figure 31C:
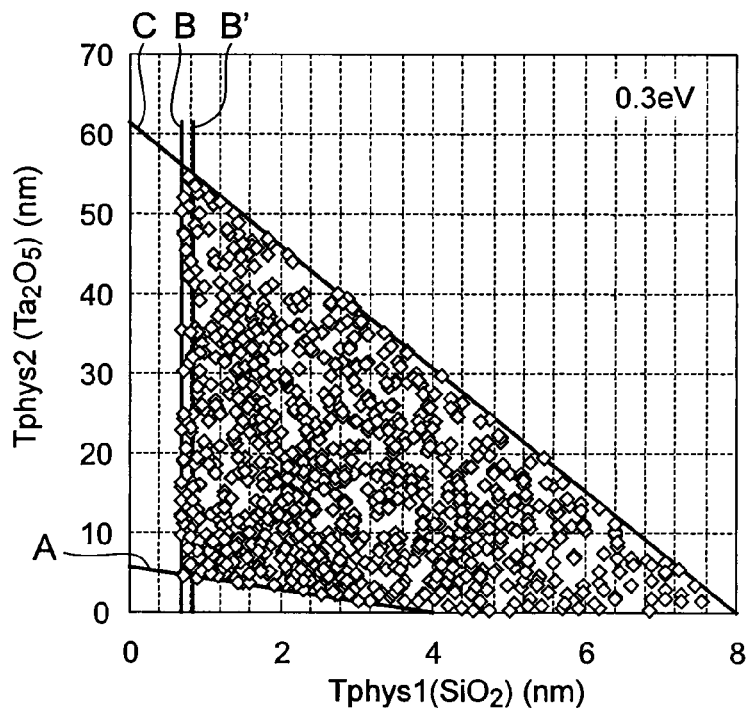
Figure 31D:
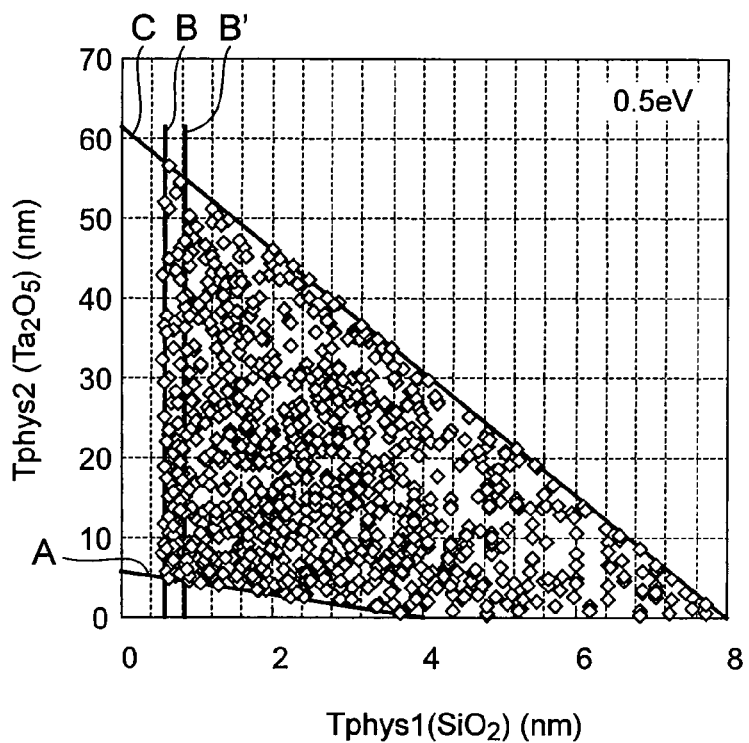
Figure 31E:
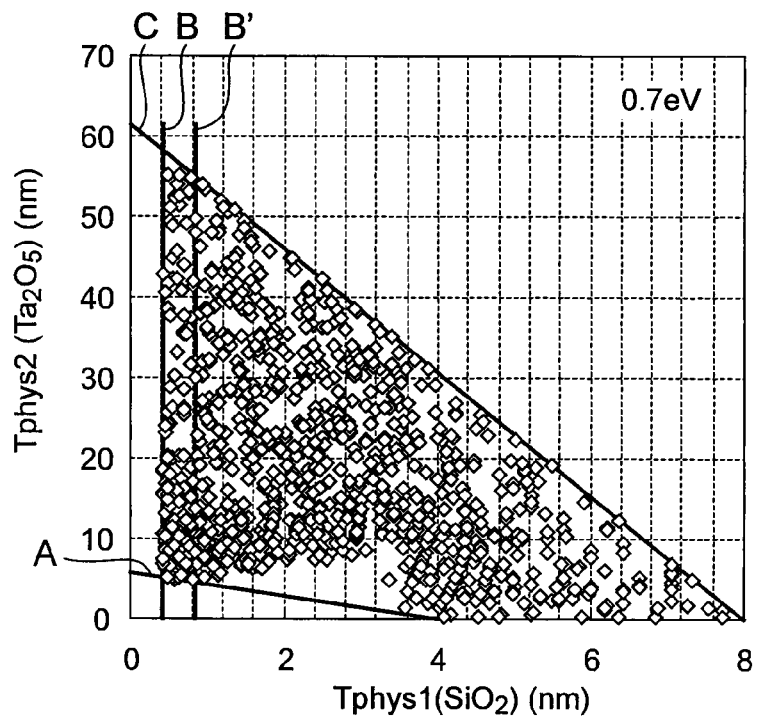
Figure 31F:
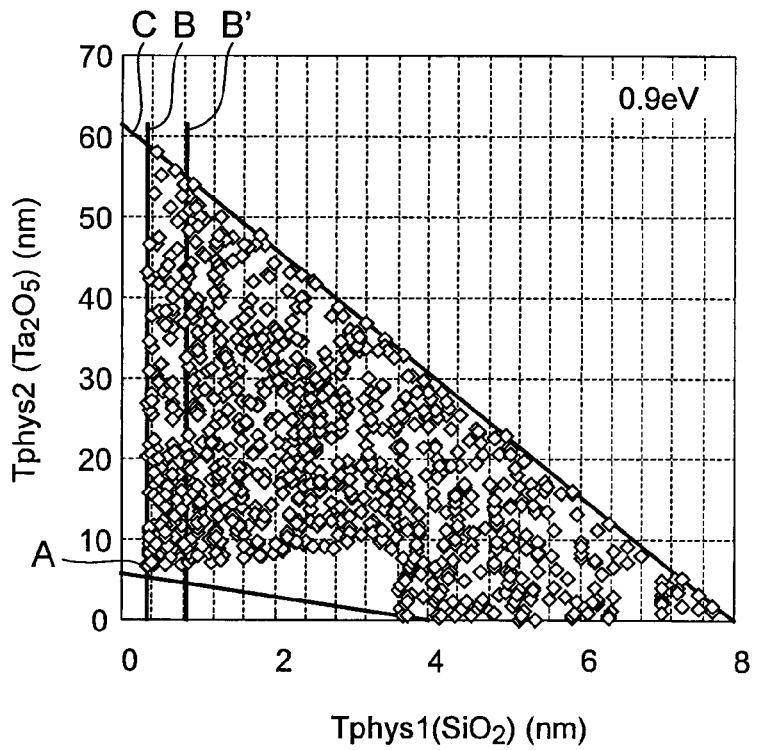
Figure 31G:
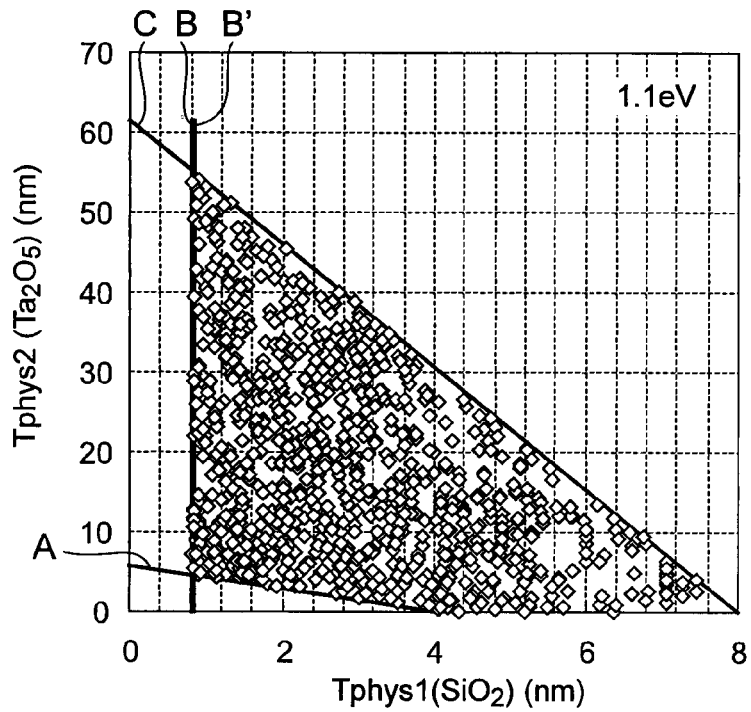
Figure 31H:
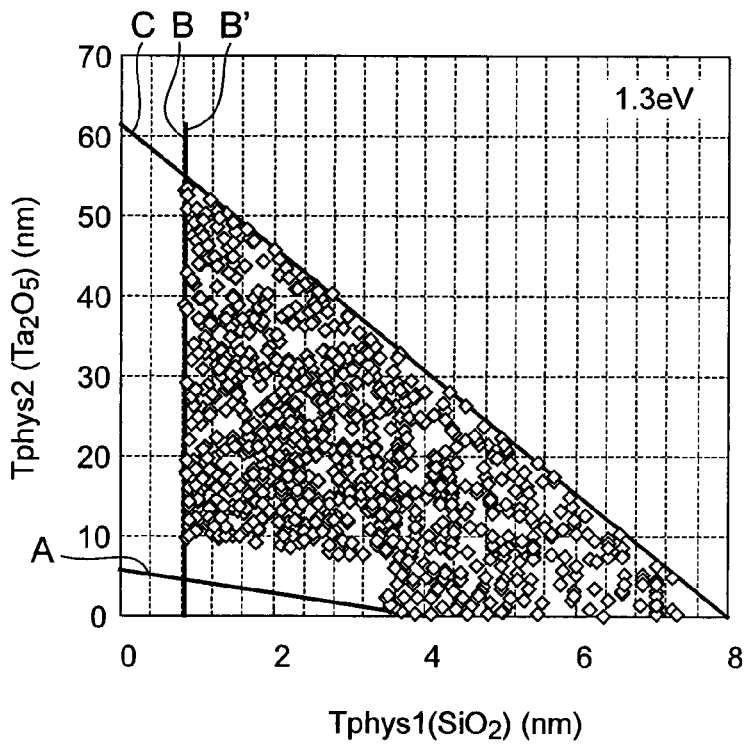
Figure 31I:
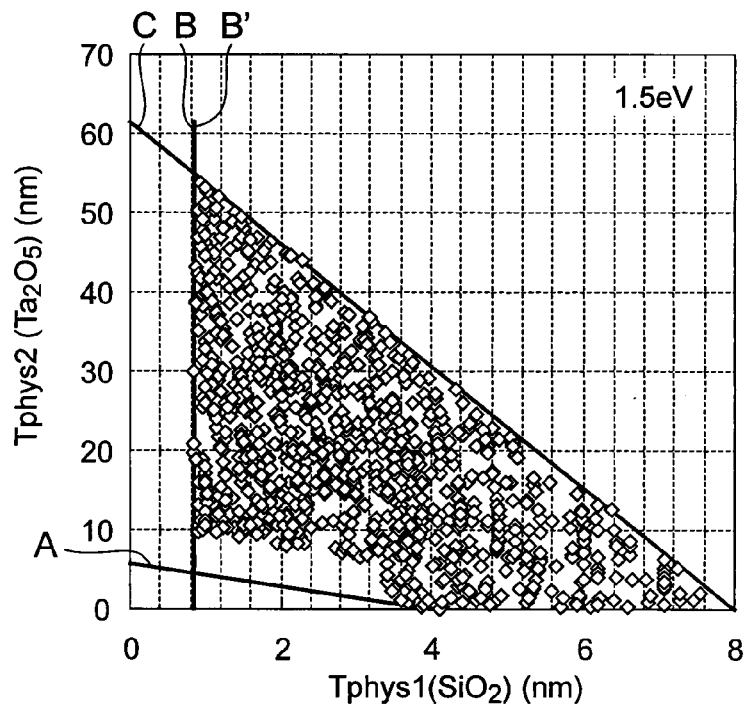
Figure 31J:
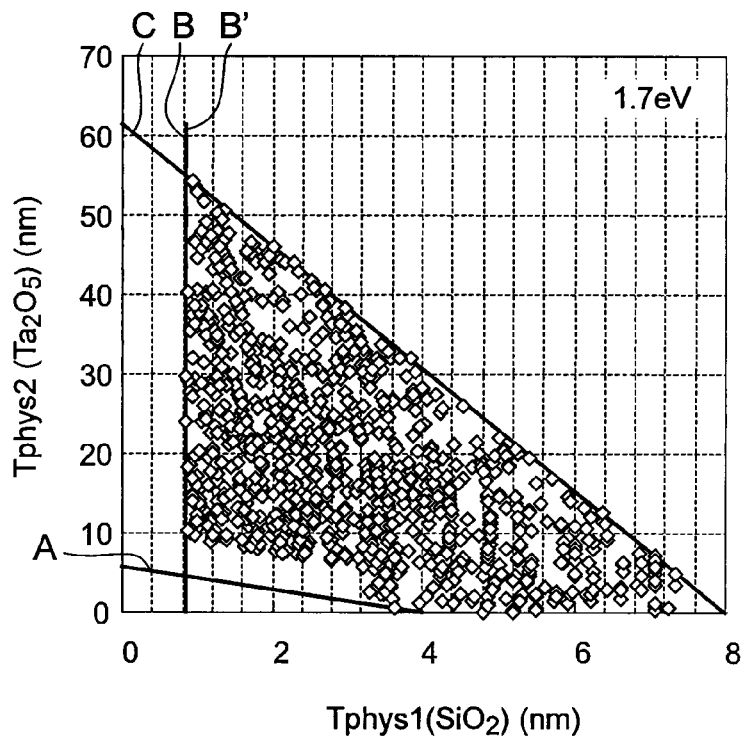

Since the dielectric constant of SiN (silicon nitride) is almost twice as high as the dielectric constant of SiO$_2$, a SiN layer functions as a high-k insulating layer with respect to a SiO$_2$ layer. FIGS. 29A to 29K show the ranges of the physical film thickness that fulfills the specs that are required in a tunnel insulating film as defined in an embodiment of the present invention at various assist levels in a case where a SiN layer is selected as the high-k layer, and a SiO$_2$ layer is selected as the low-k layer of the stacked structure. FIGS. 29A to 29K illustrate cases where the assist level in the SiN layer is 0 eV (no assist levels), 0.1 eV, 0.3 eV, 0.5 eV, 0.7 eV, 0.9 eV, 1.1 eV, 1.3 eV, 1.5 eV, 1.7 eV, and 1.9 eV. FIG. 30 shows the relationship between each of those assist levels and the EOT of the tunnel insulating film.

As can be seen from FIG. 30, in the case where the SiN layer is selected as the high-k layer, an appropriate assist level to reduce the EOT does not exist. However, by forming an assist level, the specs of the erase characteristics in a low electric field are fulfilled. Accordingly, the erase efficiency can be made higher.

Ta$_2$O$_5$ Layer

Figure 32:
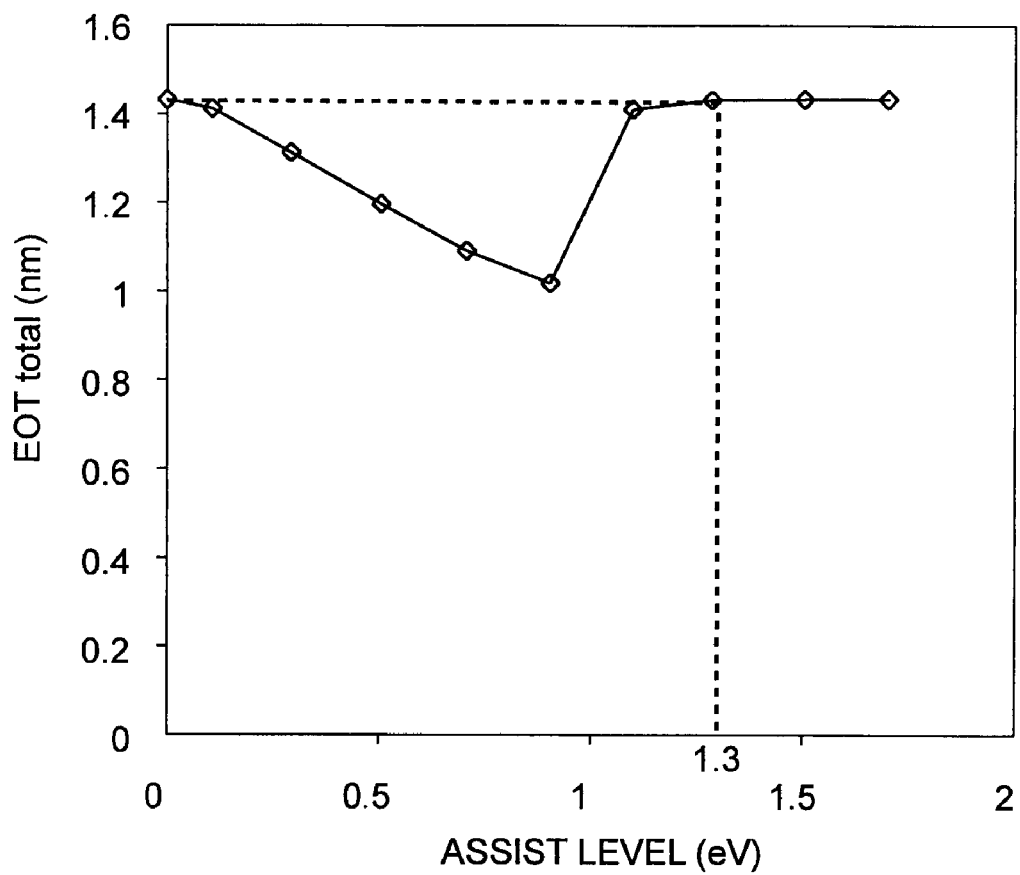
FIG. 32 is a diagram showing the assist level dependency of the EOT of the tunnel insulating film.

FIGS. 31A to 31J show the ranges of the physical film thickness that fulfills the specs that are required in a tunnel insulating film as defined in an embodiment of the present invention at various assist levels in a case where a Ta$_2$O$_5$ layer is selected as the high-k layer, and a SiO$_2$ layer is selected as the low-k layer of the stacked structure. FIGS. 31A to 31J illustrate cases where the assist level in the Ta$_2$O$_5$ layer is 0 eV (no assist levels), 0.1 eV, 0.3 eV, 0.5 eV, 0.7 eV, 0.9 eV, 1.1 eV, 1.3 eV, 1.5 eV, and 1.7 eV. FIG. 32 shows the relationship between each of those assist levels and the EOT of the tunnel insulating film.

As can be seen from FIG. 32, in the case where the Ta$_2$O$_5$ layer is selected as the high-k layer, it is preferable that the assist level is greater than 0 eV but is equal to or smaller than 1.3 eV. When there is an assist level, the layer thickness of the low-k layer (indicated by the value of the point at which the straight line B intersects with the abscissa axis) can be made smaller than the layer thickness of the low-k layer (indicated by the value of the point at which the straight line B' intersects with the abscissa axis) required in a case where there is not an assist level (see FIGS. 31B to 31F). In this example, a $SiO_2$ layer is used as the low-k layer. However, since SiN (silicon nitride) has a lower dielectric constant than a $Ta_2O_5$ layer, a SiN layer can be used as the low-k layer together with a $Ta_2O_5$ layer, like a $SiO_2$ layer. In the above description, the low-k layer is a $SiO_2$ layer, and the high-k layer is a $Ta_2O_5$ layer. However, the same effects as above can be achieved in a case where the low-k layer is a silicon oxide layer and the high-k layer is a tantalum oxide (TaO) layer, as long as the assist levels are within the above described ranges.

In each of FIGS. 13A to 13P, FIGS. 17A to 17Z, FIGS. 19A to 19N, FIGS. 21A to 21S, FIGS. 23A to 23N, FIGS. 25A to 25O, FIGS. 27A to 27M, FIGS. 29A to 29K, and FIGS. 31A to 31J, there are regions having no dots drawn in the layer thickness range. The regions are the regions where holes are trapped while emitting energy, and the regions fulfill the specs of a tunnel insulating film, like the regions having dots drawn therein.

Figures 33A, 33B:
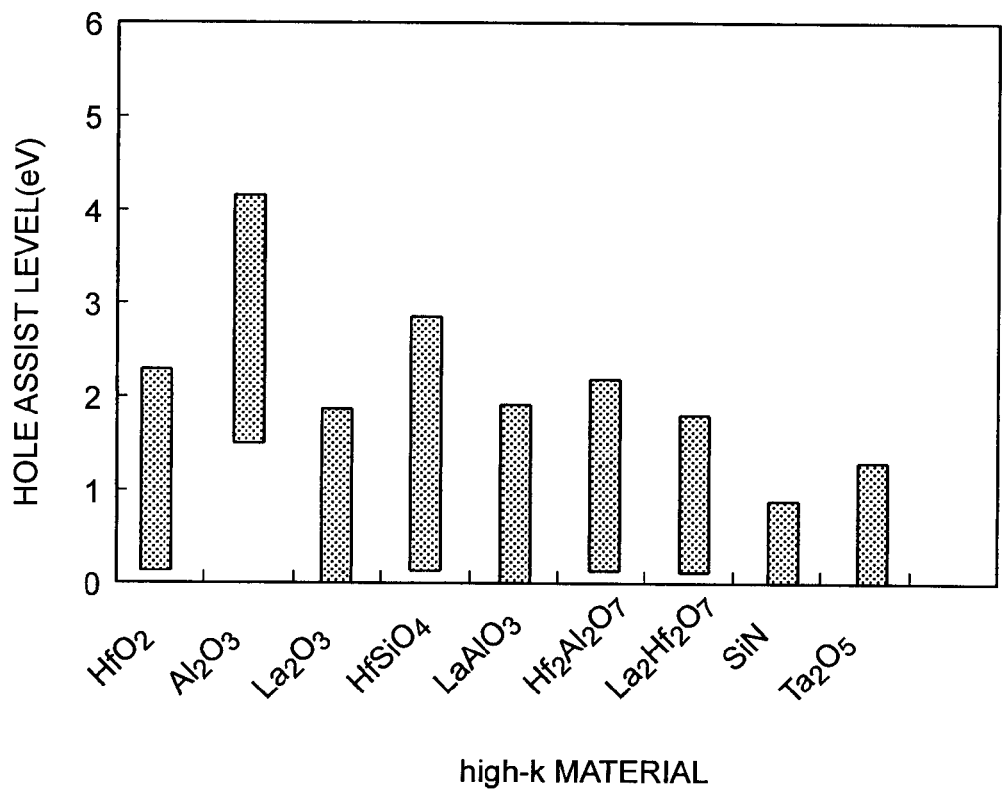
FIGS. 33A and 33B are diagrams showing the ranges of the assist level that satisfy the specs in a tunnel insulating film.

FIGS. 14, 18, 20, 22, 24, 26, 28, 30, and 32 also show appropriate ranges of the assist level to reduce the EOT. FIGS. 33A and 33B show those appropriate ranges for the respective high-k layers. FIG. 33A is a graph indicating the ranges of the assist level that is more effective than a single-layer film formed with each high-k insulating layer in a stacked structure having the assist level. FIG. 33B is a table showing those assist level ranges and the minimum EOTs. As can be seen from FIG. 33B, the lower limit of the EOT of the tunnel insulating film is 1.02 nm, which is observed when the high-k layer is a $Ta_2O_5$ layer. The upper limit of the EOT of the tunnel insulating film is 5 nm, as described in the first embodiment. To sum up, the EOT of the tunnel insulating film should be in the range of 1.02 nm to 5 nm.

Figures 34A, 34B:
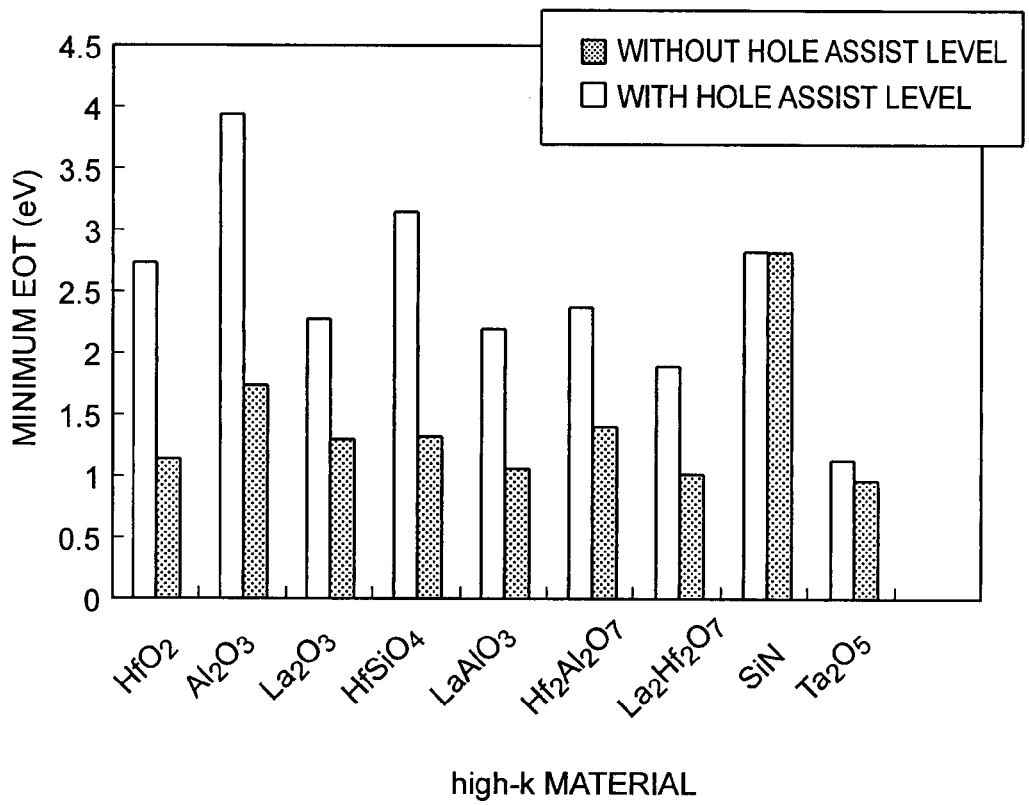
FIGS. 34A and 34B are diagrams showing the results of comparisons between the minimum value of the EOT in a case where an assist level exists in a tunnel insulating film, and the minimum value of the EOT in a case where there is not an assist level in a tunnel insulating film.

FIGS. 34A and 34B show the results of comparisons between the minimum values of the EOT observed in a case where an assist level exists in a tunnel insulating film formed with a stacked structure of each of the various high-k layers and a $SiO_2$ layer, and the minimum values of the EOT observed in a case where there is not an assist level. As can be seen from FIGS. 34A and 34B, the EOT can be made smaller in each case where there is an assist level, than in the case where there is not an assist level.

Other than the above mentioned high-k materials, a material that has the same dielectric constant and $\Delta E_v$ as one of the above mentioned high-k layers or a dielectric constant and $\Delta E_v$ between the corresponding values of those layers can be used as the high-k layer in an embodiment of the present invention. In such a case, there is an appropriate physical layer thickness range. The physical layer thickness range can be accurately calculated from the discussion made so far, or can be estimated by performing interpolation or extrapolation based on the data about the above mentioned high-k layers.

Although the low-k insulating layer is a $SiO_2$ layer in the above described cases, the same effects as above can be achieved with a nitride film such as a SiN film or a SiON film, or an oxynitride film, or an insulating film containing one of those materials, as long as the film has a low dielectric constant. In the case of a $TiO_2$ layer, there is not a film thickness range that fulfills the specs of the tunnel insulating film defined in an embodiment of the present invention, whether or not an assist level exists.

In a case where a high-k layer and a low-k layer are stacked, basically, generalization can be performed in the following manner. Where the high-k layer is a $HfO_2$ layer and the low-k layer is a $SiO_2$ layer, the specs of hole leakage current required in a tunnel insulating film are $1.0 \times 10^{-16}$ A/cm² or lower in a low electric field $E_{ox}$ of 3 MV/cm, and $1.0 \times 10^{-5}$ A/cm² or higher in a high electric field $E_{ox}$ of 13 MV/cm. However, the same applies to a stacked structure formed with layers having different dielectric constants, and the same effects can be achieved by such a stacked structure. The specs required in a charge retaining state indicate that the leakage current is $J_{low}$ or less in an electric field $E_{low}$. Where $T_{1,low}$ and $T_{2,low}$ represent the physical film thicknesses required to achieve the leakage current $J_{low}$ or less in each single layer of the low-k layer and the high-k layer having an assist level, and $T_1$ and $T_2$ represent the physical layer thicknesses of the low-k layer and the high-k layer that are stacked to form a stacked structure, the following equation is satisfied:

$$T_2 = -(T_{2,low}/T_{1,low}) \times T_1 + T_{2,low} \tag{13}$$

This equation is equivalent to the straight line A in each of FIG. 10, FIGS. 13A to 13P, FIGS. 17A to 17Z, FIGS. 19A to 19N, FIGS. 21A to 21S, FIGS. 23A to 23N, FIGS. 25A to 25O, FIGS. 27A to 27M, FIGS. 29A to 29K, and FIGS. 31A to 31J. Here, $T_{1,low}$ represents the value of the point at which the straight line A intersects with the abscissa axis, and $T_{2,low}$ represents the value of the point at which the straight line A intersects with the ordinate axis. Accordingly, when the low-k layer is a $SiO_2$ layer, $T_{2,low}$ is 4 nm.

The specs required for writing indicate that the leakage current is $J_{high}$ or higher in an electric field $E_{high}$. Where $T_{1,high}$ represents the required minimum film thickness of the low-k layer, the following relationship is established:

$$T_1 = T_{1,high} \tag{14}$$

This equation is equivalent to the straight line B shown in FIG. 9.

To cause a tunnel insulating film to function, limitations should be put on the trap level $\phi_{t1}$ of the low-k layer. Therefore, it is necessary to satisfy the following relationship:

$$0 \leq \phi_{t1} \leq \Delta\phi_b + \phi_{t2} \tag{15}$$

or no traps should be formed in the low-k layer. Here, $\Delta\phi_b$ is defined as follows:

$$\Delta\phi_b = \phi_{b1} - \phi_{b2} \tag{16}$$

If the relationship (15) is not established, the leakage current becomes higher in a low electric field, and charges cannot be retained. Here, $\phi_{b1}$ and $\phi_{b2}$ represent the hole barrier heights of the low-k layer and the high-k layer with respect to the Fermi level $E_F$ of the silicon substrate.

In this manner, the relationship between the assist level and the range of the film thickness of each insulating layer required in a tunnel insulating film is determined according to the equations (13) to (16).

Figure 35:
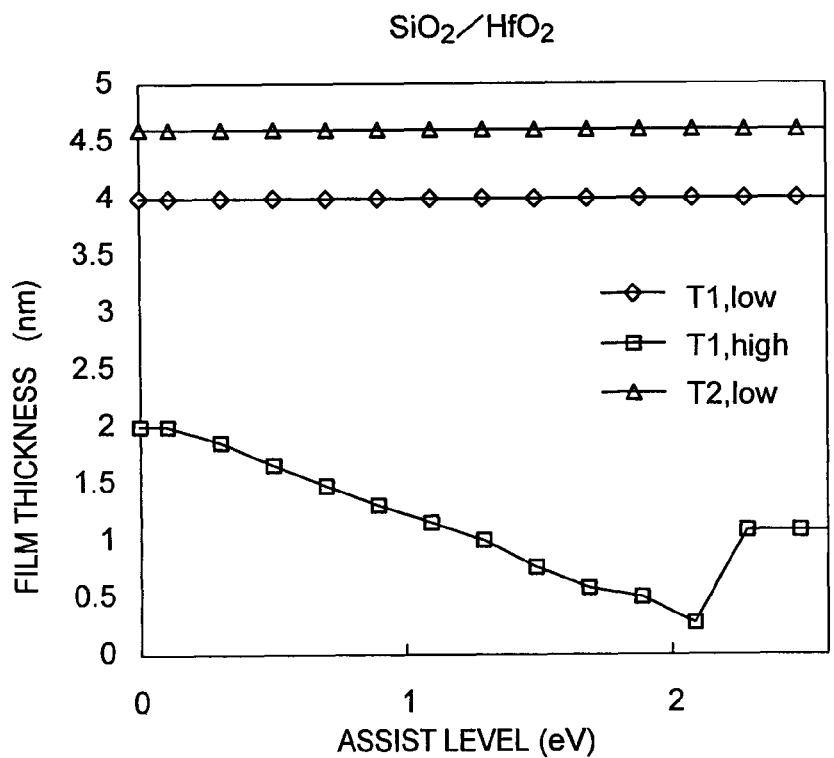
FIGS. 35 to 43 are diagrams showing the relationships between the assist level and $T_{1,low}$, $T_{1,high}$, and $T_{2,low}$ in a tunnel insulating film.

FIGS. 35 to 43 collectively show the ranges of the layer thicknesses of the high-k layer and the low-k layer with respect to various assist levels. FIG. 35 shows the relationships between the assist level and $T_{1,low}$, $T_{1,high}$, and $T_{2,low}$ in a case where a $HfO_2$ layer is selected as the high-k layer, and a $SiO_2$ layer is selected as the low-k layer.

Figure 36:
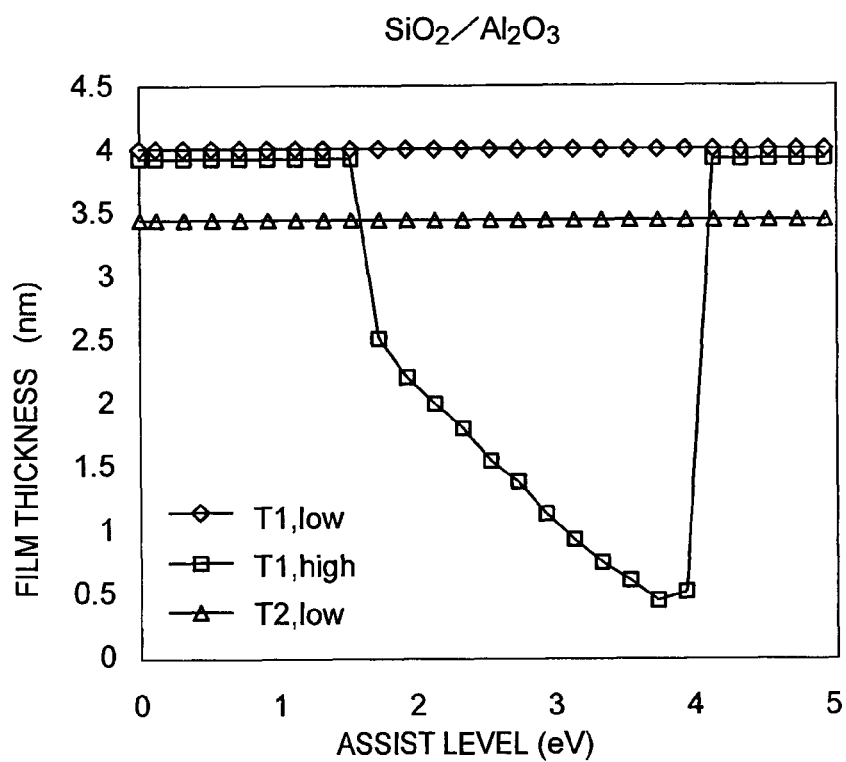

FIG. 36 shows the relationships between the assist level and $T_{1,low}$, $T_{1,high}$, and $T_{2,low}$ in a case where a $Al_2O_3$ layer is selected as the high-k layer, and a $SiO_2$ layer is selected as the low-k layer.

Figure 37:
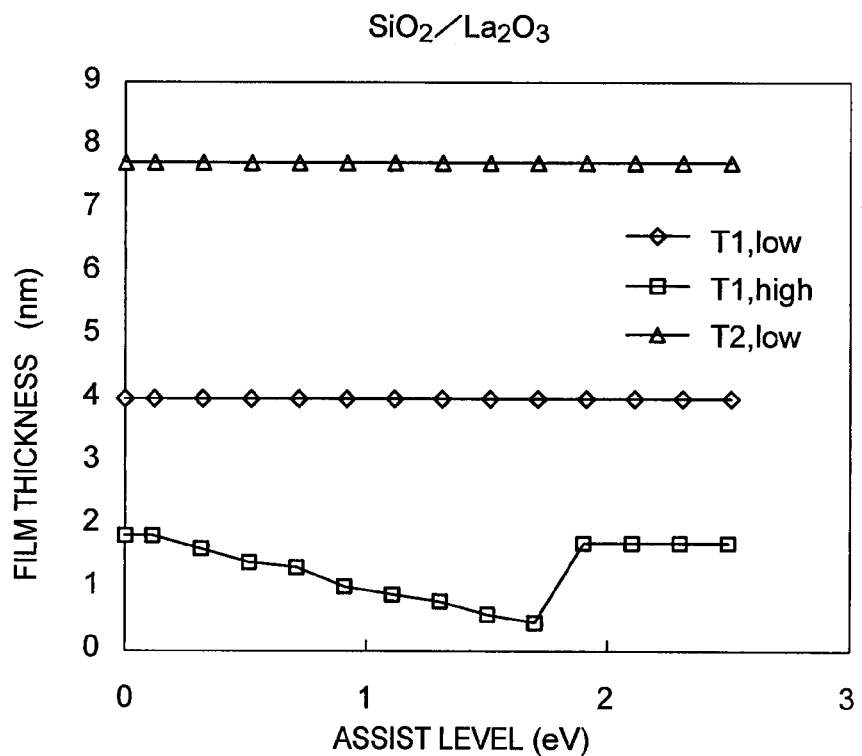

FIG. 37 shows the relationships between the assist level and $T_{1,low}$, $T_{1,high}$, and $T_{2,low}$ in a case where a $La_2O_3$ layer is selected as the high-k layer, and a $SiO_2$ layer is selected as the low-k layer.

Figure 38:
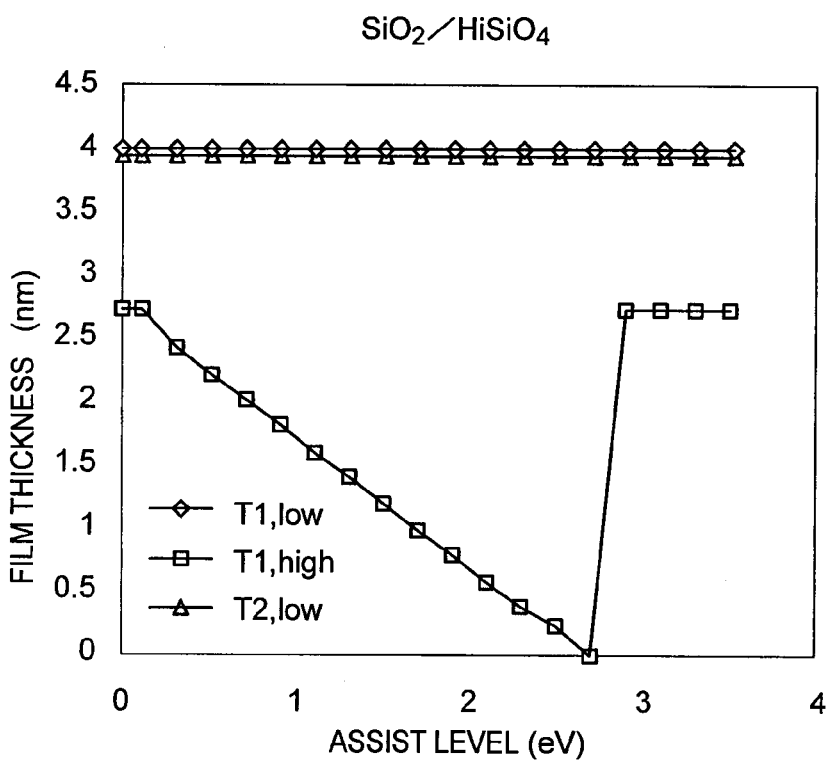

FIG. 38 shows the relationships between the assist level and $T_{1,low}$, $T_{1,high}$, and $T_{2,low}$ in a case where a $HfSiO_4$ layer is selected as the high-k layer, and a $SiO_2$ layer is selected as the low-k layer.

Figure 39:
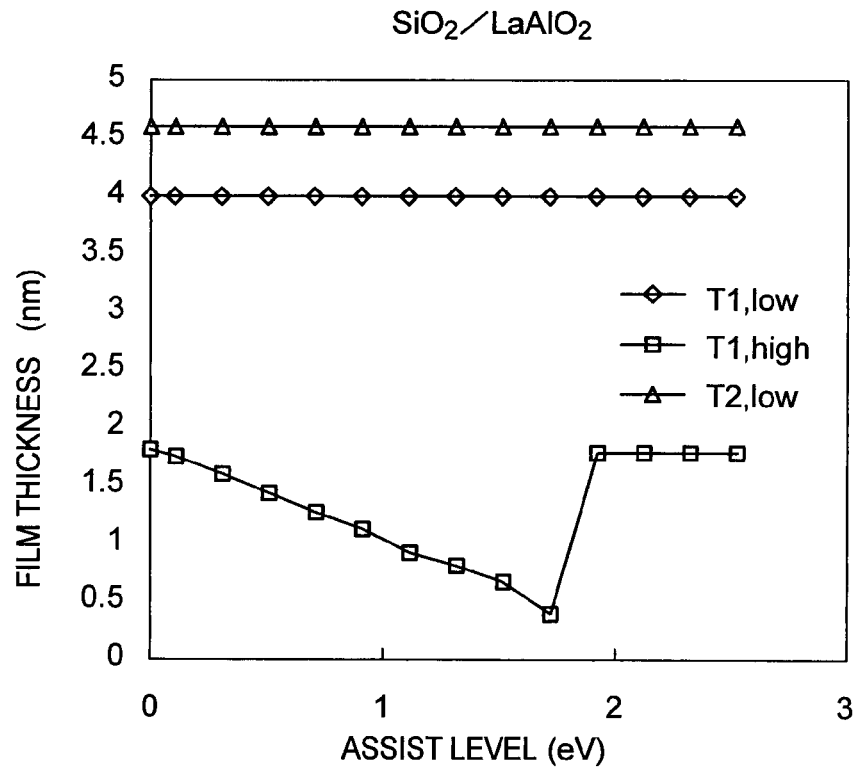

FIG. 39 shows the relationships between the assist level and $T_{1,low}$, $T_{1,high}$, and $T_{2,low}$ in a case where a $LaAlO_3$ layer is selected as the high-k layer, and a $SiO_2$ layer is selected as the low-k layer.

Figure 40:
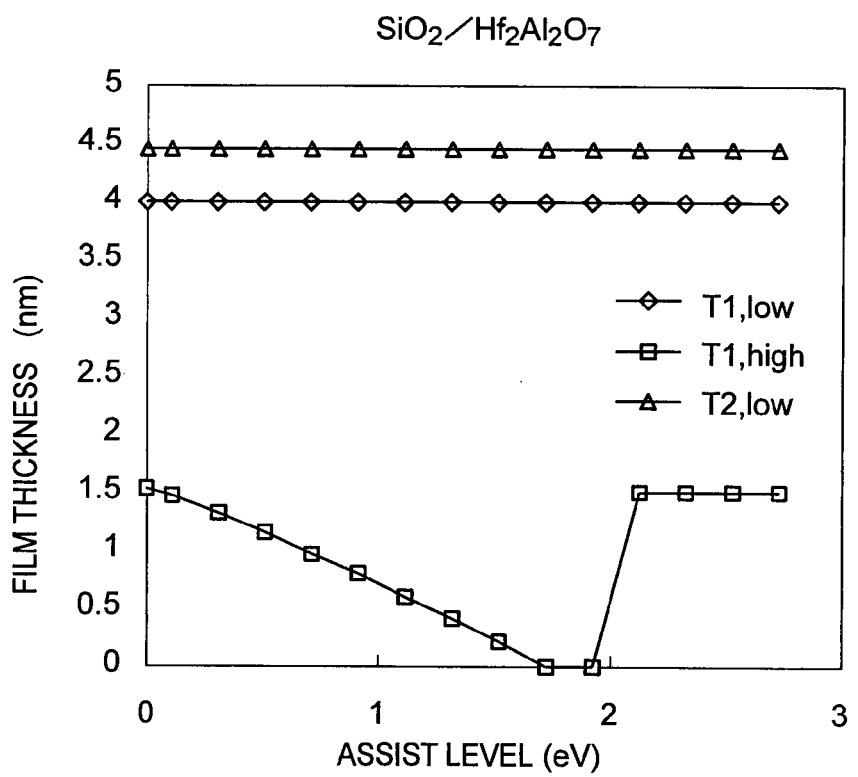

FIG. 40 shows the relationships between the assist level and $T_{1,low}$, $T_{1,high}$, and $T_{2,low}$ in a case where a $Hf_2Al_2O_7$ layer is selected as the high-k layer, and a $SiO_2$ layer is selected as the low-k layer.

Figure 41:
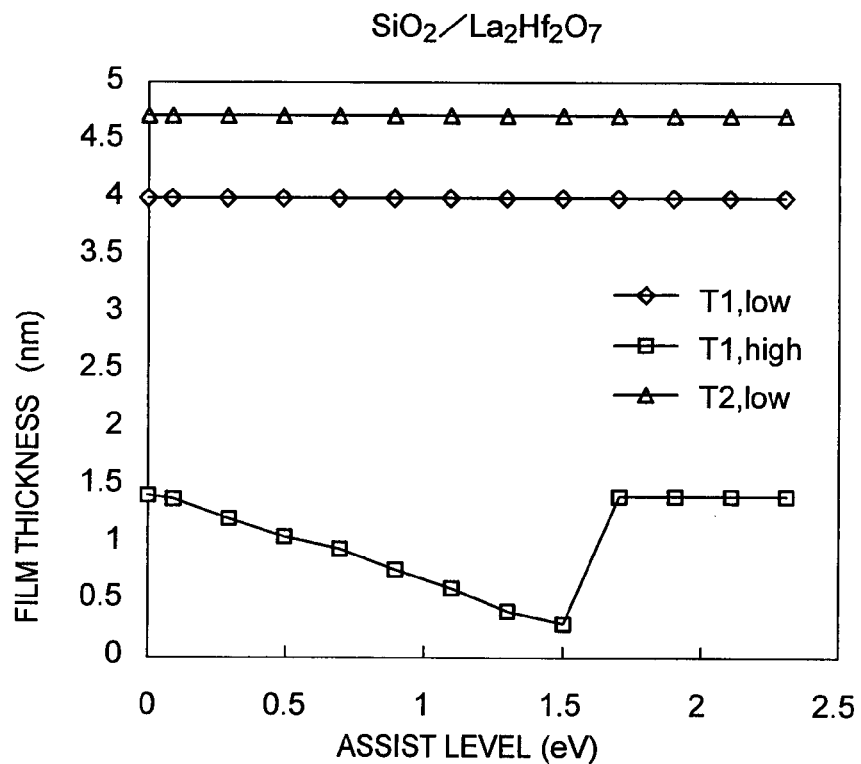

FIG. 41 shows the relationships between the assist level and $T_{1,low}$, $T_{1,high}$, and $T_{2,low}$ in a case where a $La_2Hf_2O_7$ layer is selected as the high-k layer, and a $SiO_2$ layer is selected as the low-k layer.

Figure 42:
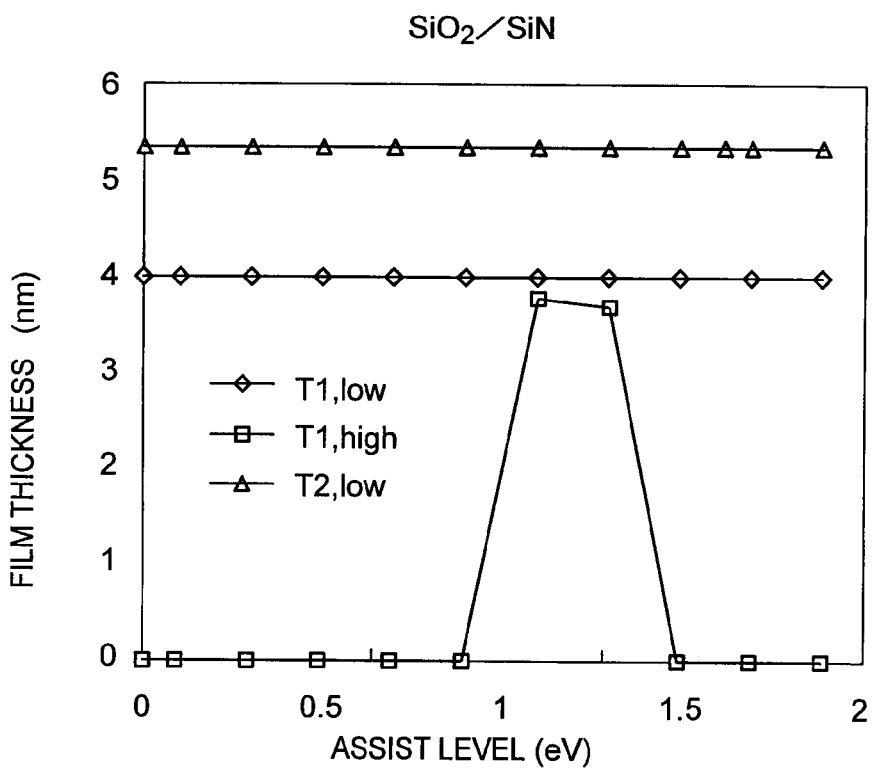

FIG. 42 shows the relationships between the assist level and $T_{1,low}$, $T_{1,high}$, and $T_{2,low}$ in a case where a SiN layer is selected as the high-k layer, and a $SiO_2$ layer is selected as the low-k layer.

Figure 43:
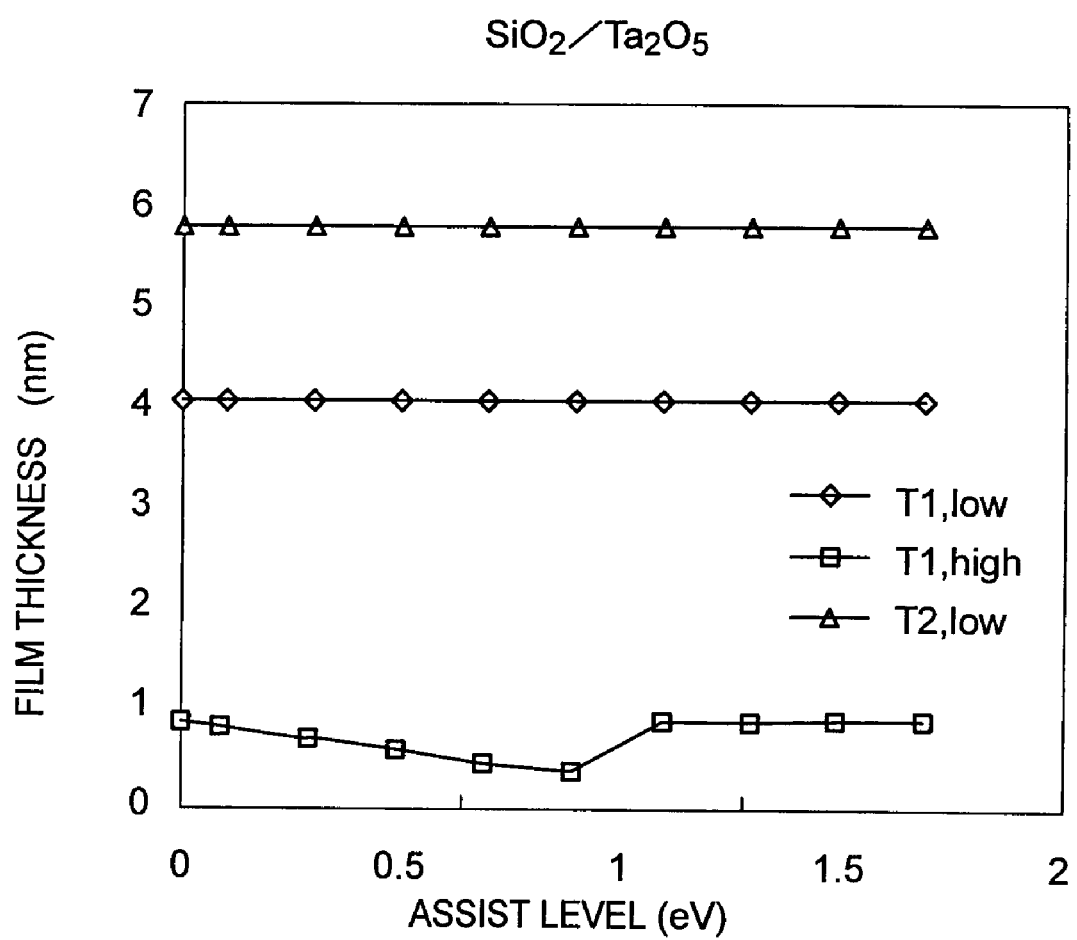

FIG. 43 shows the relationships between the assist level and $T_{1,low}$, $T_{1,high}$, and $T_{2,low}$ in a case where a $Ta_2O_5$ layer is selected as the high-k layer, and a $SiO_2$ layer is selected as the low-k layer. Based on those relationships, limitations are put on the type of the high-k layer (or the barrier height and the dielectric constant of the high-k layer), the range of the layer thickness of the high-k layer in the stacked structure formed with the high-k layer and the low-k layer, and the assist level, so as to fulfill the specs in a tunnel insulating film.

As can be seen from FIGS. 35 to 43, $T_{1,low}$ and $T_{2,low}$ vary with material, but hardly vary with assist level. $T_{1,high}$ varies with both material and assist level.

The ranges of desirable physical thicknesses of the high-k layer and the low-k layer can be determined by the equation (13) (the equation expressing the straight line A shown in FIG. 10, for example), the equation (14) (the equation expressing the straight line B shown in FIG. 10, for example), the equation expressing the prescribed value of the EOT (=8 nm in the above embodiments) of the stack insulating film formed with the high-k layer and the low-k layer (the equation expressing the straight line C shown in FIG. 10, for example), and the desirable range of the assist level of each material. The equation expressing the prescribed value of the $EOT_{total}$ (=8 nm in the above embodiments) of the stack insulating film formed with the high-k layer and the low-k layer is as follows:

$$EOT_{total} = T_1 \times \epsilon_{ox}/\epsilon_1 + T_2 \times \epsilon_{ox}/\epsilon_2 = 8 \text{ (nm)} \qquad (17)$$

where $\epsilon_1$ and $\epsilon_2$ represent the dielectric constants of the low-k layer and the high-k layer, $T_1$ and $T_2$ represent the physical film thicknesses of the low-k layer and the high-k layer, and $\epsilon_{ox}$ represents the dielectric constant of $SiO_2$. Accordingly, the regions defined by the equation (13), the equation (14), and the equation (17) represent the regions of the desirable physical film thicknesses of the high-k layer and the low-k layer. The regions vary with the desirable range of the assist level of each material. The regions are also equivalent to the regions that satisfy the following three inequations:

$$T_2 \geq -(T_{2,low}/T_{1,low}) \times T_1 + T_{2,low}$$

$$T_1 \geq T_{1,high}$$

$$T_1 \times \epsilon_{ox}/\epsilon_1 + T_2 \times \epsilon_{ox}/\epsilon_2 \leq 8$$

The film thicknesses that minimize the thickness of the tunnel insulating film are determined by defining $T_1$ according to the equation (14), and assigning the equation (14) to the equation (13) so as to define $T_2$ as follows:

$$T_2 = -(T_{2,low}/T_{1,low}) \times T_{1,high} + T_{2,low} \qquad (18)$$

In this manner, the film thicknesses and the effective assist level in the stack insulating film formed with the high-k layer and the low-k layer can be easily determined, so that the high-k layer of any kind fulfills the specs required in the tunnel insulating film, according to the equations (13), (14), (17), and (18).

(Assist Level Distribution)

Figure 44:
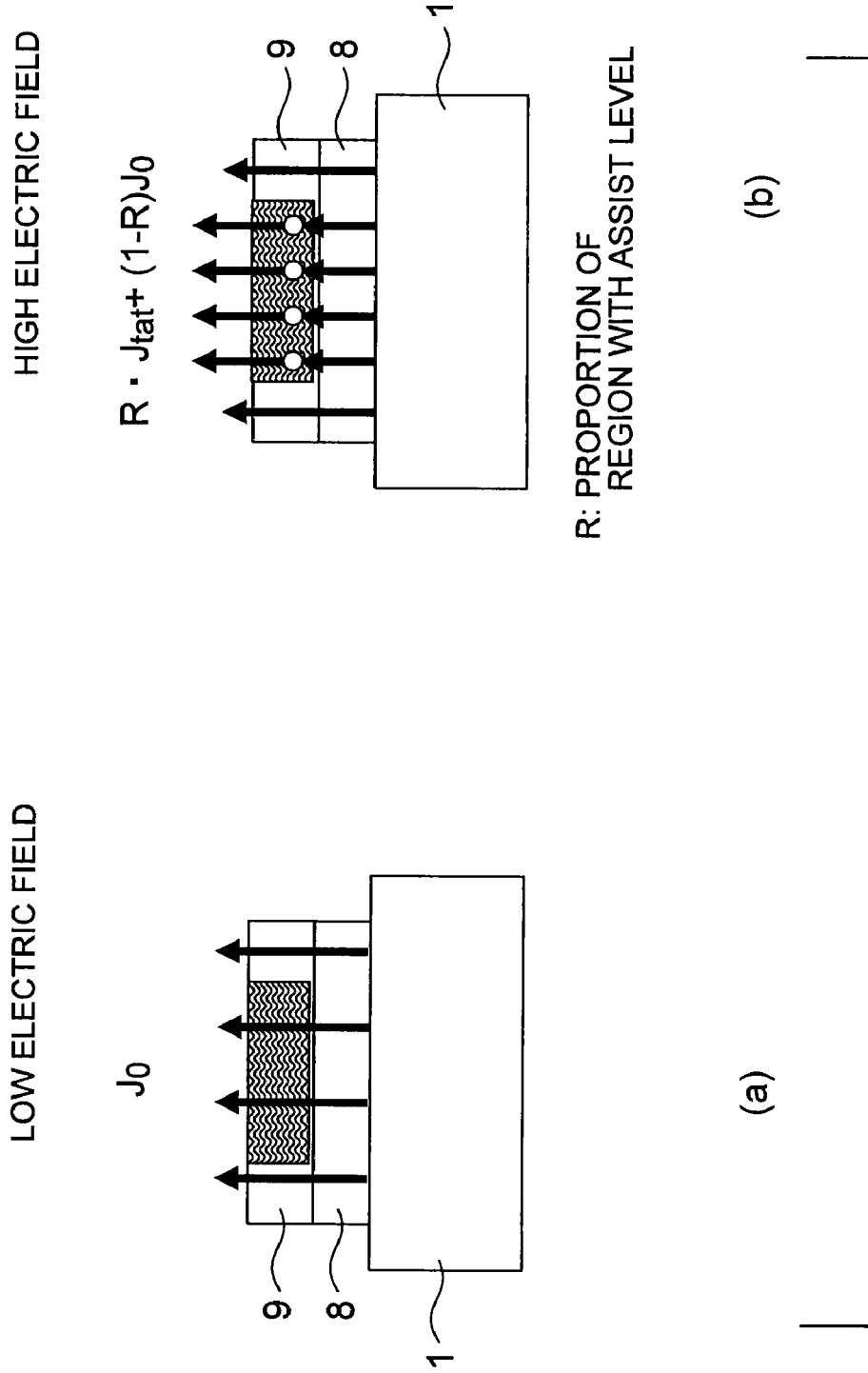
FIGS. 44(a) and 44(b) are diagrams for explaining a case where an assist level exists partially in a tunnel insulating film.
Figure 45:
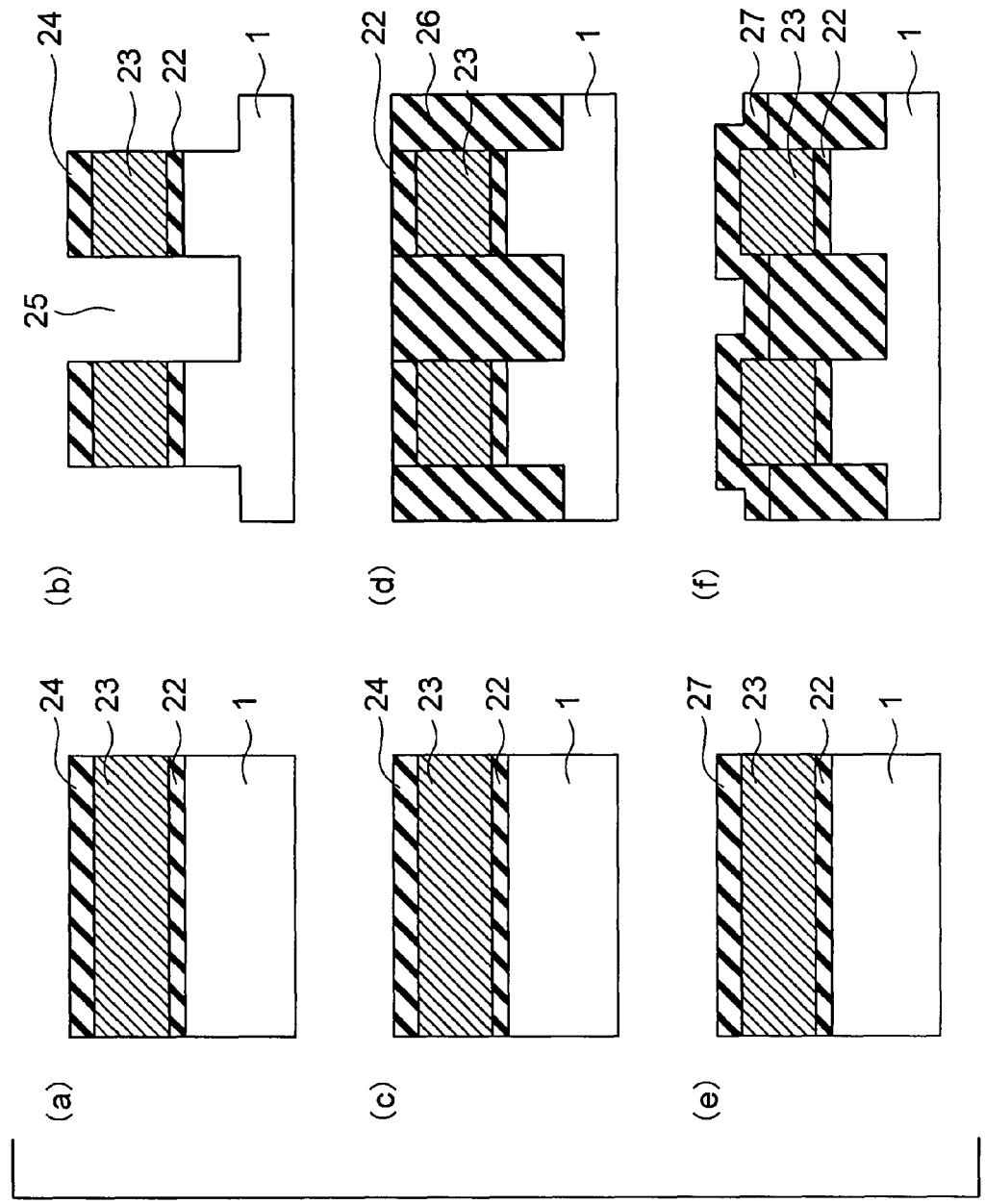
FIGS. 45(a) to 45(f) are cross-sectional views showing a method for manufacturing a floating-gate type flash memory in accordance with a third embodiment.
Figure 46:
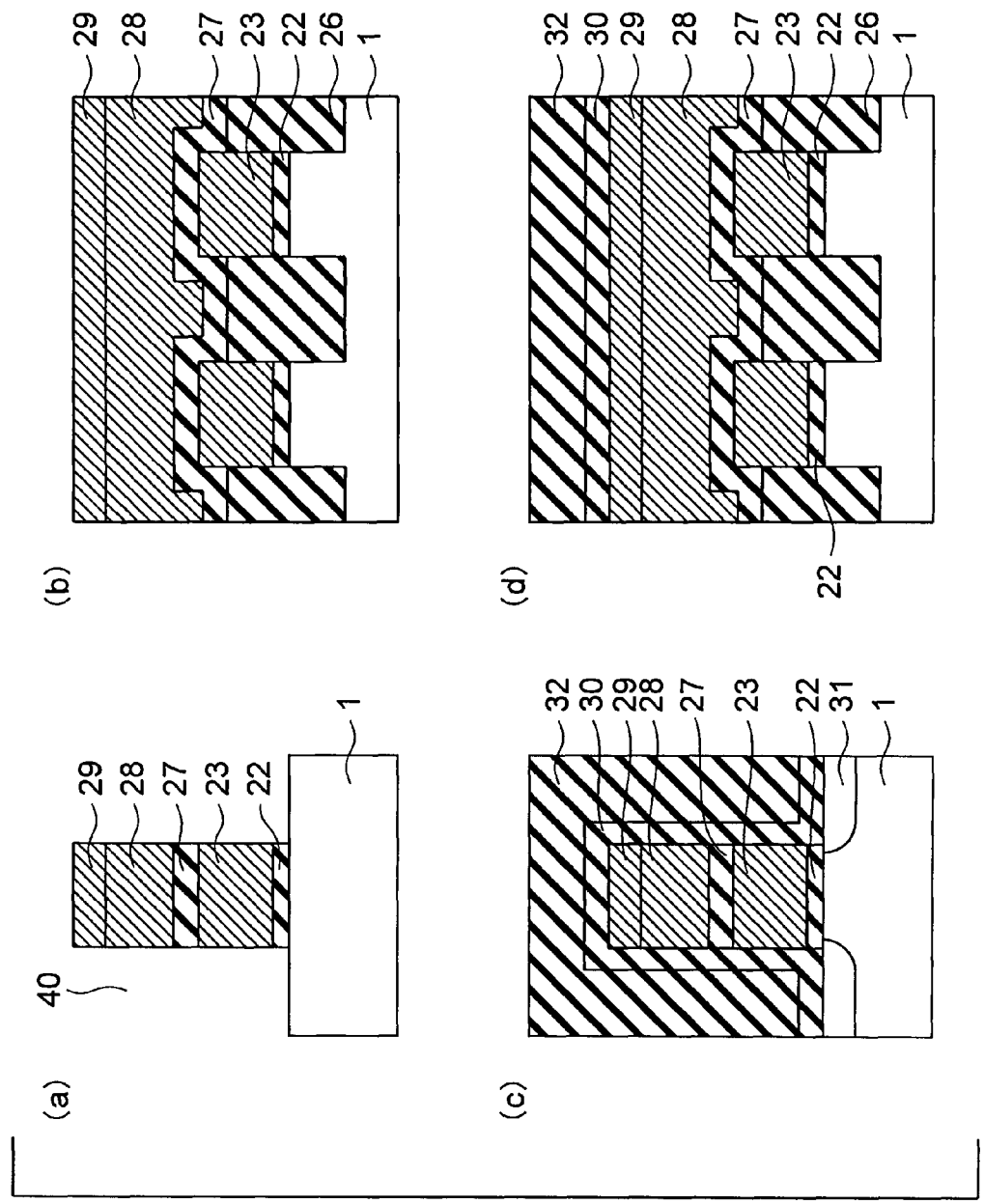
FIGS. 46(a) to 46(d) are cross-sectional views showing the method for manufacturing the floating-gate type flash memory in accordance with the third embodiment.
Figure 47:
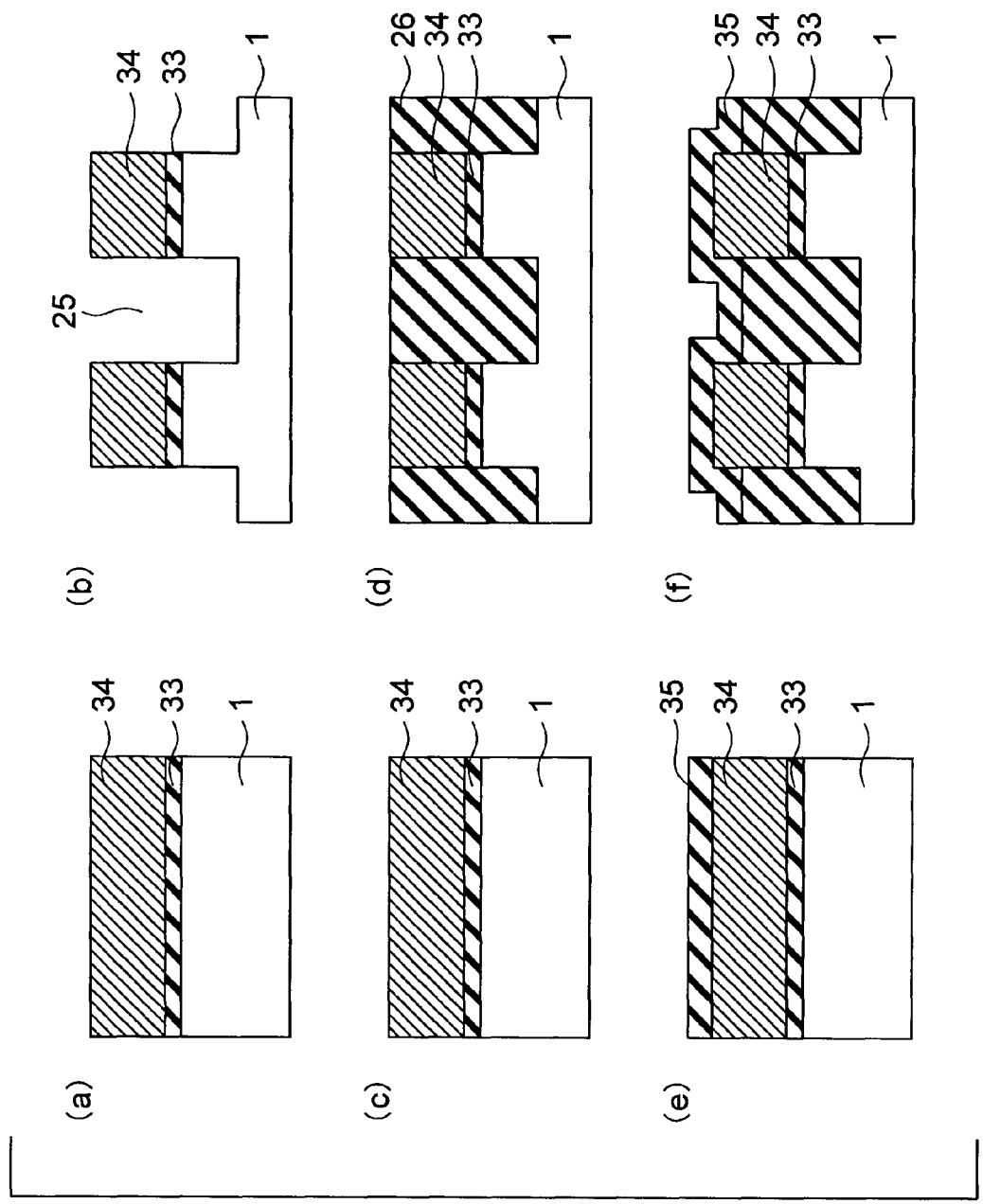
FIGS. 47(a) to 47(f) are cross-sectional views showing a method for manufacturing a MONOS type flash memory in accordance with a fourth embodiment.
Figure 48:
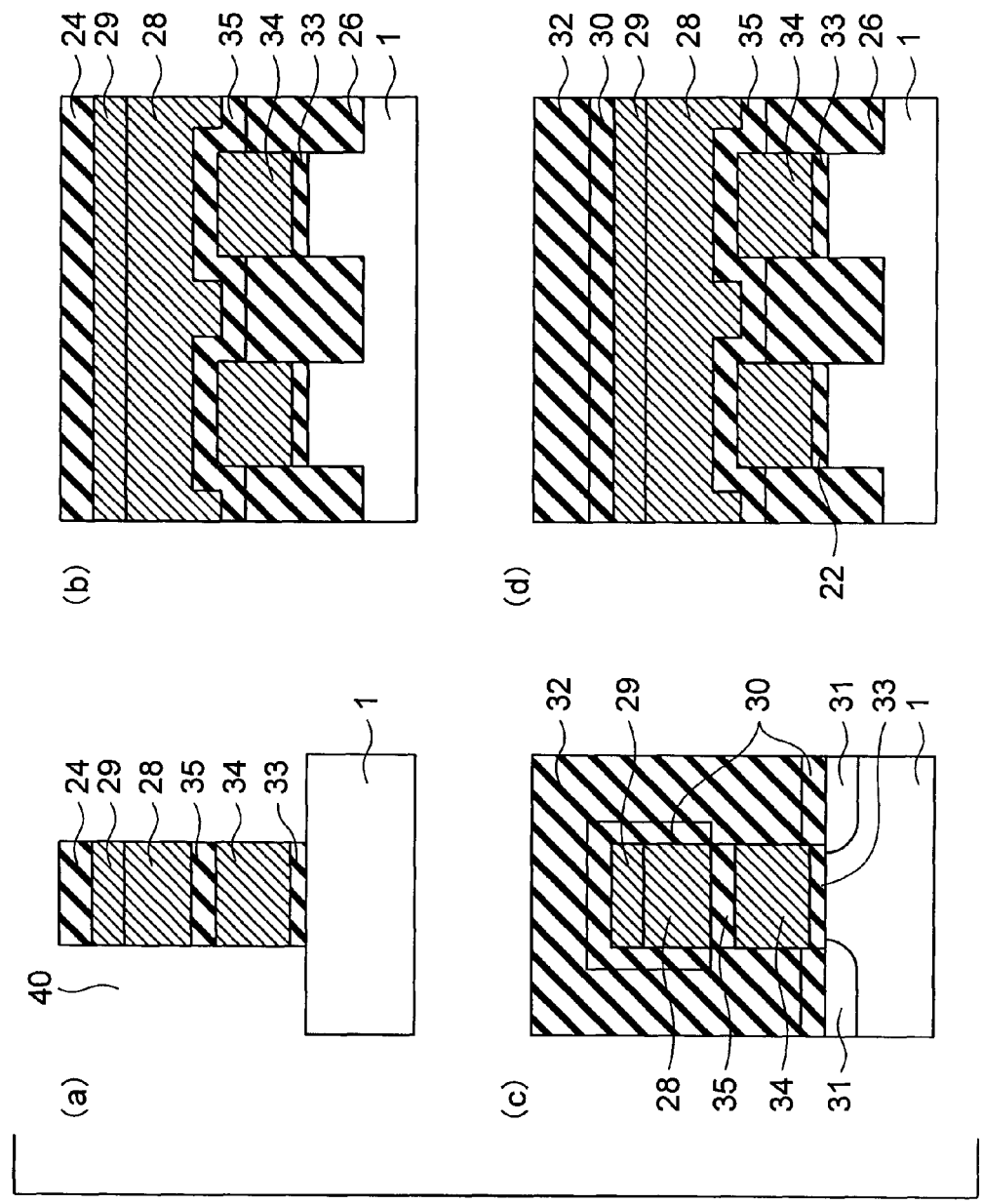
FIGS. 48(a) to 48(d) are cross-sectional views showing a method for manufacturing the MONOS type flash memory in accordance with the fourth embodiment.

The hole assist level does not need to exist uniformly in the direction parallel to the film. FIGS. 44(a) and 44(b) are schematic views of tunnel insulating films having an assist level partially formed therein. This tunnel insulating film is formed by stacking a low-k layer 8 and a high-k layer 9 having an assist level on a substrate 1. With R representing the proportion of the region having the assist level, the proportion of the region without the assist level is represented by 1-R. Where $J_{tat}$ represents the leakage current observed when an assist level exists, and $J_0$ represents the leakage current observed when there is not an assist level, the current J flowing in the entire film is expressed as follows:

$$J = R \times J_{tat} + (1-R) \times J_0 \qquad (19)$$

Since the leakage current is not affected by the existence of an assist level in a low electric field, the leakage current can be restricted to a small amount in the entire film. In a high electric field, on the other hand, the leakage current becomes higher when there is an assist level. Accordingly, the leakage current can be increased only in the region having the assist level. As shown in FIGS. 44(a) and 44(b), an assist level can be formed on the inner side from the edge of the film, for example. In this manner, the leakage current can be increased outside the edge where breakdown is easily caused by field concentration. Thus, the reliability of the film can be made higher.

Defects that originally exist in the high-k layer (such as a $HfO_2$ layer), or defects formed by oxygen vacancy, are uncontrolled and unsteady, and therefore, do not exhibit the same functions as the assist level in an embodiment of the present invention. To achieve the same effects as those of an embodiment of the present invention, it is necessary to add such an element so as to form an assist level having a sufficient density at an optimum position that fulfills the specs required in the tunnel insulating film as an embodiment of the present invention. In other words, it is necessary to form a purposefully designed assist level in a layer that originally has no defects or in a layer that inherently has defects. Accordingly, an insulating layer having such effects is necessarily formed with three or more elements including the added element. The added element may be located at the substitutional site, i.e., the position that replaces the lattices forming the layer to which the element is added, or may be located at the interstitial site, i.e., the position between the lattices forming the layer to which the element is added.

Where the tunnel insulating film has a stacked structure formed with the first insulating layer (the low-k layer), the second insulating layer (the high-k layer), and the third insulating layer stacked in this order, it is preferable that the third insulating layer has the same dielectric constant as the first insulating layer or has a dielectric constant falling between the dielectric constant of the first insulating layer and the dielectric constant of the second insulating layer.

Third Embodiment

Referring now to FIGS. 45(a) to 46(d), a method for manufacturing a FG-type nonvolatile memory in accordance with a third embodiment of the present invention is described. The cross sections shown in FIGS. 45(a), 45(c), 45(e), 46(a), and 46(c) are perpendicular to the cross sections shown in FIGS. 45(b), 45(d), 45(f), 46(b), and 46(d), respectively.

First, as shown in FIGS. 45(a) and 45(b), a tunnel insulating film 22 having the assist level described in the above embodiments is formed on the surface of a p-type silicon substrate 1 doped with desired impurities. For example, after a $SiO_2$ layer is formed by oxidizing the surface through combustion and oxidation with the use of hydrogen and oxygen at 750° C., a high-k film having a hole assist level formed therein, such as a $HfO_2$ layer having Ru added thereto, is formed, and a tunnel insulating film having an assist level is formed by CVD. A 60-nm thick phosphorus-doped crystalline silicon layer 23 to be a floating gate electrode is then deposited by CVD (chemical vapor deposition). A mask material 24 formed with a silicon nitride film, for example, is placed on the crystalline silicon layer 23. Etching is then performed on the mask material 24, the floating gate electrode 23, and the tunnel insulating film 22 in this order by reactive ion etching (RIE) with the use of a resist mask (not shown). In this manner, the surface of the silicon substrate 1 is partially exposed. Etching is further performed on the exposed region of the silicon substrate 1, so as to form a 100-nm deep device isolation groove 25.

As shown in FIGS. 45(c) and 45(d), a silicon oxide film 26 for device isolation is deposited on the entire surface, so as to completely fill the device isolation groove 25. The portion of the silicon oxide film 26 located on the surface is removed by CMP (chemical mechanical polishing), so that the surface is flattened. At this point, the upper face of the silicon nitride film 24 as the mask material is exposed.

After the exposed mask material 24 is selectively removed by etching, the exposed surface of the silicon oxide film 26 is also removed by etching with the use of a diluted hydrofluoric acid solution, so as to partially expose the sidewall faces of the floating gate electrode 23. A high-dielectric film to be an interelectrode insulating film 27 is formed. For example, the interelectrode insulating film 27 is formed with a film made of one of $Al_2O_3$, SiN, $SiO_2$, $La_2O_3$, $HfO_2$, $TaO_2$, and $TiO_2$, or a multi-layer film made of two or more of those materials on the floating gate electrode (phosphorus-doped crystalline silicon layer) 23 (see FIGS. 45(e) and 45(f)).

As shown in FIGS. 46(a) and 46(b), a phosphorus-doped $n^+$-type polycrystalline silicon layer 28 is deposited as a control gate electrode by CVD at 620° C. A tungsten silicide (WSi) layer 29 is then formed on the polycrystalline silicon layer 28, so as to form a 100-nm thick conductive layer having a two-layer structure formed with the WSi layer and the polycrystalline Si layer. Here, the WSi layer 29 is formed by depositing W by CVD using $W(CO)_6$ as a raw material gas, and converting the polycrystalline silicon layer into WSix through a later heating process. The film forming technique is not limited to the above described technique, and some other raw material gas may be used. Also, it is possible to use a technique other than CVD, such as ALD (Atomic Layer Deposition), a sputtering technique, a vapor deposition method, a laser abrasion method, MBE, or a film forming technique developed by combining two or more of those techniques. The polycrystalline Si layer may be replaced with a metal layer.

After that, etching is performed on the WSi layer 29, the polycrystalline silicon layer 28, the interelectrode insulating film 27, the single-crystal silicon floating gate electrode 23, and the tunnel insulating film 22 in this order by RIE using a resist mask (not shown), so as to form a slit portion 40 extending in the word-line direction. In this manner, the shapes of the floating gate electrode and the control gate electrode are determined.

Lastly, as shown in FIGS. 46(c) and 46(d), a silicon oxide film 30 called an electrode sidewall oxide film is formed on the exposed surface by a thermal oxidation technique. An $n^+$-type source/drain diffusion layer 31 is then formed through ion implantation. Further, an interlayer insulating film 32 such as a silicon oxide film is formed by CVD, so as to cover the entire surface. After that, a wiring layer and the likes are formed by known techniques, so as to complete nonvolatile memory cells.

Fourth Embodiment

Referring now to FIGS. 47(a) to 48(d), a method for manufacturing a MONOS-type nonvolatile memory in accordance with a fourth embodiment of the present invention is described. The cross sections shown in FIGS. 47(a), 47(c), 47(e), 48(a), and 48(c) are perpendicular to the cross sections shown in FIGS. 47(b), 47(d), 47(f), 48(b), and 48(d), respectively.

First, as shown in FIGS. 47(a) and 47(b), a tunnel insulating film 33 having the assist level described in the above embodiments is formed on the surface of a p-type silicon substrate 1 doped with desired impurities. For example, after a $SiO_2$ layer is formed by oxidizing the surface through combustion and oxidation with the use of hydrogen and oxygen at 750° C., a high-k film having a hole assist level formed therein, such as a $HfO_2$ layer having Ru added thereto, is formed by CVD. A 60-nm thick silicon nitride film 34 to be a charge storage layer is then deposited by CVD. The gas used here may be a gas formed with dichlorosilane ($SiH_2Cl_2$) and ammonia ($NH_3$), or a gas formed with hexachlorodisilane ($Si_2Cl_6$) and ammonia ($NH_3$), for example. The film forming temperature here is approximately in the range of 450° C. to 800° C. Etching is then performed on the silicon nitride film 34 as the charge storage layer and the tunnel insulating film 33 in this order by RIE with the use of a resist mask (not shown). In this manner, the surface of the silicon substrate 1 is partially exposed. Etching is further performed on the exposed region of the silicon substrate 1, so as to form a 100-nm deep device isolation groove 25.

As shown in FIGS. 47(c) and 47(d), a silicon oxide film 26 for device isolation is deposited on the entire surface, so as to completely fill the device isolation groove 25. The portion of the silicon oxide film 26 located on the surface is removed by CMP, so that the surface is flattened. At this point, the upper face of the silicon nitride film 34 is exposed.

As shown in FIGS. 47(e) and 47(f), the exposed surface of the silicon oxide film 26 is removed by etching with the use of a diluted hydrofluoric acid solution, so as to expose the sidewall faces of the silicon nitride film 33. After that, a 15-nm thick HfAlO film to be a block insulating film 35 is formed on the entire surface. Although the base is a silicon substrate in this embodiment, a SiN film may be used instead. If the surface of such a SiN film is oxidized during the film formation, the SiN film is turned into a SiON film, and the charge retention properties deteriorate. However, by the method in accordance with the first embodiment, a HfAlO film can be formed on such a SiN film, while the characteristics of the SiN film are maintained. In this embodiment, etching is performed on part of the surface of the silicon oxide film 26 for device isolation, so that a step portion is formed in the block insulating film 35. However, the present invention is not limited to that arrangement, and the block insulating film 35 may be formed to have a flat surface, depending on the desired capacity ratio between the tunnel insulating film and the charge storage layer.

As shown in FIGS. 48(a) and 48(b), a phosphorus-doped $n^+$-type polycrystalline silicon layer 28 is deposited as a control gate electrode by CVD at 420° C. A WSi layer 29 is then formed on the polycrystalline silicon layer 28, so as to form a 100-nm thick electrode layer having a two-layer structure formed with the WSi layer 29 and the silicon layer 28. Here, the WSi layer 29 is formed by depositing W by CVD using $W(CO)_6$ as a raw material gas, and converting the polycrystalline silicon layer into WSix through a later heating process. The film forming technique is not limited to the above described technique, and some other raw material gas may be used. Also, it is possible to use a technique other than CVD, such as ALD, a sputtering technique, a vapor deposition method, a laser abrasion method, MBE, or a film forming technique developed by combining two or more of those techniques. A silicon nitride film 24 to be a mask material is then deposited on the WSi layer 29 to be the control gate electrode. After that, etching is performed on the silicon nitride film 24, the WSi layer 29, the polycrystalline silicon layer 28, the HfAlOx film as the block insulating film 35, the silicon nitride film as the charge storage layer 34, and the SiON film as the tunnel insulating film 33 in this order by RIE using a resist mask (not shown), so as to form a slit portion 40 extending in the word-line direction, as shown in FIG. 48(a).

Lastly, as shown in FIGS. 48(c) and 48(d), a silicon oxide film 30 called an electrode sidewall oxide film is formed on the exposed surface by a thermal oxidation technique. An $n^+$-type source/drain diffusion layer 31 is then formed through ion implantation. Further, an interlayer insulating film 32 such as a silicon oxide film is formed by CVD, so as to cover the entire surface. After that, a wiring layer and the likes are formed by known techniques, so as to complete MONOS-type nonvolatile memory cells.

In each of the above described embodiments, a stacked structure that has an assist level and is formed with a low-k layer and a high-k layer is formed. However, it is possible to form a three-layer structure that has an assist level and is formed with a low-k layer, a high-k layer, and a low-k layer. It is also possible to form a multilayer stacked structure including more than three layers. Even if the dielectric constants of the layers vary gradually, the above described effects can be achieved, as long as an assist level is formed.

Also, in the above embodiments, the assist level is uniformly distributed in a layer. However, the assist level may exist partially in the depth direction of the film, or may have a density distribution. The element that forms the assist level may also be contained in the semiconductor substrate, the charge storage film, the interelectrode insulating film, or the control gate electrode.

Further, the specs required in a tunnel insulating film define that the leakage current is $1.0 \times 10^{-16}$ A/cm² or less in an electric field of 3 MV/cm in a charge retaining state, and the leakage current is $1.0 \times 10^{-5}$ A/cm² in an electric field of 13 MV/cm in an erasing state. However, the present invention is not limited to that, and a tunnel insulating film that fulfills any desired specs can be formed in accordance with the present invention.

A semiconductor substrate such as a Ge substrate or a GaAs substrate may be used, instead of a silicon substrate. It is also possible to use a substrate having a surface layer made of one of those semiconductor layers. Since the $E_v$ level of Ge is higher than the $E_v$ level of Si, the hole leakage current does not easily flow in the case of Ge. However, if a hole assist level is formed in the tunnel insulating film, the hole leakage current can be made sufficiently high in the case even where a Ge substrate is used.

Although the nonvolatile semiconductor memory apparatus of each of the first through fourth embodiments is of a NAND type, but it may be of a NOR type. In such a case, the tunnel insulating film of each memory cell in the NOR-type nonvolatile semiconductor memory apparatus is the tunnel insulating film of any one of the above embodiments.

As described so far, each of the above embodiments of the present invention can provide a nonvolatile semiconductor memory apparatus including a tunnel insulating film that can reduce the leakage current in a low electric field and increase the leakage current, especially the hole leakage current, in a high electric field, even if the EOT is made smaller.

Although embodiments of the present invention have been described so far, the present invention is not limited to those specific examples, and various changes and modifications may be made to them without departing from the scope of the invention.

What is claimed is:

1. A nonvolatile semiconductor memory apparatus comprising
   a memory element including:
   a semiconductor layer;
   a source region and a drain region formed at a distance from each other in the semiconductor layer;
   a first insulating film formed on a portion of the semiconductor layer, the portion being located between the source region and the drain region, the first insulating film including a first insulating layer and a second insulating layer formed on the first insulating layer and having a higher dielectric constant than the first insulating layer, the second insulating layer having a first site that performs hole trapping and releasing, the first site being formed by adding an element different from a base material to the second insulating film, the first site being located at a lower level than a Fermi level of a material forming the semiconductor layer;
   a charge storage film formed on the first insulating film;
   a second insulating film formed on the charge storage film; and
   a control gate electrode formed on the second insulating film,
   wherein physical film thicknesses of the first insulating layer and the second insulating layer satisfy the following three inequations:

$T_2 \geq -(T_{2,low}/T_{1,low}) \times T_1 + T_{2,low}$, $T_1 \geq T_{1,high}$, and $T_1 \times \epsilon_{ox}/\epsilon_1 + T_2 \times \epsilon_{ox}/\epsilon_2 \leq 8$, where:
   $T_{1,low}$ represents a physical film thickness of the first insulating layer when the first insulating film includes only the first insulating layer and the first insulating layer needs to reduce a leakage current to $J_{low}$ or lower, leakage current of the first insulating film in a first electric field applied in the first insulating film being required to be $J_{low}$ or lower as a required condition in a charge retaining state;

$T_{2,low}$ represents a physical film thickness of the second insulating layer when the first insulating film includes only the second insulating layer and the second insulating layer needs to reduce a leakage current to $J_{low}$ or lower, leakage current of the first insulating film in the first electric field applied in the first insulating film being required to be $J_{low}$ or lower as the required condition in the charge retaining state;

$T_{1,high}$ represents a physical film thickness of the first insulating layer that the first insulating layer needs to increase the leakage current in the first insulating film to $J_{high}$ higher in a second electric field $E_{high}$ applied in the first insulating film as a condition required when erasing is performed;

$\in_1$ and $\in_2$ represent dielectric constants of the first and second insulating layers respectively, $\in_{ox}$ represents a dielectric constant of silicon oxide, and $T_1$ (nm) and $T_2$ (nm) represent the physical film thicknesses of the first insulating layer and the second insulating layer respectively when stacked.

2. The apparatus according to claim 1, wherein:
the first insulating layer is a silicon oxide layer;
when the second insulating layer is a hafnia layer, the first site is located in a range that is greater than 0 eV but is smaller than 2.2 eV from a valence band maximum of the hafnia layer;
when the second insulating layer is an alumina layer, the first site is located in a range that is equal to or greater than 1.5 eV but is equal to or smaller than 4.1 eV from a valence band maximum of the alumina layer;
when the second insulating layer is a lanthanum oxide layer, the first site is located in a range that is equal to or greater than 0.1 eV but is smaller than 1.9 eV from a valence band maximum of the lanthanum oxide layer;
when the second insulating layer is a hafnium silicate layer, the first site is located in a range that is greater than 0.1 eV but is equal to or smaller than 2.9 eV from a valence band maximum of the hafnium silicate layer;
when the second insulating layer is a lanthanum aluminate layer, the first site is located in a range that is greater than 0 eV but is smaller than 1.9 eV from a valence band maximum of the lanthanum aluminate layer;
when the second insulating layer is a hafnium aluminate layer, the first site is located in a range that is greater than 0.1 eV but is equal to or smaller than 2.1 eV from a valence band maximum of the hafnium aluminate layer; and
when the second insulating layer is a lanthanum hafnate layer, the first site is located in a range that is equal to or greater than 0.1 eV but is equal to or smaller than 1.7 eV from a valence band maximum of the lanthanum hafnate layer.

3. The apparatus according to claim 1, wherein a band offset $\Delta E_v$ that is a difference between a valence band maximum of the semiconductor layer and a valence band maximum of the second insulating layer is in the range of 1.8 eV to 4.9 eV.

4. The apparatus according to claim 1, wherein the first insulating film has an EOT in the range of 1.02 nm to 5 nm.

5. The apparatus according to claim 1, wherein the charge storage film is a trap insulating film.

6. The apparatus according to claim 1, wherein the charge storage film is a floating gate electrode.

7. The apparatus according to claim 1, wherein the first insulating film has a site that performs hole trapping and releasing, the site being partially distributed in a film-plane direction.

8. The apparatus according to claim 1, wherein the element added to the first insulating film is at least one element selected from the group consisting of Cr, Mn, V, Ru, Tc, and Os.

9. A nonvolatile semiconductor memory apparatus comprising
a memory element that includes:
a semiconductor layer;
a source region and a drain region formed at a distance from each other in the semiconductor layer;
a first insulating film formed on a portion of the semiconductor layer, the portion being located between the source region and the drain region, the first insulating film having a site that performs hole trapping and releasing, the site being formed by adding an element different from a base material to the first insulating film, the site being located at a lower level than a Fermi level in a surface of a material forming the semiconductor layer;
a charge storage film formed on the first insulating film;
a second insulating film formed on the charge storage film; and
a control gate electrode formed on the second insulating film,
wherein:
when the first insulating film is a hafnium silicate layer, the site is located in a range that is equal to or greater than 0.1 eV but is equal to or smaller than 2.9 eV from a valence band maximum of the hafnium silicate layer; and
when the first insulating film is a hafnium aluminate layer, the site is located in a range that is equal to or greater than 0.1 eV but is equal to or smaller than 1.7 eV from of a valence band maximum of the hafnium aluminate layer.

10. The apparatus according to claim 9, wherein the element added to the first insulating film is at least one element selected from the group consisting of Cr, Mn, V, Ru, Tc, and Os.

* * * * *